United States Patent
Oikawa et al.

(10) Patent No.: US 10,141,520 B2
(45) Date of Patent: Nov. 27, 2018

(54) COATING LIQUID FOR FORMING LIGHT EMITTING LAYER, ORGANIC ELECTROLUMINESCENT ELEMENT, METHOD FOR MANUFACTURING ORGANIC ELECTROLUMINESCENT ELEMENT, AND LIGHTING/DISPLAY DEVICE

(71) Applicant: Konica Minolta, Inc., Tokyo (JP)

(72) Inventors: Kazuhiro Oikawa, Hachioji (JP); Hideo Taka, Inagi (JP); Dai Ikemizu, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 535 days.

(21) Appl. No.: 14/782,110

(22) PCT Filed: Apr. 1, 2014

(86) PCT No.: PCT/JP2014/059651
§ 371 (c)(1),
(2) Date: Oct. 2, 2015

(87) PCT Pub. No.: WO2014/163083
PCT Pub. Date: Oct. 9, 2014

(65) Prior Publication Data
US 2016/0056393 A1 Feb. 25, 2016

(30) Foreign Application Priority Data
Apr. 5, 2013 (JP) .................................. 2013-079599

(51) Int. Cl.
*H01L 51/54* (2006.01)
*C09K 11/06* (2006.01)
(Continued)

(52) U.S. Cl.
CPC .......... *H01L 51/0072* (2013.01); *C09K 11/06* (2013.01); *H01L 51/0064* (2013.01);
(Continued)

(58) Field of Classification Search
None
See application file for complete search history.

(56) References Cited

U.S. PATENT DOCUMENTS

| | | | |
|---|---|---|---|
| 6,893,743 B2* | 5/2005 | Sato et al. .......... | H01L 51/0059 257/102 |
| 2010/0090209 A1* | 4/2010 | Ikari et al. .......... | H01L 27/3211 257/40 |
| 2013/0207088 A1* | 8/2013 | Seo ..................... | H01L 51/5016 257/40 |

FOREIGN PATENT DOCUMENTS

| | | |
|---|---|---|
| JP | 2004199875 A | 7/2004 |
| JP | 2005071986 A | 3/2005 |

(Continued)

OTHER PUBLICATIONS

Mikroyannidis et al., "Alternating Copolyfluorenevinyles . . . Electroluminescence", Journal of Polymer Science: Part A: Polymer Chemistry, vol. 45, 4661-4670 (2007).*
(Continued)

*Primary Examiner* — Marie R. Yamnitzky
(74) *Attorney, Agent, or Firm* — Lucas & Mercanti, LLP

(57) ABSTRACT

One objective of the present invention is to provide a coating liquid for forming a light emitting layer, which improves quantum efficiency. Another objective of the present invention is to provide: an organic electroluminescent element which is formed by means of this coating liquid for forming a light emitting layer; a lighting device, a display device and a white electroluminescent device, each of which is provided with this organic electroluminescent element; and a method for manufacturing an organic electroluminescent element. A
(Continued)

coating liquid for forming a light emitting layer according to the present invention is used for the purpose of forming a light emitting layer, which is one of one or more organic layers held between a positive electrode and a negative electrode, and this coating liquid for forming a light emitting layer is characterized by containing a thermally activated delayed fluorescent compound.

11 Claims, 7 Drawing Sheets

(51) Int. Cl.
*H01L 51/00* (2006.01)
*H01L 51/50* (2006.01)
*H01L 27/32* (2006.01)

(52) U.S. Cl.
CPC ...... *H01L 51/0067* (2013.01); *H01L 51/0073* (2013.01); *H01L 51/0074* (2013.01); *H01L 51/0085* (2013.01); *H01L 51/0094* (2013.01); *H01L 51/5012* (2013.01); *H01L 51/5016* (2013.01); *H01L 51/5028* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1088* (2013.01); *C09K 2211/1092* (2013.01); *C09K 2211/185* (2013.01); *H01L 27/32* (2013.01); *H01L 51/0003* (2013.01); *H01L 51/0004* (2013.01); *H01L 51/0005* (2013.01)

(56) References Cited

FOREIGN PATENT DOCUMENTS

| | | | |
|---|---|---|---|
| JP | 2010093181 | A | 4/2010 |
| JP | 2010-114425 | A | 5/2010 |
| JP | 2010114070 | A | 5/2010 |
| JP | 2011213643 | A | 10/2011 |
| JP | 2012023127 | A | 2/2012 |
| JP | 2013120770 | A | 6/2013 |
| JP | 2014107557 | A | 6/2014 |
| WO | 2011161425 | A | 12/2011 |
| WO | 2012001002 | A2 | 1/2012 |
| WO | 2012133188 | A | 10/2012 |

OTHER PUBLICATIONS

Written Opinion of the International Searching Authority dated Jul. 15, 2014; International Application No. PCT/JP2014/059651; International filing date: Apr. 1, 2014; Applicant: Konica Minolta, Inc.; total of 9 pages.

English translation of Written Opinion of the International Searching Authority; (PCT/JP2014/059651; dated Jul. 15, 2014.

Office Action dated Aug. 23, 2017 from the corresponding Korean Patent Application No. KR 10-2015-7027051 and English translation, (6 pages).

Notice of Reasons of Rejection dated Sep. 5, 2017 from corresponding Japanese Patent Application No. JP 2015-510099 and English translation, (37 pages).

Korean Final Office Action and english translation, 10-2015-7027051, dated Oct. 23, 2017, (5 pages).

Development of phosphorescent OLED (organic light emitting diode) technology for lighting; H. Kita; Applied Physics; vol. 80, No. 4, 2011; pp. 290-294.

H. Uoyama, et al., Highly efficient organic light-emitting diodes from delayed fluorescence; Nature, 2012, vol. 492; pp. 234-238.

S. Y. Lee, et al., High-efficiency organic light-emitting diodes utilizing thermally activated delayed . . . ; Applied Physics Letters, 2012, 101, 093306-093306-4.

Q. Zhang, et al., Design of efficient thermally activated delayed fluorescence materials for pure blue . . . ; J. Am. Chem. Soc., 2012, 134, 14706-14709.

T. Nakagawa, et al., Electroluminescence based on thermally activated delayed fluorescence . . . ; Chem. Commun., 2012, 48, 9580-9582.

A. Endo, et al., Thermally activated delayed fluorescence from . . . ; Adv. Mater., 2009, 21, 4802-4806.

Yukiieru Toronkai 10-kai Reikai Yokoshu (Organic EL Round-Table Discussion 10th Meeting Preprint), S2-5; pp. 11-12, 2010.

Xu-Lin Chen, et al; Rational design of strongly blue-emitting cuprous complexes with thermally . . . ; Chemistry of Materials; 2013; vol. 25; pp. 3910-3920.

T. Edura, et al; TADF; A1 cathode deposition for all wet-processed OLED devices . . . ; 2014; 17a-PG1-12; 1 page International Search Report dated Jul. 15, 2014 for Application No. PCT/JP2014/059651 and English translation.

Office Action dated Feb. 23, 2017 from the corresponding Korean Patent Application No. KR 10-2015-7027051; Applicant: Konica Minolta, Inc.; English translation of Office Action; Total of 7 pages.

* cited by examiner

TADF COMPOUND   PHOSPHORESCENT METAL COMPLEX

| | |
|---|---|
|  | ENERGY TRANSFER FROM TADF COMPOUND TO PHOSPHORESCENT METAL COMPLEX |
|  | ENERGY TRANSFER OF THERMALLY DEACTIVATED COMPONENT FROM TADF COMPOUND AT $T_1$ |
|  | THERMALLY DEACTIVATED COMPONENT FROM TADF COMPOUND AT $T_1$ |

LIGHT

LIGHT

COATING LIQUID FOR FORMING LIGHT EMITTING LAYER, ORGANIC ELECTROLUMINESCENT ELEMENT, METHOD FOR MANUFACTURING ORGANIC ELECTROLUMINESCENT ELEMENT, AND LIGHTING/DISPLAY DEVICE

CROSS REFERENCE TO RELATED APPLICATION

This Application is a 371 of PCT/JP2014/059651 filed on Apr. 1, 2014, which, in turn, claimed the priority of Japanese Patent Application No. JP2013-079599 filed on Apr. 5, 2013, both applications are incorporated herein by reference.

TECHNICAL FIELD

The present invention relates to coating solutions for forming luminous layers, organic electroluminescent elements, lighting devices, display devices, white electroluminescent devices, and methods of producing organic electroluminescent elements. More specifically, the present invention relates to coating solutions for forming luminous layers having enhanced quantum efficiency, organic electroluminescent elements, lighting device, display device, white electroluminescent devices, and methods of producing organic electroluminescent elements.

BACKGROUND ART

Organic electroluminescent (hereinafter written as "EL") elements utilizing electroluminescence of organic materials (also referred to as "organic light-emitting diodes") have been practically used as a new generation of light-emitting systems enabling planar light emission. The organic EL elements have been applied to not only electronic displays but also lighting apparatuses, and their development has been expected.

The prototype of organic EL elements (composed of fluorescent materials) was published in 1987. In 1998, an organic EL element of another type composed of a phosphorescent material was published that utilizes all of singlet excitons and triplet excitons in electroluminescence to attain high luminescent efficiency.

Phosphorescent organic EL elements emitting green light and red light have been developed as a result of development of materials and techniques attaining the luminescent efficiency and the emission lifetime of practical levels, and have been used in electronic displays and lightings.

Phosphorescent organic EL elements emitting blue light should be composed of a luminous material having higher triplet energy than that of the luminous materials for red and green light emissions, and thus the luminous material for blue light emission should have a wide gap between the energy level of the ground state and that of the excited state. Such requirements reduce molecular stability, resulting in luminescent elements having shorter service lives (for example, see NPL 1).

A wider gap between the energy level of the ground state and that of the excited state is required to attain light emission of a color closer to pure blue or blue violet. A light emission having such a shorter wavelength is completely traded off against a longer service life of the luminescent element, and the compatibility therebetween has not been established yet.

Typical luminous materials for organic EL elements include the phosphorescent materials and fluorescent materials. A new trend has been found in the development of the fluorescent materials.

For example, PTL 1 focuses attention on a phenomenon of generation of a singlet exciton through fusion of two collided triplet excitons (hereinafter referred to as "triplet-triplet fusion (TTF) phenomenon"), and discloses a technique of efficiently generating the TTF phenomenon to enhance the efficiency of the fluorescence elements. The blue fluorescent material attained by this technique has double or triple the power efficiency of the traditional blue fluorescent materials. Unfortunately, the fluorescent materials intrinsically have a conversion rate of 50% from the lowest excited triplet energy level to the lowest excited singlet energy level. In other words, the luminescent efficiency of the fluorescent materials is limited in principle and cannot be enhanced to be equal to the luminescent efficiency of the phosphorescent materials.

PTL 2 discloses a technique using a delayed fluorescent compound composed of a copper complex to enhance luminescent efficiency. Unfortunately, the compound disclosed in PTL 2 has light emissions ranging from green to red. The luminescent efficiency of the compound is higher than that of the traditional fluorescent materials, but is significantly lower than that of the phosphorescent materials having high luminescent efficiency.

Delayed fluorescent compounds having a different light-emitting scheme called thermally-activated delayed fluorescent compounds (hereinafter also referred to as TADF compounds) have been found, and their applications to organic EL elements have been examined (for example, see NPLs 2 to 7 and PTL 3).

The TADF compounds have a unique light-emitting mechanism as illustrated in an energy diagram in FIG. 1. The difference between the lowest excited singlet energy level and the lowest excited triplet energy level in the TADF compounds is smaller than that in typical fluorescent materials ($\Delta Est(TADF)$ is smaller than $\Delta Est(F)$ in FIG. 1). Electric field excitation generates triplet excitons at a 75% probability, and these triplet excitons usually do not contribute to light emission. If the difference between the lowest excited singlet energy level and the lowest excited triplet energy level is small enough, the triplet excitons transit to a singlet excited state under heat of the organic EL element being driven, and are radiatively deactivated (also referred to as "radiative transit" or "radiative deactivation") from the singlet excited state to the ground state to generate fluorescence.

The lowest excited triplet energy $T_1$ (TADF) is always smaller (or more stable) than the lowest excited singlet energy $S_1$(TADF) even in this transition. Such a relation between $T_1$ (TADF) and $S_1$(TADF) prevents part or most of the triplet excitons generated at a 75% probability to transit to the singlet excited state through intersystem crossing, so that part or most of the triplet excitons generated at a 75% probability are thermally deactivated. Moreover, the lifetime of excitation at $T_1$ longer than that at $S_1$(TADF) and agglomeration of the TADF compounds in films formed through deposition readily cause triplet-triplet (T-T) annihilation to prevent an enhancement in luminescent efficiency.

NPL 2 attempted to enhance luminescent efficiency through modification of substituents to effectively utilize the triplet excitons ($T_1$(TADF)) of TADF compounds subjected to thermal deactivation or T-T annihilation. Unfortunately, a reduction in the difference between the lowest excited singlet energy level and the lowest excited triplet energy level has technical difficulties in molecular design and synthesis. Actually, introduction of a substituent into a TADF compound for the dispersion of the TADF compound in films leads to a significant reduction in luminescent efficiency, change in wavelength of light emitted, and a reduction in driving life of elements, which phenomena are not found in the common fluorescent materials and phosphorescent materials.

PRIOR ART DOCUMENTS

Patent Documents

PTL 1: WO 2012/133188
PTL 2: WO 2011/161425
PTL 3: Japanese Patent Application Laid-Open No. 2011-213643

Non Patent Documents

NPL 1: "Shomeinimuketa Rinkoyuki Ierugijutsu no Kaihatsu (Development of phosphorescent organic EL techniques for lighting)," Ohyobutsuri (Applied Physics) Vol. 80, No. 4, 2011
NPL 2: H. Uoyama, et al., Nature, 2012, 492, 234-238
NPL 3: S. Y. Lee, et al., Applied Physics Letters, 2012, 101, 093306-093309
NPL 4: Q. Zhang, et al., J. Am. Chem. Soc., 2012, 134, 14706-14709
NPL 5: T. Nakagawa, et al., Chem. Commun., 2012, 48, 9580-9582
NPL 6: A. Endo, et al., Adv. Mater., 2009, 21, 4802-4806
NPL 7: Yukiieru Toronkai 10-kai Reikai Yokoshu (Organic EL Round-Table Discussion 10th Meeting Preprint), pp. 11-12, 2010

DISCLOSURE OF THE INVENTION

Problems to be Solved by the Invention

The present invention has been made in consideration of these problems and circumstances. An object of the present invention is to provide a coating solution for forming a luminous layer to enhance the quantum efficiency of an organic electroluminescent element. Another object of the present invention is to provide an organic electroluminescent element made of the coating solution for forming a luminous layer, a lighting device, a display device, and a white electroluminescent device including the organic electroluminescent element, and a method of producing an organic electroluminescent element.

Means for Solving the Problem

The present inventors, who have conducted extensive research to solve the above problems on technical problems of synthesis and a reduction in agglomeration of a compound during film formation, have found that a thermally-activated delayed fluorescent luminous compound formed into a film through a wet process using a solvent exhibits satisfactory results, and have achieved the present invention.

The object of the present invention is achieved by the following aspects:

1. A coating solution for forming a luminous layer included in one or more organic layers disposed between an anode and a cathode, the coating solution comprising:
a thermally-activated delayed fluorescent compound.

2. The coating solution for forming the luminous layer according to item 1, comprising: the thermally-activated delayed fluorescent compound; and a heavy atom compound having an external heavy-atom effect to promote intersystem crossing of the thermally-activated delayed fluorescent compound from a triplet excited state to a singlet excited state to increase a fluorescent intensity.

3. The coating solution for forming the luminous layer according to item 2, wherein the heavy atom compound is a phosphorescent metal complex.

4. The coating solution for forming the luminous layer according to item 3, wherein at least one type of the thermally-activated delayed fluorescent compound and at least one type of the phosphorescent metal complex are each contained in any of the one or more organic layers, and the lowest excited triplet energy level ($T_1$(TADF)) of the thermally-activated delayed fluorescent compound (TADF) and the lowest excited triplet energy level (MAP)) of the phosphorescent metal complex (P) are within ranges allowing transfer of energy or electrons therebetween.

5. The coating solution for forming the luminous layer according to items 3 or 4, wherein a difference in energy between the lowest excited singlet energy level ($S_1$(TADF)) of the thermally-activated delayed fluorescent compound and the lowest excited triplet energy level (MAP)) of the phosphorescent metal complex is within a range represented by Expression (1):

$$-0.2\ eV \le [S_1(TADF) - T_1(P)] \le 1.0\ eV \qquad (1).$$

6. The coating solution for forming the luminous layer according to any one of items 3 to 5, wherein a difference in energy between the lowest excited singlet energy level ($S_1$(TADF)) of the thermally-activated delayed fluorescent compound and the lowest excited triplet energy level ($T_1$(P)) of the phosphorescent metal complex is within a range represented by Expression (2):

$$0\ eV \le [S_1(TADF) - T_1(P)] \le 0.2\ eV \qquad (2).$$

7. The coating solution for forming the luminous layer according to any one of items 3 to 6, wherein a difference in energy between the lowest excited triplet energy level ($T_1$(TADF)) of the thermally-activated delayed fluorescent compound and the lowest excited triplet energy level ($T_1$(P)) of the phosphorescent metal complex is within a range represented by Expression (3):

$$-0.2\ eV \le [T_1(TADF) - T_1(P)] \le 0.5\ eV \qquad (3).$$

8. The coating solution for forming the luminous layer according to any one of items 3 to 7, wherein a difference in energy between the lowest excited triplet energy level ($T_1$(TADF)) of the thermally-activated delayed fluorescent compound and the lowest excited triplet energy level ($T_1$(P)) of the phosphorescent metal complex is within a range represented by Expression (4):

$$0\ eV \le [T_1(TADF) - T_1(P)] \le 0.1\ eV \qquad (4).$$

9. The coating solution for forming the luminous layer according to any one of items 1 to 8, wherein the lowest excited triplet energy level ($T_1$(TADF)) of the thermally-activated delayed fluorescent compound is within a range of 2.4 to 3.5 eV.

10. The coating solution for forming the luminous layer according to any one of items 3 to 9, wherein the thermally-activated delayed fluorescent compound and the phosphorescent metal complex are contained in a same luminous layer.

11. The coating solution for forming the luminous layer according to any one of items 3 to 10, wherein the phosphorescent metal complex has a structure represented by Formula (I):

[Chemical Formula 1]

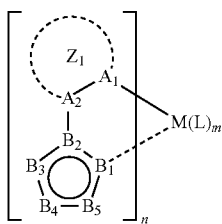

Formula (I)

where M represents Ir, Pt, Rh, Ru, Ag, Cu, or Os; $A_1$ and $A_2$ each represent a carbon or nitrogen atom; ring $Z_1$ represents a 6-membered aromatic hydrocarbon ring group or 5- or 6-membered aromatic heterocyclic ring group containing $A_1$ and $A_2$; $B_1$ to $B_5$ are an atomic group forming a 5-membered aromatic heterocyclic ring group, and each represent a carbon, nitrogen, oxygen, or sulfur atom optionally having a substituent; the ring $Z_1$ optionally has a substituent, or optionally has a condensed ring structure formed through bonding of substituents; substituents of ligands are optionally bonded to each other to bond the ligands to each other; L represents a monoanionic bidentate ligand coordinated with M; m represents an integer of 0 to 2; n represents an integer of 1 to 3; m+n is 2 or 3; if at m and n of 2 or more, the ring $Z_1$, an aromatic heterocyclic ring group represented by $B_1$ to $B_5$, and L may be same or different.

12. The coating solution for forming the luminous layer according to any one of items 1 to 11, further comprising a host compound.

13. An organic electroluminescent element comprising a luminous layer made from the coating solution for forming the luminous layer according to any one of items 1 to 12.

14. A lighting device comprising the organic electroluminescent element according to item 13.

15. A display device comprising the organic electroluminescent element according to item 13.

16. A white electroluminescent device which has a single luminous layer disposed between an anode and a cathode, the white electroluminescent device comprising:
the organic electroluminescent element according to item 13.

17. A method of producing an organic electroluminescent element including one or more organic layers disposed between an anode and a cathode, the method comprising:
forming a luminous layer with the coating solution for forming the luminous layer according to any one of items 1 to 12, the luminous layer being one of the organic layers.

Effects of the Invention

The aspects according to the present invention provide a coating solution for forming a luminous layer to enhance the quantum efficiency of an organic electroluminescent element. The aspects according to the present invention also provide an organic electroluminescent element made of the coating solution for forming a luminous layer, a lighting device, a display device, and a white electroluminescent device comprising the organic electroluminescent element, and a method of producing an organic electroluminescent element.

Although the advantageous effects, mechanism, and action of the present invention are not clarified, the present inventors infer as follows.

The coating solution for forming a luminous layer according to the present invention forms a low-density coating film. Despite TADF compounds having a limited variety of substituents, the compounds are pseudo-dispersed in such a coating film to reduce the probability of T-T annihilation, enhance the quantum efficiency, and prevent shift of the peaks of light emitted to longer regions of the wavelength.

If the coating solution for forming a luminous layer according to the present invention is used in combination with a phosphorescent material and/or a host compound in preparation of organic EL elements, the phosphorescent material and/or the host compound function as fillers into the low-density portions of the coating film. Such a filler effect of the phosphorescent material and/or the host compound together with the effect of the dispersed TADF compounds achieves organic EL elements having high efficiency, low driving voltage, and prolonged service life. The coating solution for forming a luminous layer according to the present invention enhances the dispersion of the TADF compound to reduce agglomeration of luminous materials during driving of the organic EL elements, prevent a change in color of light emission, reduce formation of non-luminous centers (dark spots), and enhances the reliability of the elements.

EMBODIMENTS FOR CARRYING OUT THE INVENTION

Figure 1:
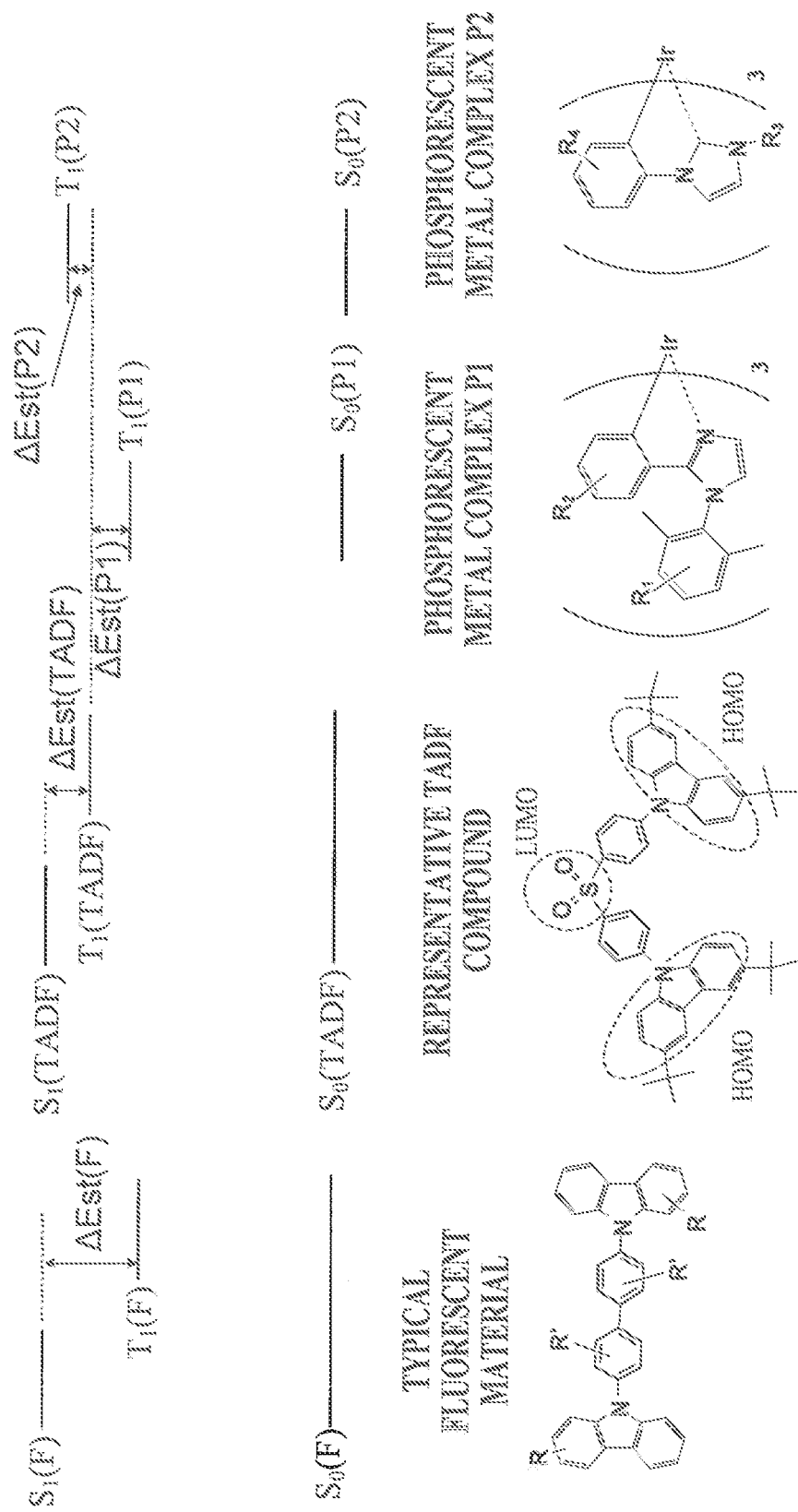
FIG. 1 is a schematic view illustrating an energy diagram of a TADF compound in combination with a phosphorescent metal complex.

The coating solution for forming a luminous layer according to the present, invention comprises a thermally-activated delayed fluorescent compound, the luminous layer being included in one or more organic layers disposed between an anode and a cathode.

In an embodiment of the present invention, the coating solution for forming a luminous layer according to the present invention preferably further comprises a heavy atom compound having an external heavy-atom effect of promoting intersystem crossing of the thermally-activated delayed fluorescent compound from a triplet excited state to a singlet excited state to increase the fluorescent intensity of the at least one thermally-activated delayed fluorescent compound. In such a coating solution, the intersystem crossing of the thermally-activated delayed fluorescent compound from the triplet excited state to the singlet excited state can be effectively promoted by the external heavy-atom effect of the heavy atom compound to increase the fluorescent intensity of the thermally-activated delayed fluorescent compound.

In the present invention, the heavy atom compound is preferably a phosphorescent metal complex. The at least one phosphorescent metal complex can effectively exert a heavy atom effect on the thermally-activated delayed fluorescent compound.

In the present invention, preferably the at least one thermally-activated delayed fluorescent compound and the at least one phosphorescent metal complex are each contained in any one of the organic layers, and the lowest excited triplet energy level ($T_1$(TADF)) of the at least one thermally-activated delayed fluorescent compound (TADF) and the lowest excited triplet energy level ($T_1$(P)) of the at least one phosphorescent metal complex (P) are within ranges allowing transfer of energy or electrons between ($T_1$(TADF)) and ($T_1$(P)). At these two energy levels within such a range, the at least one phosphorescent metal complex (P) can effectively exert the heavy atom effect on the at least one thermally-activated delayed fluorescent compound (TADF), and can effectively trap the energy to be thermally deactivated of the energy of triplet excitons constituting 75% of excitons of the TADF compound.

In the present invention, the difference in energy between the lowest excited singlet energy level ($S_1$(TADF)) of the at least one thermally-activated delayed fluorescent compound and the lowest excited triplet energy level ($T_1$(P)) of the at least one phosphorescent metal complex is preferably within the range represented by Expression (1).

At a difference in energy within this range, the phosphorescent metal complex can effectively exert the heavy atom effect on the thermally-activated delayed fluorescent compound without dominant energy transfer from the thermally-activated delayed fluorescent compound to the phosphorescent metal complex.

In the present invention, the difference in energy between the lowest excited singlet energy level ($S_1$(TADF)) of the at least one thermally-activated delayed fluorescent compound and the lowest excited triplet energy level ($T_1$(P)) of the at least one phosphorescent metal complex is preferably within the range represented by Expression (2).

At a difference in energy within this range, the phosphorescent metal complex can more effectively exert the heavy atom effect on the thermally-activated delayed fluorescent compound without dominant energy transfer from the thermally-activated delayed fluorescent compound to the phosphorescent metal complex.

In the present invention, the difference in energy between the lowest excited triplet energy level ($T_1$(TADF)) of the at least one thermally-activated delayed fluorescent compound and the lowest excited triplet energy level ($T_1$(P)) of the at least one phosphorescent metal complex is preferably within the range represented by Expression (3).

At a difference in energy within this range, the phosphorescent metal complex can effectively exert the heavy atom effect on the thermally-activated delayed fluorescent compound without dominant energy transfer from the thermally-activated delayed fluorescent compound to the phosphorescent metal complex, and can effectively trap the energy to be thermally deactivated of triplet excitons constituting 75% of excitons of the TADF compound.

In the present invention, the difference in energy between the lowest excited triplet energy level ($T_1$(TADF)) of the at least one thermally-activated delayed fluorescent compound and the lowest excited triplet energy level ($T_1$(P)) of the at least one phosphorescent metal complex is preferably within the range represented by Expression (4).

At a difference in energy within this range, the phosphorescent metal complex can effectively exert the heavy atom effect on the thermally-activated delayed fluorescent compound without dominant energy transfer from the thermally-activated delayed fluorescent compound to the phosphorescent metal complex, and can more effectively trap the energy to be thermally deactivated of the energy of triplet excitons constituting 75% of excitons of the thermally-activated delayed fluorescent compound.

In the present invention, the lowest excited triplet energy level ($T_1$(TADF)) of the thermally-activated delayed fluorescent compound is preferably within the range of 2.4 to 3.5 eV. At $T_1$(TADF) within this range, the phosphorescent metal complex according to the present invention can effectively exert the heavy atom effect on the thermally-activated delayed fluorescent compound emitting blue to blue green light, and can effectively trap the energy to be thermally deactivated of triplet excitons constituting 75% of excitons of the thermally-activated delayed fluorescent compound.

In the present invention, the at least one thermally-activated delayed fluorescent compound and the at least one phosphorescent metal complex are preferably contained in the same luminous layer. In such a configuration, intersystem crossing of the thermally-activated delayed fluorescent compound from the triplet excited state to the singlet excited state can be more effectively promoted by the external heavy-atom effect of the phosphorescent metal complex to increase the fluorescent intensity of the thermally-activated delayed fluorescent compound.

In the present invention, the at least phosphorescent metal complex preferably has a structure represented by Formula (I).

The phosphorescent metal complex having such a structure has relatively high quantum efficiency and high stability, can effectively exert the heavy atom effect on its adjacent TADF compound, and can effectively trap the energy to be thermally deactivated of the energy of triplet excitons constituting 75% of excitons of the TADF compound.

The coating solution for forming a luminous layer according to the present invention preferably further comprises a host compound. The host compound can more significantly enhance the dispersion of the TADF compound, and can act as a filler to the low-density portions of the coating film, which are unique to film formation by coating, to prevent molecules inhibiting light emission, such as solvents and water, from being contained in the film.

The organic electroluminescent element according to the present invention preferably comprises a luminous layer made of the coating solution for forming a luminous layer according to the present invention. Use of the coating solution for forming a luminous layer according to the present invention can attain a luminous layer containing TADF molecules highly dispersed therein while keeping their properties, without introduction of any dispersible substituent to disperse the TADF molecules in consideration of a complex energy relationship between the singlet excited state and the triplet excited state of the TADF compound, and can produce an organic electroluminescent element at low cost to enhance the luminescent efficiency, reduce the driving voltage, prolong the driving life, prevent change in chromaticity after driving of the element, and enhance the reliability.

The organic electroluminescent element according to the present invention can be suitably used in a lighting device. A lighting device having enhanced luminescent efficiency can be thereby achieved.

The organic electroluminescent element according to the present invention can be suitably used in a display device. A display device having enhanced luminescent efficiency can be thereby achieved.

The white electroluminescent device according to the present invention preferably comprises the organic electroluminescent element according to the present invention, wherein the organic electroluminescent element according to the present invention comprises a single luminous layer disposed between an anode and a cathode. A white electroluminescent device having enhanced luminescent efficiency can be thereby achieved.

In a preferred embodiment of the present invention, a method of producing an organic electroluminescent element including one or more organic layers disposed between an anode and a cathode preferably involves forming a luminous layer with a coating solution according to the present invention, the luminous layer being one of the organic layers. Such a method can produce inexpensive organic electroluminescent elements that have high luminescent efficiency, can be driven at low voltage, and exhibit prolonged driving lives, reduced changes in chromaticity during their driving modes, and high reliability.

The present invention, components, and embodiments and aspects of the present invention will now be described in detail.

Throughout the specification, the term "to" between numeric values indicates that the numeric values before and after the term are inclusive as the lower limit and the upper limit, respectively.

<Outline of Coating Solution for Forming a Luminous Layer According to the Present Invention>

The coating solution for forming a luminous layer according to the present invention comprises at least one thermally-activated delayed fluorescent compound, the luminous layer being included in one or more organic layers disposed between an anode and a cathode.

The coating solution for forming a luminous layer according to the present invention preferably contains a phosphorescent material and a host compound. These phosphorescent material and host compound can more significantly enhance the dispersion of the TADF compound, and can act as fillers to the portions having a low TADF density in the coating film, which is unique to film formation by coating, to exclude molecules inhibiting light emission, such as solvents and water, from the film.

The details of the coating solution for forming a luminous layer will be described later.

<Principle of Thermally-Activated Delayed Fluorescence and Energy Level>

The relationship between the energy level of the TADF compound and that of a phosphorescent metal complex will be described.

In the fluorescent compound such as TADF compounds, normally transition from a singlet state to a singlet state and transition from a triplet state to a triplet state are allowed transitions with large velocity constants. In contrast, transition from a singlet state to a triplet state and transition from a triplet state to a singlet state are forbidden transitions with small velocity constants. In other words, forbidden transition barely occurs.

The phosphorescent metal complex does not generate fluorescent light through radiative deactivation from the singlet excited state to the ground state, and generates phosphorescent light through radiative deactivation from the triplet excited state to the ground state at a high rate with high efficiency. The phosphorescence occurs by the heavy atom effect of the central transition metal (such as iridium or platinum) of the complex.

This heavy atom effect is observed not only in the same molecule (internal heavy atom effect) but also between adjoining or adjacent molecules (external heavy-atom effect).

Figure 2:
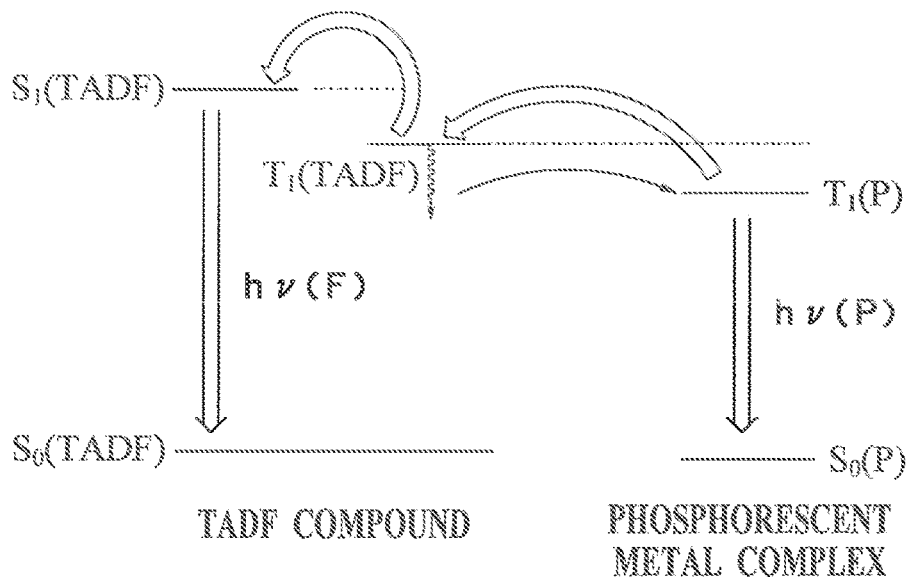
FIG. 2 is a schematic view illustrating activation of a TADF compound with a phosphorescent metal complex.

Namely, as illustrated in the schematic view of FIG. 2, a phosphorescent metal complex adjacent to the TADF compound accelerates the main transition mechanism of the TADF compound, i.e., reverse intersystem crossing ($T_1$ (TADF)→$S_1$(TADF)) through thermal activation to promote thermally-activated delayed fluorescence (TADF).

The residual triplet excitons of the TADF compound which do not undergo reverse intersystem crossing or radiative deactivation only radiate heat to be non-radiatively deactivated in the absence of any co-existing phosphorescent metal complex, but causes energy transfer from $T_1$(TADF) to $T_1$(P) to emit phosphorescent light from the metal complex in the presence of any co-existing phosphorescent metal complex. This energy transfer is an allowed transition from a triplet state to a triplet state with a high energy transfer rate, and immediately occurs if the energy level $T_1$(TADF) is higher than that of $T_1$(P).

In such an allowed transition from a triplet state to a triplet state $T_1$(P) lower than $T_1$(TADF) is not always required. This energy transfer and thus light emission from the phosphorescent metal complex occur even if the energy level $T_1$(P) is equal to or slightly higher than the energy level $T_1$(TADF). The absolute value of the allowable difference between $T_1$(P) and $T_1$(TADF) can be within the range of 0 to 0.5 eV, particularly preferably 0 to 0.1 eV. The present inventors have found that an absolute difference within this range can attain fluorescence from the TADF compound and phosphorescence from the phosphorescent metal complex at the same time, which is the essential feature to the present invention.

The material having the external heavy-atom effect may be any compound containing an element of 6th period or the following periods in the periodic table. Preferred compounds contain at least one element selected from Ir, Pt, Rh, Ru, Ag, Cu, and Os. More preferred are organic metal complexes containing at least one element selected from Os, Pt, Ir, and Au. Among these organic metal complexes, particularly preferred are phosphorescent metal complexes containing at least one element selected from Os, Pt, Ir, and Au.

Among these phosphorescent metal complexes, most preferred are complexes emitting phosphorescent light at room temperature (about 25° C.). Namely, it is important to contain an organic compound readily interactive with the TADF compound to achieve the external heavy-atom effect. It is also important to hybridize the spins of the singlet excitons with those of the triplet excitons by the internal heavy atom effect (spin-orbit coupling). Furthermore, it is also important that the organic compound emits phosphorescent light at room temperature for conversion of the thermally deactivated energy from the triplet excited state of the TADF compound into phosphorescent light.

If the absolute difference between $T_1(P)$ and $T_1(TADF)$ is within the preferred range, the light emitted from the phosphorescent metal complex has a wavelength longer than that of the light emitted from the TADF compound used in combination for energy transfer from $T_1(TADF)$ to $T_1(P)$. For example, the TADF compound can generate blue fluorescent light and the phosphorescent metal complex can generate orange phosphorescent light at the same time to emit approximately white light as a whole. Alternatively, the TADF compound can generate pure blue light having a short wavelength and the phosphorescent metal complex can generate pale blue light having a longer wavelength to emit blue light as a whole.

Any combination of the TADF compound and the phosphorescent metal complex can be selected so as to control the energy level $T_1$ of the phosphorescent metal complex within the preferred range described above. Especially, a technical demand for blue light emission having a short wavelength component with high efficiency and prolonged service life has been increasing to expand the reproducible color range in electronic displays and increase the color temperature of lighting devices. The best way to meet the demand in the industrial viewpoint is emission of pure blue to blue violet light from the TADF compound and pale blue light from the co-existing phosphorescent metal complex.

[The Lowest Excited Singlet Energy $S_1(TADF)$]

The lowest excited singlet energy $S_1$ of the TADF compound in the present invention is also determined by a standard method. Namely, a target compound is deposited on a quartz substrate to prepare a sample, and the absorption spectrum (ordinate: absorbance, abscissa: wavelength) of the sample is measured at normal temperature (300 K). A tangent is drawn to the rise on the longer wavelength side in the absorption spectrum. The lowest excited singlet energy $S_1$ is calculated from a given expression based on the wavelength at the intersection of the tangent and the abscissa. Since the molecules of the TADF compound used in the present invention relatively readily agglomerate, the TADF compound in a thin film may cause errors of measurement due to the agglomeration. In consideration of a relatively small Stokes shift of the TADF compound in the present invention and an extremely small change in the structure between the excited state and the ground state, the lowest excited singlet energy in the present invention is determined, as an approximate value, as the peak value of the light emission wavelength of a liquid TADF compound at room temperature (about 25° C.). The solvent used in the measurement can be any solvent having a small solvent effect or not affecting the agglomeration of the TADF compound. Non-polar solvents, such as cyclohexane and toluene, can be used, for example.

The absolute value of $\Delta Est=(S_1(TADF)-T_1(TADF))$ is preferably 1.0 eV or less, more preferably 0.5 eV or less for the thermally-activated delayed fluorescence (TADF) of the TADF compound. The $\Delta Est$ value is a very important factor to attain thermally-activated delayed fluorescence because this value directly reflects the occurrence of the reverse intersystem crossing $(T_1(TADF) \rightarrow S_1(TADF))$ through thermal activation (the main mechanism of the TADF compound).

Since the lowest excited singlet energy of the TADF compound is always larger than the lowest excited triplet energy thereof, the difference between the lowest excited singlet energy of the TADF compound and the lowest excited triplet energy level of the phosphorescent metal complex $[S_1(TADF)-T_1(P)]$ is always larger than the difference $[T_1(TADF)-T_1(P)]$. The range is defined as the sum of $\Delta Est=(S_1(TADF)-T_1(TADF))$ and $[T_1(TADF)-T_1(P)]$.

Accordingly, the value $[S_1(TADF)-T_1(P)]$ is within the range of 1.0 eV or less where a preferred value $\Delta Est$ is 0.5 eV or less and a preferred value $[T_1(TADF)-T_1(P)]$ is 0.5 eV or less, for example. Specifically, the value $[S_1(TADF)-T_1(P)]$ is within the range of $-0.2 \text{ eV} \leq [S_1(TADF)-T_1(P)] \leq 1.0 \text{ eV}$, particularly preferably $0 \text{ eV} \leq [S_1(TADF)-T_1(P)] \leq 0.2 \text{ eV}$. At a value within this range, a co-existing phosphorescent metal complex adjacent the TADF compound accelerates the reverse intersystem crossing $(T_1(TADF) \rightarrow S_1(TADF))$ through thermal activation (main mechanism of the TADF compound) to promote thermally-activated delayed fluorescence of the TADF compound.

[The Lowest Excited Triplet Energy $T_1(TADF)$]

The lowest excited triplet energy of the TADF compound is calculated from the photoluminescent (PL) characteristics of a liquid or a thin film. For example, the lowest excited triplet energy of the TADF compound in a thin film can be calculated as follows: A diluted dispersion of the TADF compound is formed into a thin film, and the transient PL characteristics are measured with a streak camera to separate the fluorescent component from the phosphorescent component. The difference in energy between the fluorescent component and the phosphorescent component is defined as $\Delta Est$, and the lowest excited triplet energy is determined from the lowest excited singlet energy. The temperature dependency of the TADF compound can also be used. For example, light emission mainly occurs from the lowest excited triplet energy at low temperature (8.5 K), and the lowest excited triplet energy can also be determined directly from the main light emission at low temperature.

[The Lowest Excited Triplet Energy $T_1(P)$]

The lowest excited triplet energy $T_1(P)$ of the phosphorescent metal complex in the present invention is determined as follows: The phosphorescent spectrum (ordinate: phosphorescent intensity, abscissa: wavelength) of a sample solution of the target compound in a solvent is measured at low temperature (77 K), and a tangent is drawn to the rise on the shorter wavelength side in the phosphorescence spectrum. The lowest excited triplet energy $T_1(P)$ of the phosphorescent metal complex in the present invention is determined from a conversion expression ($E \approx 1240/\lambda$ [eV] where $\lambda$ is a wavelength [nm]) based on the wavelength at the intersection of the tangent and the abscissa.

The absolute PL quantum efficiency for measurement and evaluation is measured with an absolute PL quantum yields measurement system C9920-02 (made by Hamamatsu Photonics K.K.). The emission lifetime is measured with a streak camera C4334 (made by Hamamatsu Photonics K.K.) while a sample is being excited with laser light.

Figure 3:
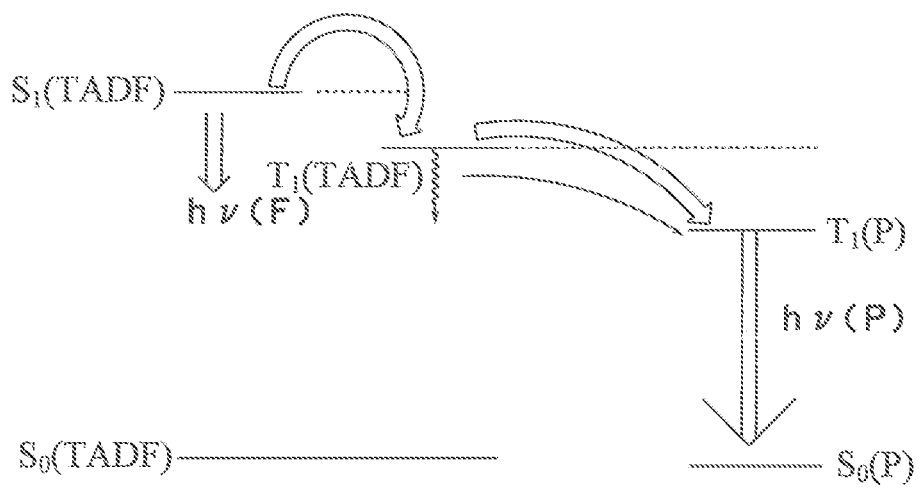
FIG. 3 is a schematic view illustrating energy transfer from a TADF compound to a phosphorescent metal complex.
Figure 3:
Figure 3:
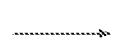
Figure 3:

The lower and upper limits of $T_1$ energy of the phosphorescent metal complex will now be described. FIG. 3 illustrates a schematic view.

The energy transfer occurs in principle, as described above, if the lowest excited triplet energy ($T_1(P)$) of the phosphorescent metal complex is lower than the lowest excited triplet energy ($T_1(TADF)$) of the co-existing TADF compound; hence, no theoretical lower limit is present. Actually, a difference ($\Delta Est$) of more than 0.5 eV causes the energy transfer to the phosphorescent metal complex occurs at an optimal rate. This energy transfer causes all of triplet excitons of the TADF compound to transit to the phosphorescent metal complex without transition to singlet excitons through intersystem crossing, precluding the intended TADF phenomenon.

For these reasons, the lowest excited triplet energy levels ($T_1$) of the TADF compound and the phosphorescent metal complex preferably have a relationship represented by an expression: $-0.2$ eV$\leq$[$T_1$(TADF)$-T_1$(P)]$\leq 0.5$ eV to emit light from the TADF compound and the phosphorescent metal complex at the same time (see FIG. 2).

Moreover, the present inventors have found, as a result of extensive research, that the condition represented by the following expression: 0 eV$\leq$[$T_1$(TADF)$-T_1$(P)]$\leq 0.1$ eV is preferably satisfied to generate blue light having a short wavelength from the TADF compound and pale blue light from the phosphorescent metal complex at the same time.

Such a light emitting mechanism is effectively attained by the TADF compound and the phosphorescent metal complex present close to the TADF compound. The term "adjacent" indicates a distance needed to cause the energy transfer (external heavy-atom effect) between the TADF compound and the phosphorescent metal complex. The distance between the TADF compound and the adjacent phosphorescent metal complex is preferably within the range of 0.3 to 1 nm for dexter energy transfer. The distance between the TADF compound and the adjacent phosphorescent metal complex is preferably within the range of 1 to 10 nm for forster energy transfer. The TADF compound and the phosphorescent metal complex should be present in the same layer in the dexter energy transfer whereas preferably the TADF compound and the phosphorescent metal complex are separately present in adjacent layers or are present in the same layer in the forster energy transfer.

In the present invention, the TADF compound and the phosphorescent metal complex can be disposed close to each other within a distance exerting the external heavy-atom effect, and may be contained in a single layer or may be separately contained in two adjacent layers.

The phosphorescent metal complex in the present invention can be used in any content, preferably in a content such that the phosphorescent metal complex can be present close enough to the TADF compound to affect the external heavy-atom effect thereon. The content is appropriately selected from the range of 0.05 mass % or more and 25 mass % or less of the content of the TADF compound in consideration of readiness of energy transfer generated due to the difference in triplet energy between the TADF compound and the phosphorescent metal complex. The content is more preferably 0.05 mass % or more and 5.0 mass % or less, most preferably 0.05 mass % or more and 1.0 mass % or less. Especially, in consideration of relationship with $T_1$(TADF)$-T_1$(P), the phosphorescent metal complex is preferably used in a content equal to or less than a content A represented by the following expression:

A (content (mass %) of phosphorescent metal complex relative to content of TADF compound)=17$-$20$\times$($T_1$(TADF)$-T_1$(P))

Specifically, if the value [$T_1$(TADF)$-T_1$(P)] is large or if the difference between the lowest excited triplet energy of the TADF compound and that of the phosphorescent metal complex is large, energy readily transfers from the lowest excited triplet energy level of the TADF compound to the lowest excited triplet energy level of the phosphorescent metal complex. Accordingly, the content of the phosphorescent metal complex is preferably low so as not to inhibit the intersystem crossing of the TADF compound. Conversely if the value [$T_1$(TADF)$-T_1$(P)] is small or if the difference between the lowest excited triplet energy of the TADF compound and that of the phosphorescent metal complex is small, the lowest excited triplet energy level of the TADF compound is readily mixed with the lowest excited triplet energy level of the phosphorescent metal complex. Accordingly, the content of the phosphorescent metal complex is relatively higher than that in the former case.

If the phosphorescent metal complex and the TADF compound are separately present in adjacent layers, the phosphorescent metal complex can be used in appropriate amounts essential for energy transfer at the interface between these layers. To maximize the energy transfer, the amounts are preferably greater than those in the case where the phosphorescent metal complex and the TADF compound are present in the same layer. A preferred content of the phosphorescent metal complex is 0.5 mass % or more and 25 mass % or less of the TADF compound in the adjacent layer. For convenience, the above range of the content of the phosphorescent metal complex can be converted into a content in vol % and be used in preparation of an organic EL element containing the TADF compound and the phosphorescent metal complex.

Figure 4:
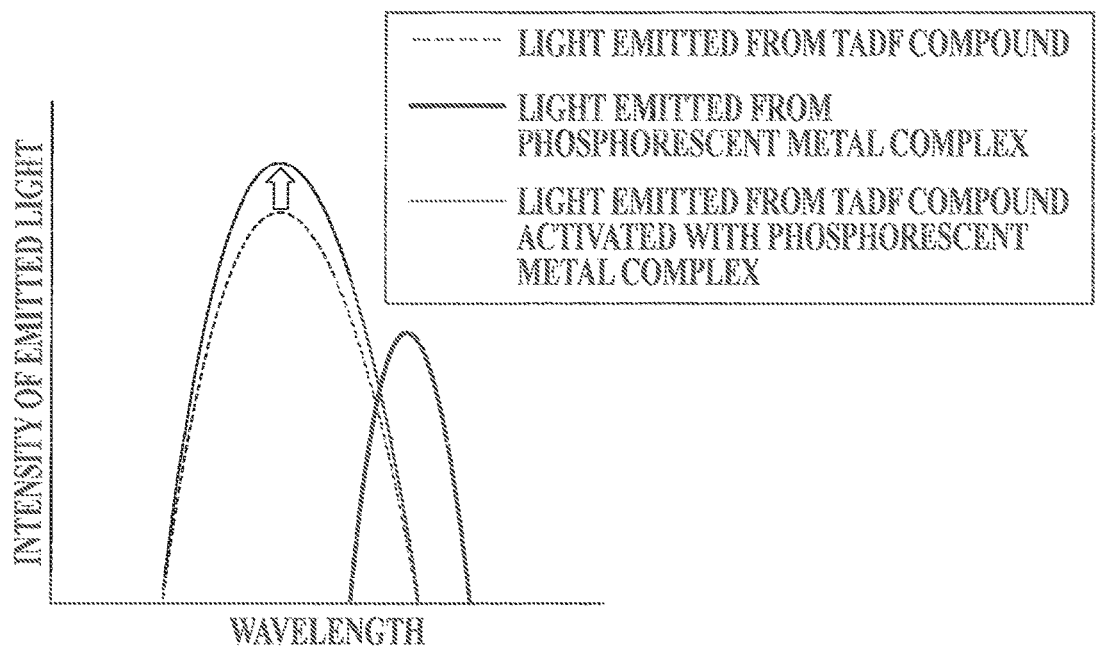
FIG. 4 is a conceptual diagram illustrating an increase in the luminescent intensity through activation of a TADF compound with a phosphorescent metal complex.

FIG. 4 illustrates a conceptual diagram illustrating an increase in the luminescent intensity through activation of the TADF compound with the phosphorescent metal complex. In detail, FIG. 4 illustrates a mechanism to increase the luminescent intensity using spectra if a relationship expressed by $-0.2$ eV$\leq$[$S_1$(TADF)$-T_1$(P)]$\leq 1.0$ eV or $-0.2$ eV$\leq$[$T_1$(TADF)$-T_1$(P)]$\leq 0.5$ eV is satisfied and if the TADF compound molecules and the phosphorescent metal complex molecules are present in appropriate amounts within a distance causing energy or electron transfer.

Specifically, the intersystem crossing from the lowest excited triplet energy level of the TADF compound to the lowest excited singlet energy level indicated by a dashed line is activated with a phosphorescent metal complex (see FIG. 2).

The phosphorescent metal complex can trap the thermally deactivated component from the lowest excited triplet energy level of the TADF compound to increase the intensity of fluorescent light emitted from the TADF compound compared to that emitted from a single TADF compound and to provide both fluorescence and phosphorescence.

Although the description above is premised on the organic EL element, electric excitation is not a necessary condition on the present invention. For example, the light emission in the present invention is achieved through photoexcitation, electromagnetic excitation, or thermal excitation.

Since the TADF compound and the phosphorescent metal complex are preferably present in the same system to attain both the fluorescence from the TADF compound and the phosphorescence from the phosphorescent metal complex, an organic luminescent composition containing the TADF compound and the co-existing phosphorescent metal complex can also be prepared.

The TADF compound and the phosphorescent metal complex both may agglomerate to generate different stable levels lower than their intrinsic levels in the triplet states and the singlet states. The function of the present invention is not attained in such cases. A binder and/or a host compound can further be added optionally, or rather preferably be used in combination with the TADF compound and the phosphorescent metal complex.

<TADF Compound>

The thermally-activated delayed fluorescent compound (TADF compound) usable in the present invention has the following characteristics:

(1) The emission lifetime in the order of microsecond at room temperature (298 K);

(2) The wavelength of light emission at room temperature (298 K) shorter than that at low temperature (77 K);

(3) The emission lifetime at room temperature (298 K) significantly shorter than that at low temperature (77 K); and (4) The enhanced luminescent intensity through an increase in temperature.

Besides, the TADF compound has a very small difference ΔEst(TADF) in energy between the lowest excited singlet energy level and the lowest excited triplet energy level as described in NPLs 2 to 7. The allowable difference is generally within in the range of 0 to 1.0 eV, preferably 0 eV≤ΔEst(TADF)≤0.5 eV. An optimized structure of the TADF compound can minimize the structural change between the ground state and the excited state or between the singlet excited state and the triplet excited state to reduce non-radiative deactivation (Knr) and thus enhance the quantum efficiency.

Although the lowest excited energy of the TADF compound varies according to a target wavelength, a compound having its lowest excited energy suitable for application can be used. For example, if the phosphorescent metal complex used in combination with the TADF compound emits sky blue light, the lowest excited triplet energy level of the TADF compound ($T_1$(TADF)) is preferably within the range of 2.4 to 3.5 eV to emit light of a color ranging from light green to deep blue.

Non-limiting examples of preferred thermally-activated delayed fluorescent compounds used in the present invention are as follows:

[Chemical Formula 2]

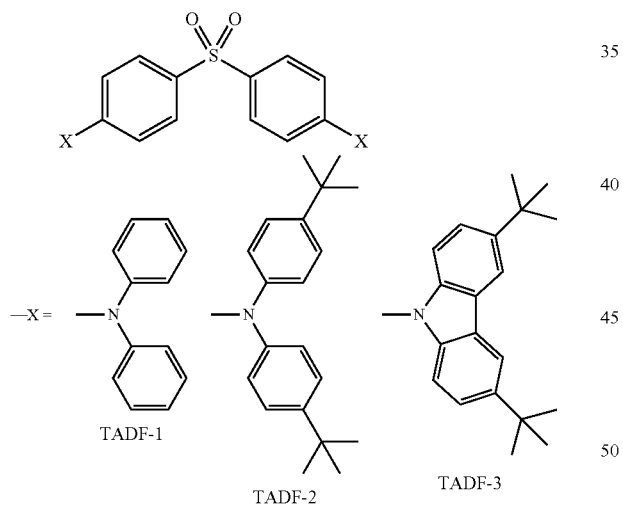

TADF-1

TADF-2

TADF-3

[Chemical Formula 3]

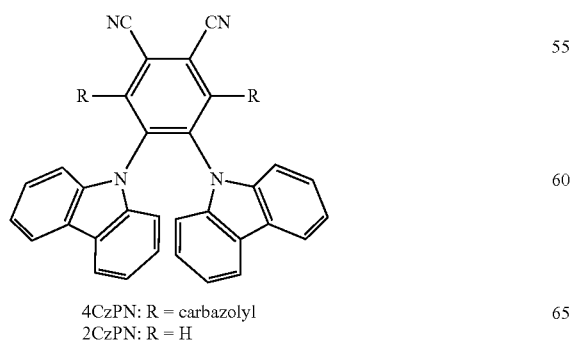

4CzPN: R = carbazolyl
2CzPN: R = H

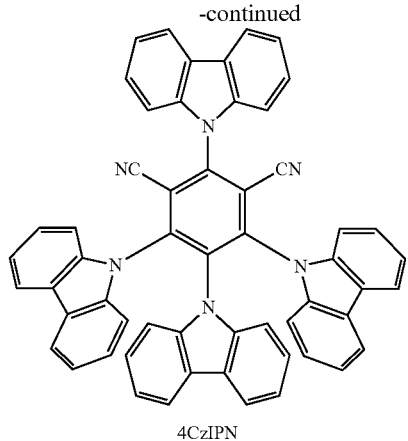

4CzIPN

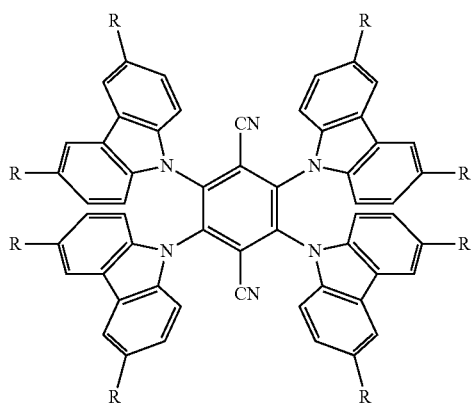

4CzTPN: R = H
4CzTPN-Me: R = Me
4CzTPN-Ph: R = Ph

[Chemical Formula 4]

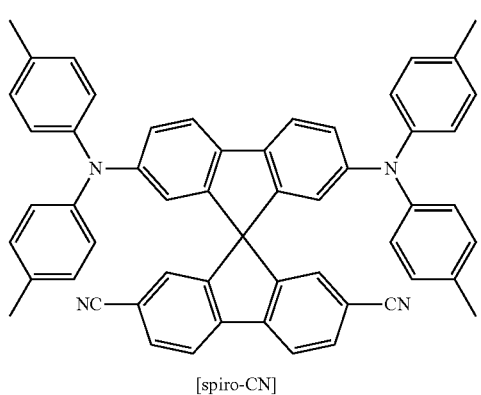

[spiro-CN]

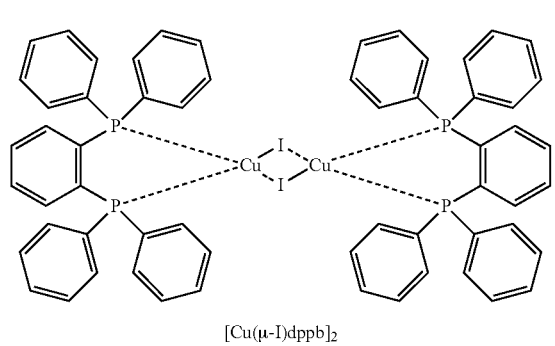

[Cu(μ-I)dppb]$_2$

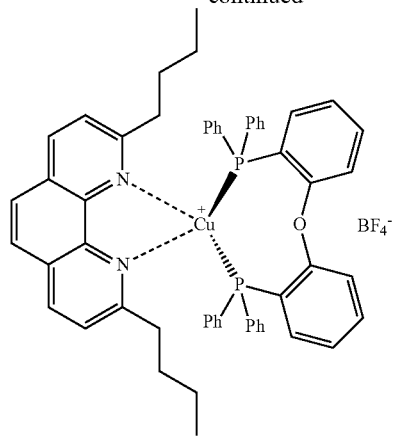
[Cu(dnbp)(DPEPhos)]BF$_4$
[Chemical Formula 5]
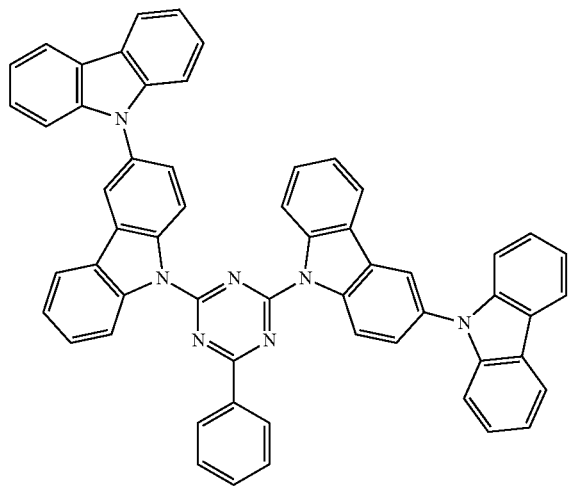
[CC2TA]
[Chemical Formula 6]
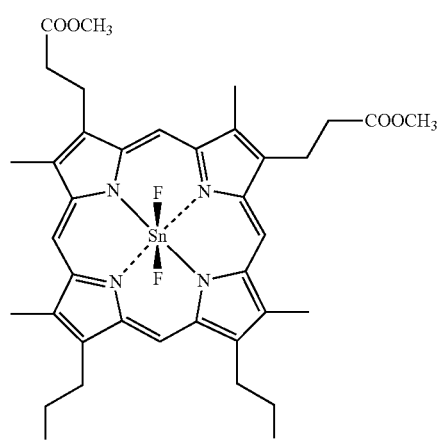
SnF$_2$-Copro III
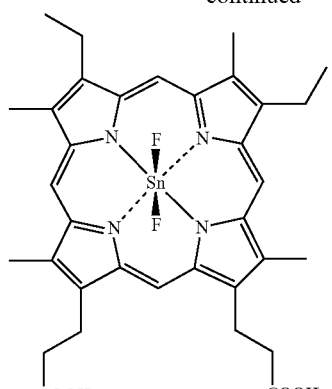
SnF$_2$-Meso IX
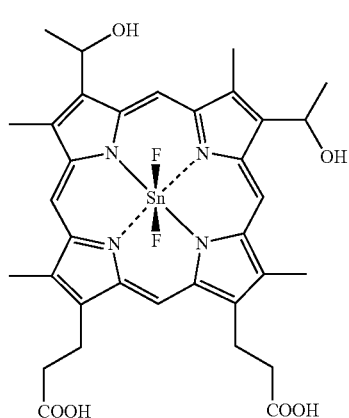
SnF$_2$-Hemato IX
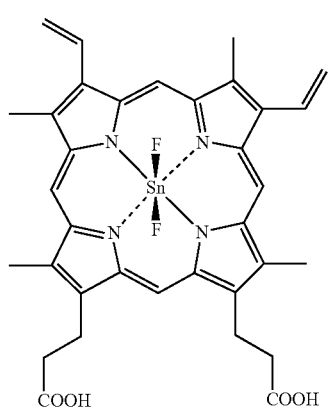
SnF$_2$-Proto IX -continued

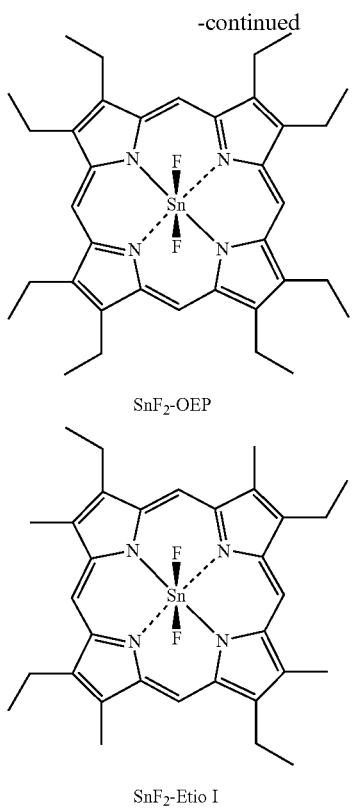

SnF$_2$-OEP

SnF$_2$-Etio I

<Phosphorescent Metal Complex>

The phosphorescent metal complex preferably used in the present invention is represented by Formula (I):

[Chemical Formula 7]

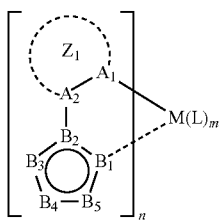

Formula (I)

where M represents Ir, Pt, Rh, Ru, Ag, Cu, or Os; $A_1$ and $A_2$ each represent a carbon or nitrogen atom; ring $Z_1$ represents a 6-membered aromatic hydrocarbon ring group or 5- or 6-membered aromatic heterocyclic ring group containing $A_1$ and $A_2$; $B_1$ to $B_5$ are an atomic group forming a 5-membered aromatic heterocyclic ring group, and each represent a carbon, nitrogen, oxygen, or sulfur atom optionally having a substituent; the ring $Z_1$ may have substituents, or may have a condensed ring structure formed through bonding of the substituents; substituents of ligands may be bonded to each other to bond the ligands to each other; L represents a monoanionic bidentate ligand coordinated with M; m represents an integer of 0 to 2; n represents an integer of 1 to 3; m+n is 2 or 3; at m and n of 2 or more, the ring $Z_1$, an aromatic heterocyclic ring group represented by $B_1$ to $B_5$, and L may be the same or different.

The ring $Z_1$ in Formula (I) represents a 6-membered aromatic hydrocarbon ring or a 5- or 6-membered aromatic heterocycle containing $A_1$ and $A_2$. Examples of the 5- or 6-membered aromatic heterocycle represented by $Z_1$ include benzene, naphthalene, pyridine, pyrimidine, pyrrole, thiophene, pyrazole, imidazole, oxazole, and thiazole rings. Among these rings, preferred is a benzene ring.

The ring $Z_1$ may have substituents, or may have a condensed ring structure formed through bonding of the substituents.

Examples of the substituents optionally included in the ring Z1 of the phosphorescent metal complex represented by Formula (I) include alkyl groups (such as methyl, ethyl, propyl, isopropyl, tert-butyl, pentyl, hexyl, octyl, dodecyl, tridecyl, tetradecyl, and pentadecyl groups); cycloalkyl groups (such as cyclopentyl and cyclohexyl groups); alkenyl groups (such as vinyl and allyl groups), alkynyl groups (such as ethynyl and propargyl groups); aromatic hydrocarbon rings (also referred to as aromatic carbon rings or aryl groups, such as phenyl, p-chlorophenyl, mesityl, tolyl, xylyl, naphthyl, anthryl, azulenyl, acenaphthenyl, fluorenyl, phenanthryl, indenyl, pyrenyl, and biphenylyl groups); aromatic heterocyclic ring groups (such as pyridyl, pyrimidinyl, furyl, pyrrolyl, imidazolyl, benzoimidazolyl, pyrazolyl, pyrazinyl, triazolyl (such as 1,2,4-triazol-1-yl and 1,2,3-triazol-1-yl), oxazolyl, benzooxazolyl, triazolyl, isooxazolyl, isothiazolyl, furazanyl, thienyl, quinolyl, benzofuryl, dibenzofuryl, benzothienyl, dibenzothienyl, indolyl, carbazolyl, carbolinyl, diazacarbazolyl (in which one of carbon atoms forming the carboline ring of the carbolinyl group is replaced by a nitrogen atom), quinoxalinyl, pyridazinyl, triazinyl, quinazolinyl, and phthalazinyl groups); heterocyclic groups (such as pyrrolidyl, imidazolidyl, morpholyl, and oxazolydyl groups); alkoxy groups (such as methoxy, ethoxy, propyloxy, pentyloxy, hexyloxy, octyloxy, and dodecyloxy groups); cycloalkoxy groups (such as cyclopentyloxy and cyclohexyloxy groups); aryloxy groups (such as phenoxy and naphthyloxy groups); alkylthio groups (such as methylthio, ethylthio, propylthio, pentylthio, hexylthio, octylthio, and dodecylthio groups); cycloalkylthio groups (such as cyclopentylthio and cyclohexylthio groups); arylthio groups (such as phenylthio and naphthylthio groups); alkoxycarbonyl groups (such as methyloxycarbonyl, ethyloxycarbonyl, butyloxycarbonyl, octyloxycarbonyl, and dodecyloxycarbonyl groups); aryloxycarbonyl groups (such as phenyloxycarbonyl and naphthyloxycarbonyl groups); sulphamoyl groups (such as aminosulfonyl, methylaminosulfonyl, dimethylaminosulfonyl, butylaminosulfonyl, hexylaminosulfonyl, cyclohexylaminosulfonyl, octylaminosulfonyl, dodecylaminosulfonyl, phenylaminosulfonyl, naphthylaminosulfonyl, and 2-pyridylaminosulfonyl groups); acyl groups (such as acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, and pyridylcarbonyl groups); acyloxy groups (such as acetyloxy, ethylcarbonyloxy, butylcarbonyloxy, octylcarbonyloxy, dodecylcarbonyloxy, and phenylcarbonyloxy groups); amide groups (such as methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, and naphthylcarbonylamino groups); carbamoyl groups (such as aminocarbonyl, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, and 2-pyridylaminocarbonyl groups); ureido groups (such as methylureido, ethylureido, pentylureido, cyclohexylureido, octylureido, dodecylureido, phenylureido, naphthylureido, and 2-pyridylaminoureido groups); sulfinyl groups (such as methylsulfinyl, ethylsulfinyl, butylsulfinyl, cyclohexylsulfinyl, 2-ethylhexylsulfinyl, dodecylsulfinyl, phenylsulfinyl, naphthylsulfinyl, and 2-pyridylsulfinyl groups); alkylsulfonyl groups (such as methylsulfonyl, ethylsulfonyl, butylsulfonyl, cyclohexylsulfonyl, 2-ethylhexylsulfonyl, and dodecylsulfonyl groups); arylsulfonyl or heteroarylsulfonyl groups (such as phenylsulfonyl, naphthylsulfonyl, and 2-pyridylsulfonyl groups); amino groups (such as amino, ethylamino, dimethylamino, butylamino, cyclopentylamino, 2-ethylhexylamino, dodecylamino, anilino, naphthylamino, and 2-pyridylamino groups); a cyano group; a nitro group; a hydroxy group; a mercapto group; and silyl groups (such as trimethylsilyl, triisopropylsilyl, triphenylsilyl, and phenyldiethylsilyl groups). Among these substituents, preferred are alkyl groups or aryl groups.

$B_1$ to $B_5$ each represent a carbon, nitrogen, oxygen, or sulfur atom, and at least one of $B_1$ to $B_5$ represents a nitrogen atom. A nitrogen-containing aromatic heterocycle composed of these five atoms is preferably a single ring. Examples of the single ring include pyrrole, pyrazole, imidazole, triazole, tetrazole, oxazole, isooxazole, triazole, isothiazole, oxadiazole, and thiadiazole rings. Among these rings, preferred are pyrazole and imidazole rings, and particularly preferred is an imidazole ring having nitrogen atoms in $B_2$ and $B_5$. These rings may have the substituents listed above. Preferred substituents are alkyl and aryl groups, and more preferred are aryl groups.

L represents a monoanionic bidentate ligand coordinated with M. Specific examples of the monoanionic bidentate ligand represented by L include substituted or unsubstituted phenylpyridine, phenylpyrazole, phenylimidazole, phenyltriazole, phenyltetrazole, pyrazole, picolinic acid, and acetylacetone. These groups may further have the substituents listed above.

m represents an integer of 0 to 2; n represents an integer of 1 to 3; m+n is 2 or 3. Preferred is m=0.

Examples of the metal element represented by M include transition metal elements of Groups 8 to 10 in the periodic table (also simply referred to as transition metals), such as Ir, Pt, Rh, Ru, Ag, Cu, and Os. Among these metal elements, preferred are iridium and platinum, and more preferred is iridium.

The aromatic heterocycle composed of $B_1$ to $B_5$ in Formula (I) is preferably represented by one of Formulae (Ia), (Ib), and (Ic):

[Chemical Formula 8]

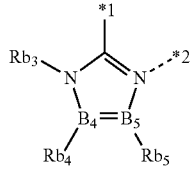

Formula (Ia)

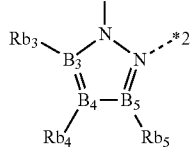

Formula (Ib)

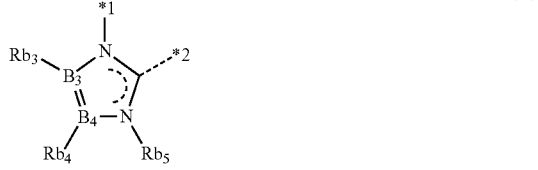

Formula (Ic)

where *1 represents a bonding site to $A_2$; *2 represents a bonding site to M;

$Rb_3$ to $Rb_5$ each represent a hydrogen atom or a substituent. Examples of the substituents represented by $Rb_3$ to $Rb_5$ include the same substituents as those included in the ring $Z_1$ in Formula (I).

$B_4$ and $B_5$ in Formula (Ia) represent a carbon or nitrogen atom, and more preferably at least one of $B_4$ and $B_5$ is a carbon atom.

$B_3$ and $B_4$ in Formula (Ic) represent a carbon or nitrogen atom, and more preferably at least of $B_3$ and $B_4$ is a carbon atom.

Non-limiting examples of the phosphorescent metal complex according to the present invention, i.e., compounds represented by Formulae (I), (Ia), (Ib), and (Ic) and other phosphorescent metal complexes used in the present invention are shown:

[Chemical Formula 9]

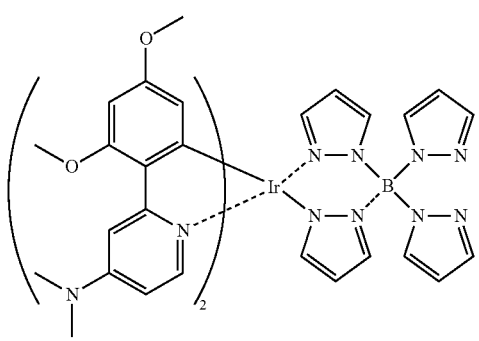

P-1

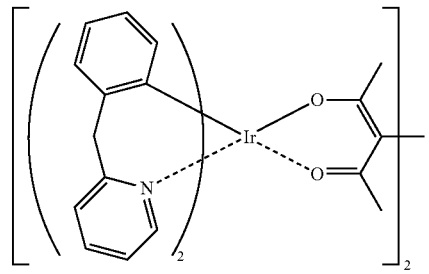

P-2

-continued
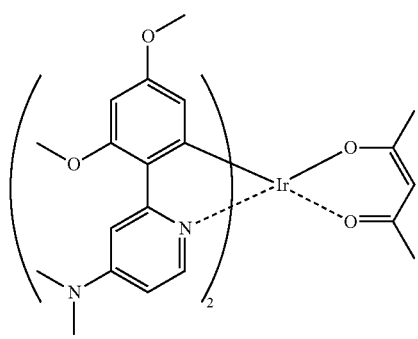
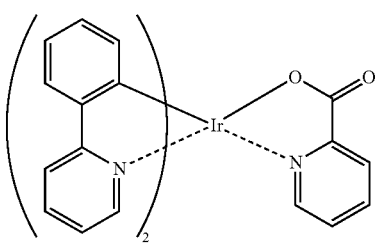
P-3      P-4
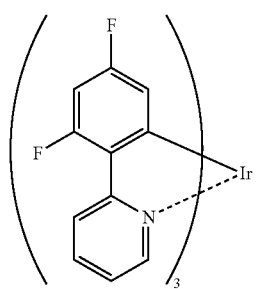
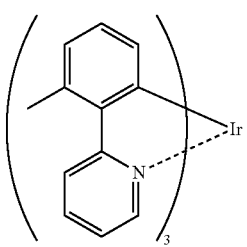
P-5      P-6
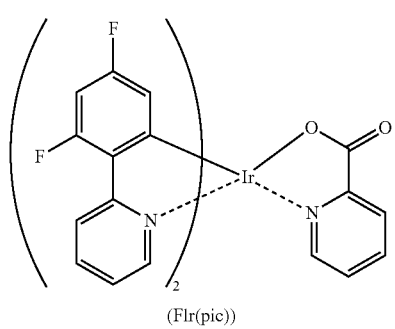
(FIr(pic))
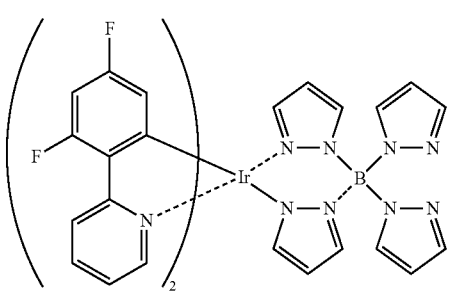
P-7      P-8
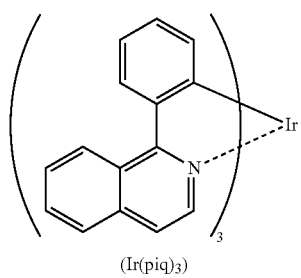
(Ir(piq)₃)
[Chemical Formula 10]
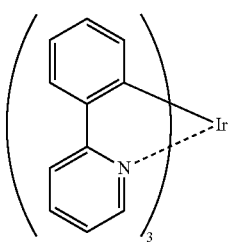
(Ir(ppy)₃)
P-9      P-10
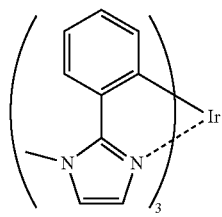
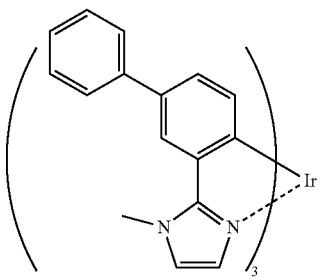
P-11      P-12

-continued
P-13
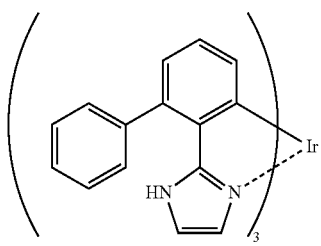
P-14
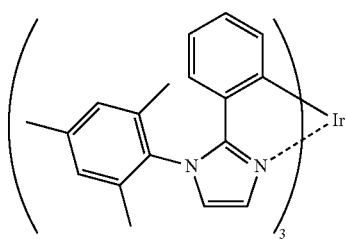
P-15
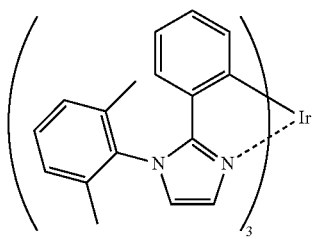
P-16
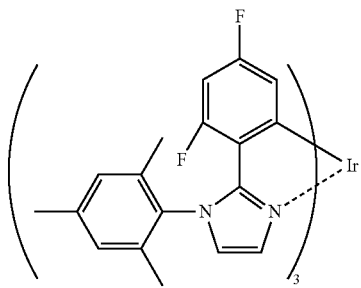
P-17
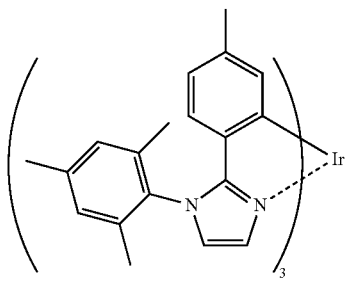
P-18
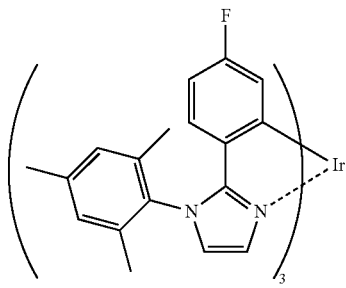
P-19
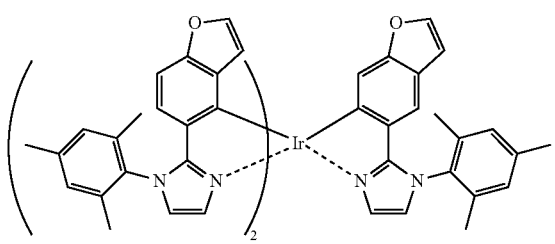
P-20
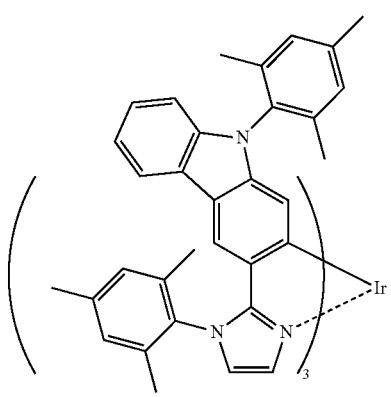
P-21
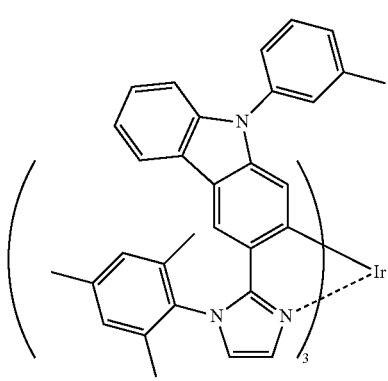
P-22
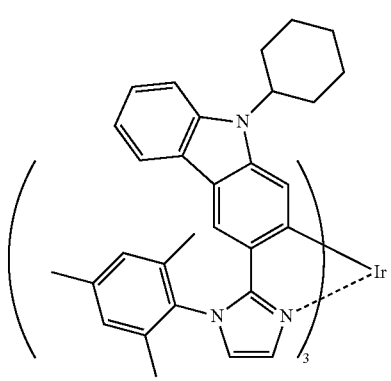

-continued
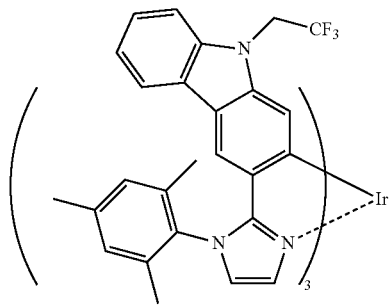
P-23
[Chemical Formula 11]
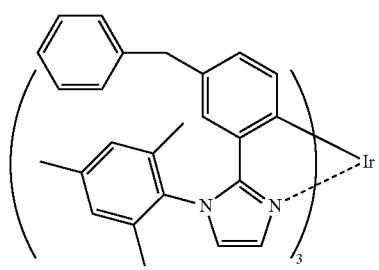
P-24
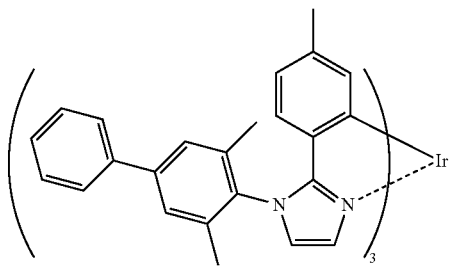
P-25
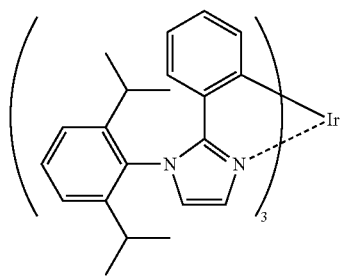
P-26
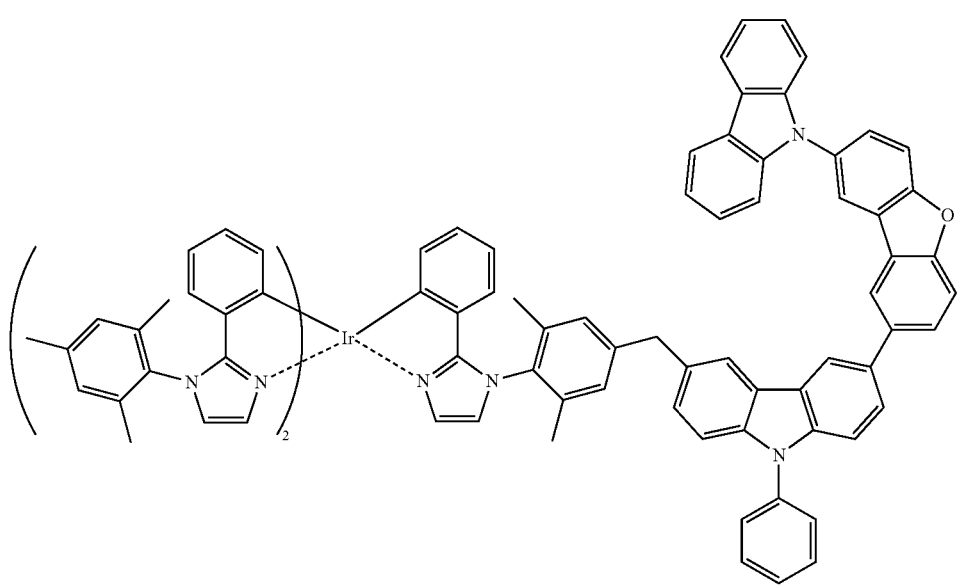
P-27

-continued
P-28
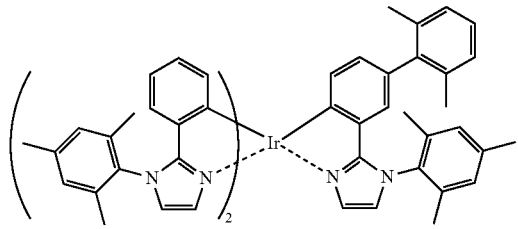
P-29
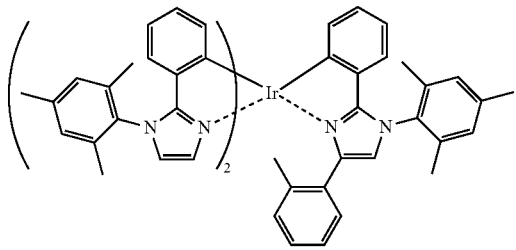
P-30
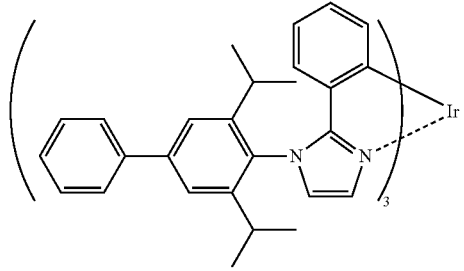
P-31
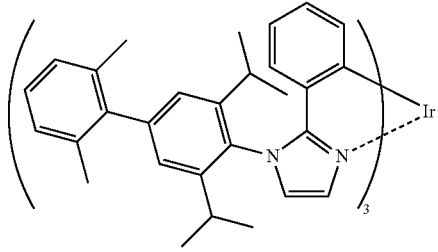
P-32
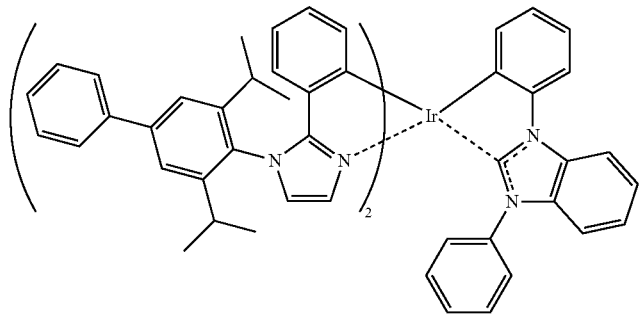
[Chemical Formula 12]
P-33
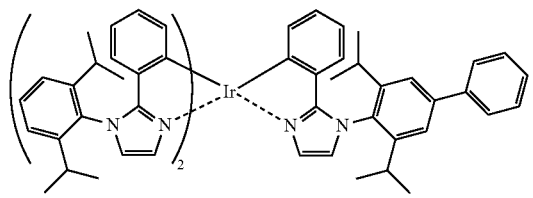
P-34
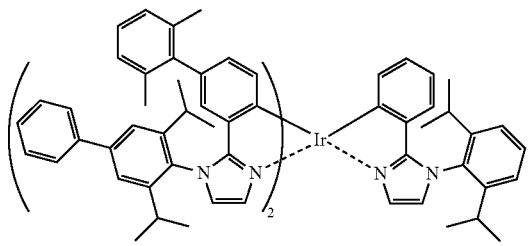
P-35
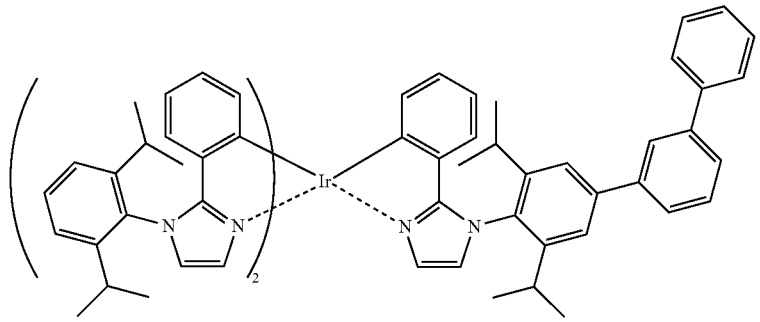

-continued
P-36
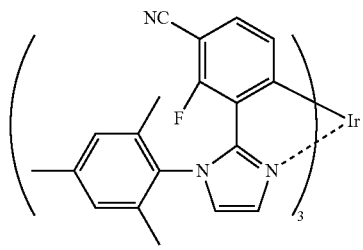
P-37
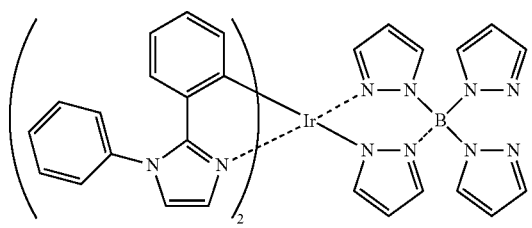
P-38
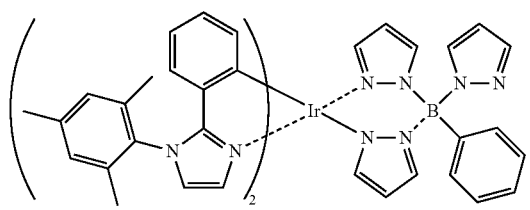
P-39
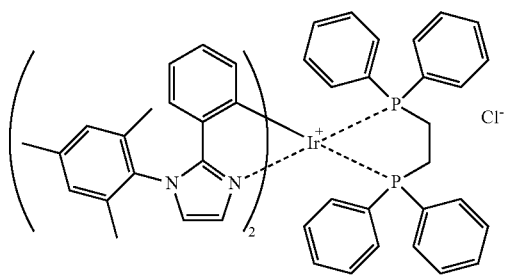
P-40
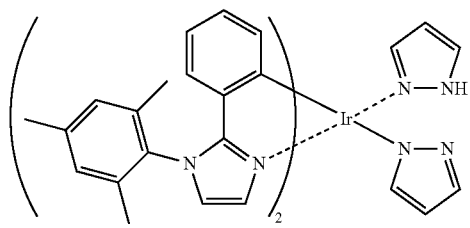
[Chemical Formula 13]
P-41
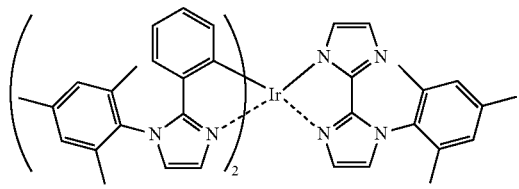
P-42
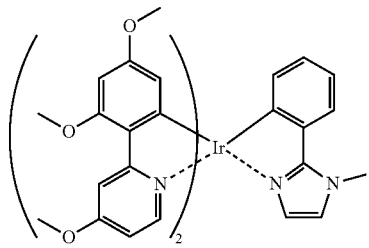
P-43
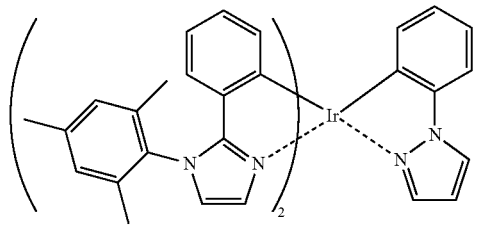
P-44
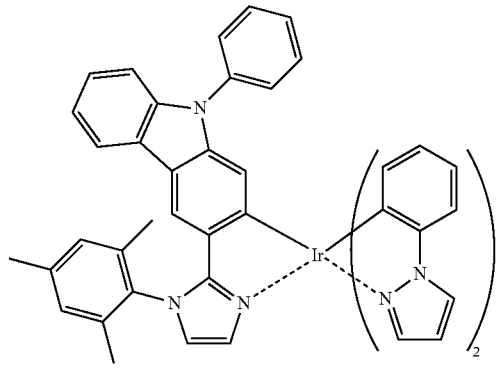

-continued
P-45
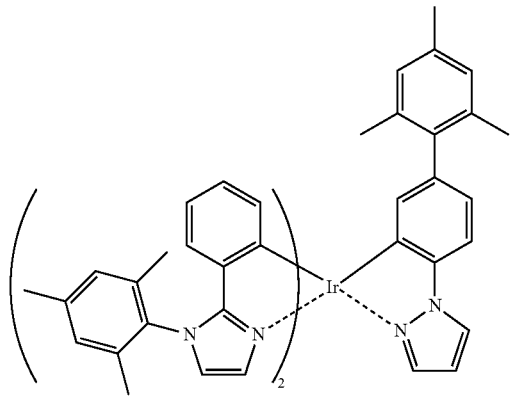
P-46
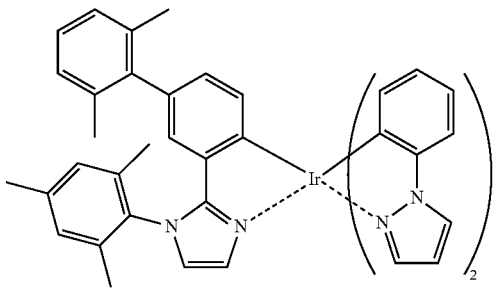
P-47
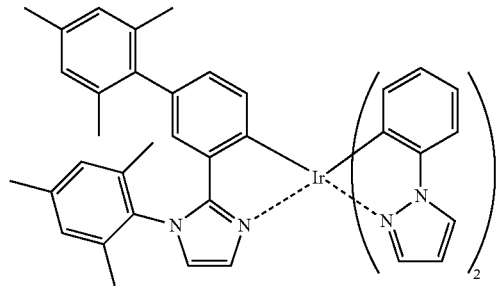
P-48
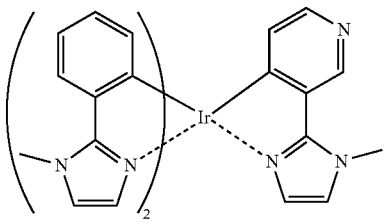
P-49
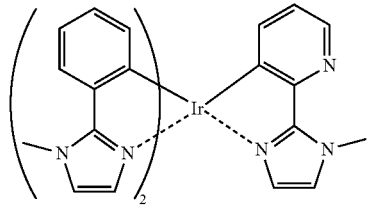
P-50
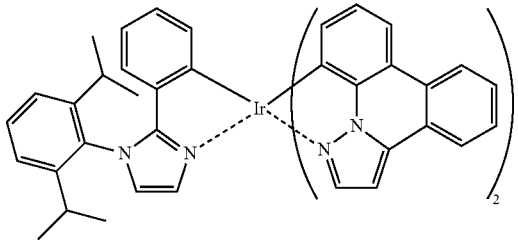
[Chemical Formula 14]
P-51
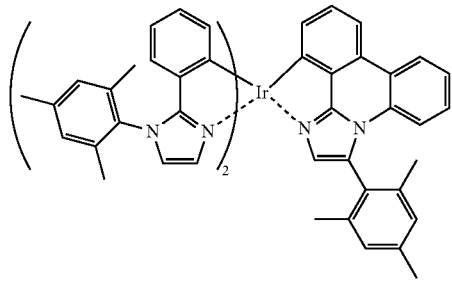
P-52
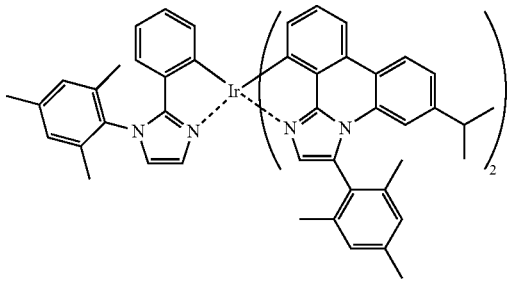
P-53
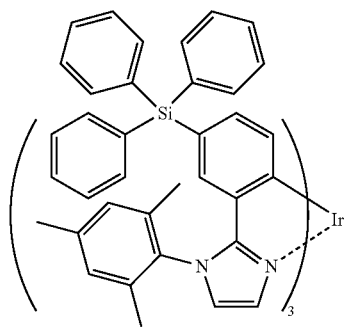
P-54
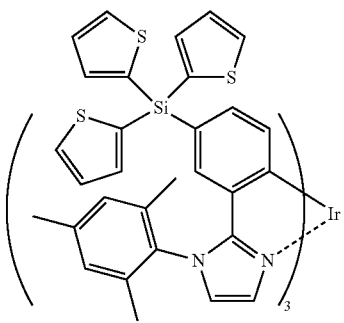

-continued
P-55
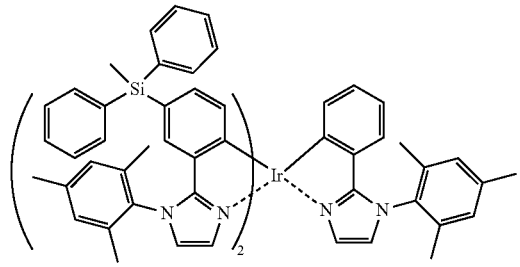
P-56
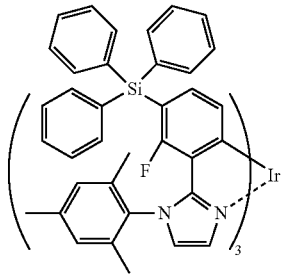
P-57
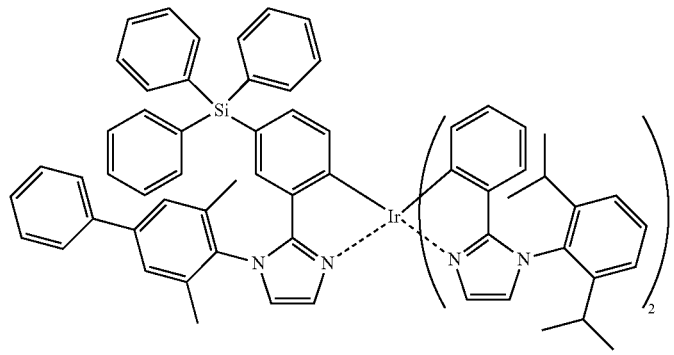
[Chemical Formula 15]
P-58
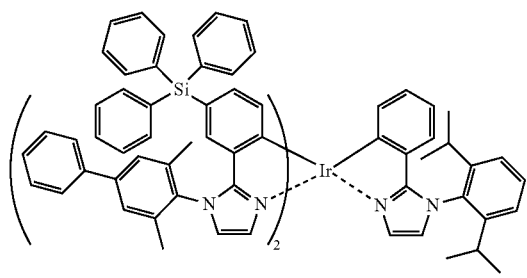
P-59
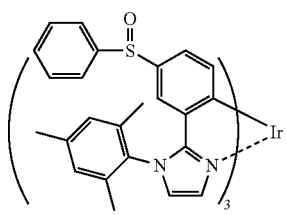
P-60
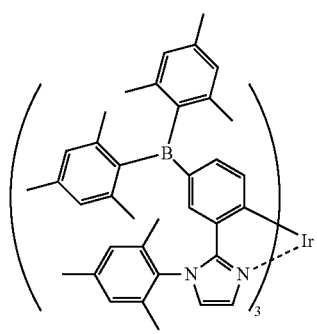
P-61
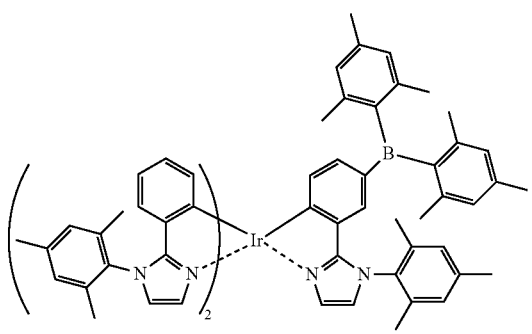

-continued
P-62
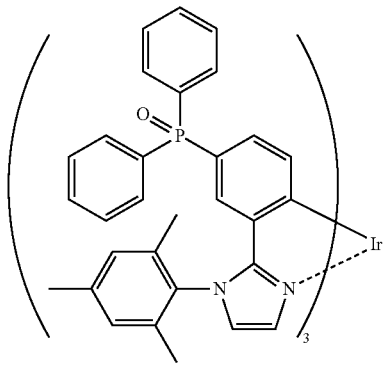
P-63
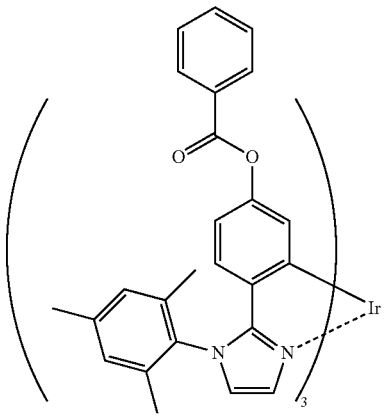
P-64
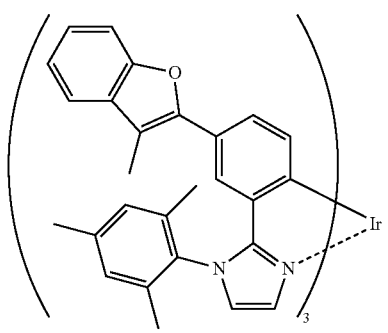
P-65
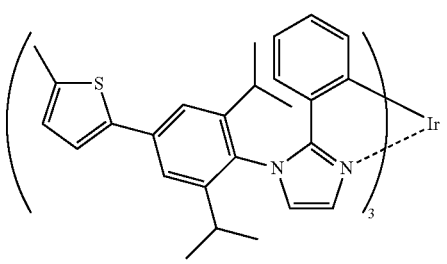
[Chemical Formula 16]
P-66
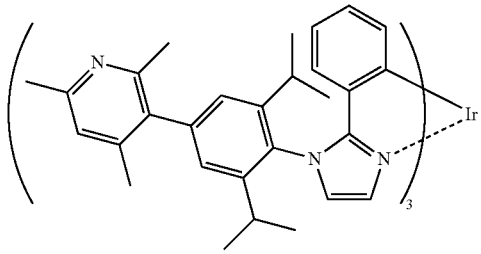
P-67
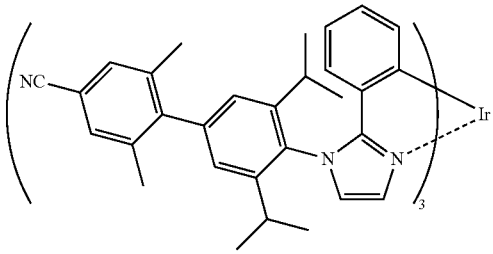
P-68
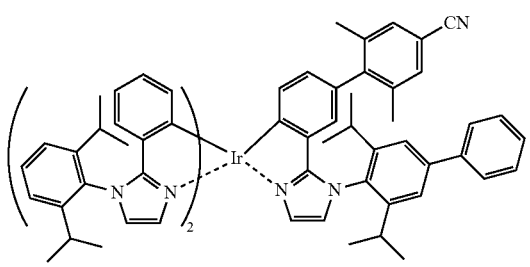
P-69
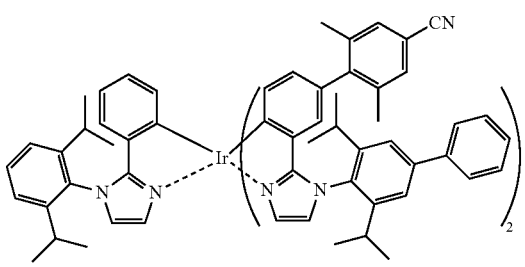

P-70
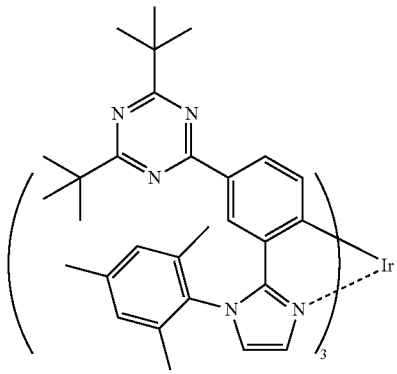
P-71
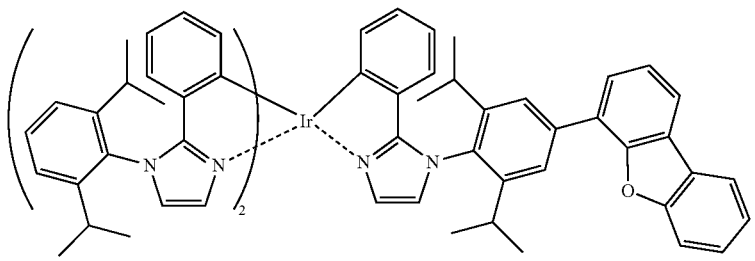
P-72
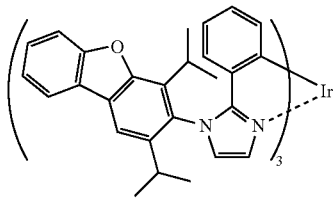
P-73
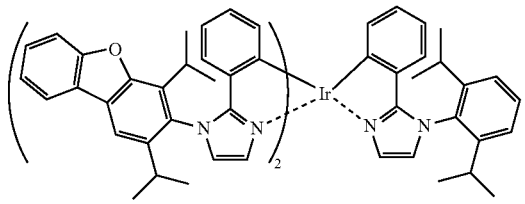
[Chemical Formula 17]
P-74
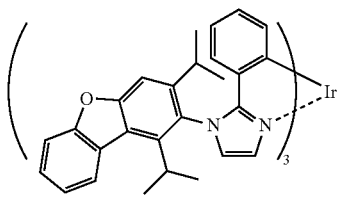
P-75
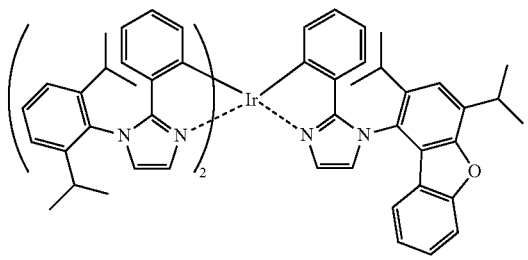
P-76
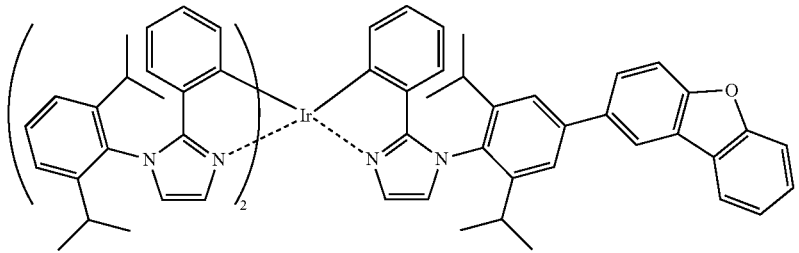

-continued
P-77
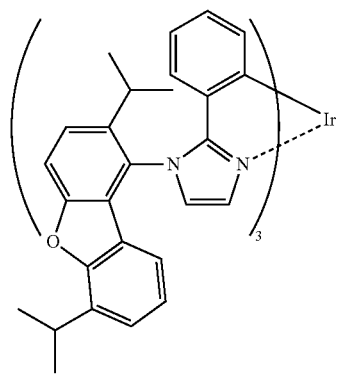
P-78
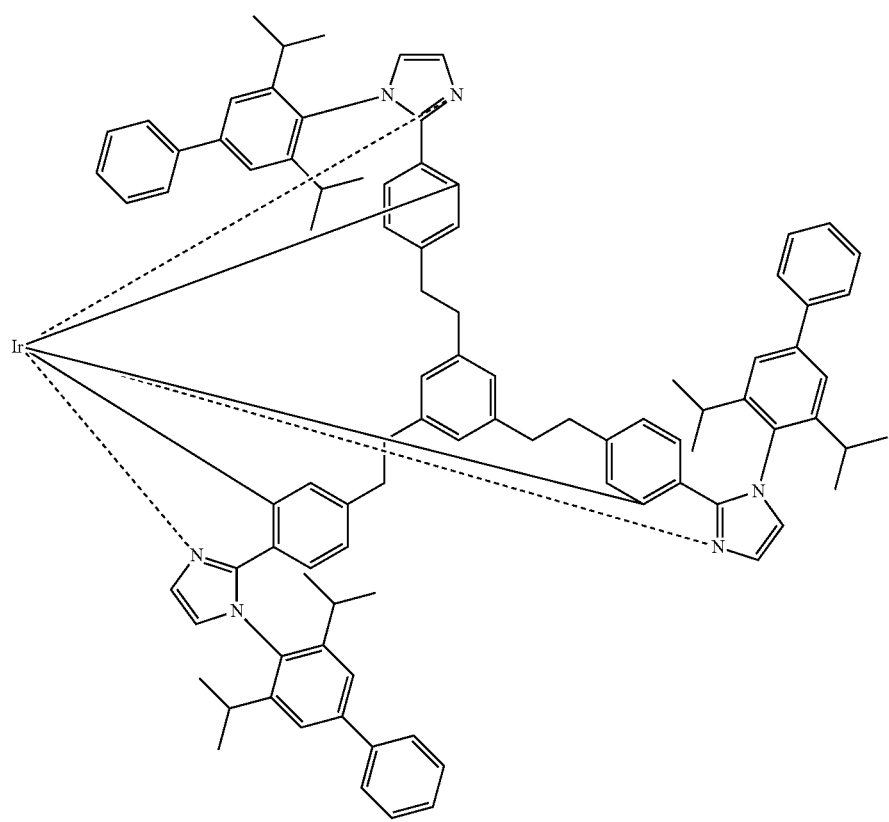

[Chemical Formula 18]
P-79
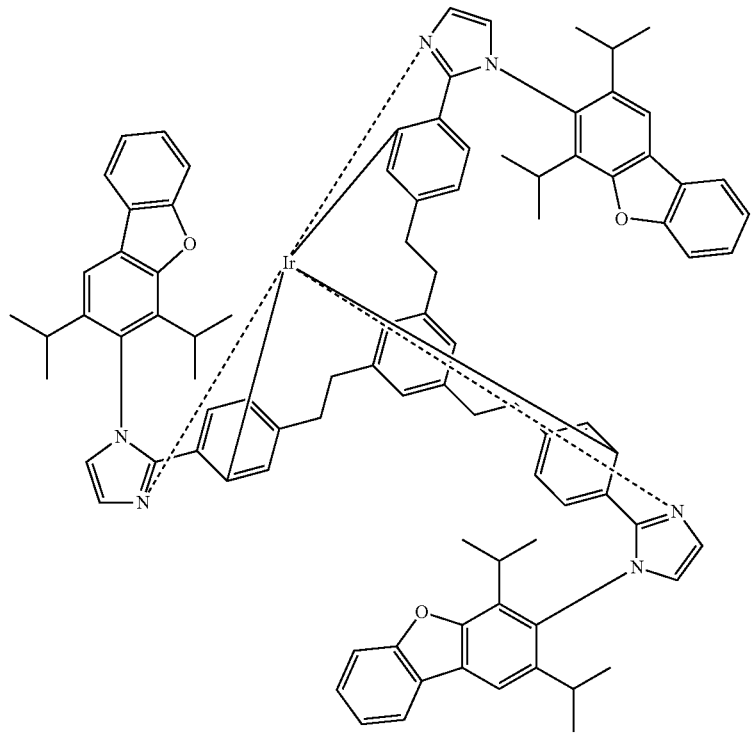
P-80
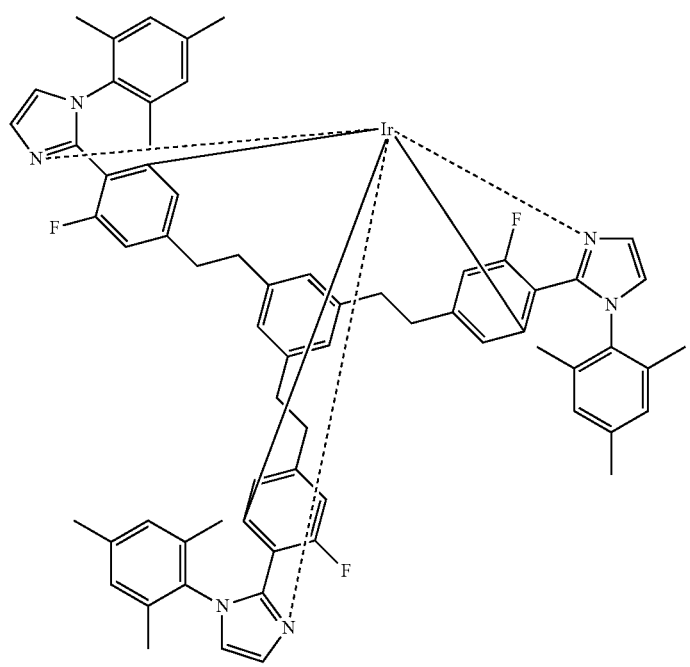

[Chemical Formula 19]
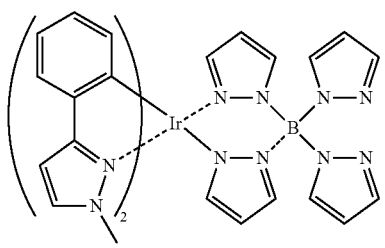 P-81
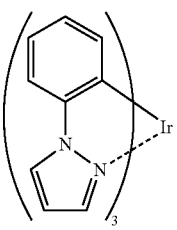 P-82
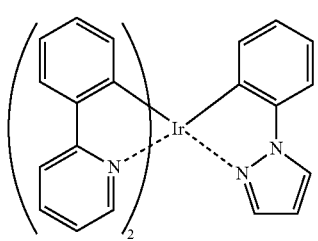 P-83
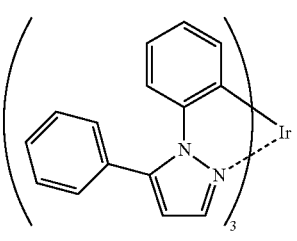 P-84
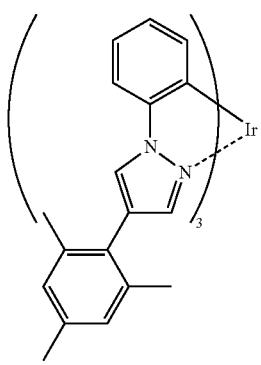 P-85
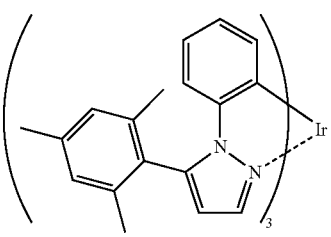 P-86
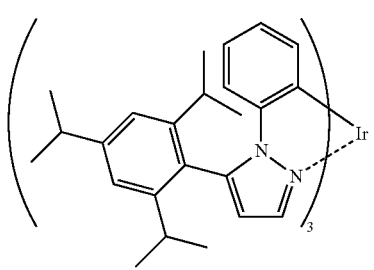 P-87
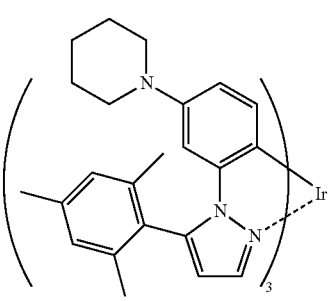 P-88
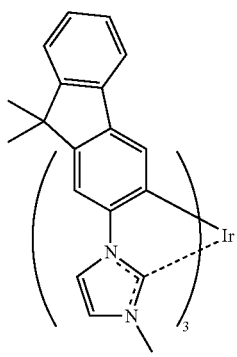 P-89
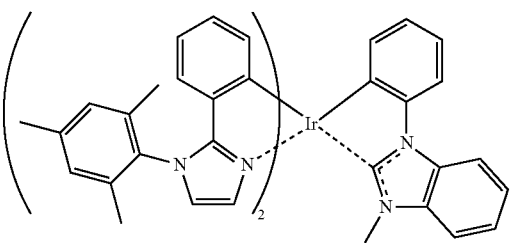 P-90

-continued
P-91
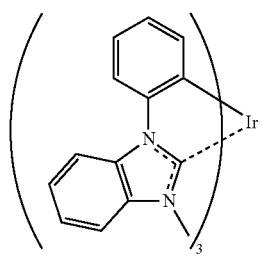
P-92
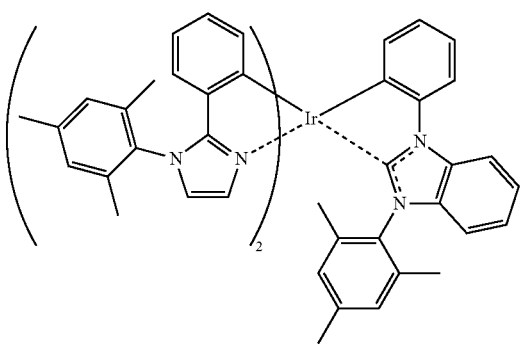
P-93
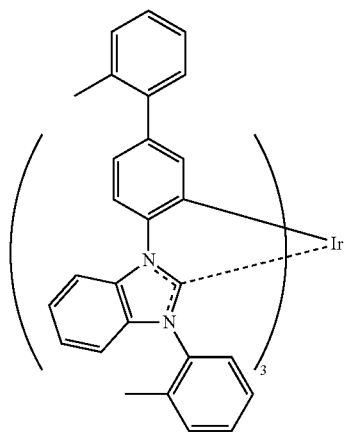
[Chemicla Formula 20]
P-94
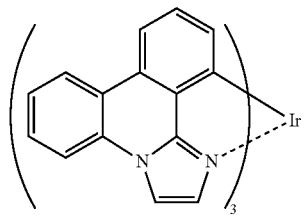
P-95
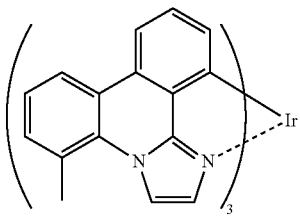
P-96
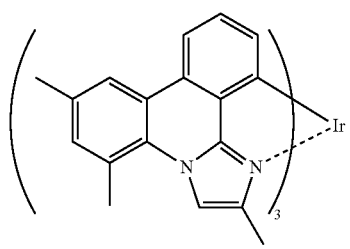
P-97
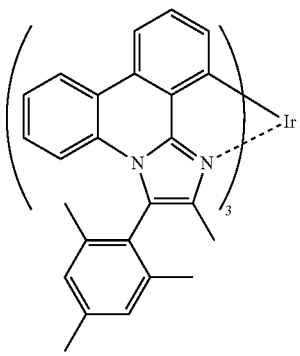

P-98 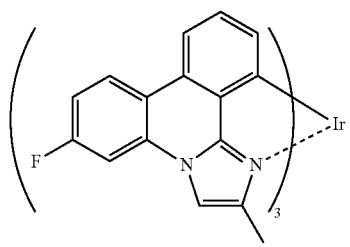
P-99 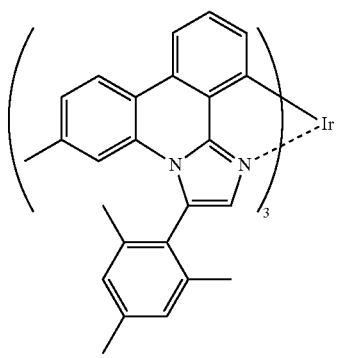
P-100 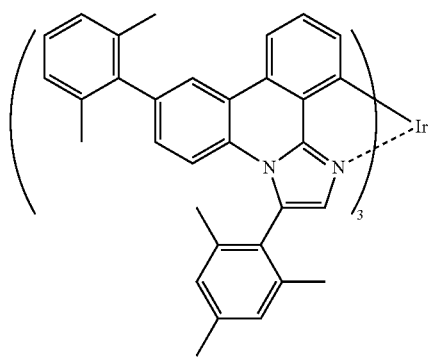
P-101 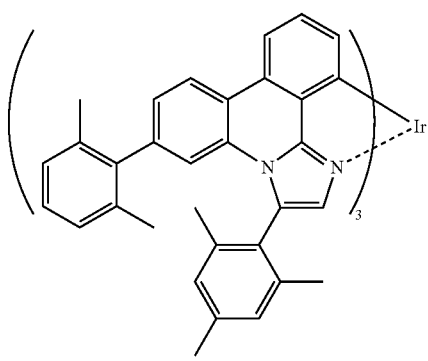
P-102 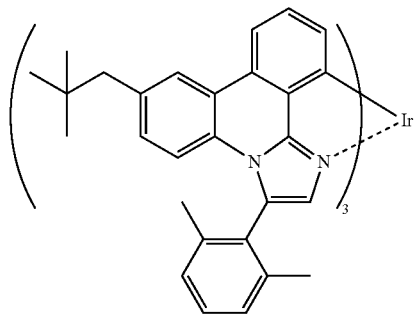
P-103 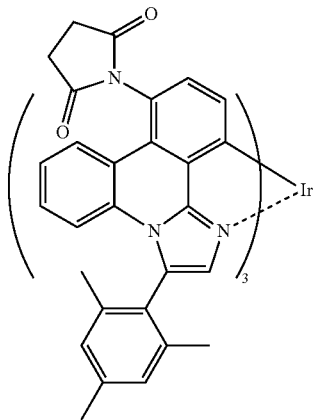
P-104 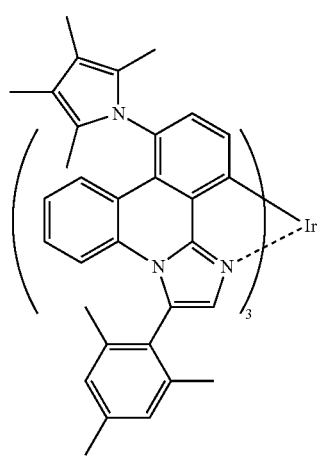

[Chemical Formula 21]
P-105 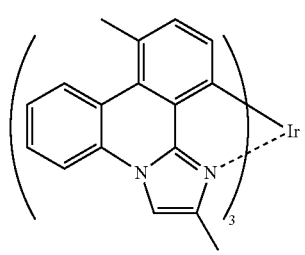
P-106 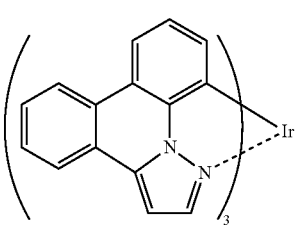
P-107 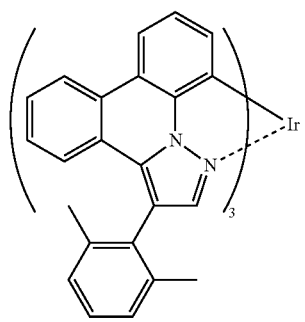
P-108 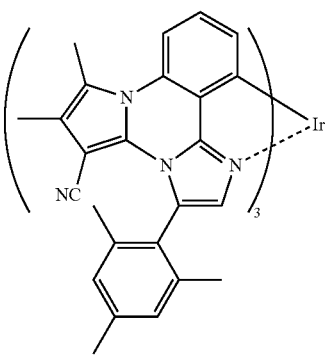
P-109 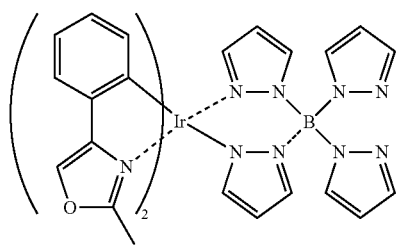
P-110 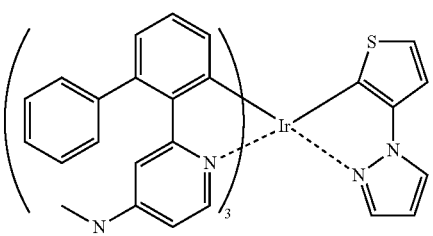
P-111 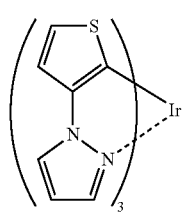
P-112 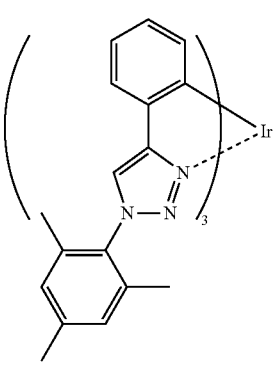
P-113 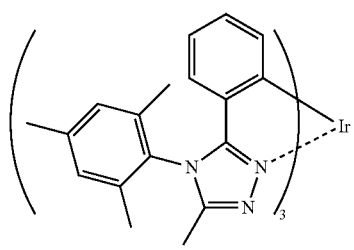
P-114 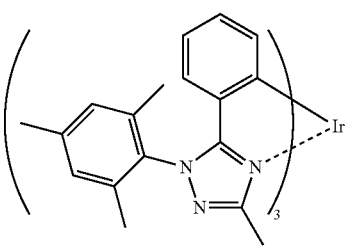

-continued
P-115
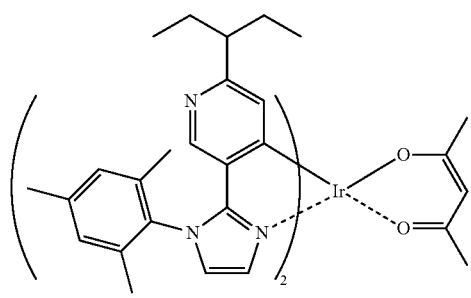
P-116
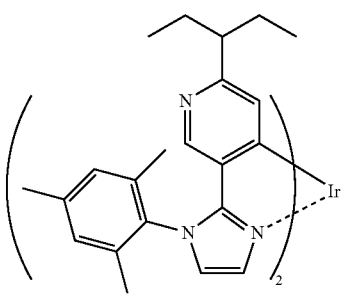
[Chemical Formula 22]
P-117
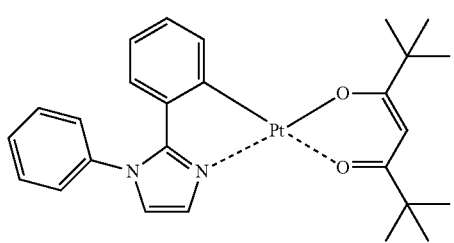
P-118
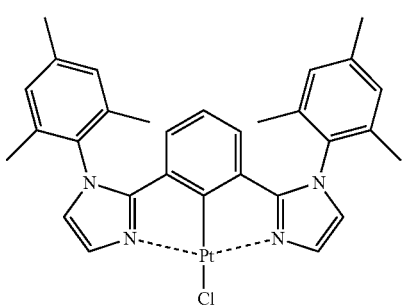
P-119
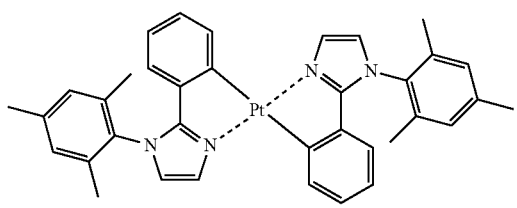
P-120
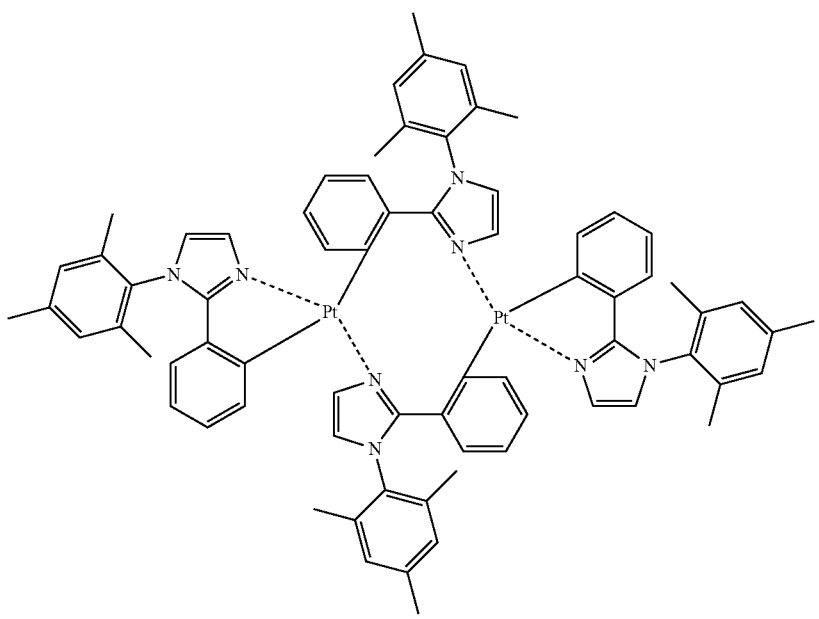

-continued
P-121
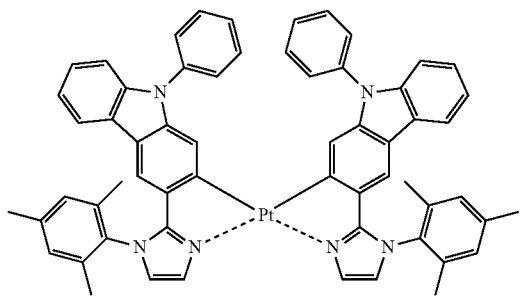
P-122
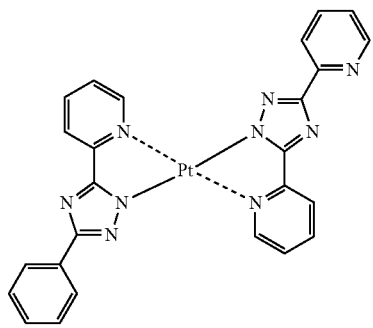
[Chemical Formula 23]
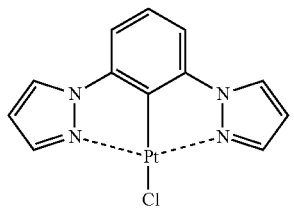
P-123
P-124
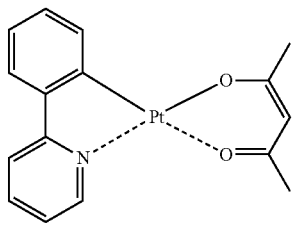
P-125
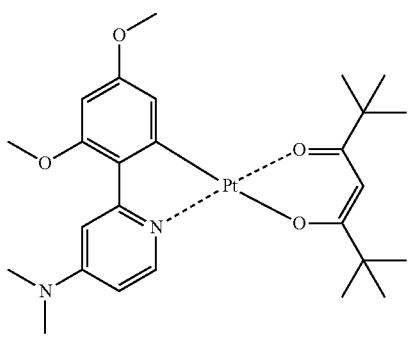
P-126
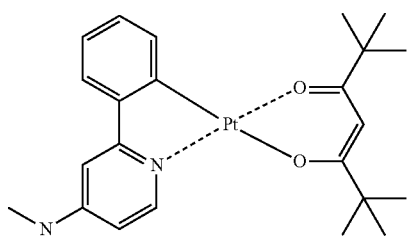
P-127
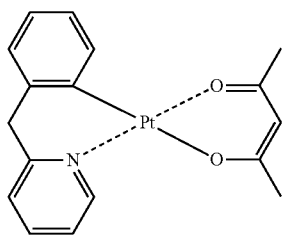
P-128
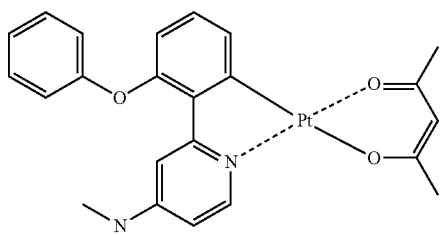
P-129
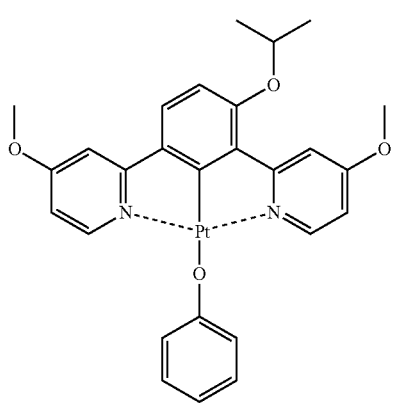
P-130
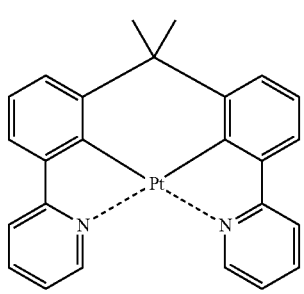

[Chemical Formula 24]

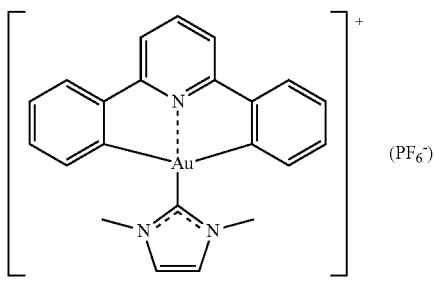

P-131

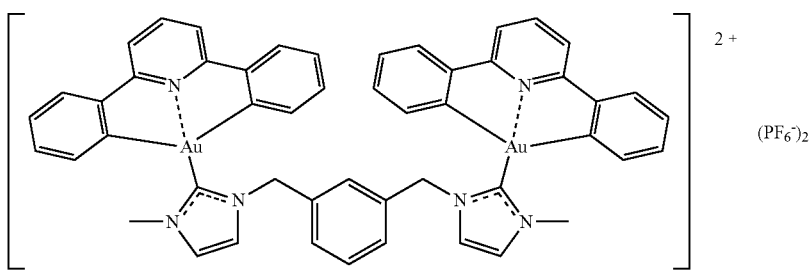

P-132

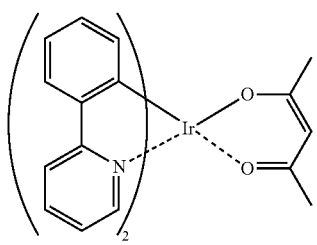

P-133

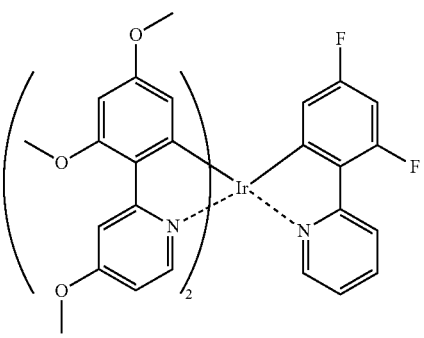

P-134

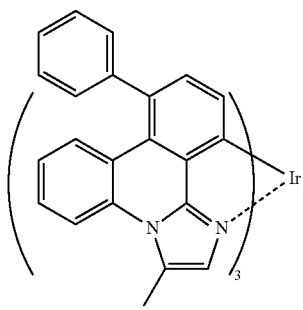

P-135

Non-limiting Synthetic Example of the compound represented by Formula (I) will now be described. Among the specific examples listed above, an exemplary process of preparing P-14 will be now described.

[Preparation of P-14]

P-14 can be prepared through the following steps.

Iridium chloride trihydrate (8.1 g, 0.02297 mol) and water (100 ml) were added to a solution of 2-phenyl-(2,3,6-trimethylphenyl)-1H-imidazole (18 g, 0.06861 mol) in 2-ethoxyethanol (350 ml) under a nitrogen atmosphere. The solution was refluxed under a nitrogen atmosphere for five hours. After the reaction solution was cooled, methanol (500 ml) was added. The precipitated crystals were separated through filtration. The crystals were cleaned with methanol, and were dried to yield complex A (15.2 g, yield: 88.4%).

Complex A (14.5 g, 0.009662 mol) and sodium carbonate (14.5 g) were suspended in 2-ethoxyethanol (350 ml) under a nitrogen atmosphere. Acetylacetone (3.9 g, 0.03895 mol) was added to this suspension, and the suspension was refluxed under a nitrogen atmosphere for two hours. The reaction solution was cooled and was filtered under reduced pressure to remove sodium carbonate and other inorganic salts. The solvent was condensed under reduced pressure to yield a solid. The solid was suspended in water (1 L), and was separated through filtration. The separated crystals were cleaned with a mixed solution of methanol/water (1:1), and were dried to yield complex B (14.7 g, yield: 93.6%).

Complex B (7.5 g, 0.009214 mol) and 2-phenyl-(2,4,6-trimethylphenyl)-1H-imidazole (6.0 g, 0.002287 mol) were suspended in glycerol (400 ml) under a nitrogen atmosphere.

The suspension was reacted under a nitrogen atmosphere at a reaction temperature of 150 to 160° C. for two hours. It was verified that complex B disappeared, and the reaction was terminated. After the reaction solution was cooled, methanol (500 ml) was added, and the precipitated crystals were separated through filtration. The crystals were cleaned with methanol, and were dried to yield a crude product (7.1 g, yield: 78.9%). This crude product was dissolved in a small amount of methylene chloride, and was purified by silica gel column chromatography (developing solvent: methylene chloride) to prepare P-14 (6.5 g, yield: 72.2%).

[Chemical Formula 25]

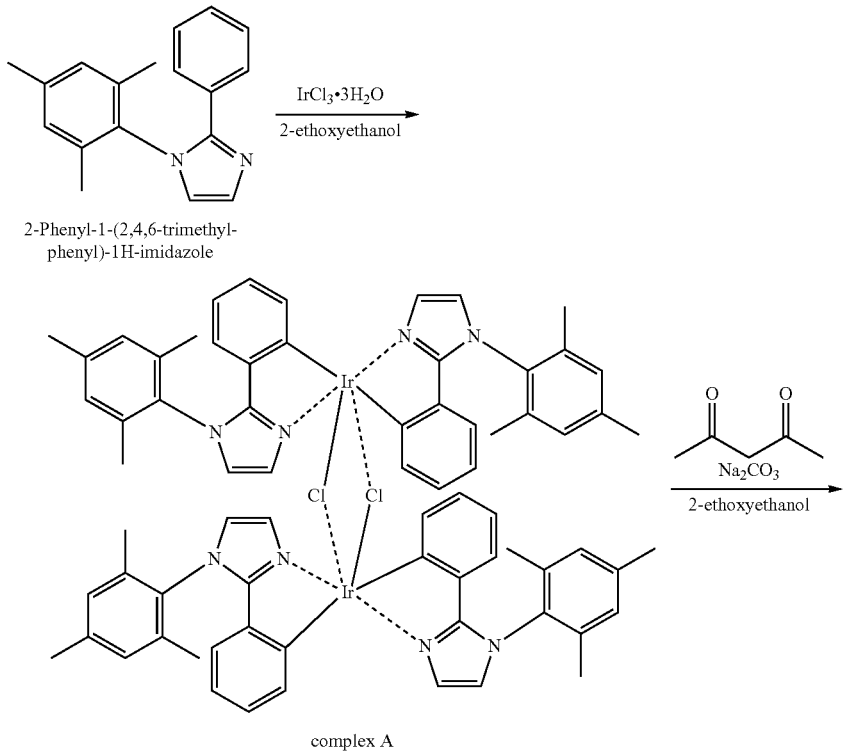

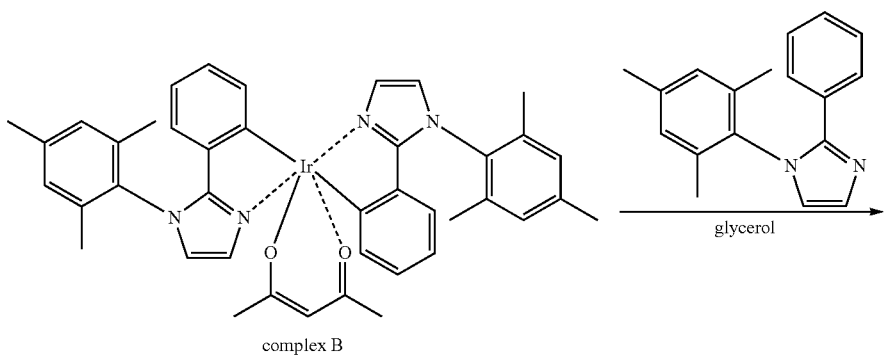

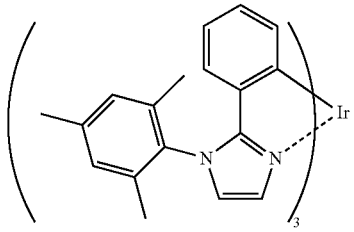

P-14

Non-limiting specific examples of other iridium complexes usable as the phosphorescent metal complex are as follows:
[Chemical Formula 26]
P-136
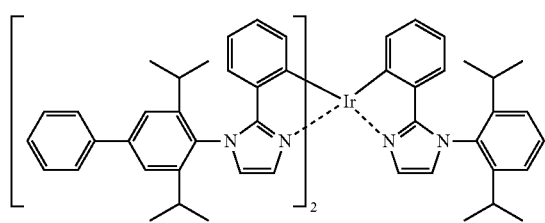
P-137
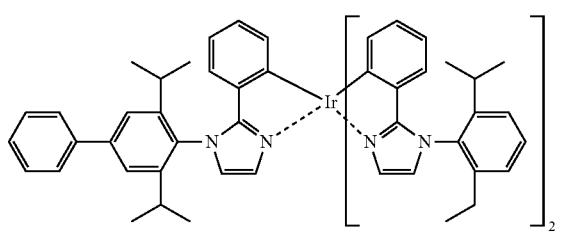
P-138
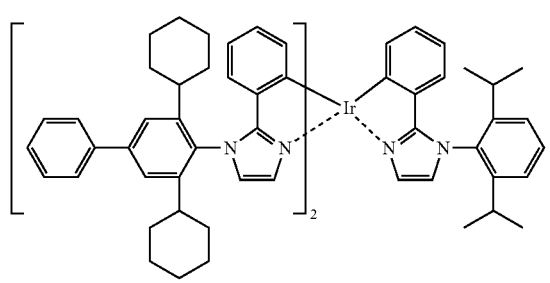
P-139
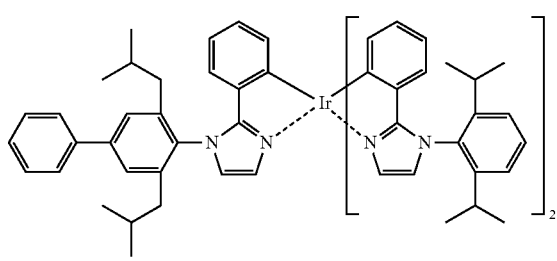
P-140
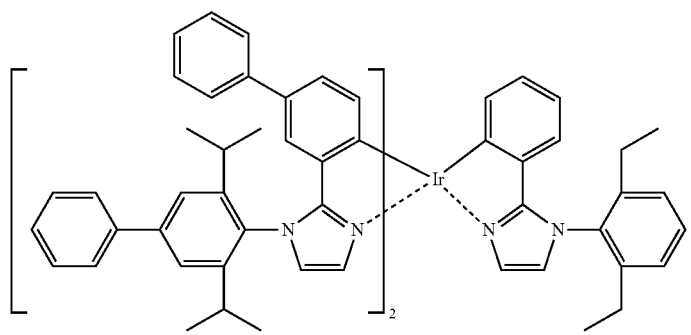
[Chemical Formula 27]
P-141
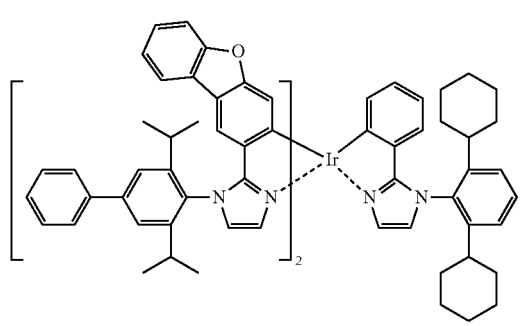
P-142
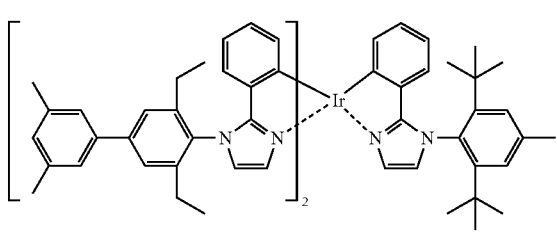

-continued
P-143 P-144
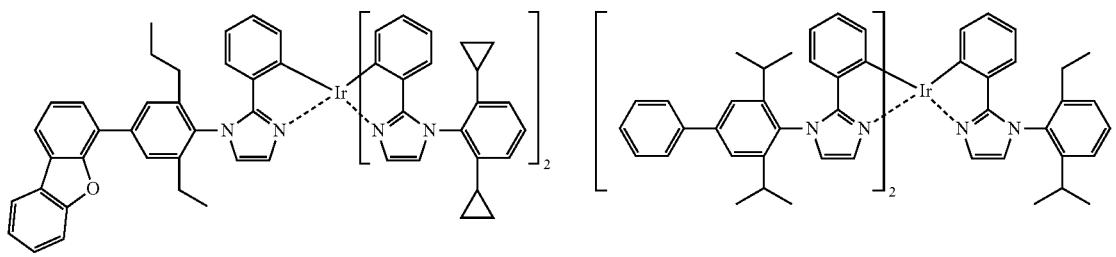
[Chemical Formula 28]
P-145 P-146
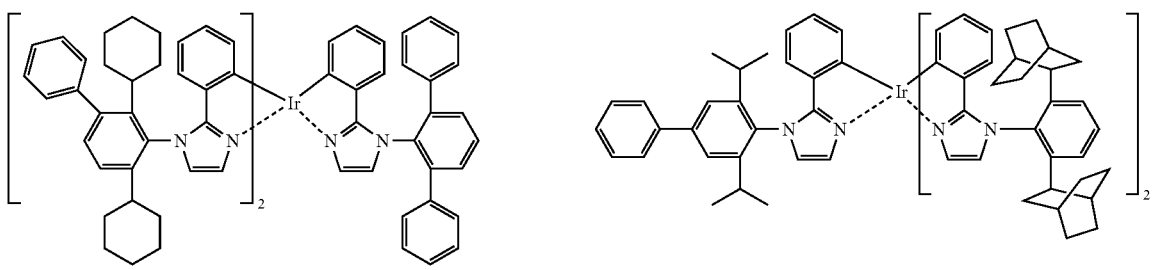
P-147
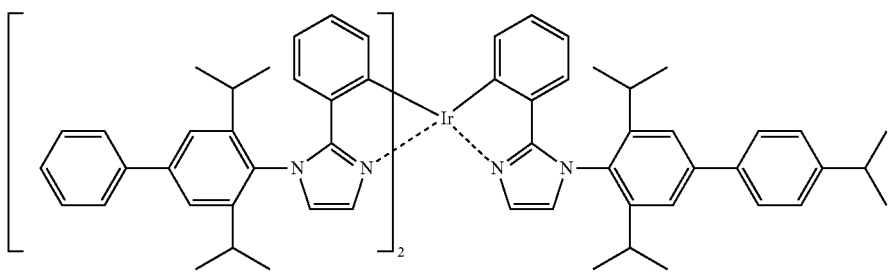
P-148 P-149
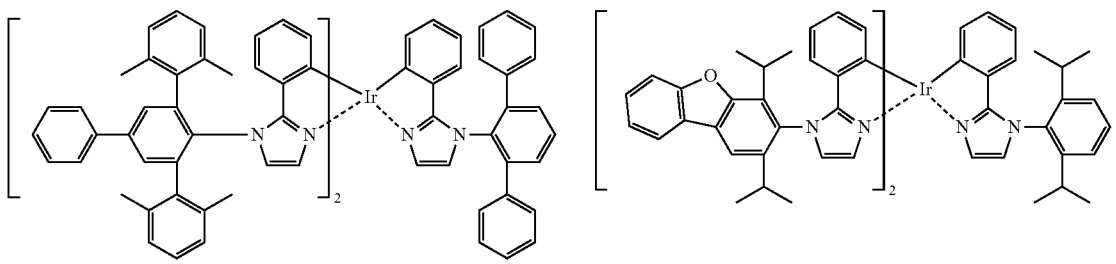
[Chemical Formula 29]
P-150 P-151
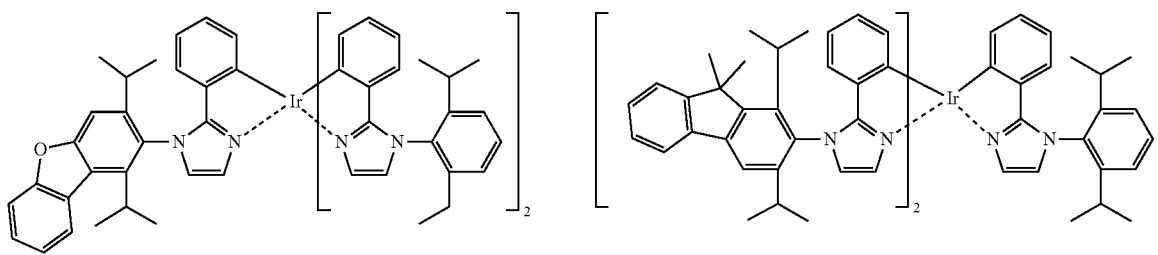

-continued
P-152
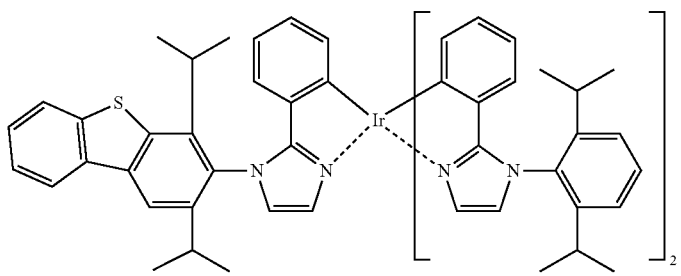
P-153
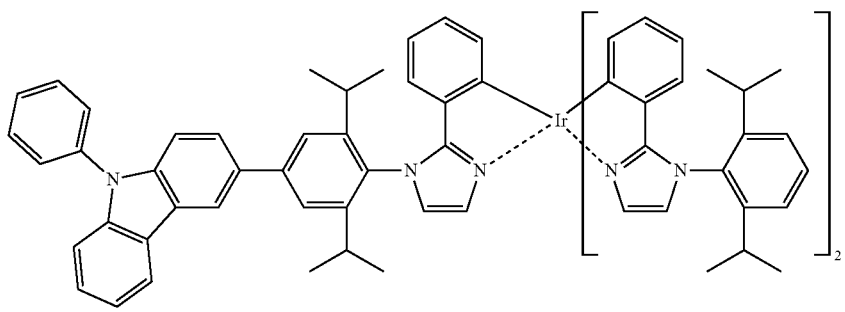
P-154
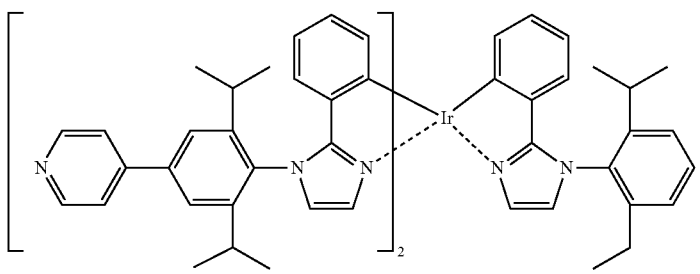
[Chemical Formula 30]
P-155
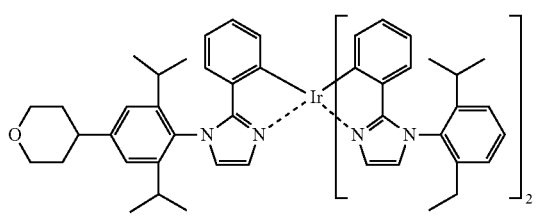
P-156
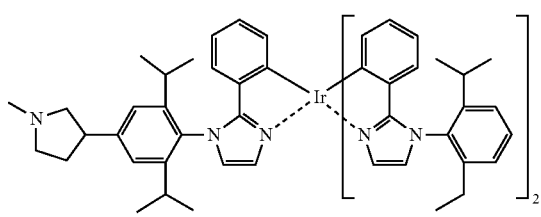
P-157
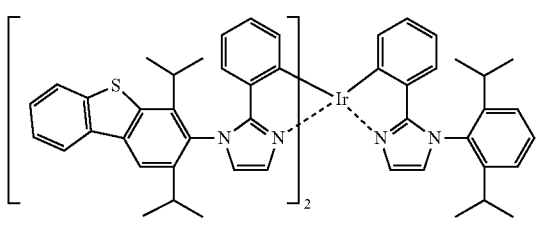
P-158
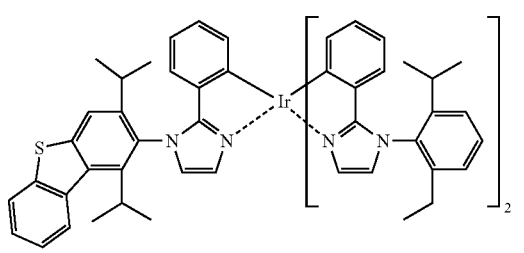

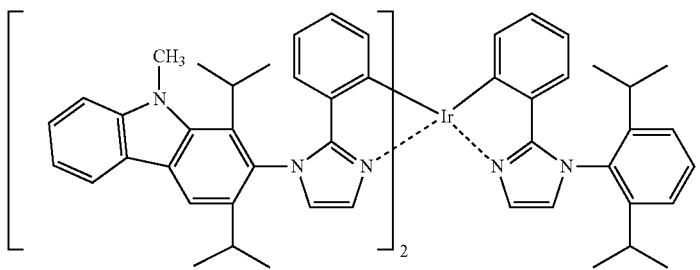
P-159
[Chemical Formula 31]
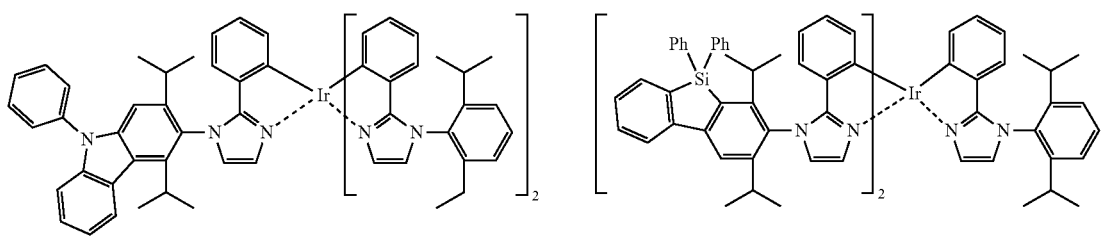
P-160   P-161
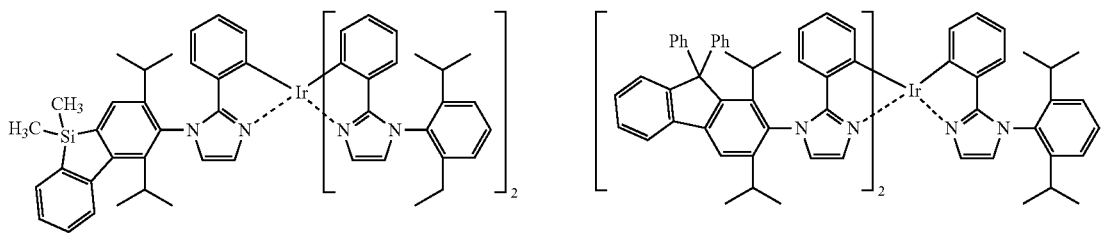
P-162   P-163
P-164
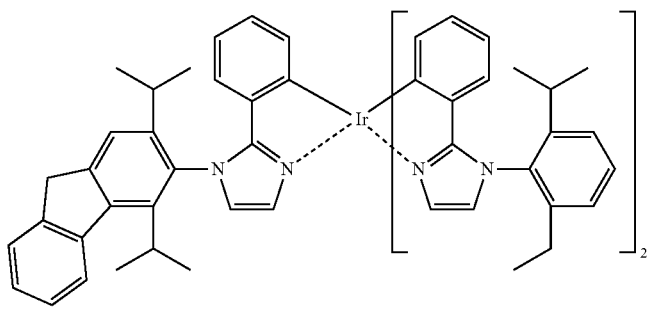
[Chemical Formula 32]
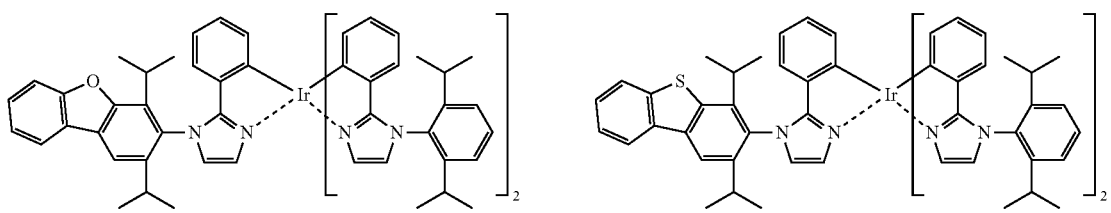
P-165   P-166

P-167
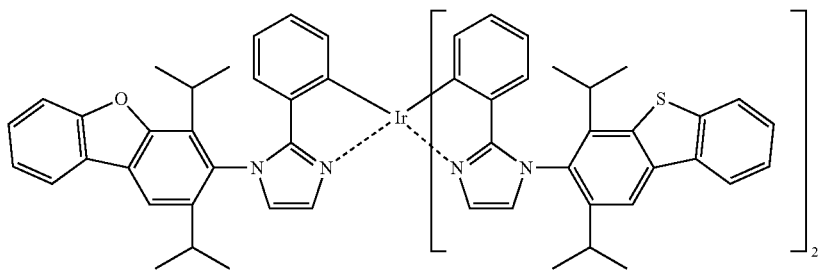
P-168
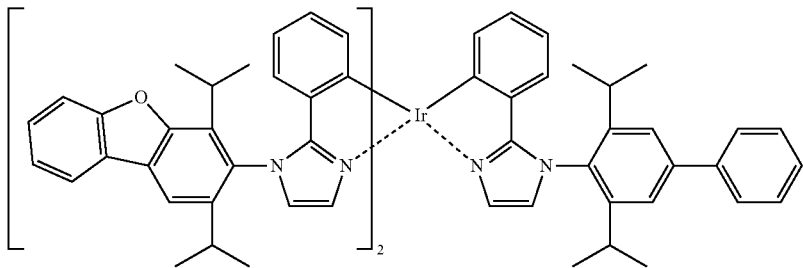
[Chemical Formula 33]
P-169 P-170
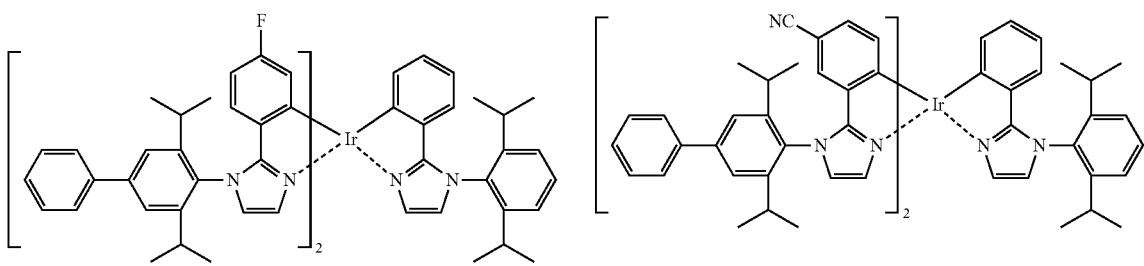
P-171
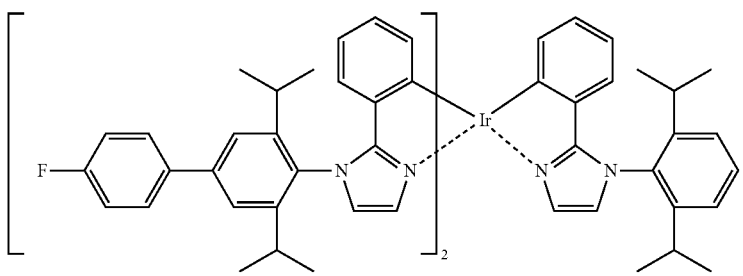
P-172
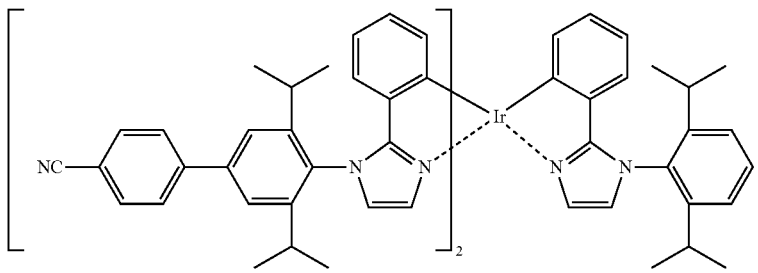

The local maximum wavelength (nm) of the emitted light and the lowest excited triplet energy (eV) for Phosphorescent metal complexes P-1 to P-135 are shown in Tables 1 to 3.

TABLE 1

| PHOSPHORESCENT METAL COMPLEX | LOCAL MAXIMUM WAVELENGTH OF EMITTED LIGHT [nm] | $T_1$ (P) [eV] |
|---|---|---|
| P-1 | 446.0 | 2.78 |
| P-2 | 432.0 | 2.87 |
| P-3 | 466.0 | 2.66 |
| P-4 | 489.0 | 2.54 |
| P-5 | 459.0 | 2.70 |
| P-6 | 501.0 | 2.48 |
| P-7 | 458.0 | 2.71 |
| P-8 | 453.0 | 2.74 |
| P-9 | 615.0 | 2.01 |
| P-10 | 495.0 | 2.51 |
| P-11 | 459.0 | 2.70 |
| P-12 | 472.0 | 2.63 |
| P-13 | 565.0 | 2.19 |
| P-14 | 466.0 | 2.66 |
| P-15 | 466.2 | 2.66 |
| P-16 | 445.8 | 2.78 |
| P-17 | 464.0 | 2.67 |
| P-18 | 448.4 | 2.77 |
| P-19 | 448.4 | 2.77 |
| P-20 | 467.8 | 2.65 |
| P-21 | 463.2 | 2.68 |
| P-22 | 464.0 | 2.67 |
| P-23 | 458.2 | 2.71 |
| P-24 | 475.4 | 2.61 |
| P-25 | 466.8 | 2.66 |
| P-26 | 467.0 | 2.66 |
| P-27 | 473.0 | 2.62 |
| P-28 | 470.0 | 2.64 |
| P-29 | 468.0 | 2.65 |
| P-30 | 467.0 | 2.66 |
| P-31 | 466.0 | 2.66 |
| P-32 | 457.0 | 2.71 |
| P-33 | 467.0 | 2.66 |
| P-34 | 473.0 | 2.62 |
| P-35 | 467.0 | 2.66 |
| P-36 | 457.0 | 2.71 |
| P-37 | 469.0 | 2.64 |
| P-38 | 465.4 | 2.66 |
| P-39 | 444.8 | 2.79 |
| P-40 | 461.6 | 2.69 |
| P-41 | 460.0 | 2.70 |
| P-42 | 467.0 | 2.66 |
| P-43 | 461.0 | 2.69 |
| P-44 | 453.2 | 2.74 |
| P-45 | 463.2 | 2.68 |

TABLE 2

| PHOSPHORESCENT METAL COMPLEX | LOCAL MAXIMUM WAVELENGTH OF EMITTED LIGHT [nm] | $T_1$ (P) [eV] |
|---|---|---|
| P-46 | 459.8 | 2.70 |
| P-47 | 459.4 | 2.70 |
| P-48 | 473.0 | 2.62 |
| P-49 | 509.0 | 2.44 |
| P-50 | 457.0 | 2.71 |
| P-51 | 464.0 | 2.67 |
| P-52 | 464.0 | 2.67 |
| P-53 | 458.0 | 2.71 |
| P-54 | 456.0 | 2.72 |
| P-55 | 464.0 | 2.67 |
| P-56 | 461.0 | 2.69 |
| P-57 | 466.0 | 2.66 |
| P-58 | 465.0 | 2.67 |
| P-59 | 468.0 | 2.65 |
| P-60 | 514.0 | 2.41 |
| P-61 | 525.0 | 2.36 |
| P-62 | 472.0 | 2.63 |

TABLE 2-continued

| PHOSPHORESCENT METAL COMPLEX | LOCAL MAXIMUM WAVELENGTH OF EMITTED LIGHT [nm] | $T_1$ (P) [eV] |
|---|---|---|
| P-63 | 463.0 | 2.68 |
| P-64 | 523.0 | 2.37 |
| P-65 | 514.0 | 2.41 |
| P-66 | 467.0 | 2.66 |
| P-67 | 468.0 | 2.65 |
| P-68 | 470.0 | 2.64 |
| P-69 | 470.0 | 2.64 |
| P-70 | 487.0 | 2.55 |
| P-71 | 467.0 | 2.66 |
| P-72 | 468.0 | 2.65 |
| P-73 | 468.0 | 2.65 |
| P-74 | 466.0 | 2.66 |
| P-75 | 467.0 | 2.66 |
| P-76 | 467.0 | 2.66 |
| P-77 | 467.0 | 2.66 |
| P-78 | 465.0 | 2.67 |
| P-79 | 466.0 | 2.66 |
| P-80 | 458.0 | 2.71 |
| P-81 | 435.0 | 2.85 |
| P-82 | 415.0 | 2.99 |
| P-83 | 489.0 | 2.54 |
| P-84 | 521.0 | 2.38 |
| P-85 | 419.8 | 2.95 |
| P-86 | 456.8 | 2.71 |
| P-87 | 463.0 | 2.68 |
| P-88 | 505.0 | 2.46 |
| P-89 | 465.0 | 2.67 |
| P-90 | 456.6 | 2.72 |

TABLE 3

| PHOSPHORESCENT METAL COMPLEX | LOCAL MAXIMUM WAVELENGTH OF EMITTED LIGHT [nm] | T1 (P) [eV] |
|---|---|---|
| P-91 | 380.8 | 3.26 |
| P-92 | 450.8 | 2.75 |
| P-93 | 441.0 | 2.81 |
| P-94 | 452.2 | 2.74 |
| P-95 | 452.0 | 2.74 |
| P-96 | 455.0 | 2.73 |
| P-97 | 460.0 | 2.70 |
| P-98 | 457.0 | 2.71 |
| P-99 | 456.0 | 2.72 |
| P-100 | 460.0 | 2.70 |
| P-101 | 464.0 | 2.67 |
| P-102 | 456.0 | 2.72 |
| P-103 | 461.0 | 2.69 |
| P-104 | 466.0 | 2.66 |
| P-105 | 467.0 | 2.66 |
| P-106 | 452.2 | 2.74 |
| P-107 | 454.0 | 2.73 |
| P-108 | 469.0 | 2.64 |
| P-109 | 439.0 | 2.82 |
| P-110 | 490.0 | 2.53 |
| P-111 | 470.0 | 2.64 |
| P-112 | 415.0 | 2.99 |
| P-113 | 457.0 | 2.71 |
| P-114 | 452.0 | 2.74 |
| P-115 | 448.2 | 2.77 |
| P-116 | 440.4 | 2.82 |
| P-117 | 468.0 | 2.65 |
| P-118 | 472.4 | 2.62 |
| P-119 | 467.6 | 2.65 |
| P-120 | 468.2 | 2.65 |
| P-121 | 469.0 | 2.64 |
| P-122 | 463.0 | 2.68 |
| P-123 | 424.0 | 2.92 |

TABLE 3-continued

| PHOSPHORESCENT METAL COMPLEX | LOCAL MAXIMUM WAVELENGTH OF EMITTED LIGHT [nm] | T1 (P) [eV] |
|---|---|---|
| P-124 | 479.0 | 2.59 |
| P-125 | 448.0 | 2.77 |
| P-126 | 452.0 | 2.74 |
| P-127 | 459.0 | 2.70 |
| P-128 | 451.0 | 2.75 |
| P-129 | 472.0 | 2.63 |
| P-130 | 515.0 | 2.41 |
| P-131 | 471.0 | 2.63 |
| P-132 | 474.0 | 2.62 |
| P-133 | 507.0 | 2.45 |
| P-134 | 518.0 | 2.39 |
| P-135 | 515.8 | 2.40 |

Phosphorescent metal complex P-136 has a local maximum wavelength (nm) of the emitted light of 467 nm and a lowest excited triplet energy (eV) of 2.66 eV.

Phosphorescent metal complex P-149 has a local maximum wavelength (nm) of the emitted light of 468 nm and a lowest excited triplet energy (eV) of 2.65 eV.

Phosphorescent metal complex P-153 has a local maximum wavelength (nm) of the emitted light of 467 nm and a lowest excited triplet energy (eV) of 2.66 eV.

Phosphorescent metal complex P-165 has a local maximum wavelength (nm) of the emitted light of 466 nm and a lowest excited triplet energy (eV) of 2.66 eV.

Phosphorescent metal complex P-166 has a local maximum wavelength (nm) of the emitted light of a 466 nm and a lowest excited triplet energy (eV) of 2.66 eV.

Phosphorescent metal complex P-172 has a local maximum wavelength (nm) of the emitted light of 467 nm and a lowest excited triplet energy (eV) of 2.66 eV.

[Host Compound]

The host compound causes the light emission of a luminous compound through energy or electron transfer from the excited state of the host compound to the luminous compound. The host compound also facilitates stable dispersion of the luminous compound in the luminous layer.

The host compound having a polycyclic aromatic condensed ring can enhance luminescent efficiency. Unfortunately, if a large amount of the host compound having a polycyclic aromatic condensed ring is used to enhance the luminescent efficiency, host compound molecules agglomerate and are localized and the luminous compound is no longer dispersed. As a result, the luminescent efficiency is not enhanced and the service life is not prolonged.

Namely, formation of the luminous layer has a trade-off relation between increase in density of the host compound in the film to prolong the service life and stable dispersion of the luminous molecules to enhance efficiency. An improvement in performance is still limited even if an intermediate compound prepared by simple balance in the trade-off relationship is used. The compatibility between high efficiency and prolonged service life requires dispersion of the luminous compound while the density of the host compound in the film is kept high.

Non-limiting specific examples of the host compound are shown below. Symbols x and y in Host compound S-46 and symbols p, q, and r in Host compound S-47 are used to represent the ratios of random copolymer units. The ratio can be expressed as x:y=1:10, for example.

[Chemical Formula 34]

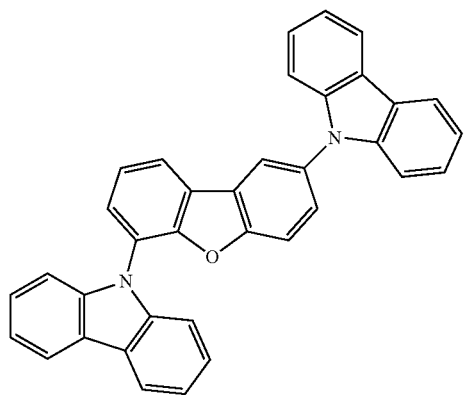

S-1

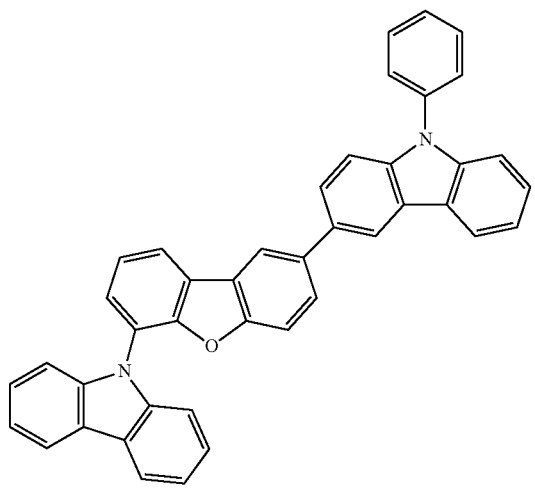

S-2

-continued
S-3
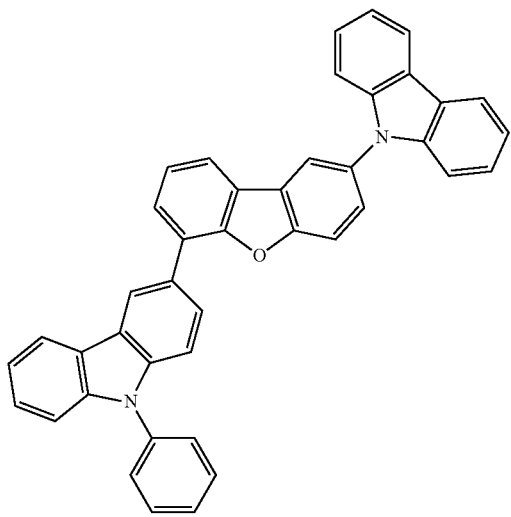
S-4
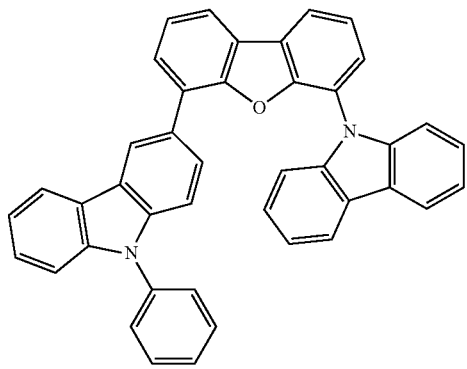
S-5
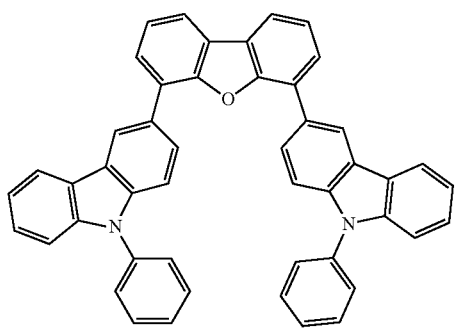
S-6
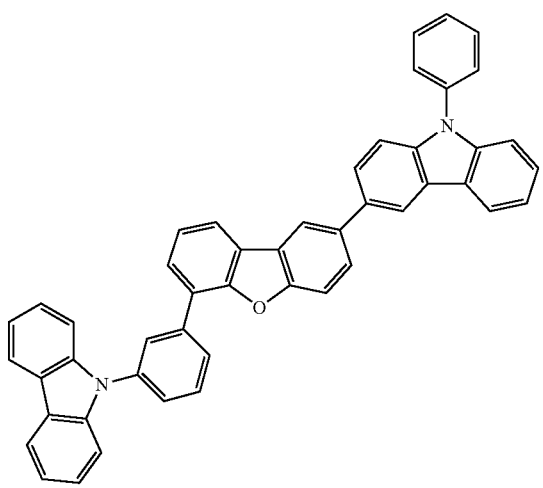
[Chemical Formula 35]
S-7
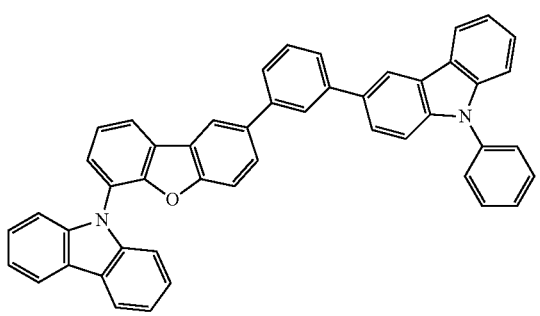
S-8
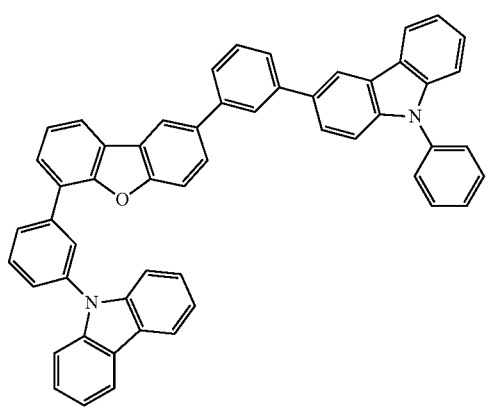

-continued
S-9
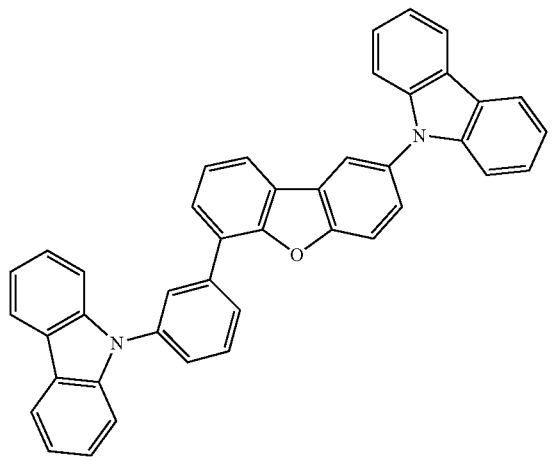
S-10
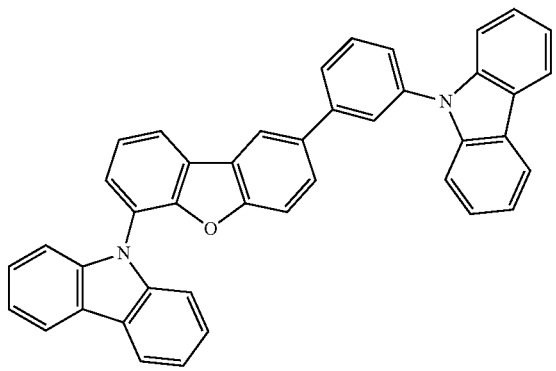
S-11
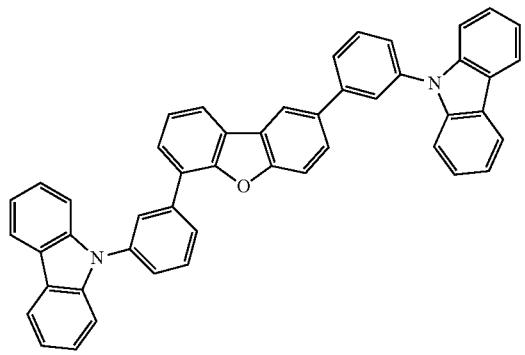
S-12
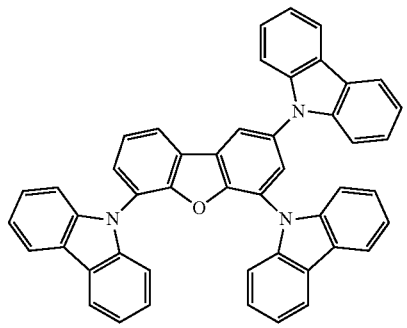
[Chemical Formula 36]
S-13
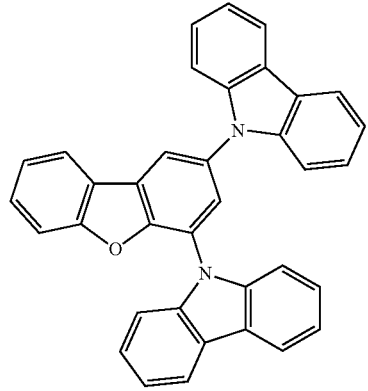
S-14
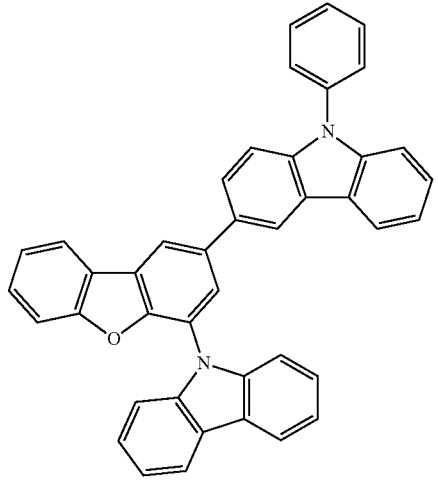

-continued
S-15
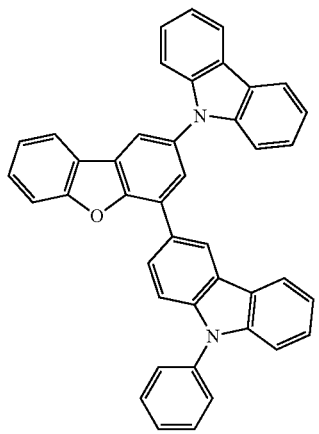
S-16
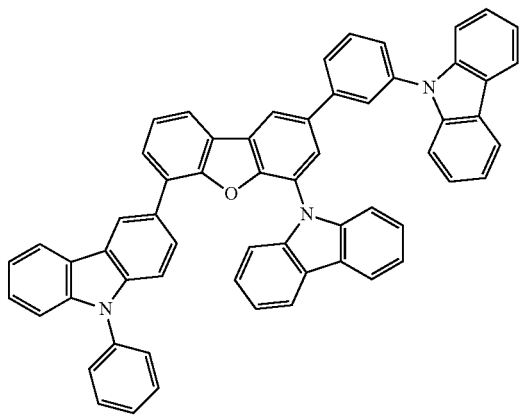
S17
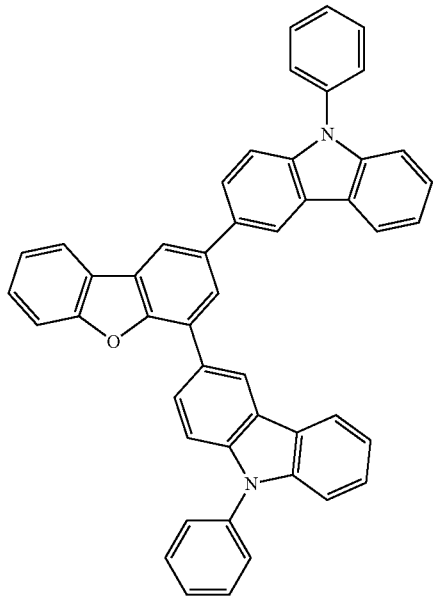
S-18
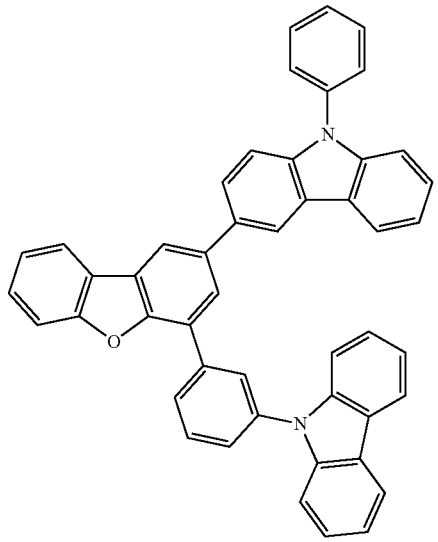
[Chemical Formula 37]
S-19
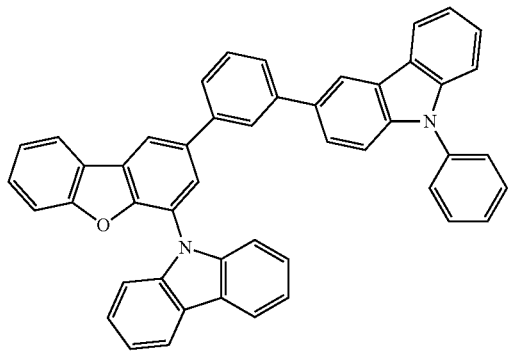
S-20
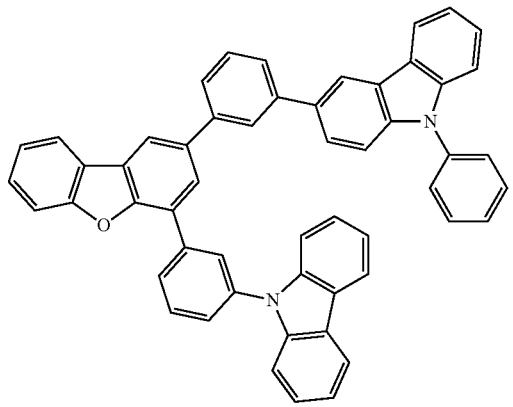

-continued
S-21
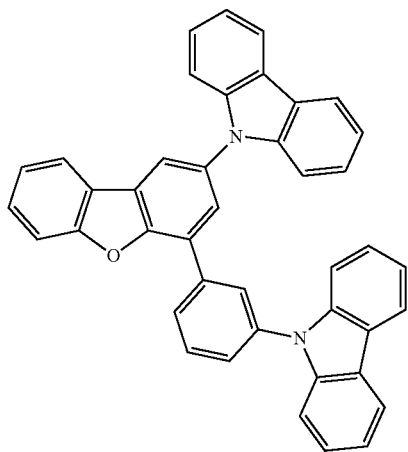
S-22
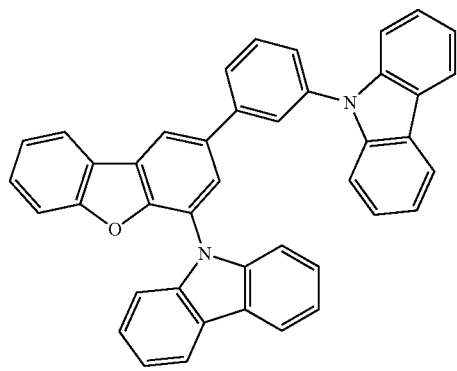
S-23
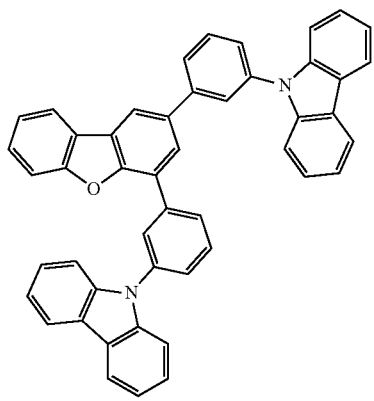
S-24
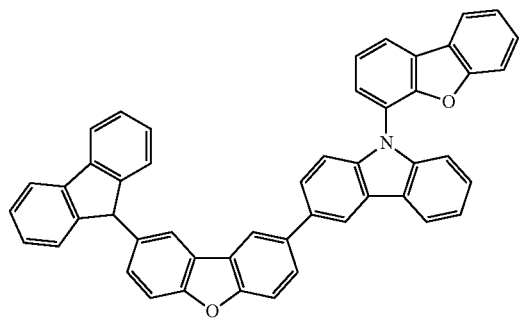
S-25
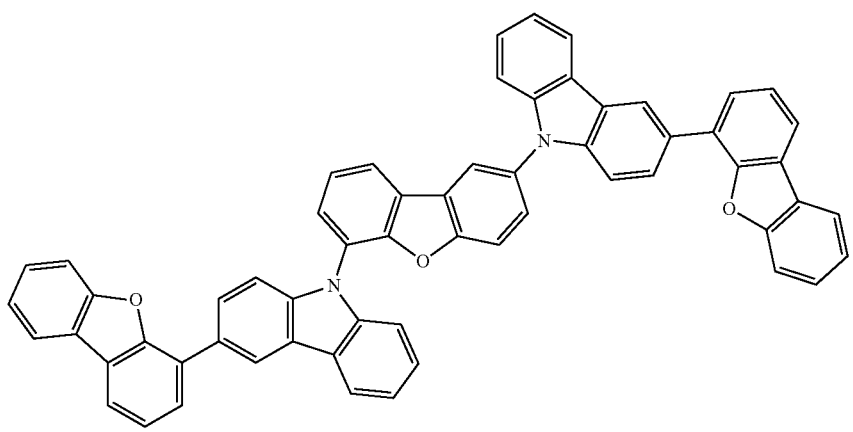

[Chemical Formula 38]
S-26
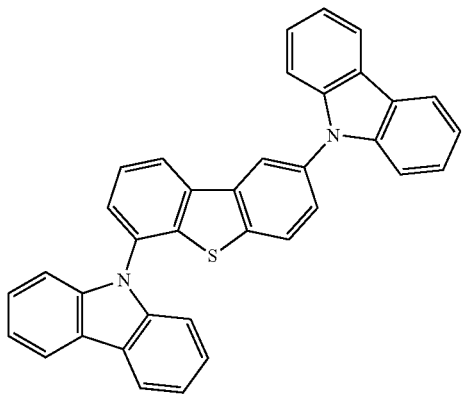
S-27
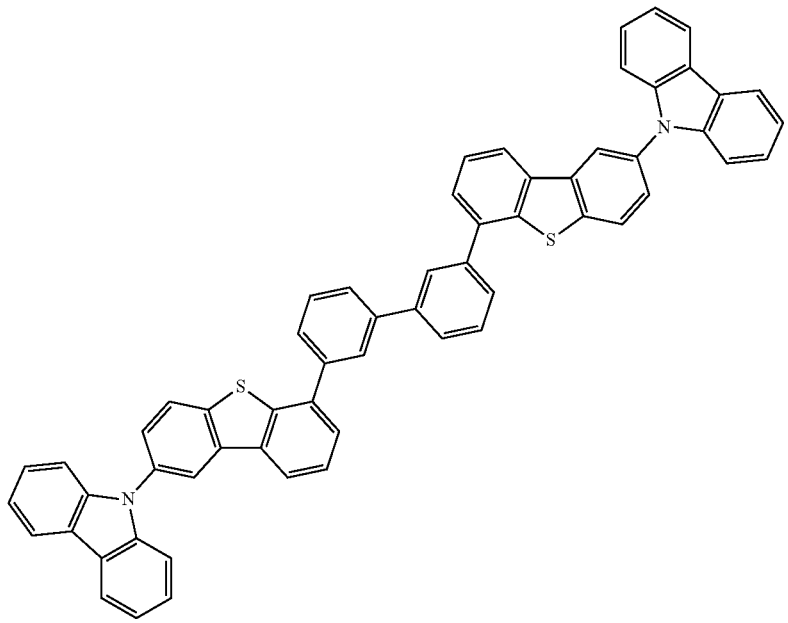
S-28
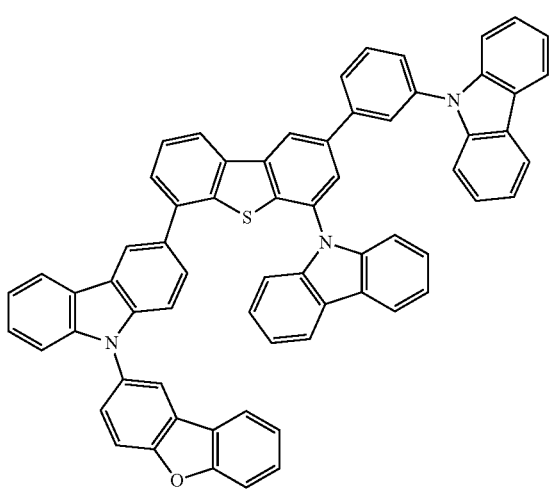
S-29
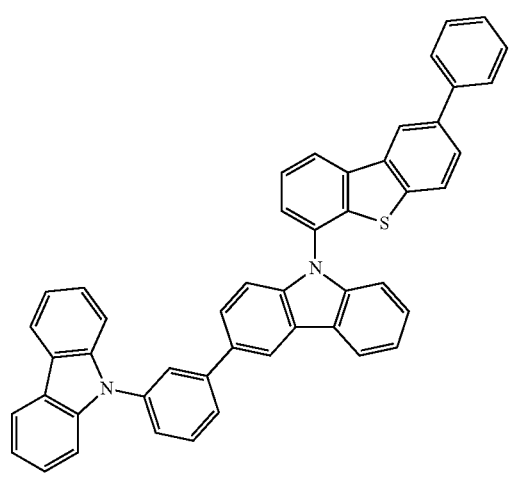

S-30
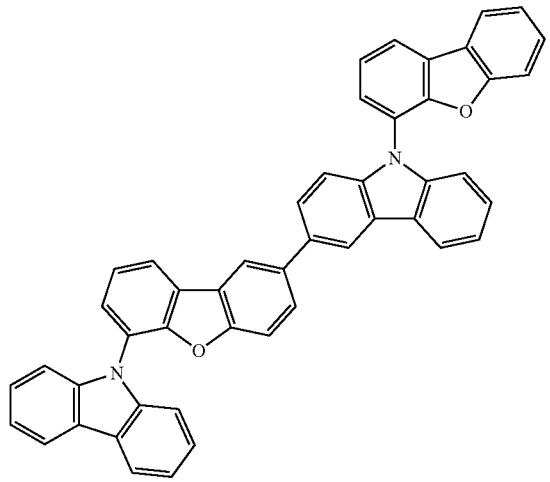
[Chemical Formula 39]
S-31
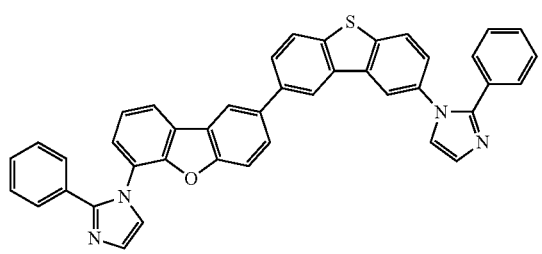
S-32
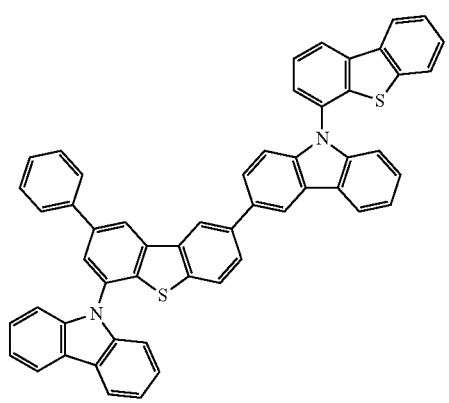
S-33
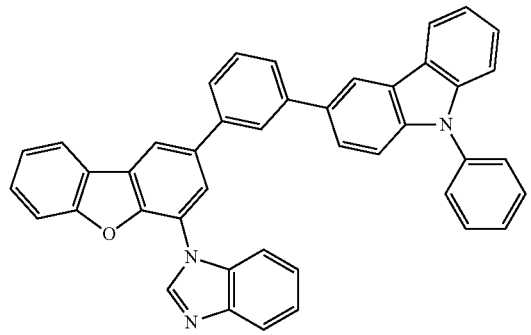
S-34
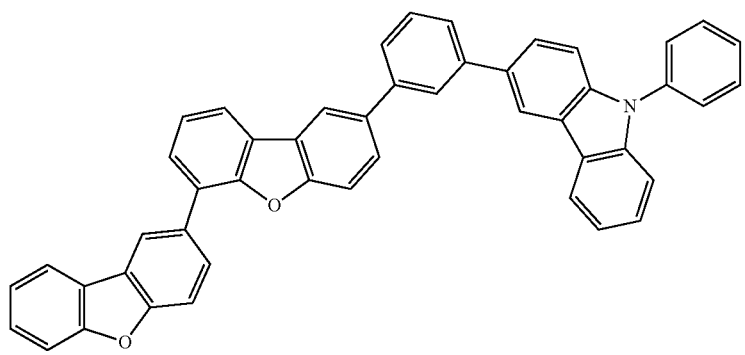

S-35
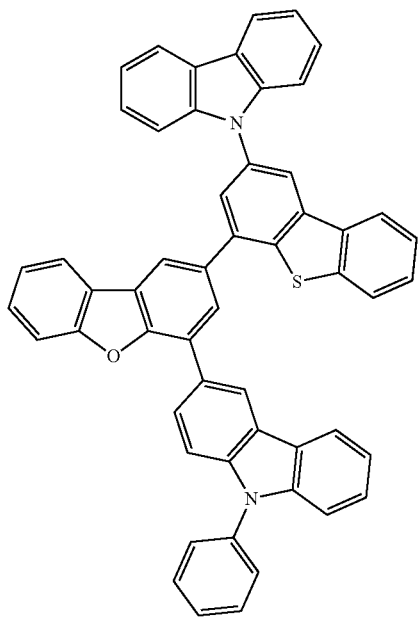
S-36
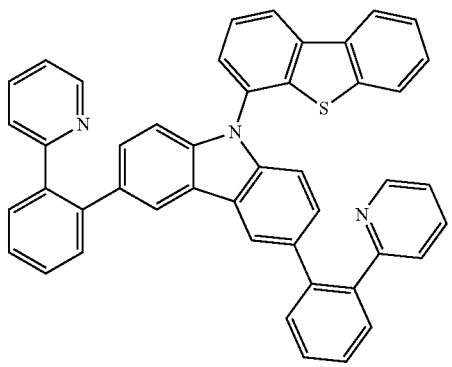
S-37
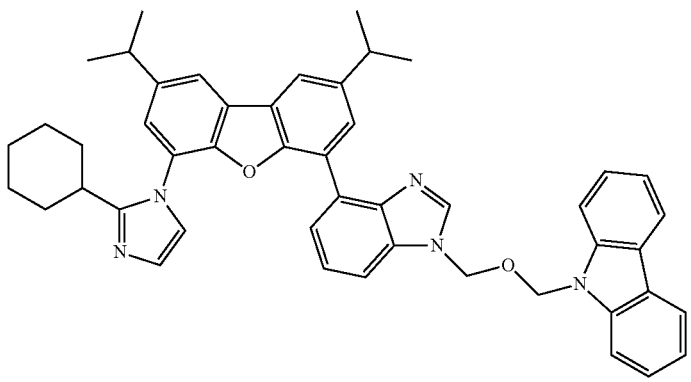
[Chemical Formula 40]
S-38
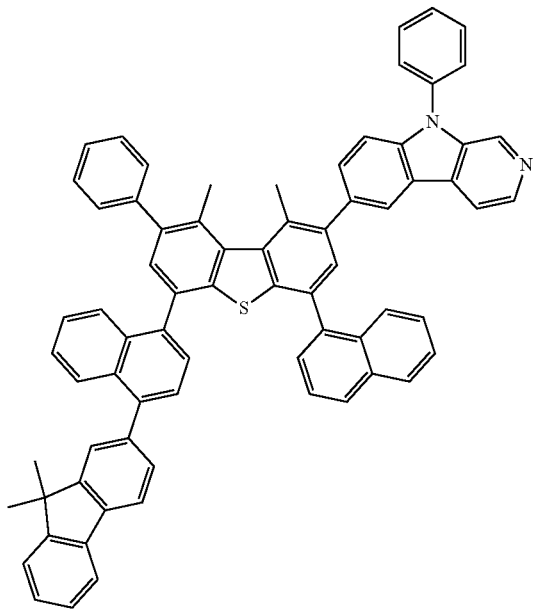

-continued
S-39
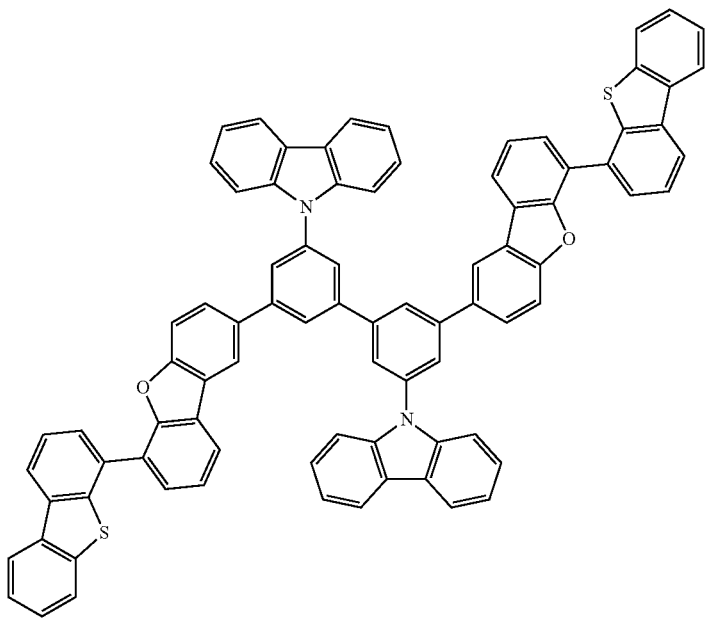
S-40
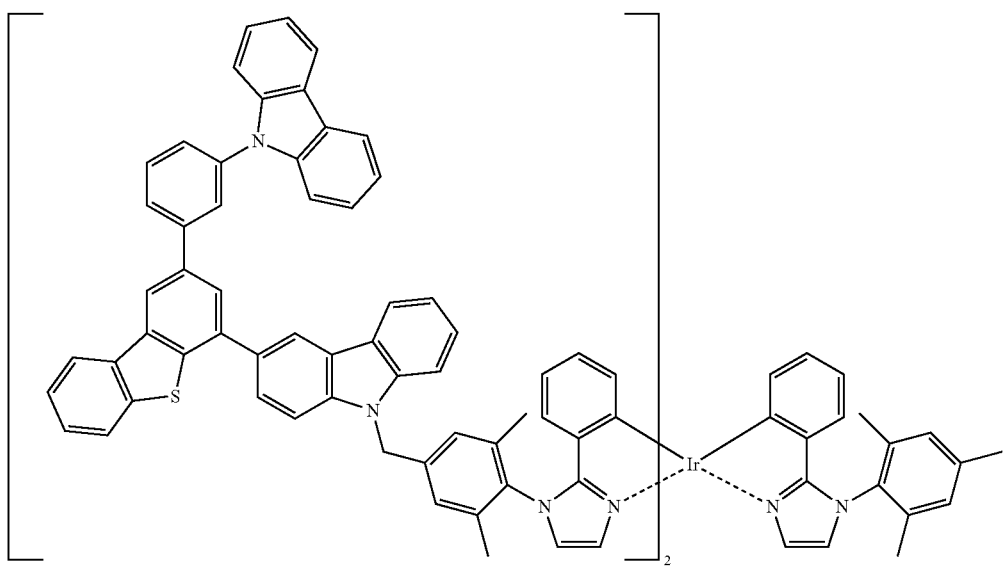

[Chemical Formula 41]
S-41
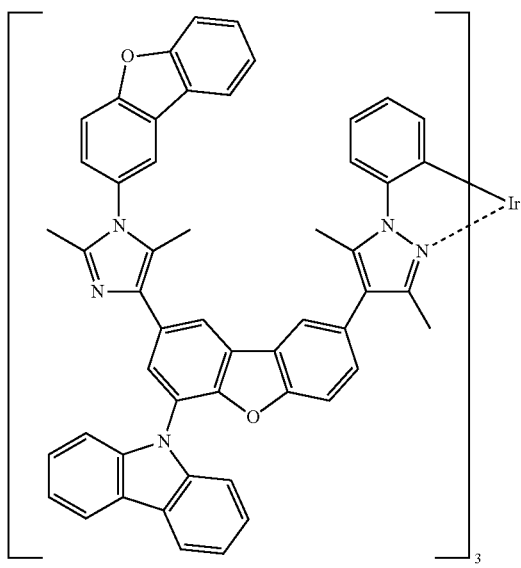
S-42
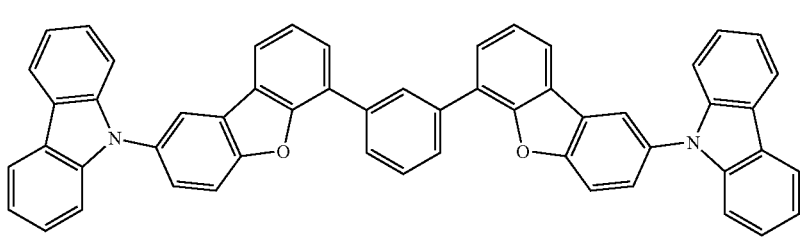
S-43
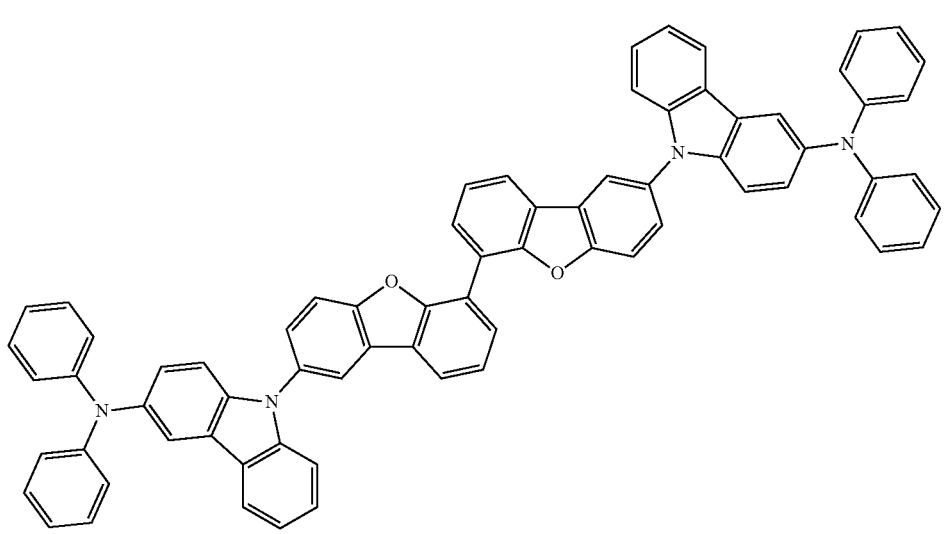

[Chemical Formula 42]
S-44
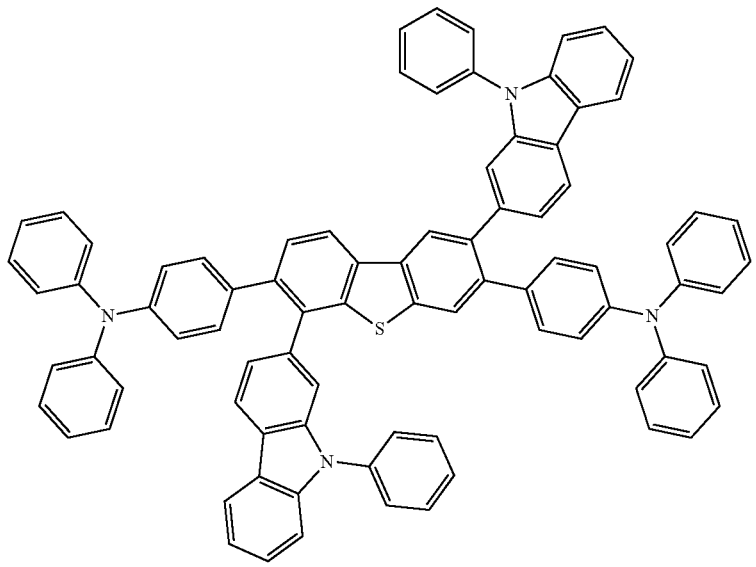
S-45
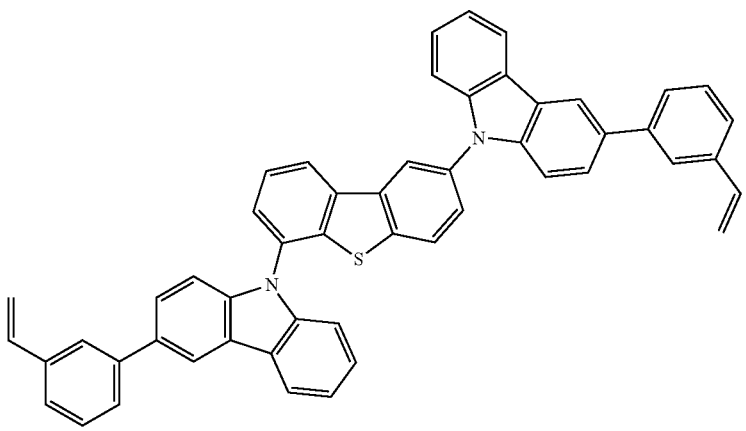
[Chemical Formula 43]
S-46
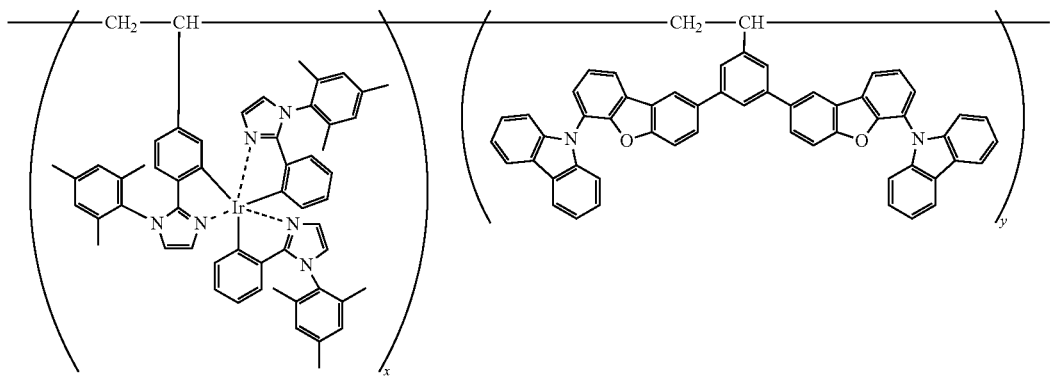
x:y = 1:10
random co-polymer

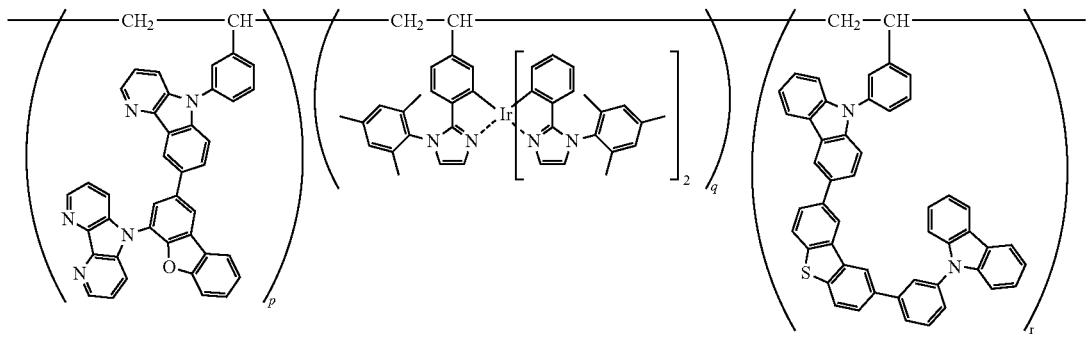
S-47
[Chemical Formula 44]
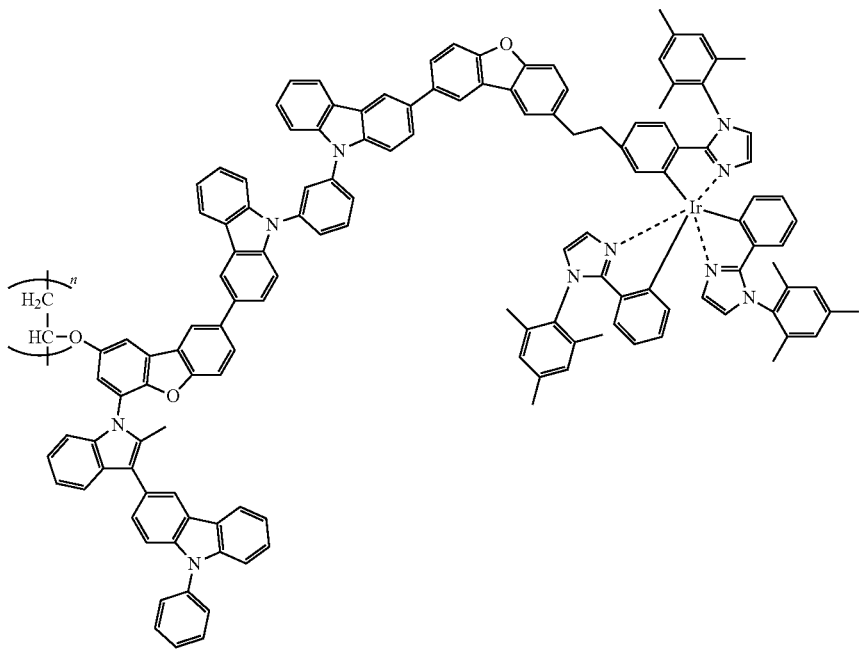
S-48
[Chemical Formula 45]
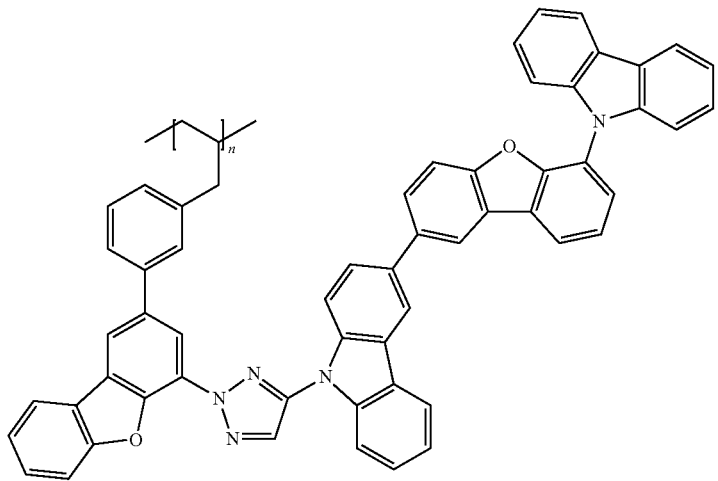
S-49

S-50
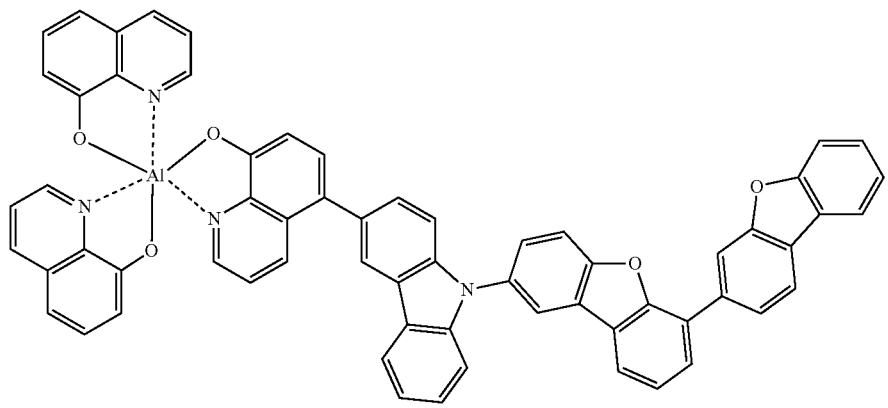
S-51                                    S-52
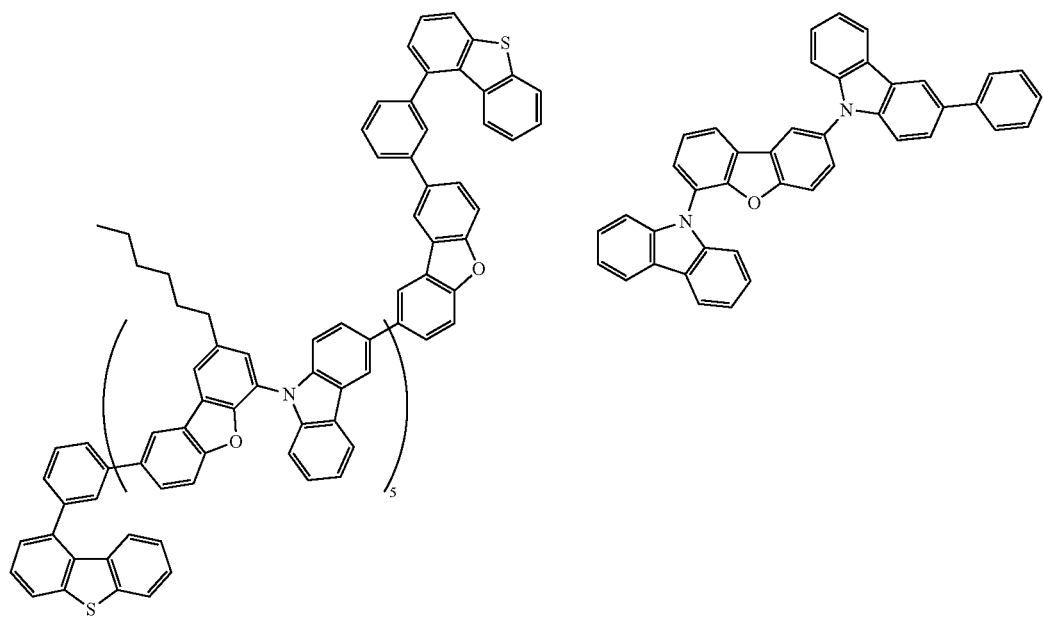
[Chemical Formula 46]
S-53                                    S-54
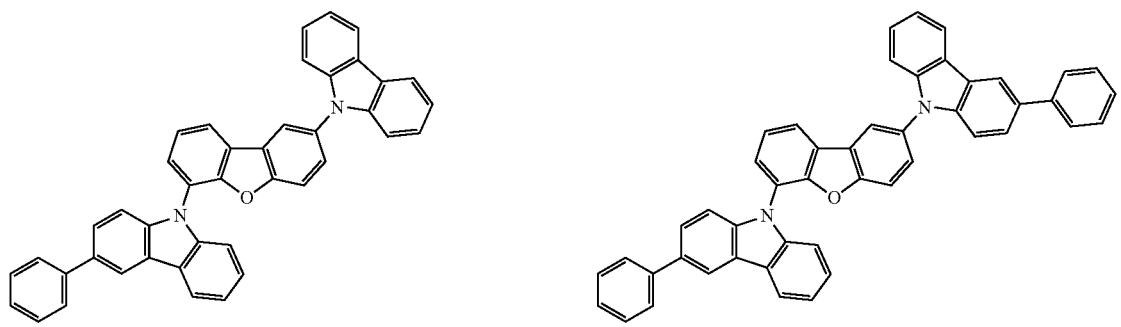

-continued
S-55
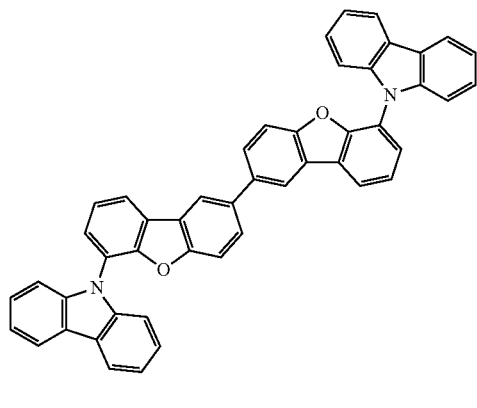
S-56
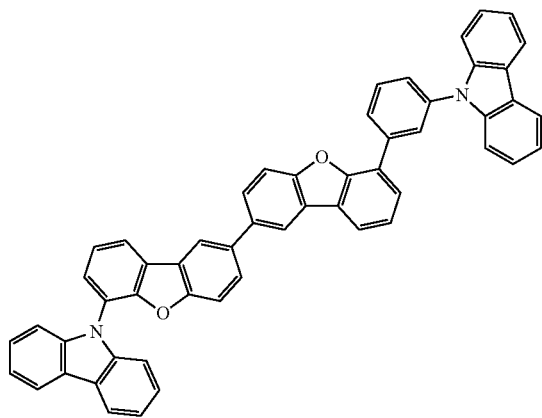
[Chemical Formula 47]
S-57
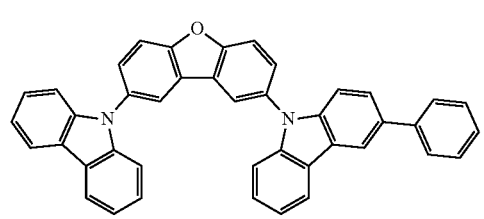
S-58
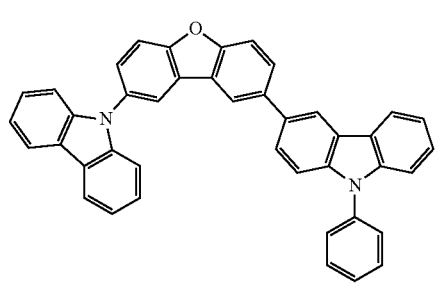
[Chemical Formula 48]
H-101
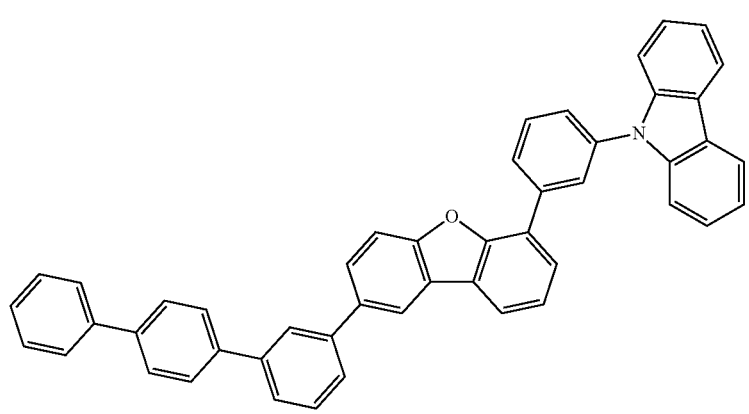

-continued
H-102
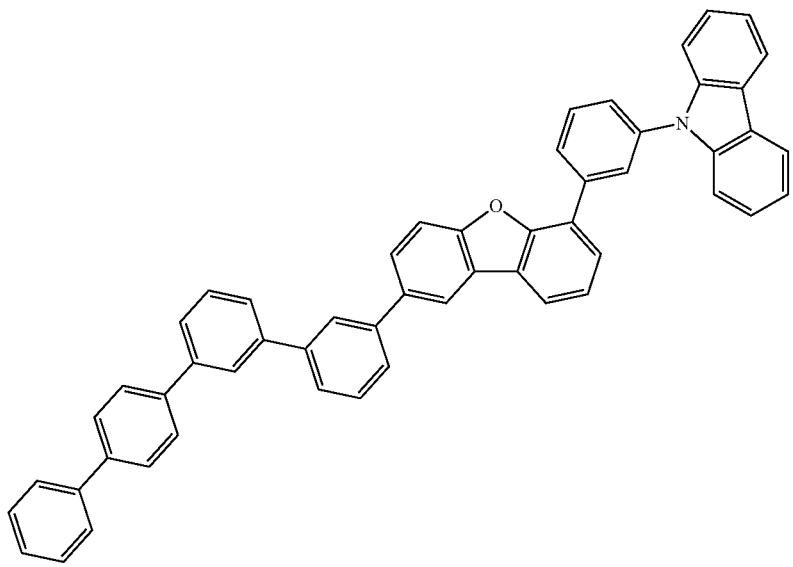
H-103
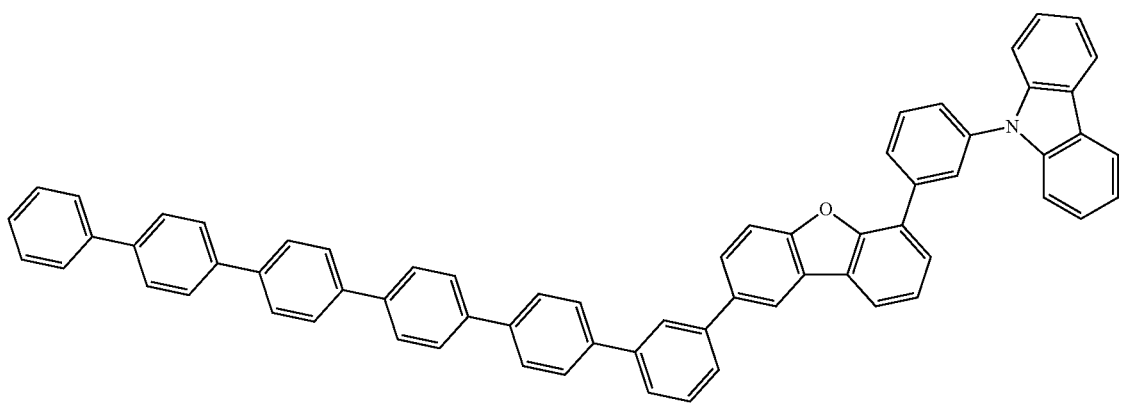
H-104
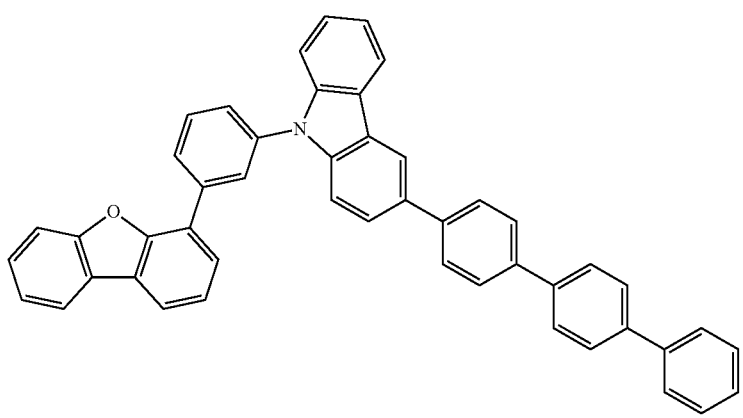

[Chemical Formula 49]
H-105
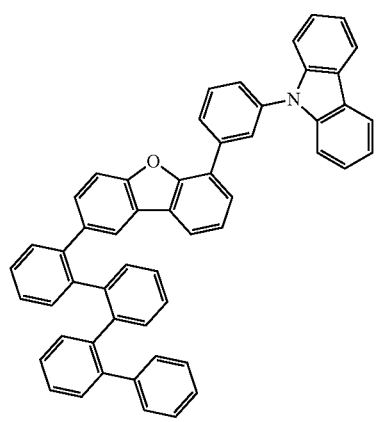
H-106
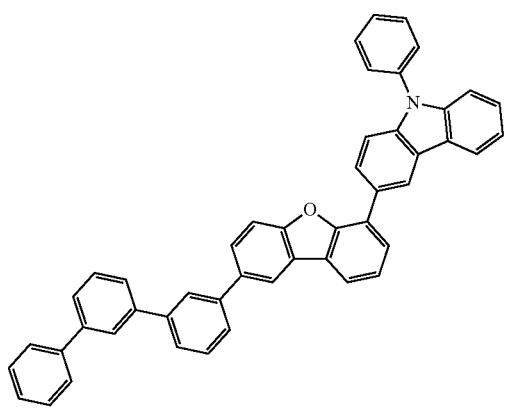
H-107
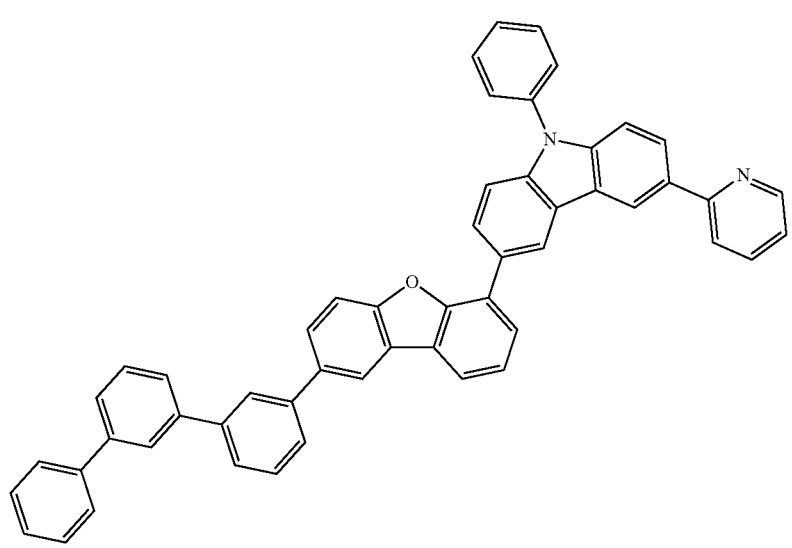
H-108
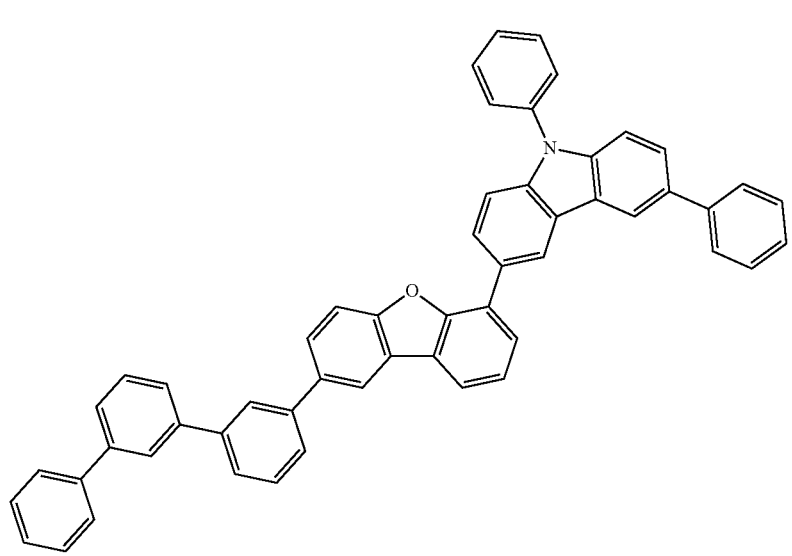

[Chemical Formula 50]
H-109
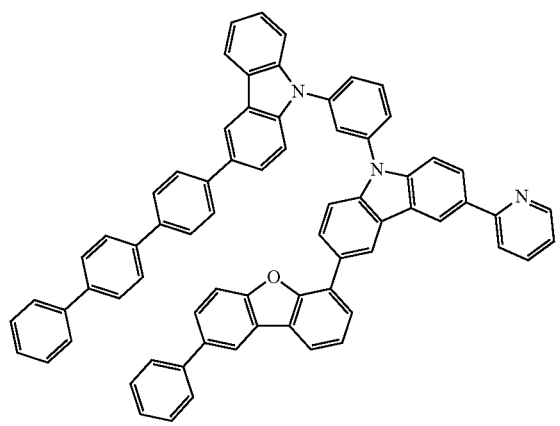
H-110
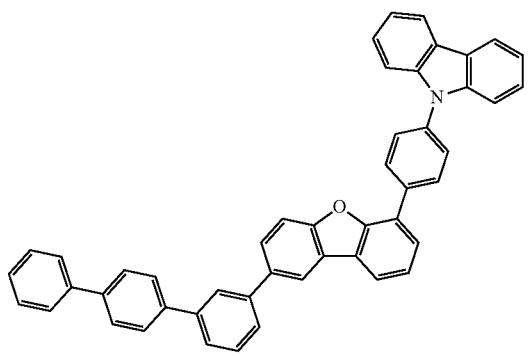
H-111
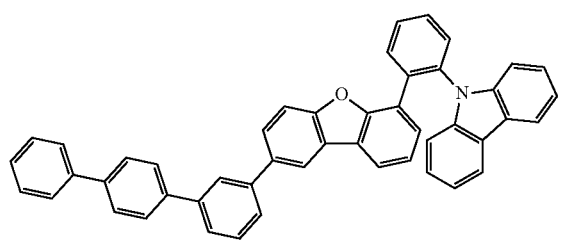
H-112
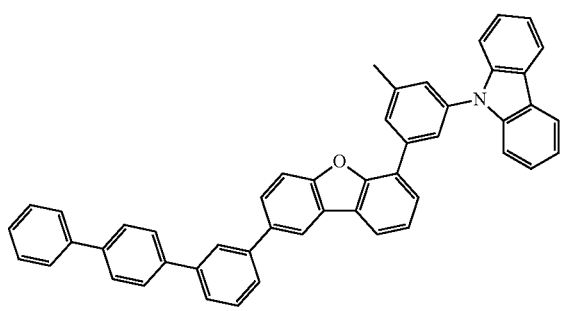
[Chemical Formula 51]
H-201
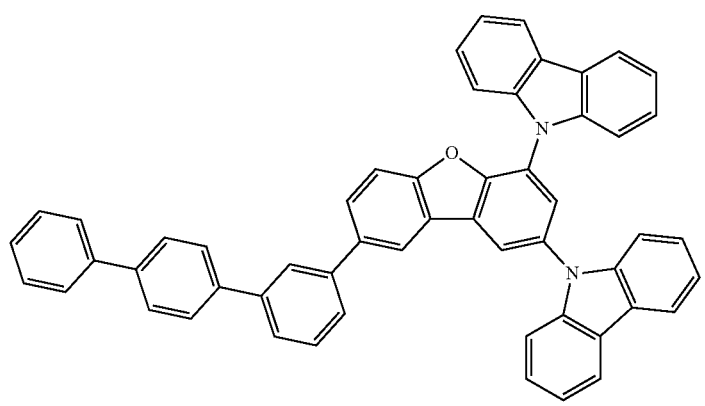

-continued
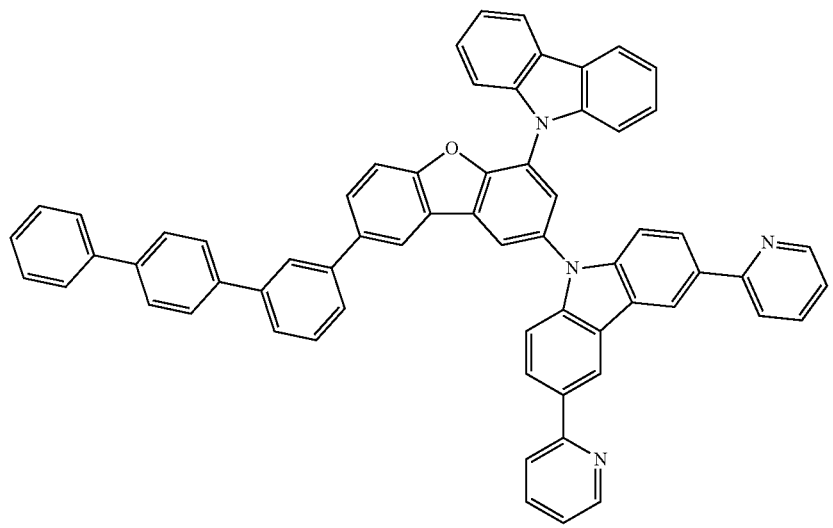
H-202
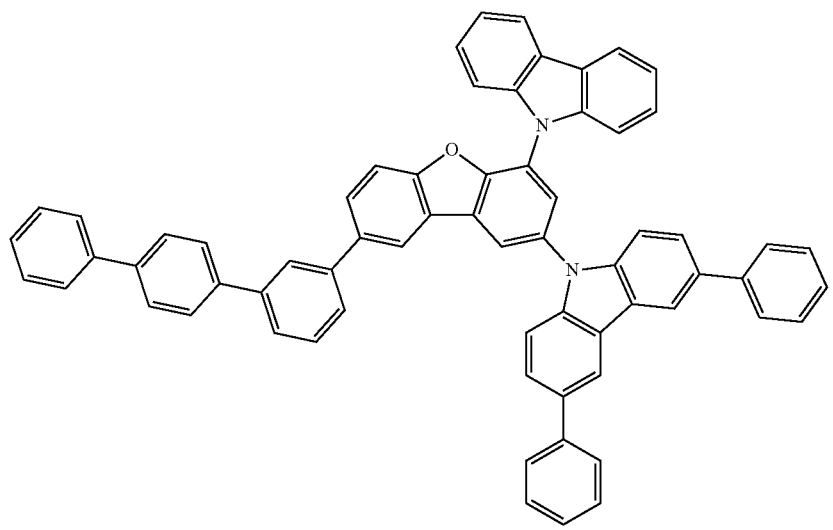
H-203
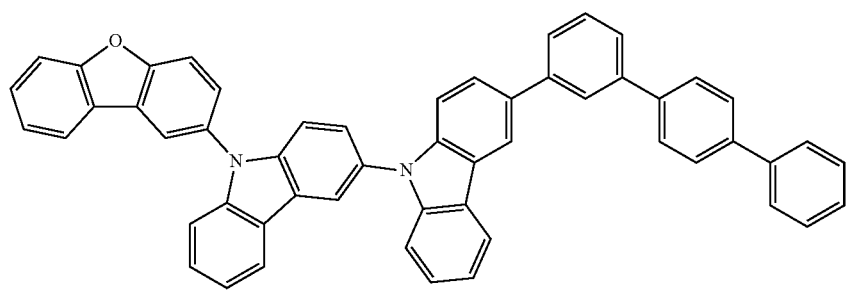
H-204

[Chemical Formula 52]
H-205
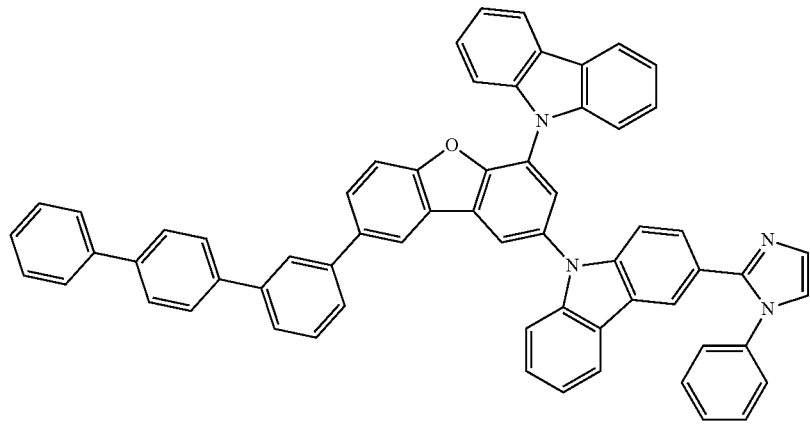
H-206
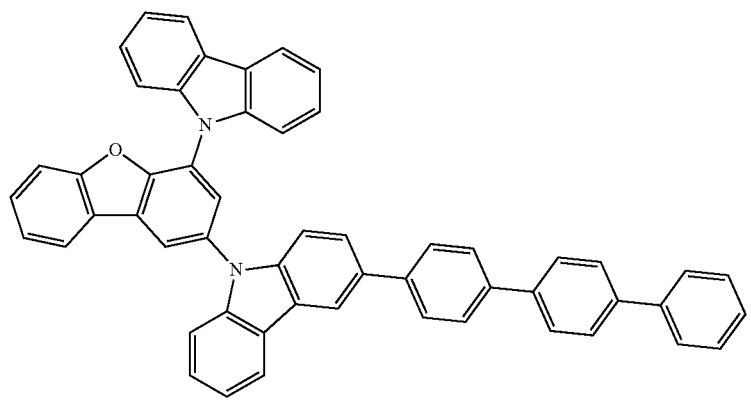
H-207
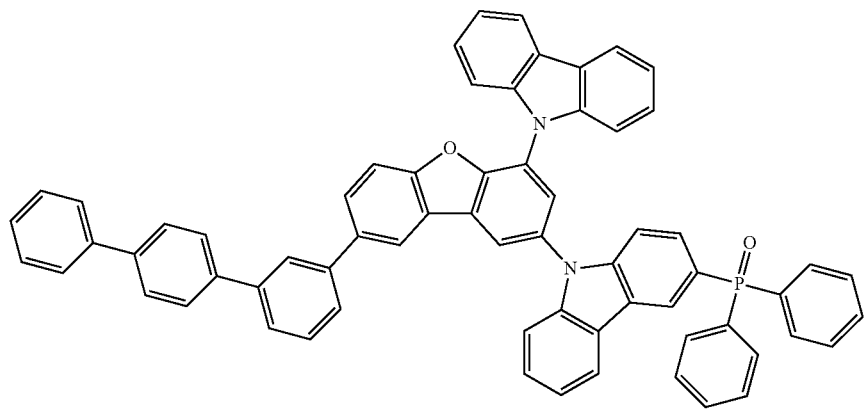

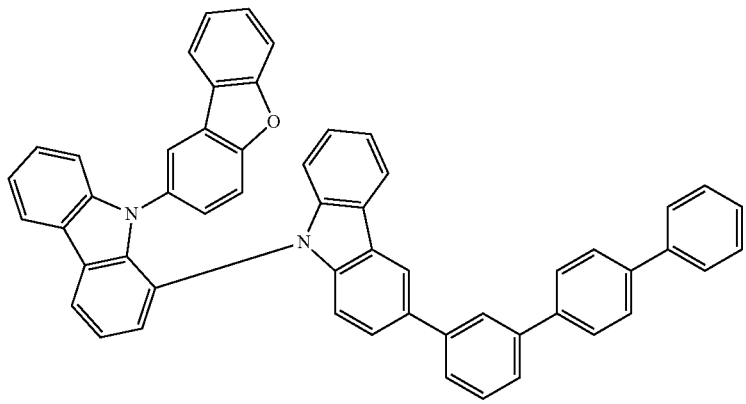
H-208
[Chemical Formula 53]
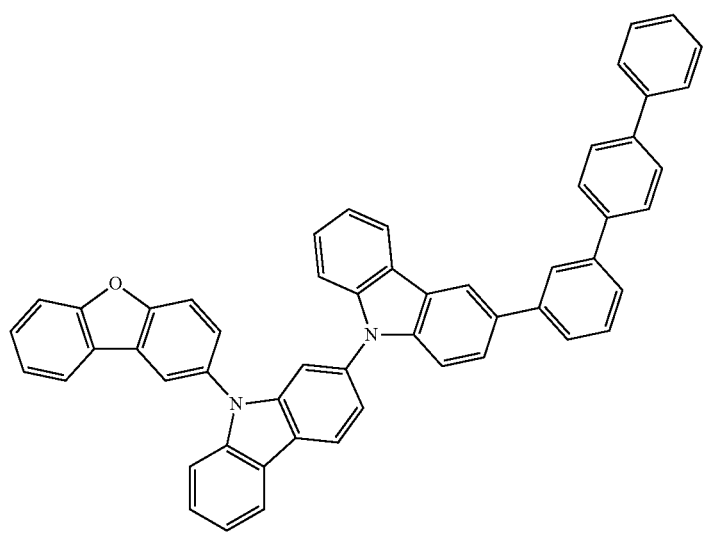
H-209
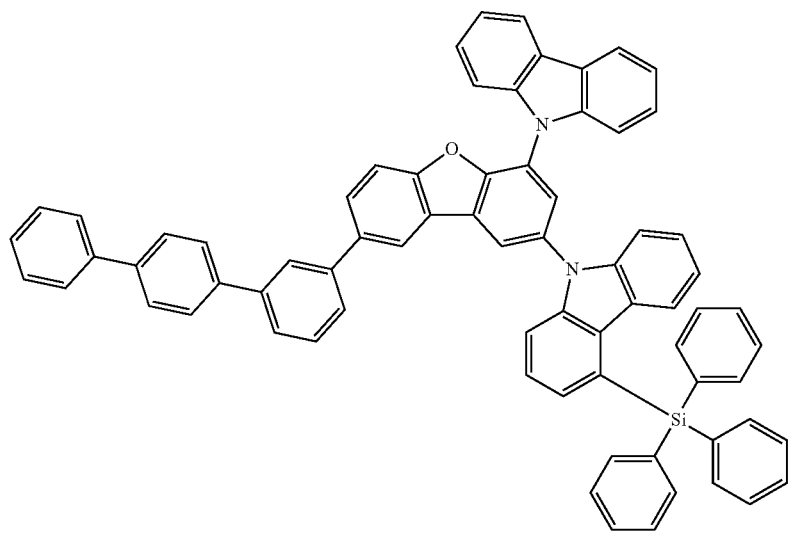
H-210

H-211
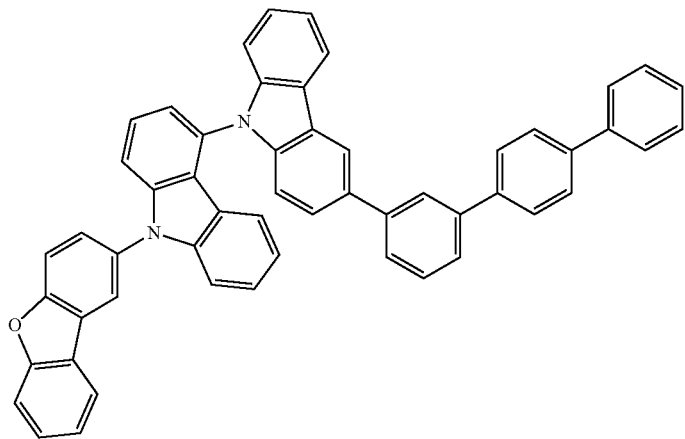
H-212
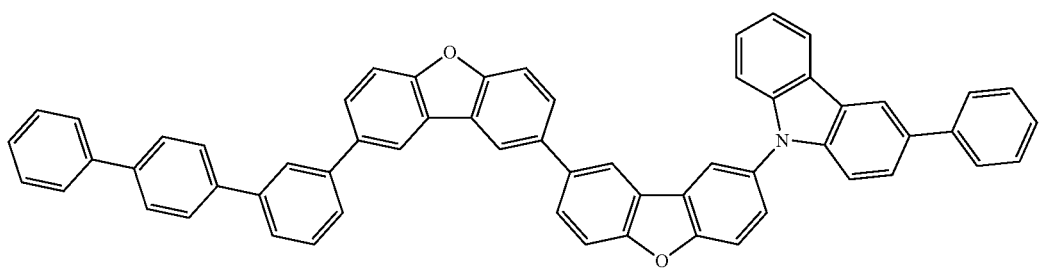
[Chemical Formula 54]
H-213
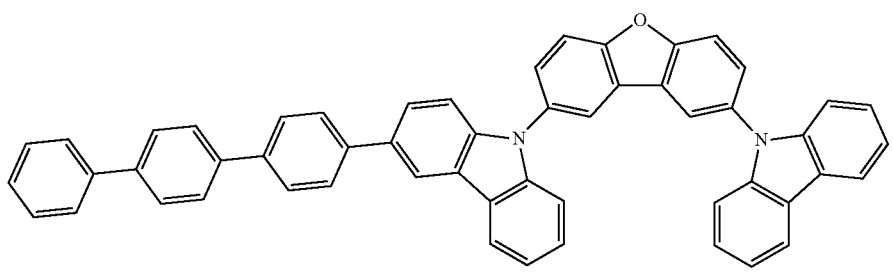
H-214
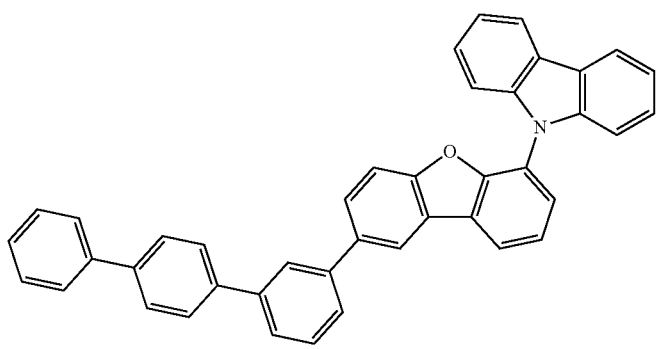

-continued
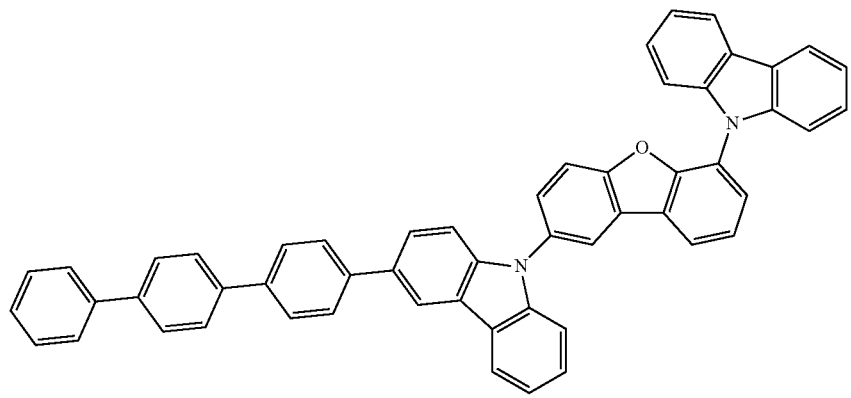
H-215
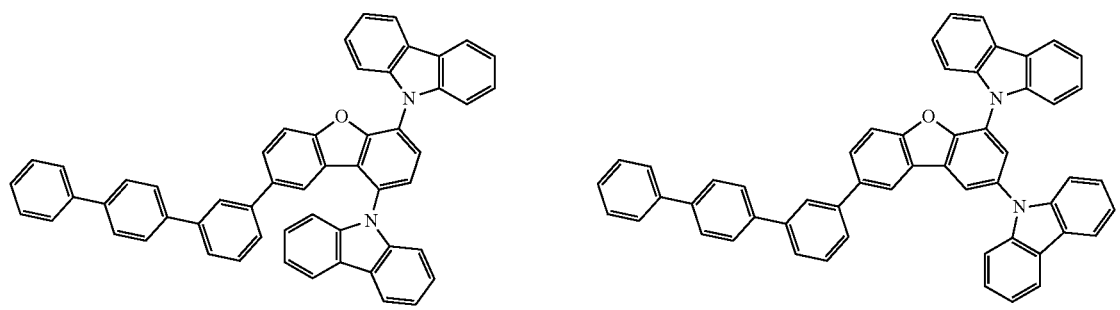
H-216
H-217
[Chemical Formula 55]
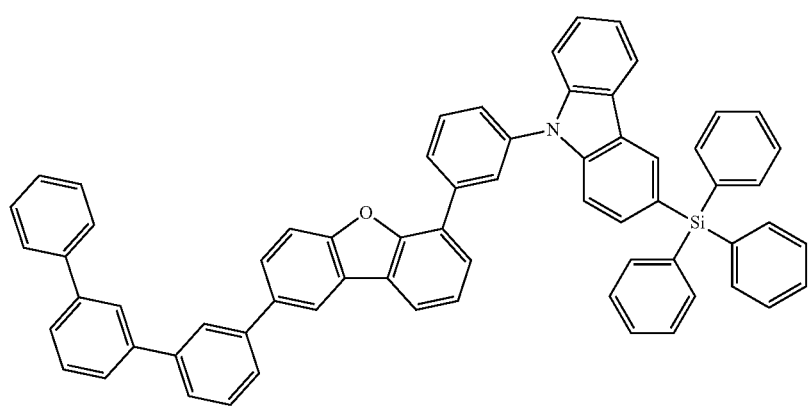
H-301

-continued
H-302
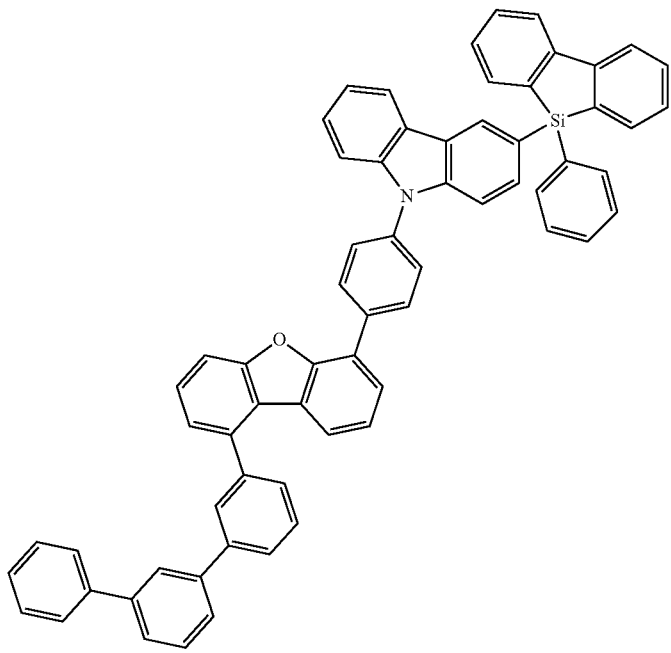
H-303
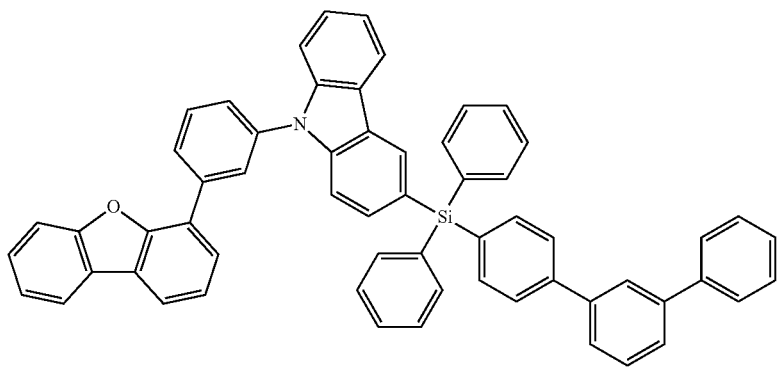
H-304
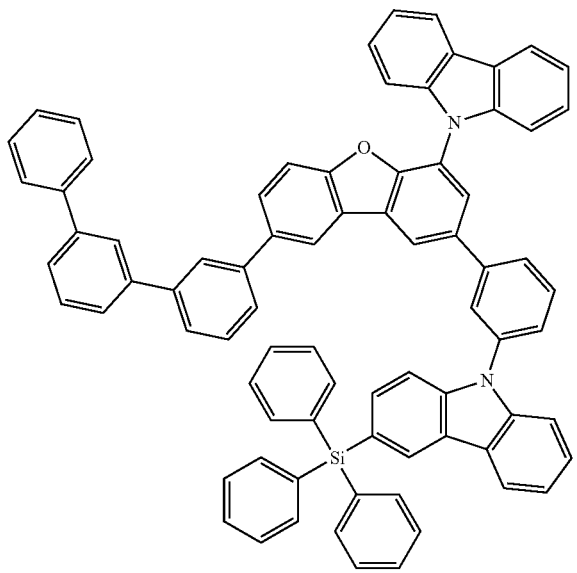

[Chemical Formula 56]
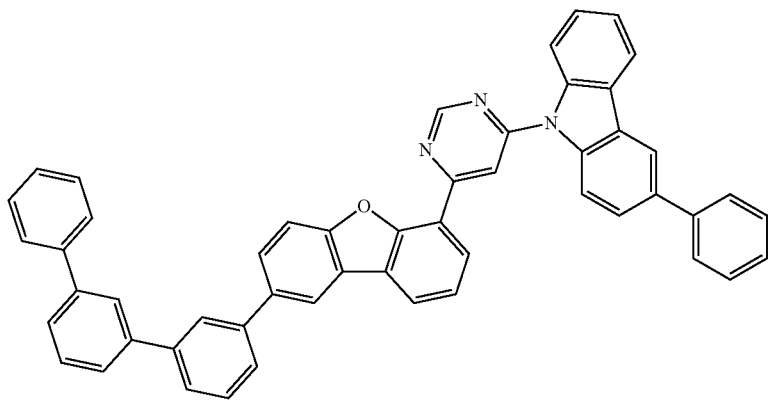
H-305
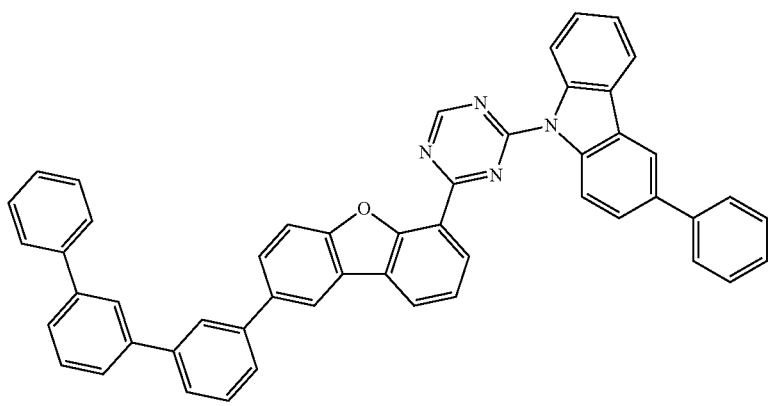
H-306
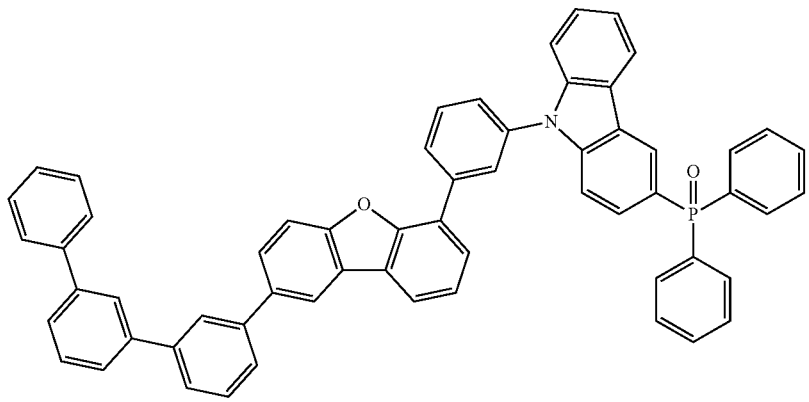
H-307
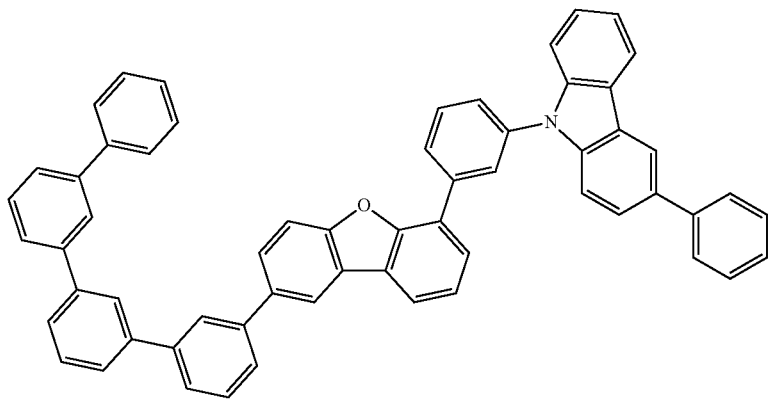
H-308

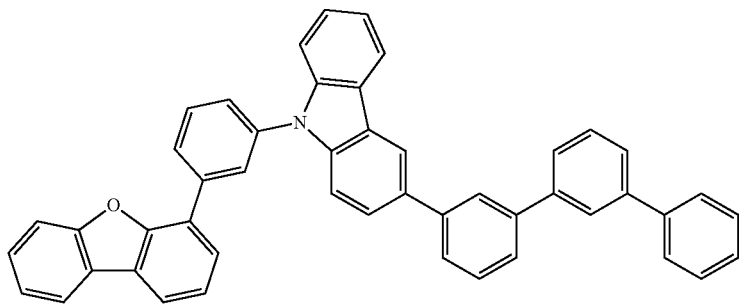
H-309
[Chemical Formula 57]
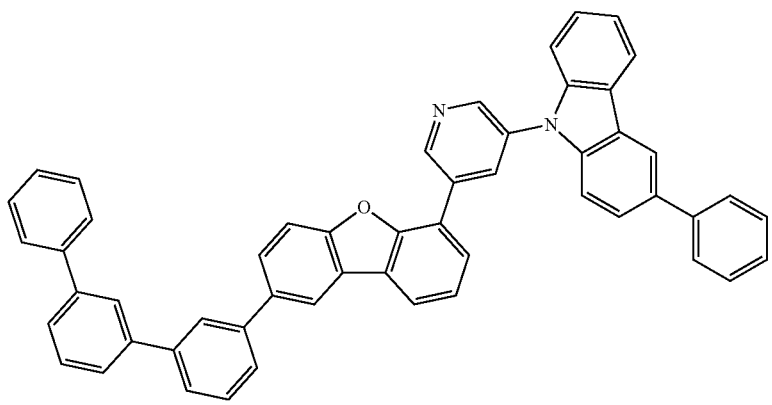
H-310
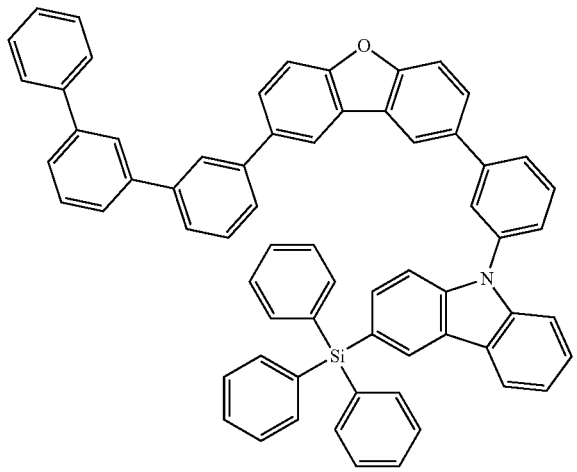
H-311
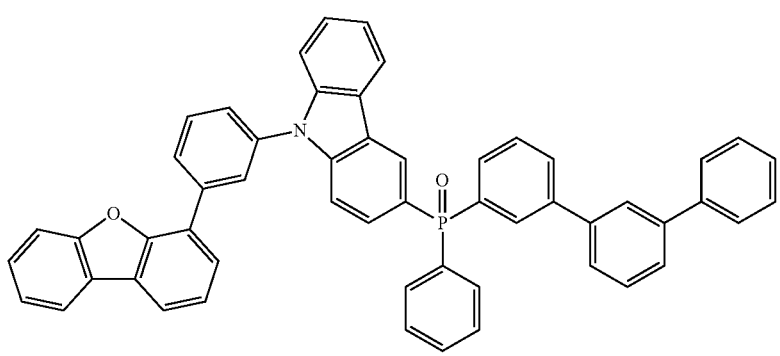
H-312

-continued
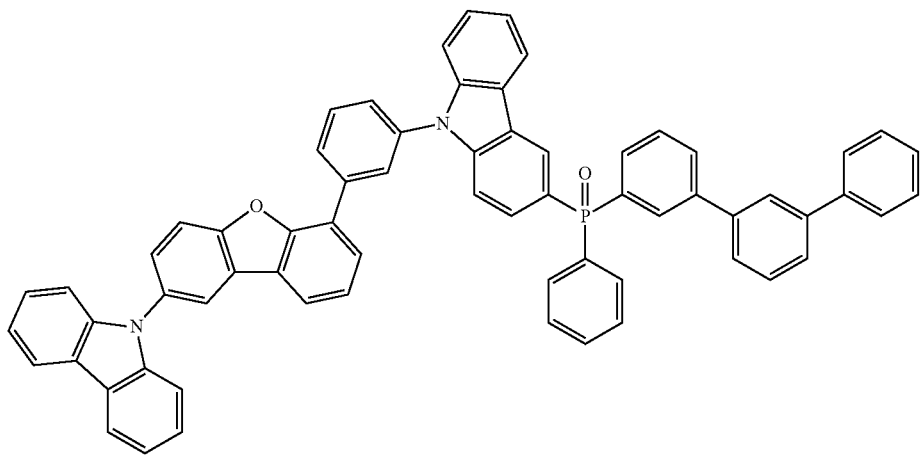
H-313
[Chemical Formula 58]
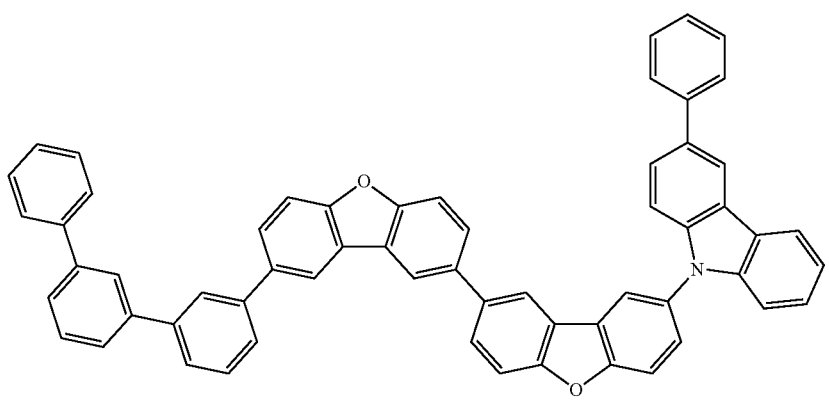
H-314
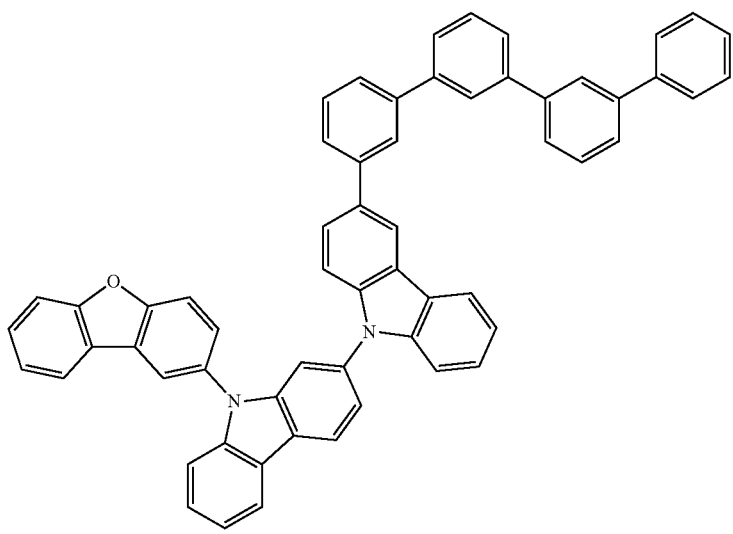
H-315

H-316
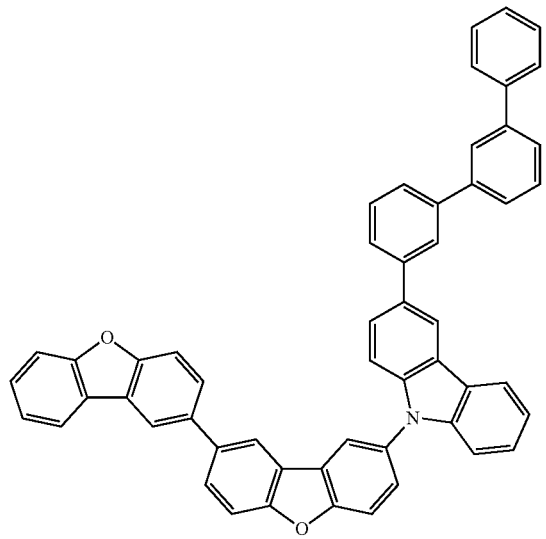
H-317
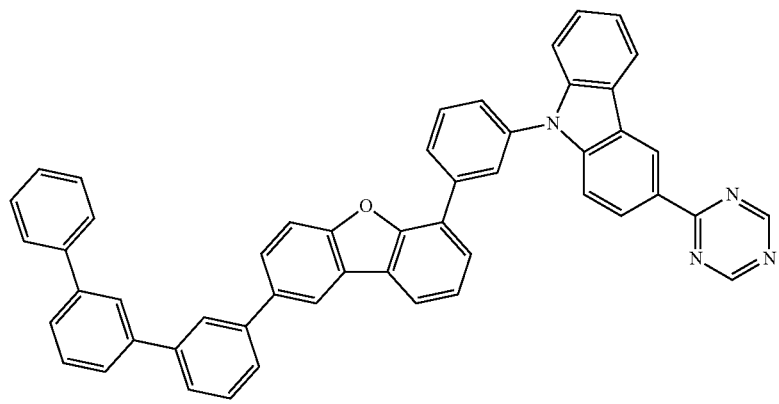
H-318
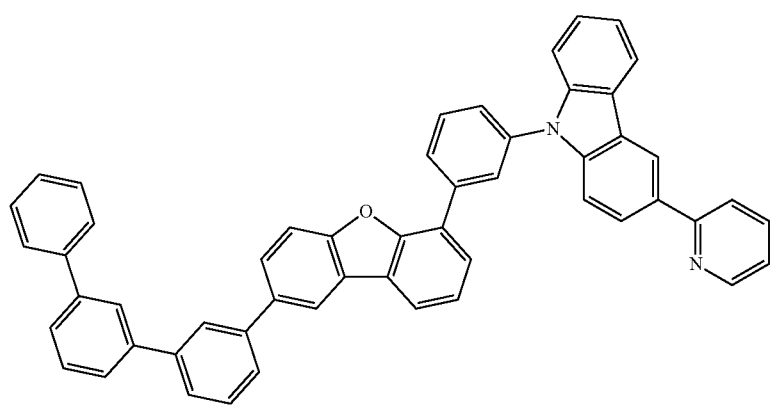

[Chemical Formula 59]
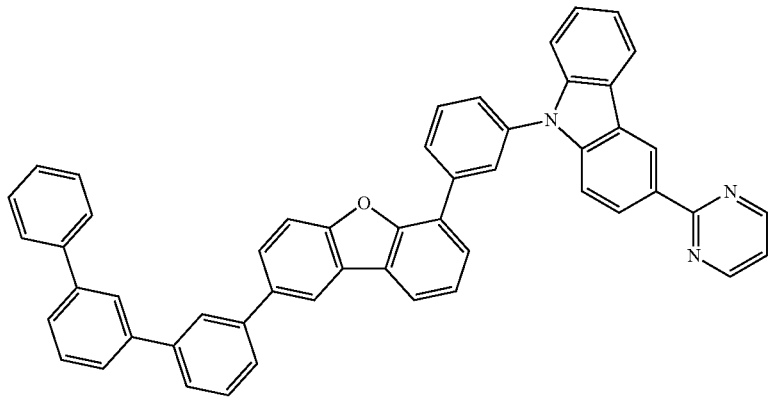
H-319
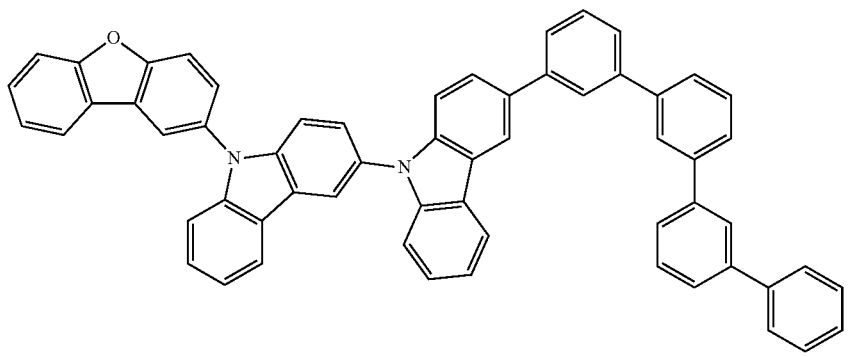
H-320
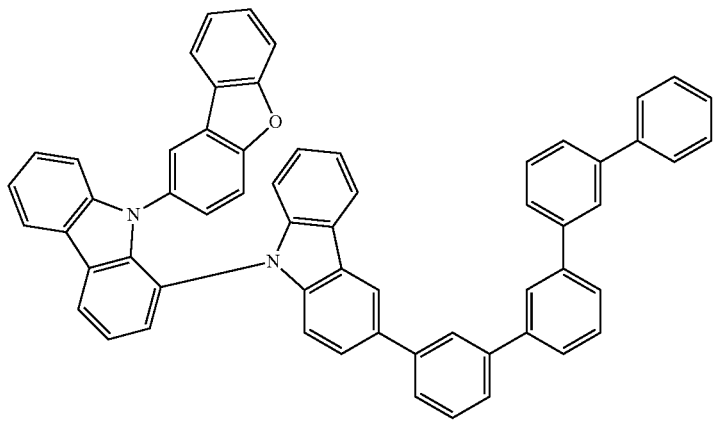
H-321
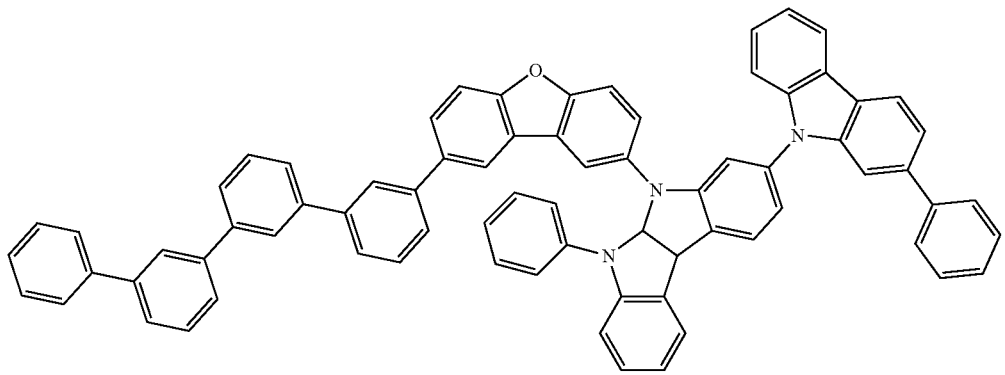
H-322

-continued
H-323
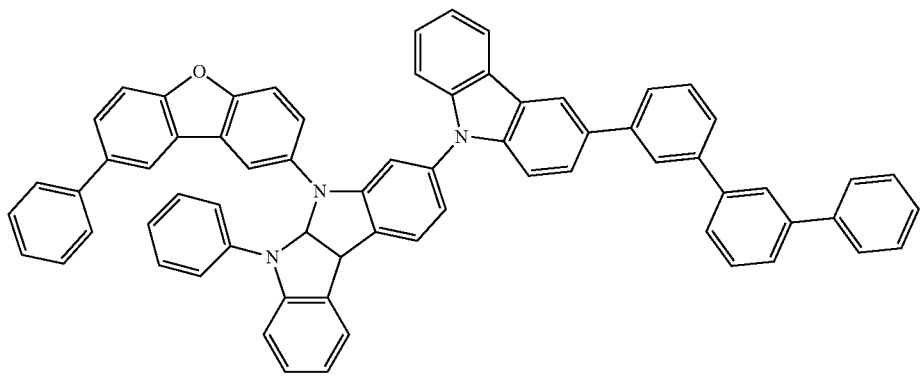
[Chemical Formula 60]
H-324
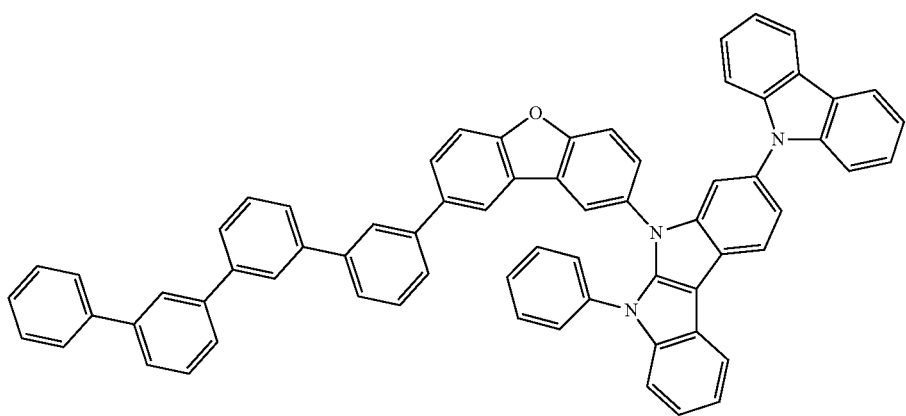
H-325
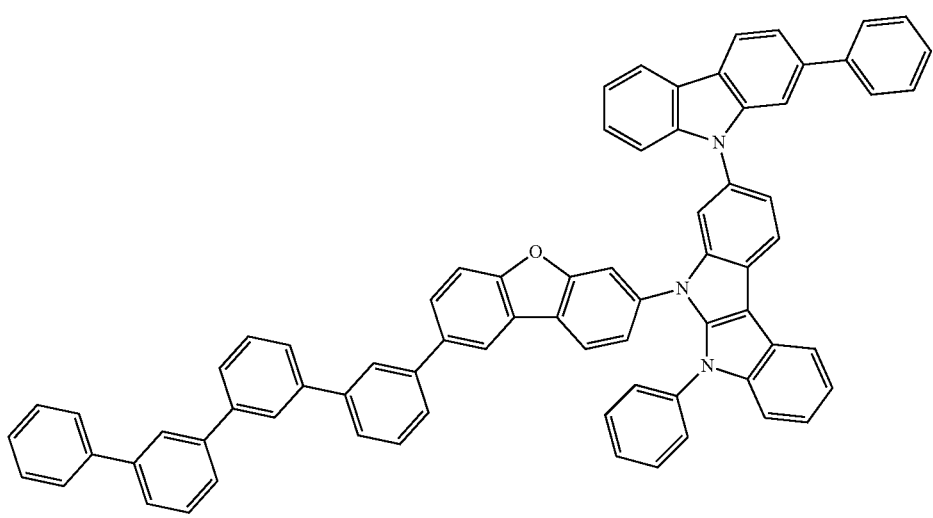

-continued
H-326
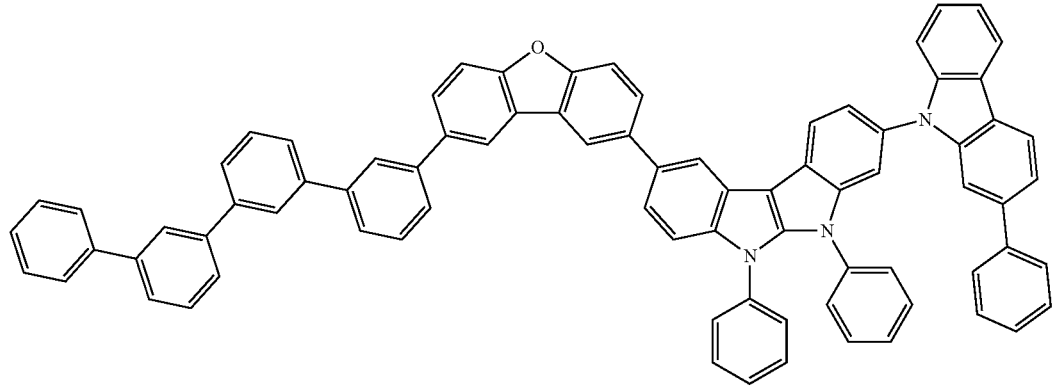
H-327
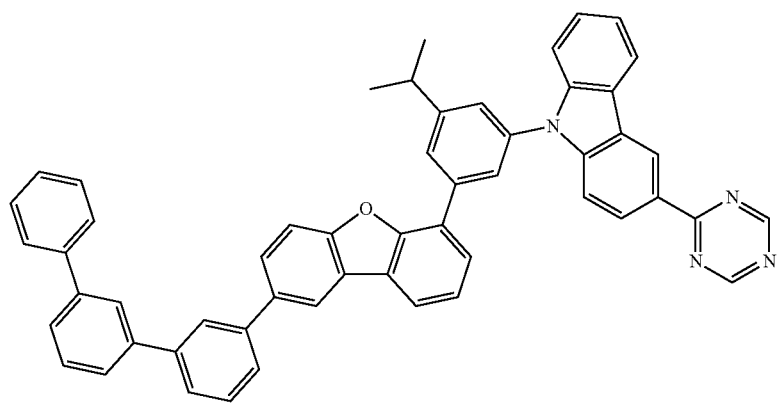
[Chemical Formula 61]
H-401
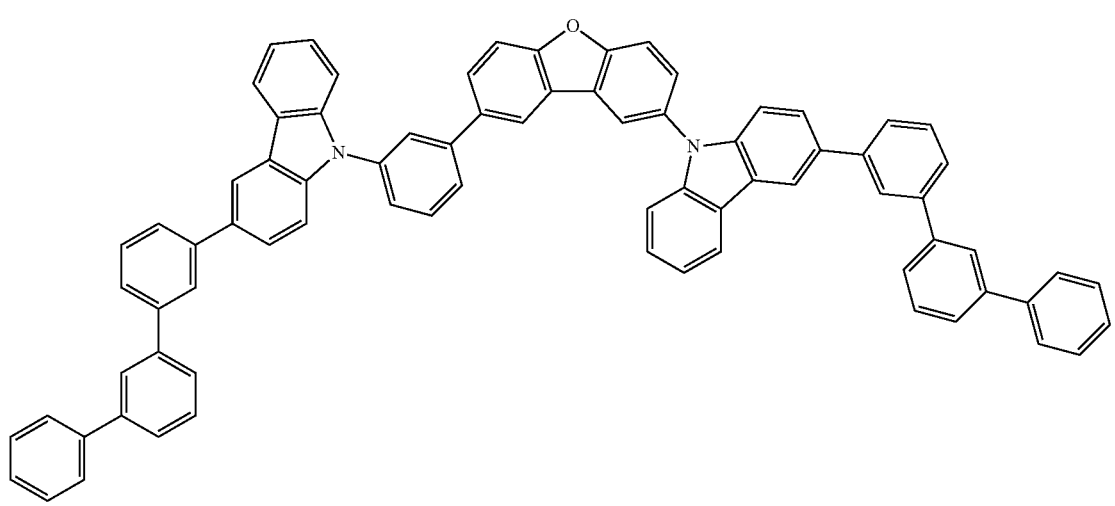
H-402
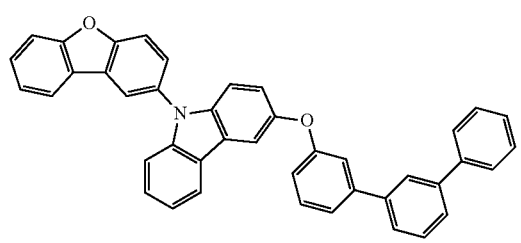
H-403
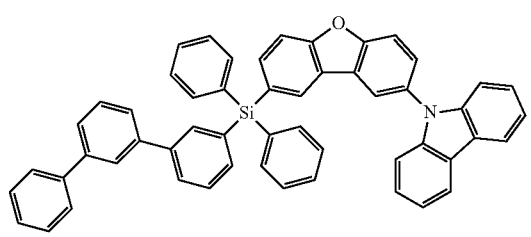

H-404
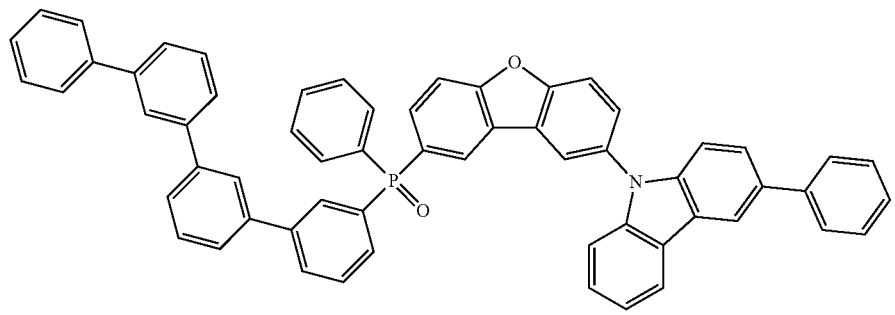
H-405
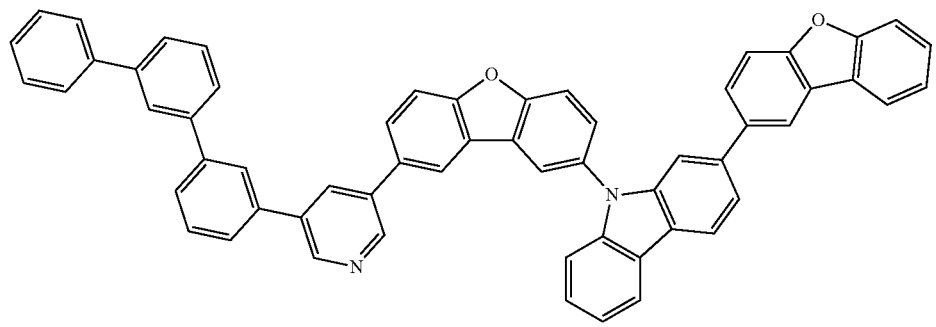
H-406
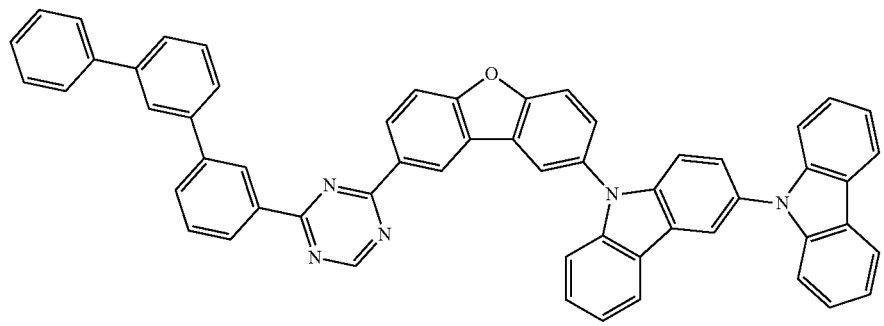
[Chemical Formula 62]
H-407
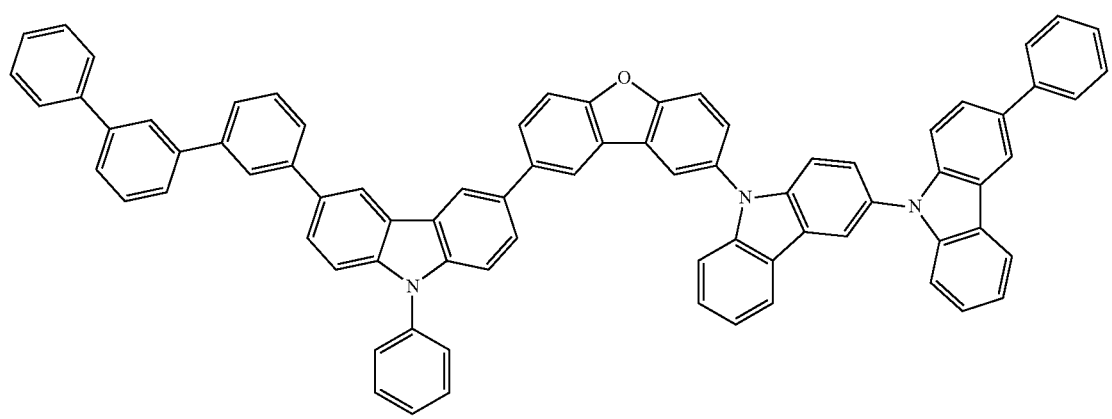

-continued
H-408
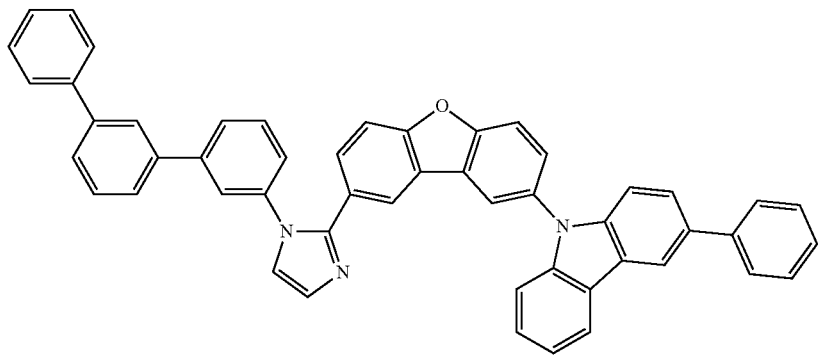
H-409
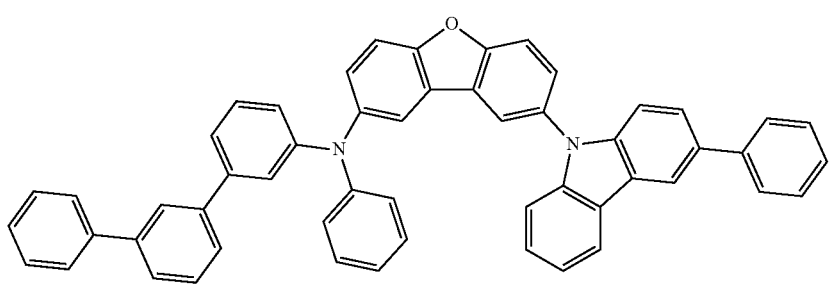
H-410 H-411
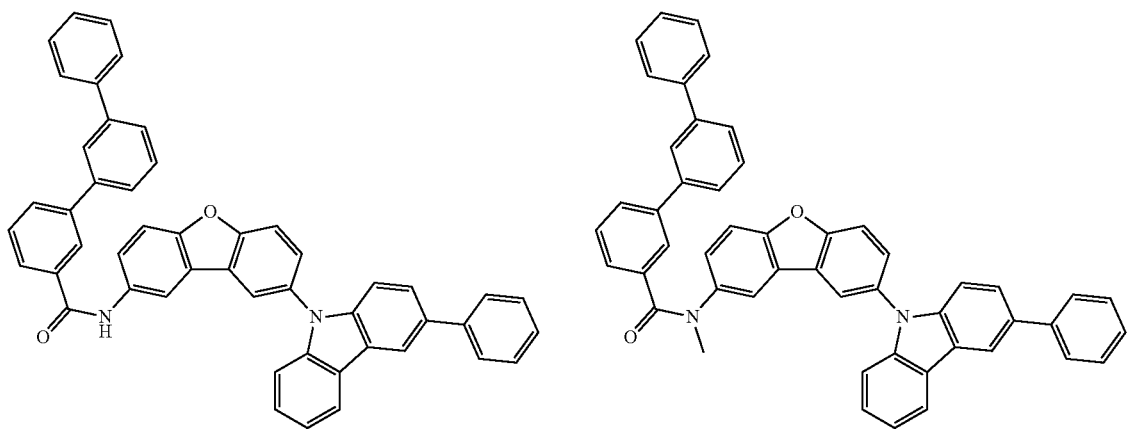
[Chemical Formula 63]
H-412
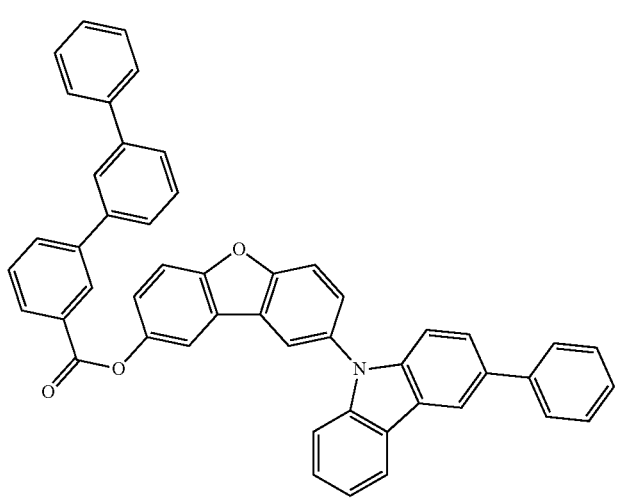

H-413
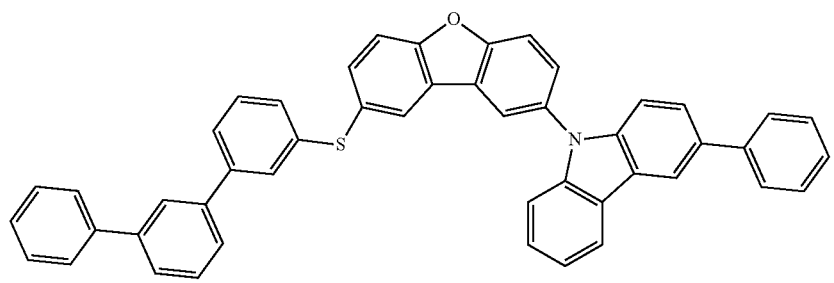
H-414
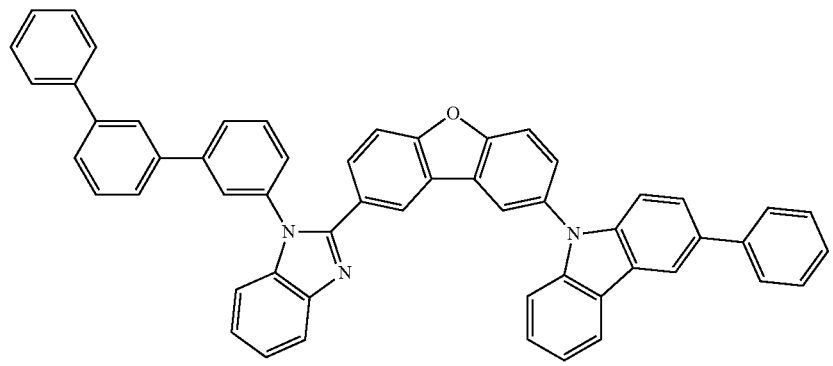
H-415
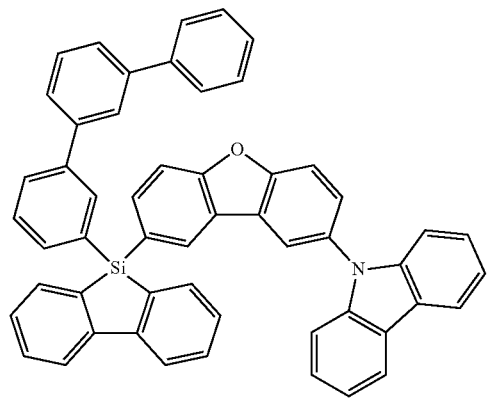
H-416
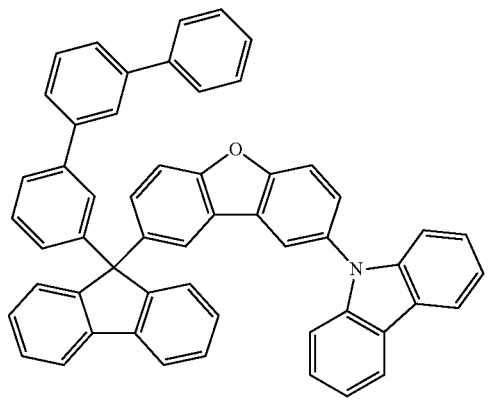
[Chemical Formula 64]
H-418
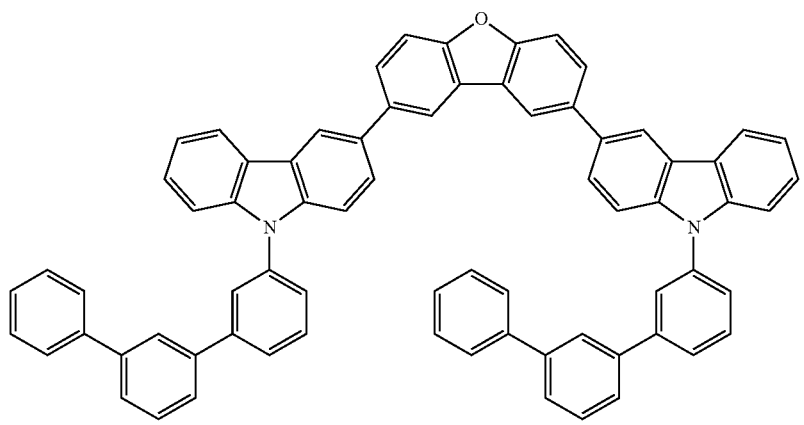

-continued
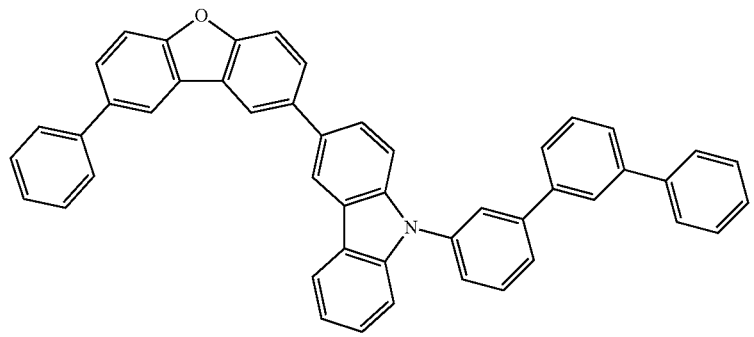
H-420
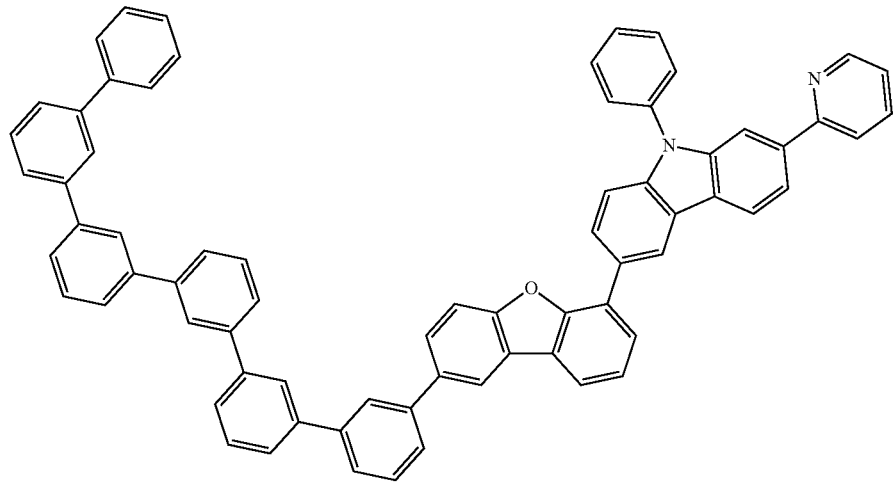
H-421
[Chemical Formula 65]
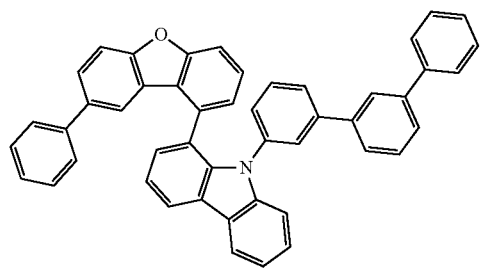
H-422
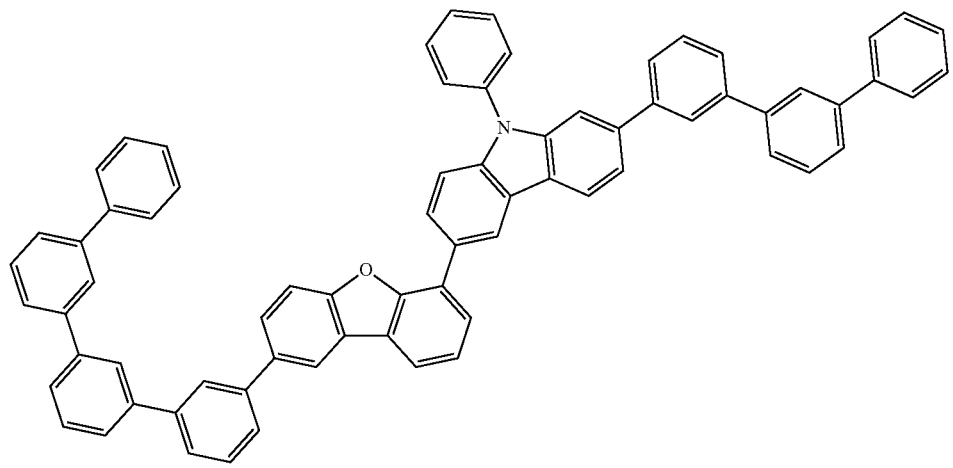
H-423

-continued
H-424
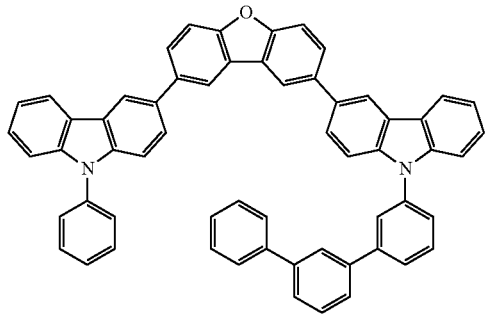
H-425
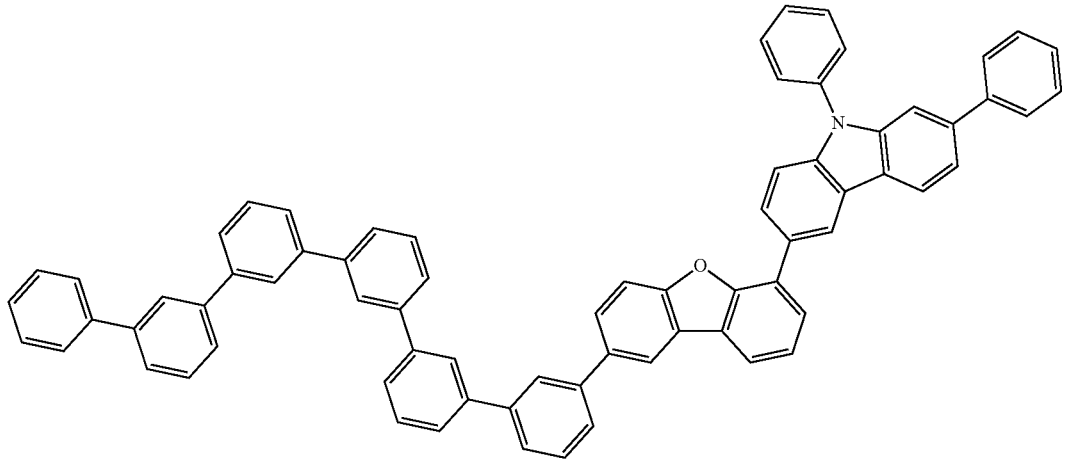
[Chemical Formula 66]
H-426
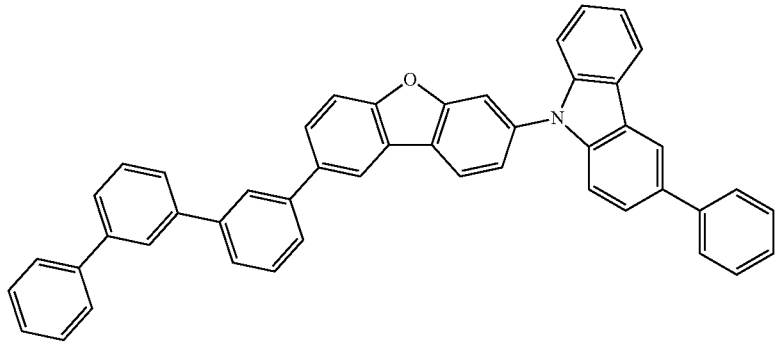
H-427
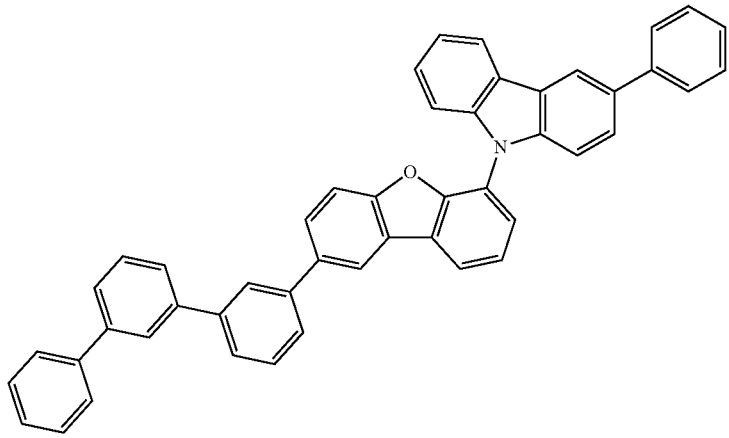

-continued
H-428
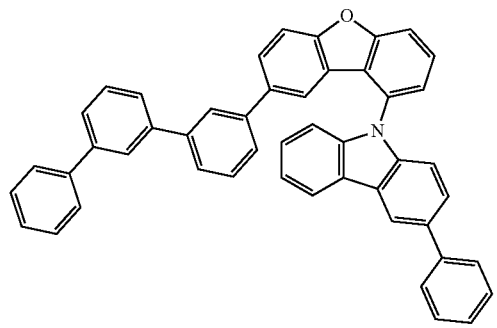
H-429
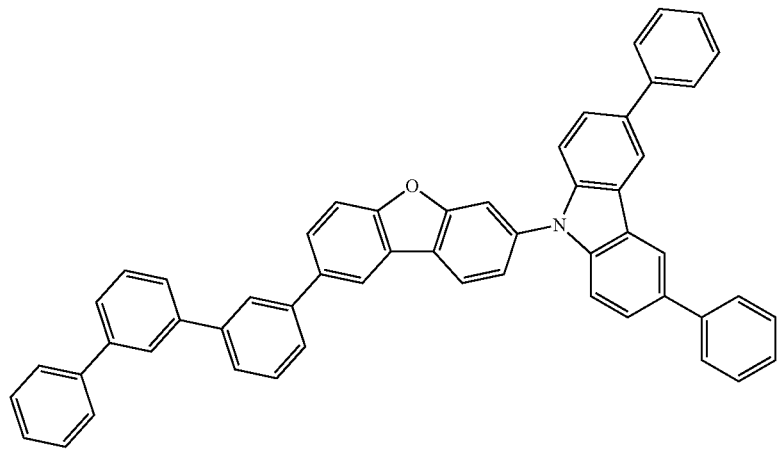
H-430
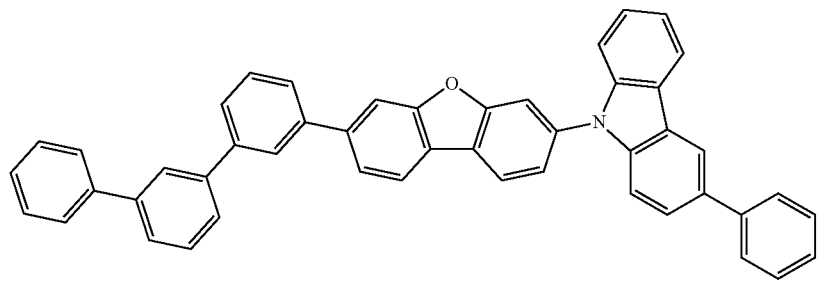
[Chemical Formula 67]
H-431
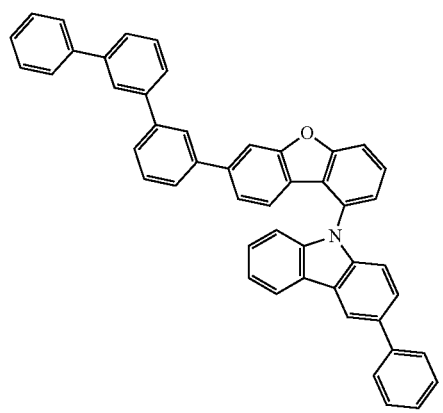
H-432
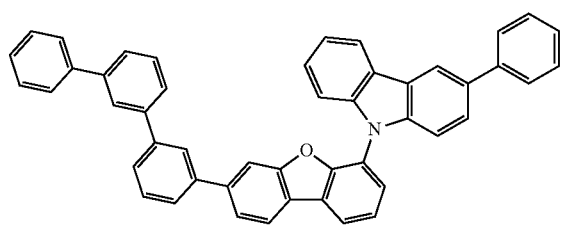

H-433
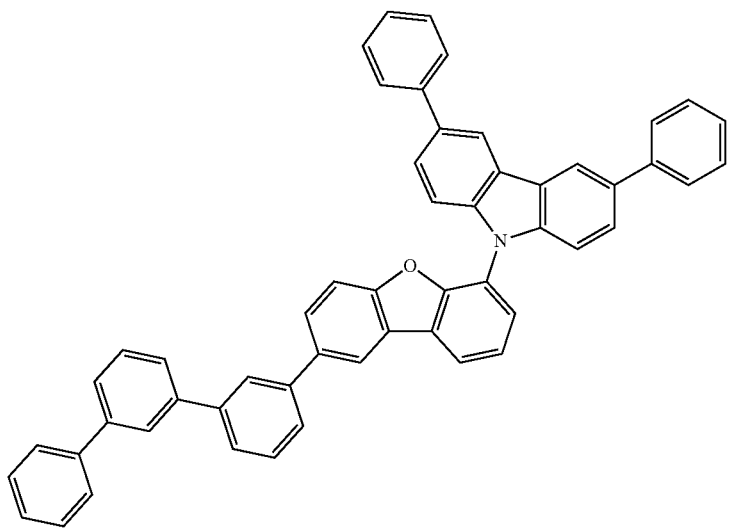
[Chemical Formula 68]
H-434
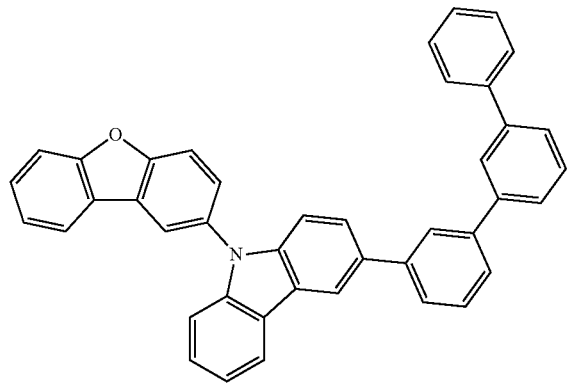
H-435
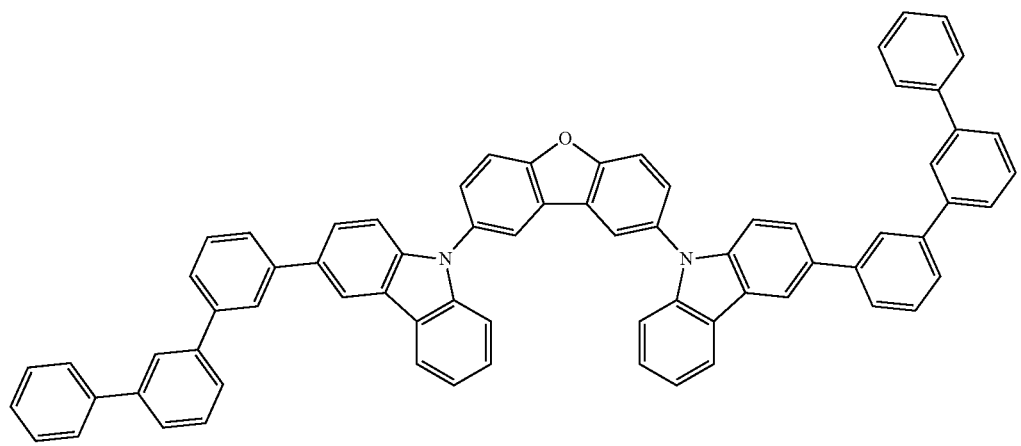

-continued
H-436
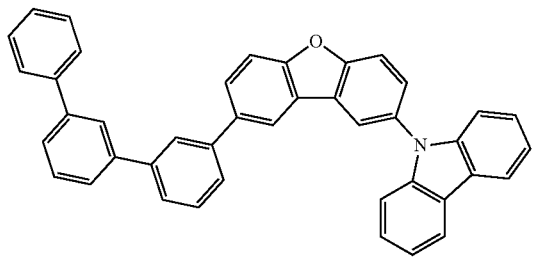
H-437
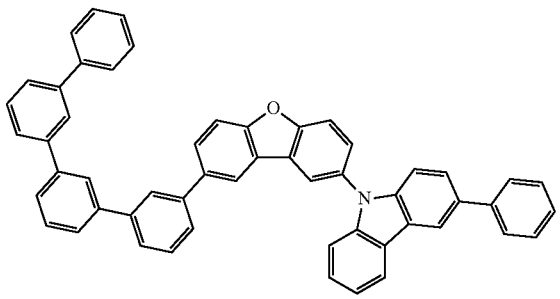
[Chemical Formula 69]
H-438
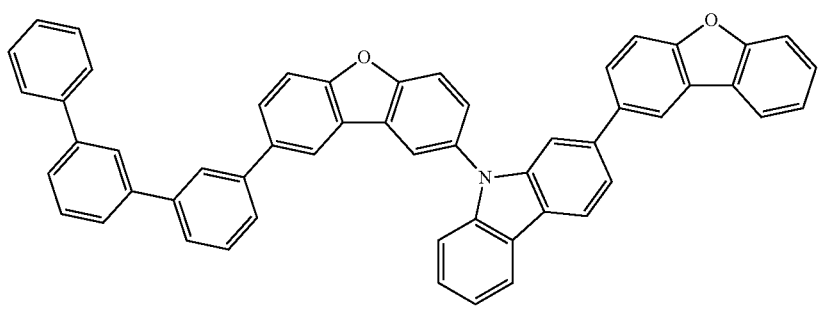
H-439
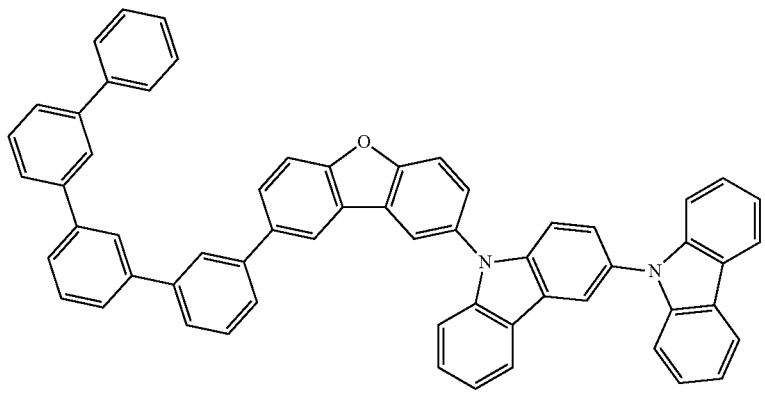
H-440
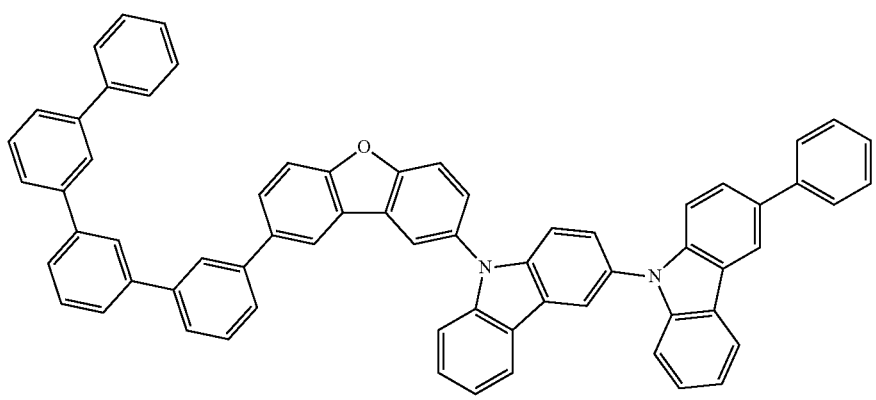

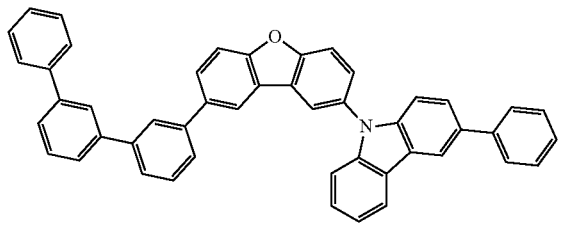
H-441
[Chemical Formula 70]
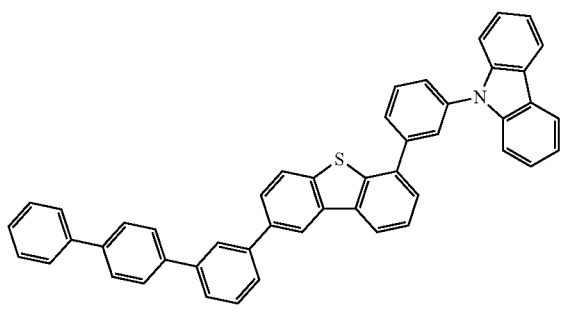
H-442
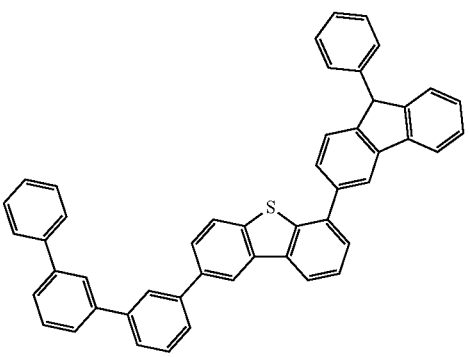
H-443
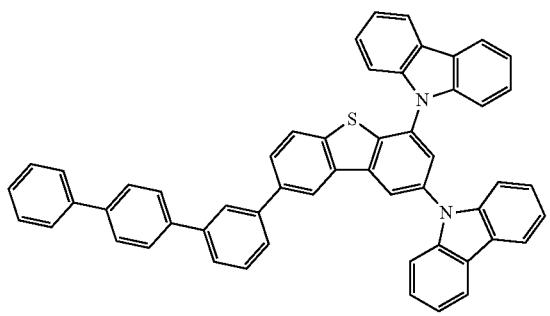
H-444
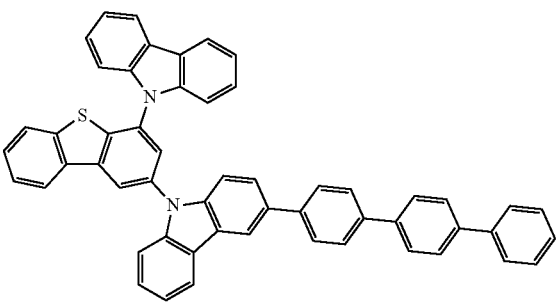
H-445
[Chemical Formula 71]
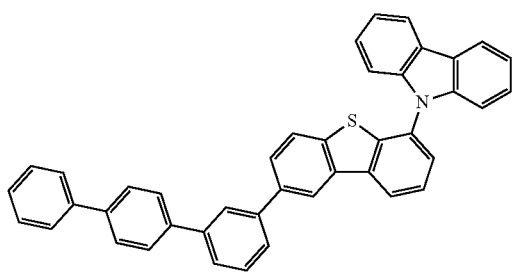
H-446
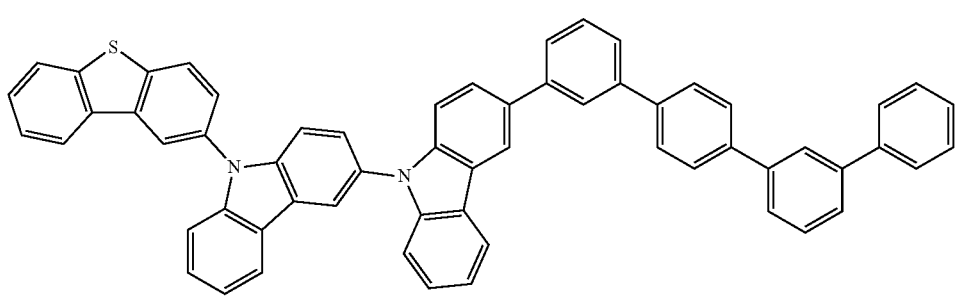
H-447

H-448
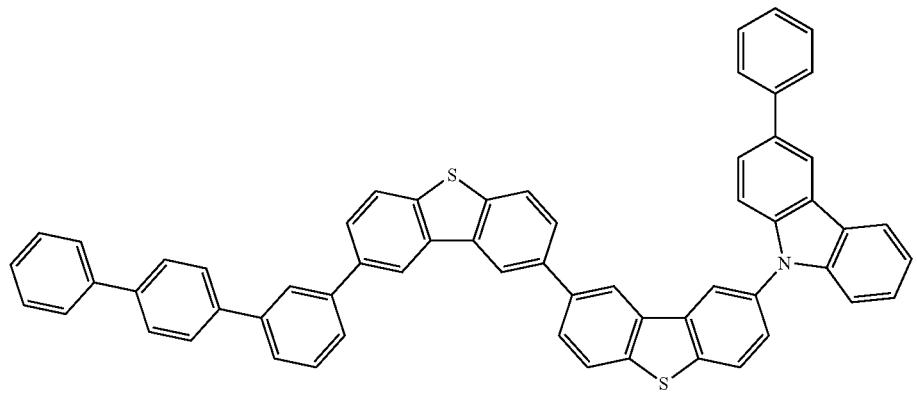
[Chemical Formula 72]
H-449
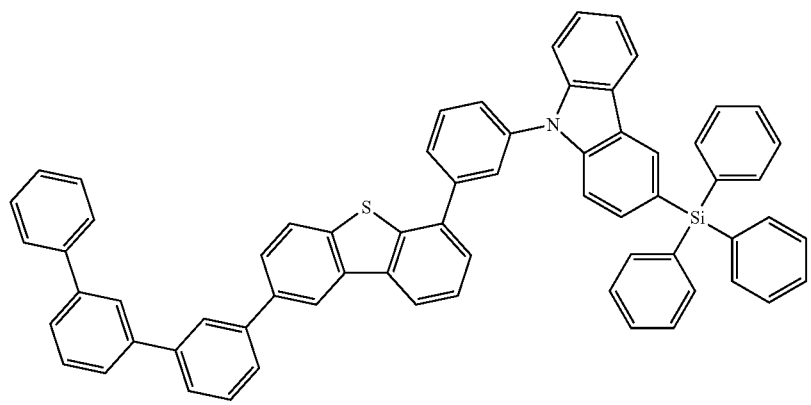
H-450
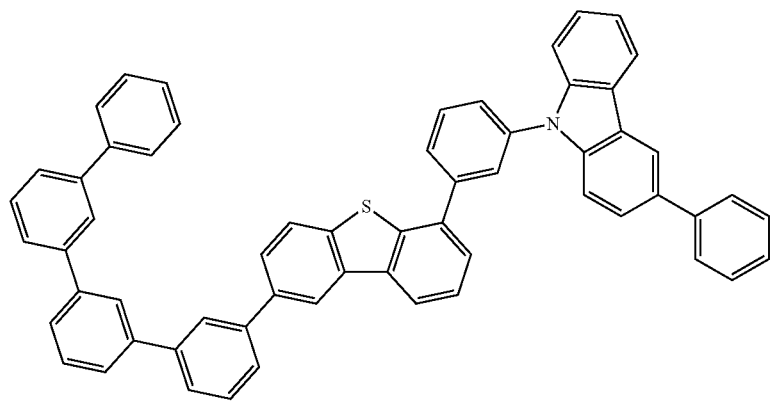
H-451
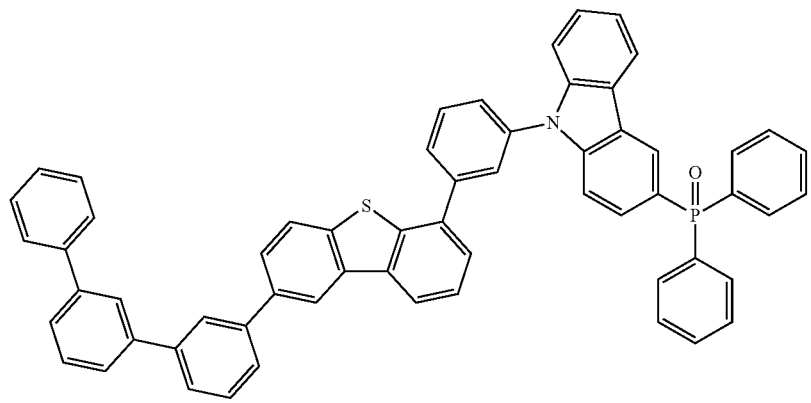

H-452
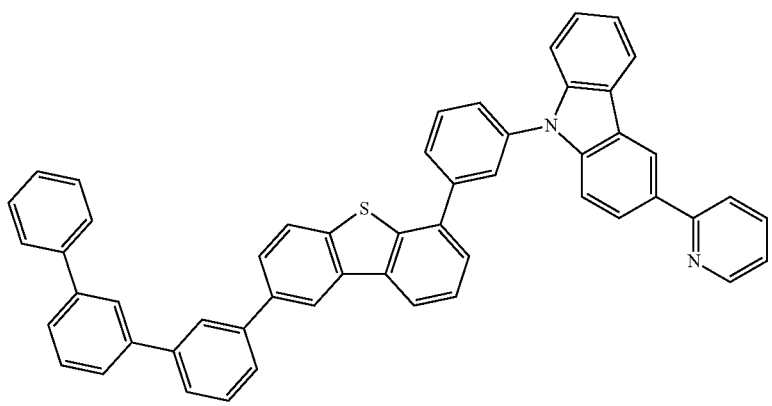
[Chemical Formula 73]
H-453
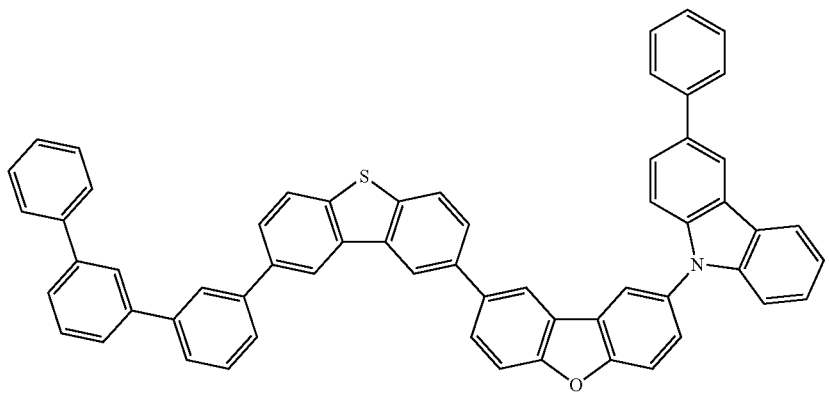
H-454
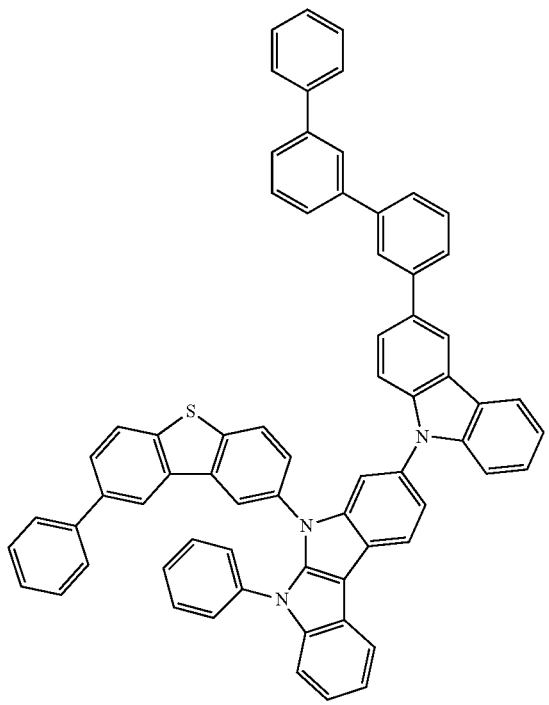

-continued
H-455
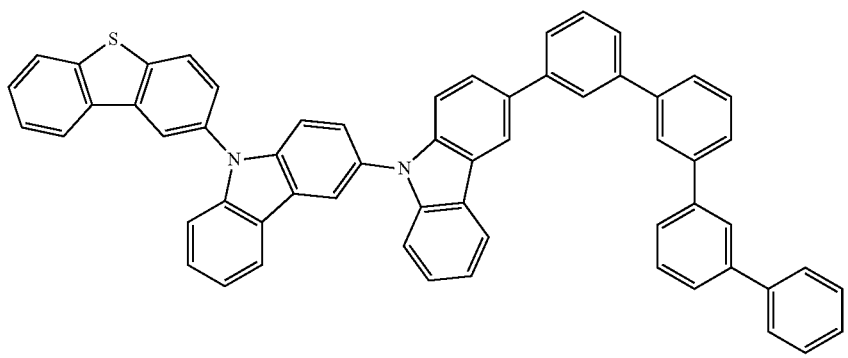
[Chemical Formula 74]
H-456
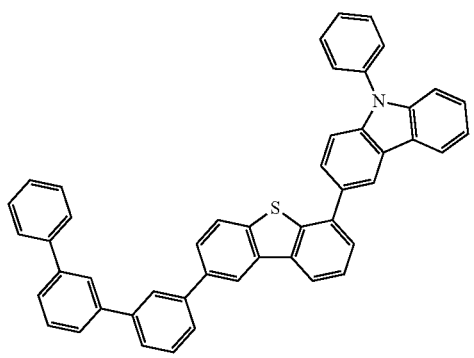
H-457
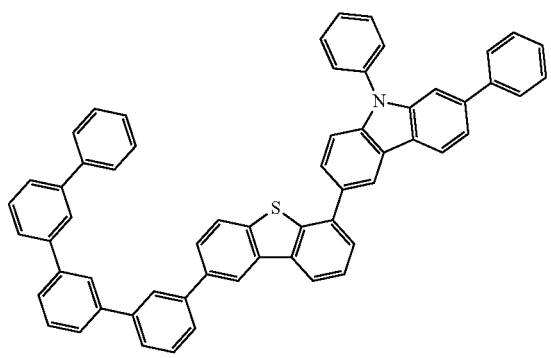
H-458
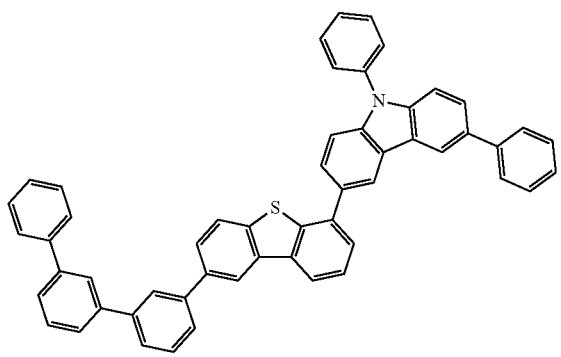
H-459
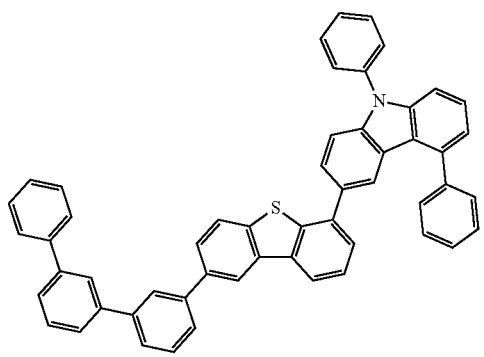
[Chemical Formula 75]
H-460
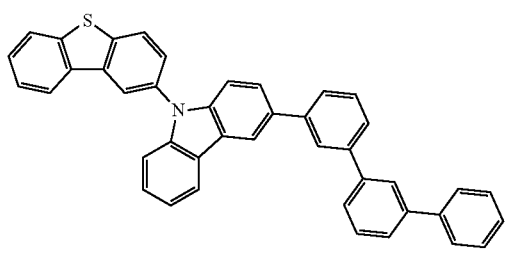
H-461
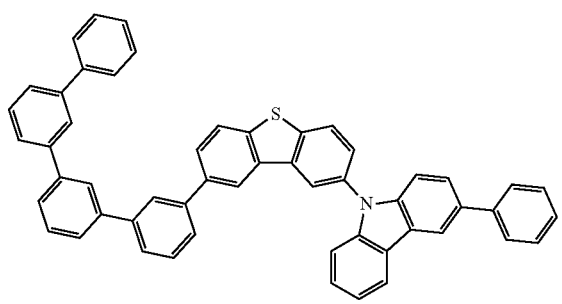

-continued
H-462
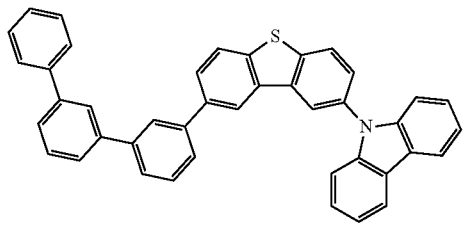
[Chemical Formula 76]
H-463
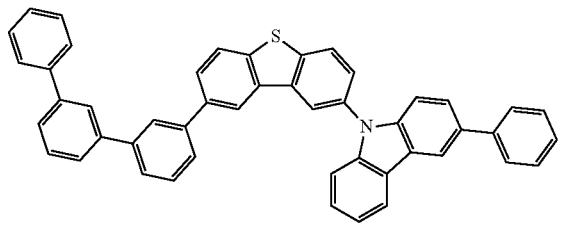
H-464
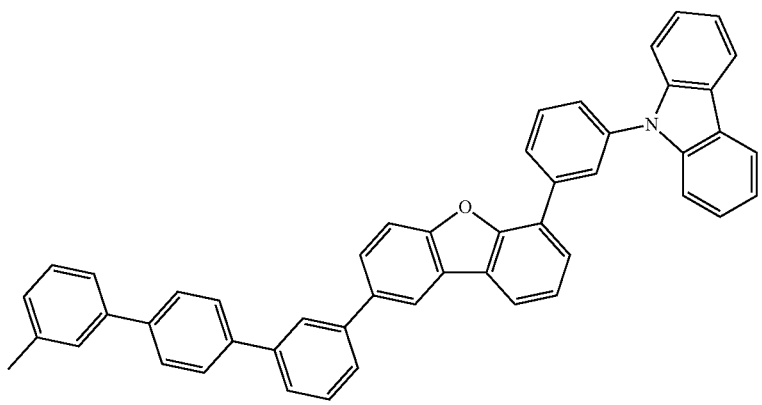
H-465
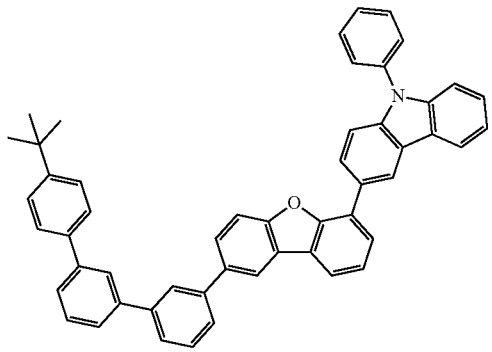
H-466
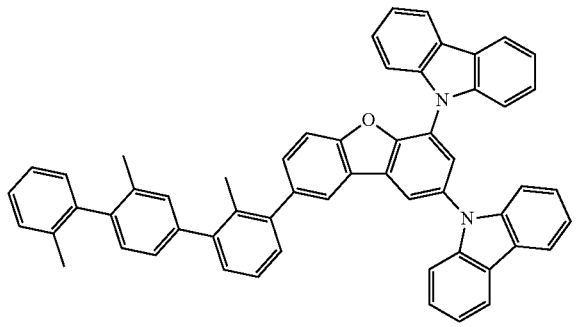

H-467
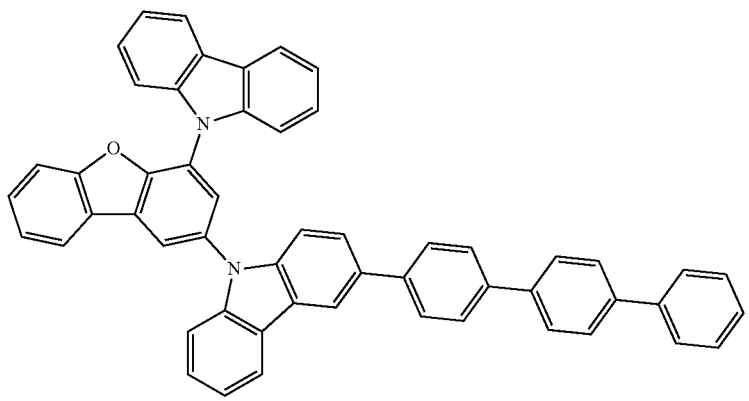
[Chemical Formula 77]
H-468
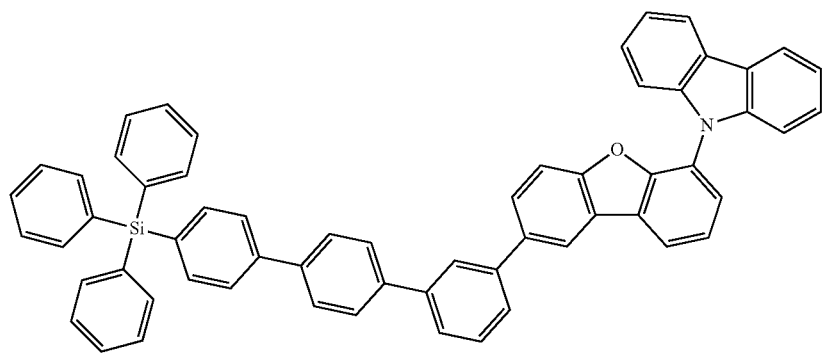
H-469
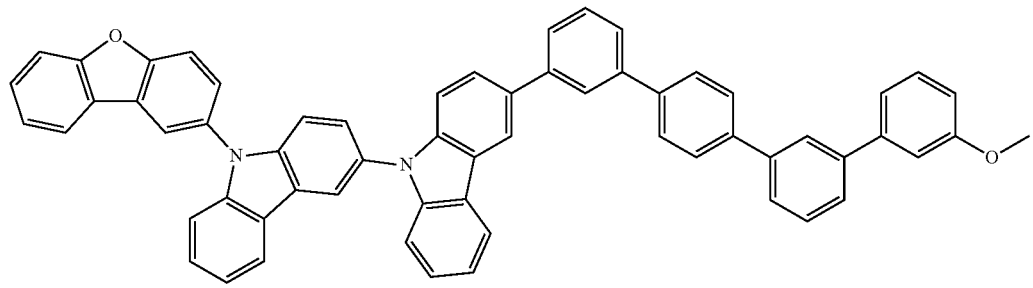
H-470
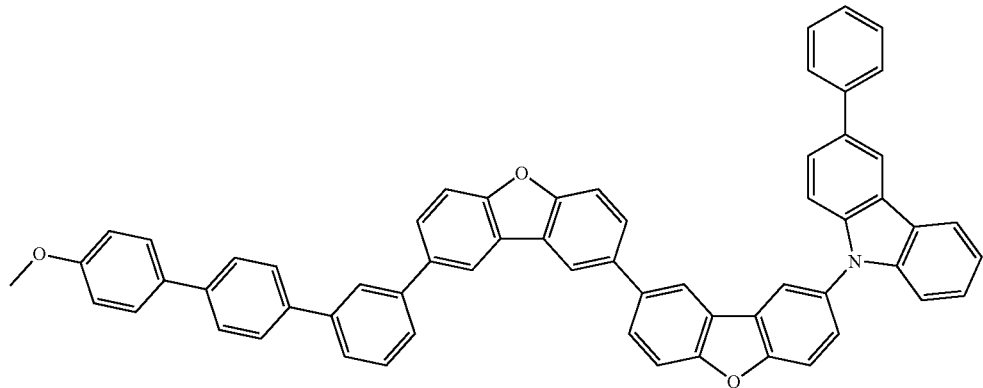

[Chemical Formula 78]
H-471
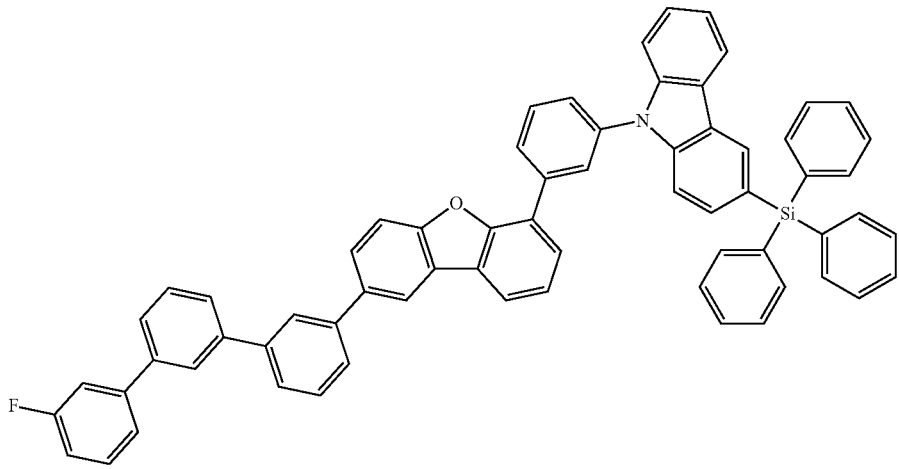
H-472
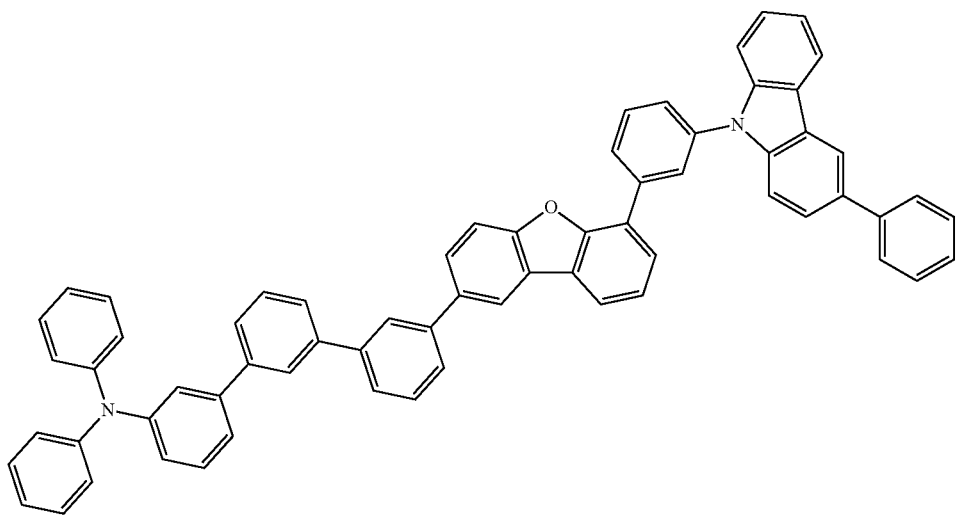
H-473
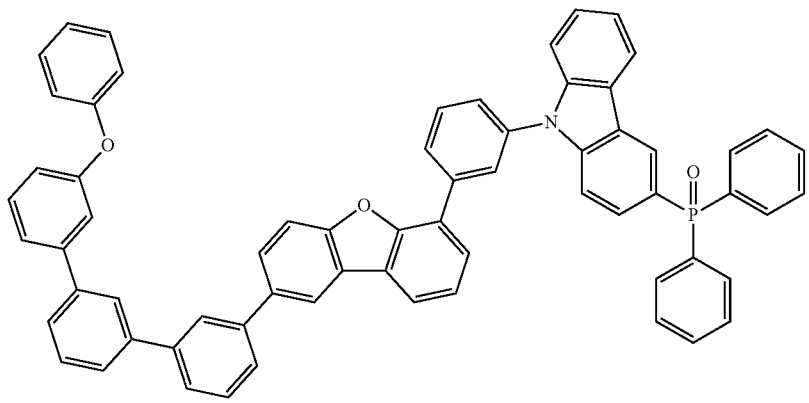

-continued
H-474
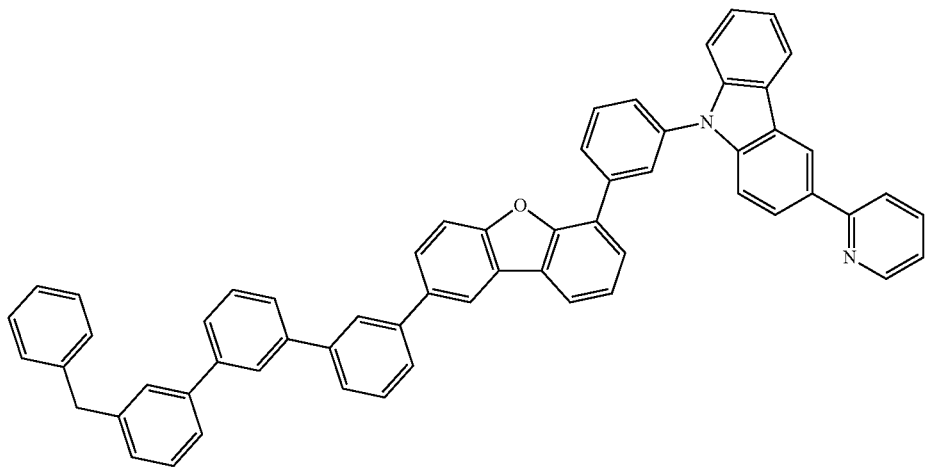
[Chemical Formula 79]
H-475
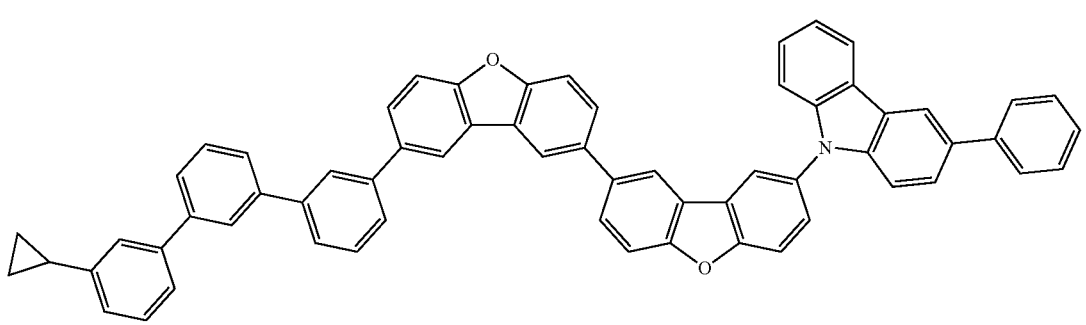
H-476
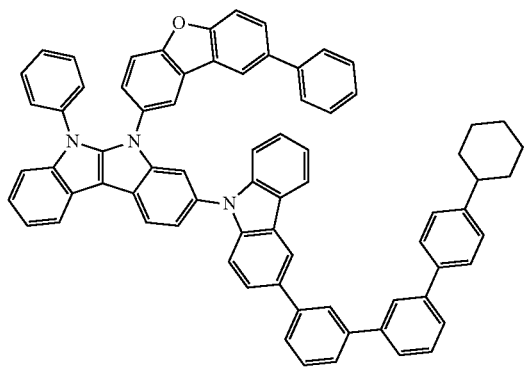
H-477
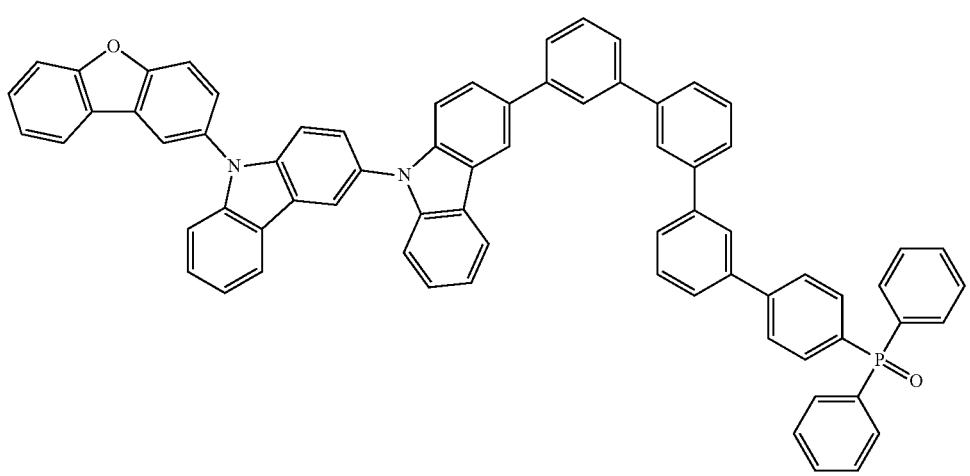

-continued
H-478
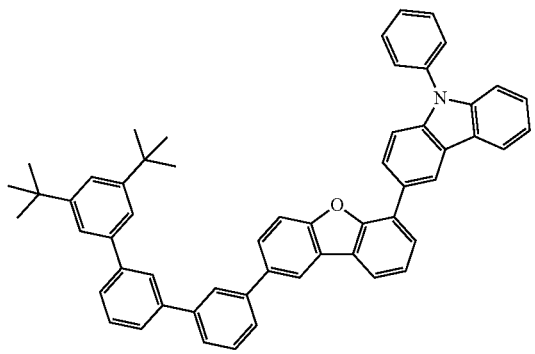
H-479
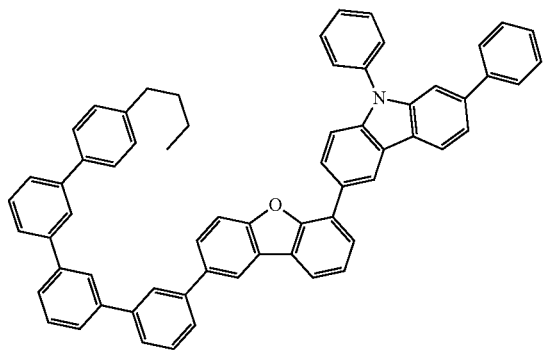
[Chemical Formula 80]
H-480
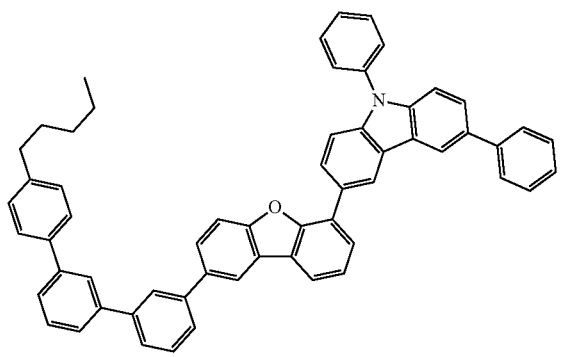
H-481
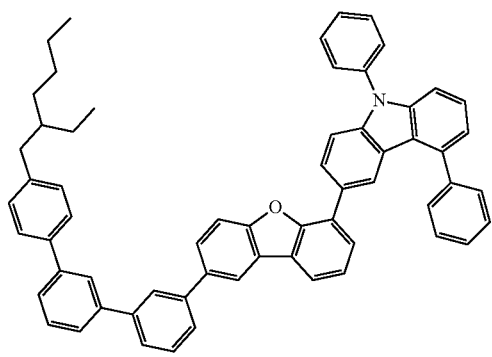
H-482
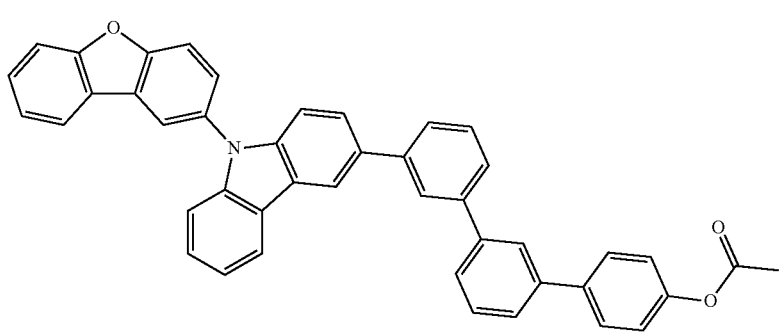
H-483
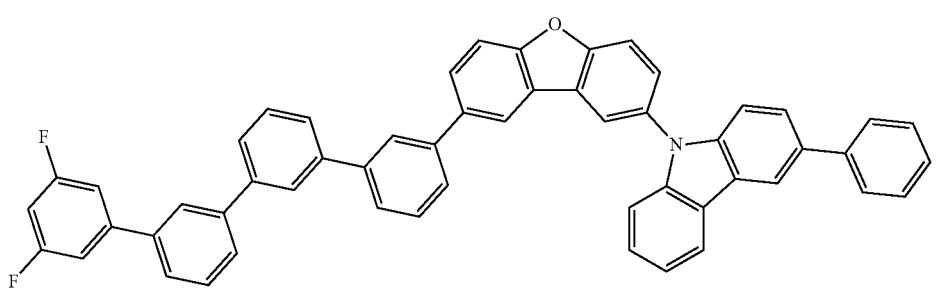

[Chemical Formula 81]
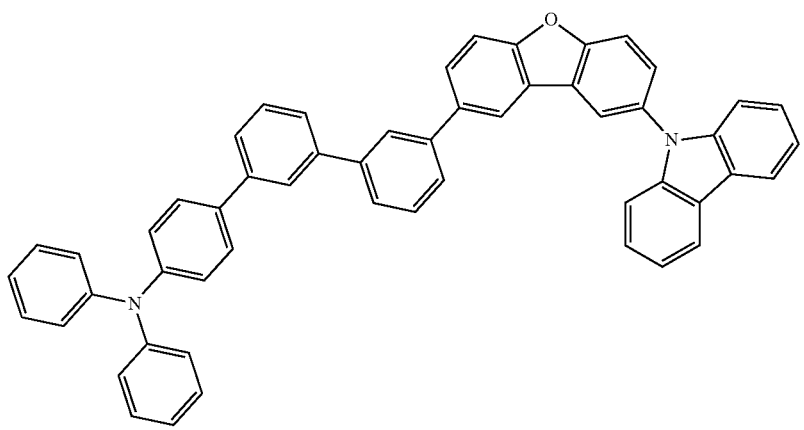
H-484
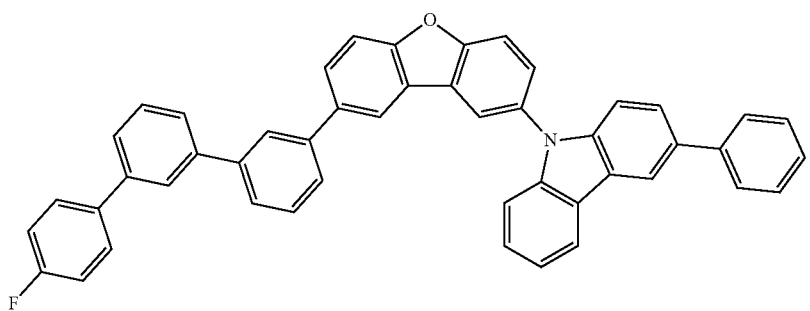
H-485
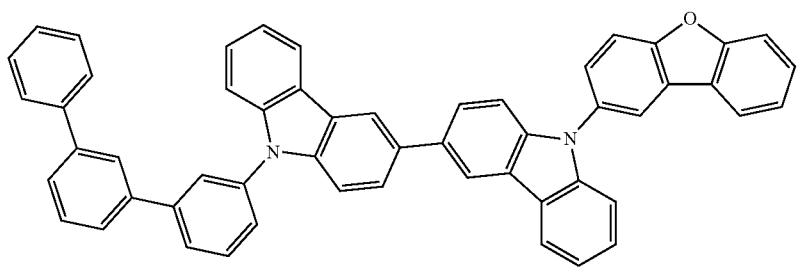
H-486
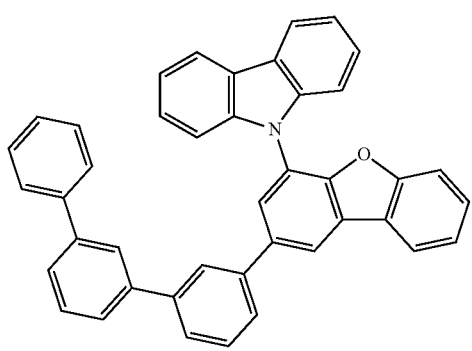
H-487
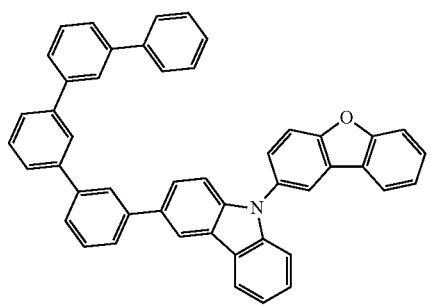
H-488

H-489
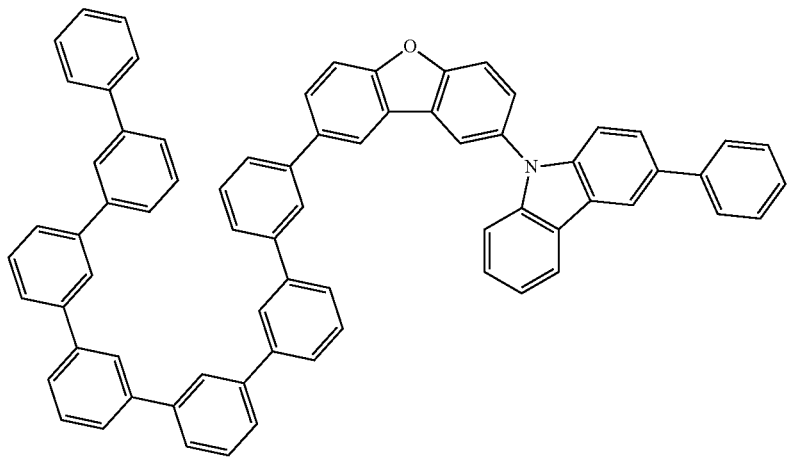
[Chemical Formula 82]
H-490
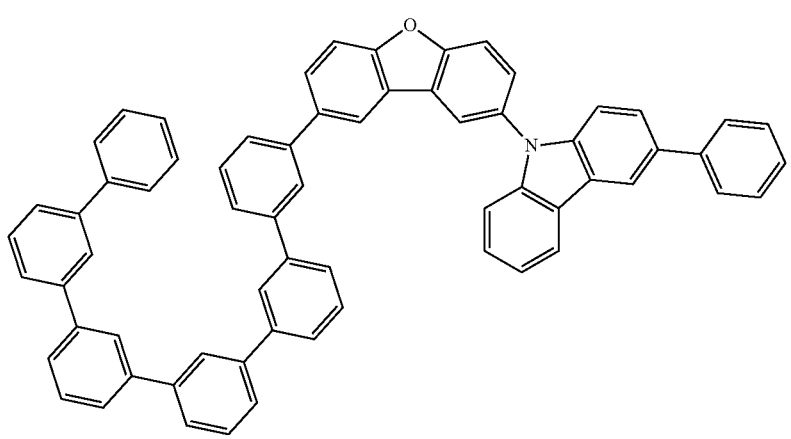
H-491 H-492
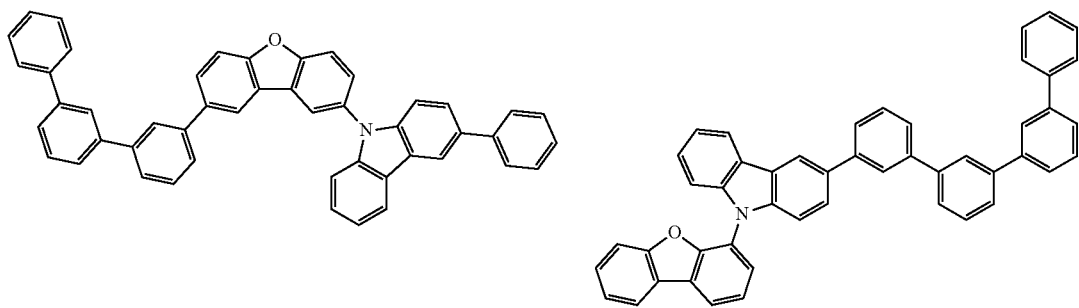
H-493
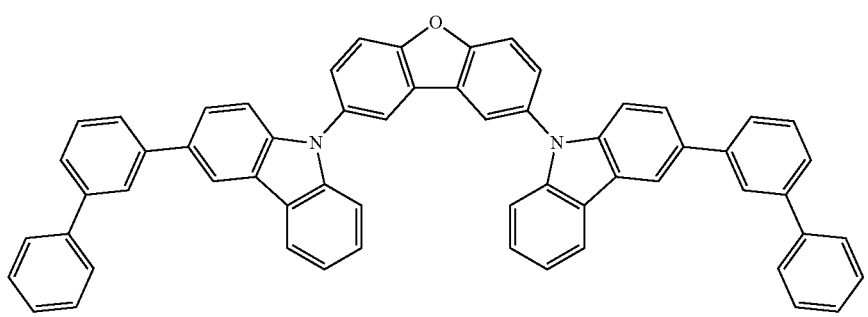

H-494

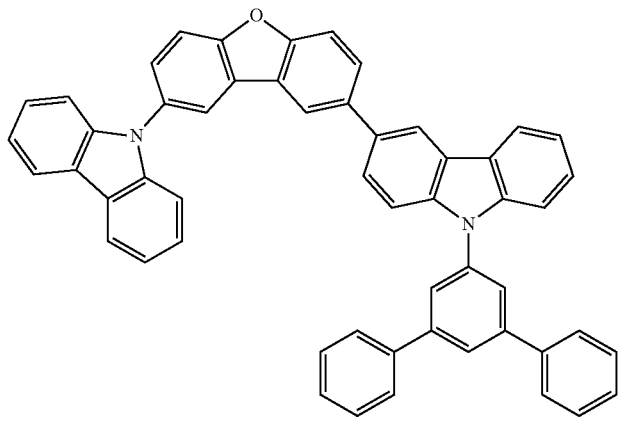

<Layers Composed of Organic EL Element>

Typical examples of the configuration of the organic EL element according to the present invention include, but should not be limited to:

(1) Anode/luminous layer/cathode
(2) Anode/luminous layer/electron transporting layer/cathode
(3) Anode/hole transporting layer/luminous layer/cathode
(4) Anode/hole transporting layer/luminous layer/electron transporting layer/cathode
(5) Anode/hole transporting layer/luminous layer/electron transporting layer/electron injecting layer/cathode
(6) Anode/hole injecting layer/hole transporting layer/luminous layer/electron transporting layer/cathode
(7) Anode/hole injecting layer/hole transporting layer/(electron blocking layer/) luminous layer/(hole blocking layer/) electron transporting layer/electron injecting layer/cathode Among these configurations, preferred is configuration (7), but other configurations are also applicable to the present invention.

The luminous layer according to the present invention is composed of a single layer or several layers. If the luminous layer is composed of several layers, a non-luminous intermediate layer may be disposed between the luminous layers.

A hole blocking layer (also referred to as hole barrier layer) and/or an electron injecting layer (also referred to as cathode buffer layer) may be disposed between the luminous layer and the cathode, or an electron blocking layer (also referred to as electron barrier layer) and/or an hole injecting layer (also referred to as anode buffer layer) may be disposed between the luminous layer and the anode when necessary.

The electron transporting layer according to the present invention can transport electrons, and the electron injecting layer and the hole blocking layer can be categorized into the electron transporting layer in a broad sense. The electron transporting layer may be composed of several layers.

The hole transporting layer according to the present invention has a function to transport holes, and can be categorized into the hole injecting layer and the electron blocking layer in a broad sense. The hole transporting layer according to the present invention may be composed of several layers.

Layers, other than the anode and the cathode, in the typical configuration of the element are also referred to as "organic layers."

(Tandem Structure)

The organic EL element according to the present invention may have a so-called tandem structure composed of a laminate of several luminous units each including at least one luminous layer.

A typical configuration of the element having a tandem structure include an anode, a first luminous unit, an intermediate layer, a second luminous unit, an intermediate layer, a third luminous unit, and a cathode.

The first, second, and third luminous units may have the same structure or different structures. Two of these luminous units may have the same structure and the other unit may have a different structure.

These luminous units may be directly laminated one another, or may be laminated with an intermediate layer interposed therebetween. The intermediate layer is usually referred to as intermediate electrode, intermediate conductive layer, charge generating layer, electron withdrawing layer, connection layer, or intermediate insulating layer. The intermediate layer can be composed of any known material which can feed electrons to its adjoining layer adjacent to the anode and holes to its adjoining layer adjacent to the cathode.

Non-limiting examples of the intermediate layer composed of such a material include conductive inorganic layers composed of compounds, such as indium.tin oxide (ITO), indium.zinc oxide (IZO), $ZnO_2$, TiN, ZrN, HfN, TiOx, VOx, CuI, InN, GaN, $CuAlO_2$, $CuGaO_2$, $SrCu_2O_2$, $LaB_6$, $RuO_2$, and Al; double-layer films composed of $Au/Bi_2O_2$; multi-layer films composed of $SnO_2/Ag/SnO_2$, ZnO/Ag/ZnO, $Bi_2O_3/Au/Bi_2O_3$, $TiO_2/TiN/TiO_2$, and $TiO_2/ZrN/TiO_2$; conductive organic layers composed of fullerenes, such as $C_{60}$, and oligothiophenes; and conductive organic compound layers composed of metal phthalocyanines, metal-free phthalocyanines, metal porphyrins, and metal-free porphyrins.

Although preferred configuration of the luminous units are typical configurations (1) to (7) of the element excluding the anode and the cathode, any other configuration is also applicable to the present invention.

Specific examples of the configurations and the materials of the tandem organic EL element include, but should not be limited to, those described in U.S. Pat. Nos. 6,337,492, 7,420,203, 7,473,923, 6,872,472, 6,107,734, and 6,337,492, WO 2005/009087, Japanese Patent Application Laid-Open Nos. 2006-228712, 2006-24791, 2006-49393, 2006-49394, 2006-49396, 2011-96679, and 2005-340187, Japanese Patent Nos. 4711424, 3496681, 3884564, and 4213169, Japanese Patent Application Laid-Open Nos. 2010-192719, 2009-076929, 2008-078414, 2007-059848, 2003-272860, and 2003-045676, and WO 2005/094130.

The layers forming the organic EL element according to the present invention will now be described.

[Luminous Layer]

The luminous layer according to the present invention recombines electrons and holes injected from electrodes and/or their adjacent layers to generate excitons, which emit light. The light emission may occur inside the luminous layer or at the interface between the luminous layer and its adjacent layer. The luminous layer according to the present invention can have any configuration which satisfies the requirements specified in the present invention.

The luminous layer can have any total thickness. The total thickness is controlled within the range of preferably 2 nm to 5 µm, more preferably 2 to 500 nm, still more preferably 5 to 200 nm to form a homogenous film, prevent application of significantly high voltage during light emission, and enhance the stability of the color of the emitted light to the driving current.

The luminous layers according to the present invention each have a thickness within the range of preferably 2 nm to 1 µm, more preferably 2 to 200 nm, still more preferably 3 to 150 nm.

The luminous layer according to the present invention preferably contains the TADF compound and the phosphorescent metal complex as luminous dopants (hereinafter also referred to as luminous dopant compound, dopant compound, or simply dopant) and the host compound (also referred to as matrix material or simply host).

(Wet Process)

The luminous layer according to the present invention is formed through a wet process. The wet process can produce a highly stable coating solution with reduced precipitation. The wet process can produce a uniform coating that can emit uniform light. A preferred wet process to form a film in the present invention is a coating process, such as spin coating, inkjetting, printing, or spray coating.

Examples of liquid media used to dissolve or disperse the organic EL element material used in the present invention include ketones, such as methyl ethyl ketone and cyclohexanone; fatty acid esters, such as ethyl acetate, isopropyl acetate, propylene glycol monomethyl ether acetate, and 3-methoxybutyl acetate; halogenated hydrocarbons, such as dichlorobenzene; aromatic hydrocarbons, such as toluene, xylene, mesitylene, and cyclohexylbenzene; non-fluoroalcohols, such as methanol, ethanol, propanol, and 2-propanol; fluoroalcohols such as trifluoroethanol (TFEO), tetrafluoropropanol (TFPO), and hexafluoropropanol (HFPO); aliphatic hydrocarbons, such as cyclohexane, decalin, and dodecane; and organic solvents, such as DMF and DMSO. A solvent having a boiling point ranging from 50 to 180° C. is suitably used to reduce the amount of the solvent contained in the element. The organic EL element material can be dispersed by ultrasonic, high shear force, or media dispersion.

The content of the solvent contained in the organic EL element in the present invention is within the range of 0.01 to 1 $\mu g/cm^2$. A content of 0.01 $\mu g/cm^2$ or less provides a low-density organic film to increase the voltage applied to the element being driven. A content of 1 $\mu g/cm^2$ or more causes scattering of substances or agglomeration of the luminous material during driving of the element to reduce the efficiency and the driving life. The content of the solvent can be determined by thermal desorption spectrometry.

[Electron Transporting Layer]

The electron transporting layer in the present invention is composed of a material having a function to transport electrons to transfer electrons injected from a cathode to the luminous layer.

The electron transporting layer according to the present invention can have any total thickness. The total thickness is controlled within the range of usually 2 nm to 5 µm, more preferably 2 to 500 nm, still more preferably 5 to 200 nm.

If the light beams generated in the luminous layer are extracted from an electrode of an organic EL element, the light beams directly extracted from the luminous layer interfere with those extracted after being reflected between the light extracting electrode and a counter electrode disposed facing the light extracting electrode. If the light is reflected on the cathode, the total thickness of the electron transporting layer can be appropriately controlled within the range of several nanometers to several micrometers to efficiently utilize this interference effect.

Since an increase in the thickness of the electron transporting layer, however, leads to an increase in driving voltage, a significantly thick electron transporting layer preferably has an electron mobility of $10^{-5}$ $cm^2/Vs$ or more.

The material for the electron transporting layer (hereinafter, also referred to as electron transport materiel) can have one of the electron injection, electron transportation, and hole barrier characteristics, and can be selected from known compounds for use.

Examples of such materials include nitrogen-containing aromatic heterocyclic derivatives (carbazole derivatives, azacarbazole derivatives (in which one of carbon atoms forming the carbazole ring is replaced by a nitrogen atom), pyridine derivatives, pyrimidine derivatives, pyrazine derivatives, pyridazin derivatives, triazine derivatives, quinoline derivatives, quinoxaline derivatives, phenanthroline derivatives, azatriphenylene derivatives, oxazole derivatives, triazole derivatives, oxadiazole derivatives, thiadiazole derivatives, triazole derivatives, benzimidazole derivatives, benzoxazole derivatives, and benzothiazole derivatives); dibenzofuran derivatives; dibenzothiophene derivatives; silole derivatives; and aromatic hydrocarbon ring derivatives (naphthalene derivatives, anthracene derivatives, and triphenylene).

Other examples of the usable electron transporting material include metal complexes coordinated with a ligand having a quinolinol or dibenzoquinolinol skeleton, such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq); and these metal complexes in which the central metals are replaced by In, Mg, Cu, Ca, Sn, Ga, or Pb.

Other preferred examples of the usable electron transporting material include metal-free or metal phthalocyanines and those having terminals replaced by an alkyl or sulfonate group. The distyrylpyrazine derivatives listed as the material for the luminous layer can also be used as the electron transporting material. Inorganic semiconductors, such as n-Si and n-SiC semiconductors, can also be used as in the hole injecting layer and the hole transporting layer.

These electron transporting materials can also be used in the form of polymer materials composed of these materials introduced into polymer chains or having main chains composed of these materials.

The electron transporting layer according to the present invention can also be used in the form of an n-rich (electron-rich) electron transporting layer doped with a dopant as a guest material. Examples of the dopant include n-dopants, such as metal complexes and metal compounds (such as halogenated metals). Specific examples of an electron transporting layer having such a configuration include those described in Japanese Patent Application Laid-Open Nos. 4-297076, 10-270172, 2000-196140, and 2001-102175, and J. Appl. Phys., 95, 5773 (2004).

Specific examples of preferred known electron transporting materials used in the organic EL element according to the present invention include, but should not be limited to, U.S. Pat. Nos. 6,528,187 and 7,230,107, U.S. Patent Application Nos. 2005/0025993, 2004/0036077, 2009/0115316, 2009/0101870, and 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 79, 156 (2001), U.S. Pat. No. 7,964,293, U.S. Patent Application No. 2009/030202, WO 2004/080975, WO 2004/063159, WO 2005/085387, WO 2006/067931, WO 2007/086552, WO 2008/114690, WO 2009/069442, WO 2009/066779, WO 2009/054253, WO 2011/086935, WO 2010/150593, WO 2010/047707, European Patent No. 2311826, Japanese Patent Application Laid-Open Nos. 2010-251675, 2009-209133, 2009-124114, 2008-277810, 2006-156445, 2005-340122, 2003-45662, 2003-31367, and 2003-282270, and WO 2012/115034.

Examples of more preferred electron transporting materials in the present invention include derivatives of pyridine, pyrimidine, pyrazine, triazine, dibenzofuran, dibenzothiophene, carbazole, azacarbazole, and benzimidazole.

These electron transporting materials can be used alone or in combination.

[Hole Blocking Layer]

The hole blocking layer in a broad sense functions as the electron transporting layer. Preferably, the hole blocking layer is composed of a material having high electron transportability and low hole transportability. Such a hole blocking layer can block holes while transporting electrons, thereby increasing the opportunities of recombination between electrons and holes.

The hole blocking layer according to the present invention may have the same configuration as that of the electron transporting layer described above when necessary.

The hole blocking layer of the organic EL element according to the present invention is preferably disposed on the luminous layer adjacent to the cathode.

The hole blocking layer according to the present invention has a thickness of preferably 3 to 100 nm, more preferably 5 to 30 nm.

Preferred materials for the hole blocking layer are the materials for the electron transporting layer and the materials for the host compounds described above.

[Electron Injecting Layer]

The electron injecting layer according to the present invention (also referred to as "cathode buffer layer") is disposed between the cathode and the luminous layer to reduce the driving voltage and enhance the luminance of the emitted light, and the details are described in Chapter 2 "Denkyoku zairyo (Electrode material)" (pp. 123 to 166) of Yuki EL Soshi to Sonokougyouka Saizensen (Organic electroluminescent elements and Their Frontiers of Industrial Applications) vol. 2 (Nov. 30, 1998, published by NTS Inc.).

The electron injecting layer in the present invention may be disposed between the cathode and the luminous layer or between the cathode and the electron transporting layer when necessary.

The electron injecting layer is preferably in the form of a very thin film. The thickness is preferably within the range of 0.1 to 5 nm although it depends on the material. The electron injecting layer may be in the form of a non-homogeneous film discontinuously containing the material for the electron injecting layer.

Detailed description on the electron injecting layer is also found in Japanese Patent Application Laid-Open Nos. 6-325871, 9-17574, and 10-74586. Specific examples of the materials preferably used in the electron injecting layer include metals, such as strontium and aluminum; alkali metal compounds, such as lithium fluoride, sodium fluoride, and potassium fluoride; alkaline earth metal compounds, such as magnesium fluoride and calcium fluoride; metal oxides, such as aluminum oxide; and metal complexes, such as lithium 8-hydroxyquinolate (Liq). The electron transporting materials listed above can also be used.

These materials for the electron injecting layer can be used alone or in combination.

[Hole Transporting Layer]

The hole transporting layer in the present invention is composed of a material having hole transporting ability, and can transfer holes injected into the anode to the luminous layer.

The hole transporting layer according to the present invention can have any total thickness. The total thickness is within the range of usually 5 nm to 5 μm, more preferably 2 to 500 nm, still more preferably 5 to 200 nm.

The material for the hole transporting layer (hereinafter referred to as hole transporting material) can have one of hole injection, hole transportation, and electron barrier characteristics, and can be selected form known compounds for use.

Examples of the known compounds include derivatives of porphyrin, phthalocyanine, oxazole, oxadiazole, triazole, imidazole, pyrazoline, pyrazolone, phenylenediamine, hydrazone, stilbene, polyarylalkane, triarylamine, carbazole, indolocarbazole, and isoindole; acene derivatives, such as anthracene and naphthalene; fluorene and fluorenone derivatives; poly(vinylcarbazole); polymer materials or oligomers having aromatic amine introduced into the main chain or the side chain; polysilane; and conductive polymers or oligomers (such as PEDOT/PSS, aniline copolymer, polyaniline, and polythiophene).

Examples of the triarylamine derivatives include benzidine derivatives such as a-NPD; star-burst triarylamine derivatives such as MTDATA; and compounds having fluorene or anthracene in triarylamine linking cores.

Other usable hole transporting materials are hexaazatriphenylene derivatives described in Japanese Unexamined Patent Application Publication (Tokuhyo) No. 2003-519432 and Japanese Patent Application Laid-Open No. 2006-135145.

A highly p-type hole transporting layer heavily doped with impurities can also be used. Examples of such a material include those described in Japanese Patent Application Laid-Open Nos. 4-297076, 2000-196140, and 2001-102175, and J. Appl. Phys., 95, 5773 (2004).

Other usable hole transporting materials are so-called p-type hole transporting materials and inorganic compounds, such as p-Si and p-SiC semiconductors, described in Japanese Patent Application Laid-Open No. 11-251067 and J. Huang, et al. (Applied Physics Letters 80 (2002), p. 139). Further preferred hole transporting materials are ortho-metalated organic metal complexes having a central metal of Ir or Pt, such as Ir(ppy)$_3$.

The hole transporting materials listed above can be used. Preferred are derivatives of triarylamine, carbazole, indolocarbazole, and azatriphenylene, organic metal complexes, and polymer materials or oligomers having aromatic amine introduced into the main chain or the side chain.

Non-limiting specific examples of known preferred hole transporting materials used in the organic EL element according to the present invention include compounds described in the above documents and those described in Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 51, 913 (1987), Synth. Met. 87, 171 (1997), Synth. Met. 91, 209(1997), Synth. Met. 111, 421 (2000), SID Symposium Digest, 37, 923(2006), J. Mater. Chem. 3, 319 (1993), Adv. Mater. 6, 677 (1994), Chem. Mater. 15, 3148 (2003), U.S. Application Patent Nos. 2003/0162053, 2002/0158242, 2006/0240279, and 2008/0220265, U.S. Pat. No. 5,061,569, WO 2007/002683, WO 2009/018009, European Patent No. 650955, U.S. Application Patent Nos. 2008/0124572, 2007/0278938, 2008/0106190, and 2008/0018221, WO 2012/115034, Japanese Unexamined Patent Application Publication (Tokuhyo) No. 2003-519432, Japanese Patent Application Laid-Open No. 2006-135145, and U.S. application patent Ser. No. 13/585, 981.

These hole transporting materials can be used alone or in combination.

[Electron Blocking Layer]

The electron blocking layer in a broad sense functions as the hole transporting layer. The electron blocking layer is preferably composed of a material having high hole transportability and low electron transportability. Such an electron blocking layer can block electrons while transporting holes, thereby increasing the opportunities of recombination between electrons and holes.

The electron blocking layer according to the present invention may have the same configuration as that of the hole transporting layer when necessary.

The electron blocking layer of the organic EL element according to the present invention is preferably disposed on the luminous layer adjacent to the anode.

The electron blocking layer according to the present invention has a thickness of preferably 3 to 100 nm, more preferably 5 to 30 nm.

Preferred materials for the electron blocking layer are the materials for the hole transporting layer and the materials for the host compounds described above.

[Hole Injecting Layer]

The hole injecting layer according to the present invention (also referred to as "anode buffer layer") is disposed between the anode and the luminous layer to reduce the driving voltage and enhance the luminance of the emitted light, and the details are described in Chapter 2 "Denkyoku zairyo (Electrode material)" (pp. 123 to 166) of Yuki EL Soshi to Sonokougyouka Saizensen (Organic electroluminescent elements and Their Frontiers of Industrial Applications) vol. 2 (Nov. 30, 1998, published by NTS Inc.).

The hole injecting layer in the present invention may be disposed between the anode and the luminous layer or between the anode and the hole transporting layer when necessary.

Detailed description of the hole injecting layer is also found in Japanese Patent Application Laid-Open Nos. 9-45479, 9-260062, and 8-288069. Examples of the material for the hole injecting layer include the materials for the hole transporting layer described above.

Among these materials, preferred are phthalocyanine derivatives, such as copper phthalocyanine, hexaazatriphenylene derivatives described in Japanese Unexamined Patent Application Publication (Tokuhyo) No. 2003-519432 and Japanese Patent Application Laid-Open No. 2006-135145, metal oxides, such as vanadium oxide, amorphous carbon, conductive polymers, such as polyaniline (emeraldine) and polythiophene, ortho-metalated complexes, such as tris(2-phenylpyridine)iridium complex, and triarylamine derivatives.

These materials for the hole injecting layer described above may be used alone or in combination.

[Additives]

The organic layer in the present invention may further contain other additives.

Examples of the additive include halogen elements, such as bromine, iodine, and chlorine; halogenated compounds; compounds, complexes, and salts of alkali metals, such as Na, alkaline earth metals, such as Ca, and transition metals, such as Pd.

The organic layer can contain the additive in any amount. The content is preferably 1000 ppm or less, more preferably 500 ppm or less, still more preferably 50 ppm or less of the total mass of the organic layer.

It should be noted that the additives can be contained in an amount out of this range to enhance electron or hole transportability or facilitate energy transfer of excitons.

[Formation of Organic Layer]

The process of forming the organic layer according to the present invention (such as a hole injecting layer, a hole transporting layer, a luminous layer, a hole blocking layer, an electron transporting layer, and an electron injecting layer) will be described.

The organic layer according to the present invention can be formed by any known process, such as vacuum evaporation and wet processes.

Examples of the wet process include spin coating, casting, inkjetting, printing, die coating, blade coating, roll coating, spray coating, curtain coating, and Langmuir Blodgett (LB) process. Preferred are die coating, roll coating, inkjetting, and spray coating, which are highly applicable to the roll-to-roll method to provide homogenous thin films at high productivity.

Examples of liquid media used to dissolve or disperse the organic EL material used in the present invention include ketones, such as methyl ethyl ketone, and cyclohexanone; fatty acid esters, such as ethyl acetate; halogenated hydrocarbons, such as dichloroobenzene; aromatic hydrocarbons, such as toluene, xylene, mesitylene, and cyclohexylbenzene; aliphatic hydrocarbons, such as cyclohexane, decalin, and dodecane; and organic solvents, such as DMF and DMSO.

The organic EL material can be dispersed by ultrasonic, high shear force, or media dispersion.

Individual layers can be formed by different processes. The conditions on deposition vary according to the compound to be used in film formation by a deposition process, and optimal conditions are usually selected within a boat heating temperature of 50 to 450° C., a degree of vacuum of $10^{-6}$ to $10^{-2}$ Pa, a deposition rate of 0.01 to 50 nm/sec, a substrate temperature of −50 to 300° C., and a thickness of 0.1 nm to 5 μm, preferably 5 to 200 nm.

The organic layer according to the present invention is preferably formed in a single vacuum process from formation of the hole injecting layer through the cathode. Alternatively, the workpiece may be extracted during a formation produce, and may be subjected to a different formation process. In this case, the workpiece is preferably treated under a dry inert gas atmosphere.

[Anode]

The anode in the organic EL element is preferably composed of an electrode material having a large work function (4 eV or more, preferably 4.5 eV or more). Examples of such an electrode material include metals and alloys thereof, conductive compounds, and mixtures thereof. Specific examples of the electrode material include metals, such as Au; and conductive transparent materials, such as CuI, indium.tin oxide (ITO), $SnO_2$, and ZnO. Other examples thereof include materials, such as $In_2O_3$—ZnO (IDIXO), which can be formed into amorphous transparent conductive films.

The anode can be formed with these electrode materials into a thin film by a process, such as deposition or sputtering. The anode may be etched into a desired pattern by photolithography. If high patterning accuracy is not required (about 100 µm or more), the pattern may be formed through a mask having a desired pattern during the film formation by deposition or sputtering of the electrode material.

A coatable material, such as an organic conductive compound, can be formed into a film by a wet process, such as printing or coating. The anode should preferably have a transmittance of more than 10% to transmit the emitted light therefrom. The anode preferably has a sheet resistance of several hundreds ohms per square or less.

The thickness is selected from the range of usually 10 nm to 1 µm, preferably 10 to 200 nm although it depends on the material.

[Cathode]

The cathode is composed of an electrode material having a small work function (4 eV or less). Examples thereof include metals (referred to as electron injecting metals) and alloys thereof, conductive compounds, and mixtures thereof. Specific examples of such an electrode material include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, aluminum, and rare earth metals. Among these materials, in view of electron injection property and durability of oxidation and such like, suitable are mixtures of electron injecting metals and second metals having stability because of their work functions larger than those of electron injecting metals, such as magnesium/silver mixtures, magnesium/aluminum mixtures, magnesium/indium mixtures, aluminum/aluminum oxide ($Al_2O_3$) mixtures, lithium/aluminum mixtures, and aluminum.

The cathode can be formed with these electrode materials into a thin film by deposition or sputtering. The cathode preferably has a sheet resistance of several hundreds ohms per square or less. The thickness is selected from the range of usually 10 nm to 5 µm, preferably 50 to 200 nm.

The organic EL element preferably transmits the emitted light through a transparent or translucent anode or cathode to enhance the luminance of the emitted light.

The metal can be deposited on the cathode into a thickness of 1 to 20 nm, and the conductive transparent material listed as the material for the anode can be disposed thereon to prepare a transparent or translucent cathode. This process can be used to prepare an element including an anode and a cathode both having transmittance.

[Support Substrate]

The organic EL element according to the present invention can be composed of any support substrate (hereinafter also referred to as base, substrate, base material, and support). The support substrate may be composed of glass or plastics, and may be transparent or opaque. The support substrate should preferably be transparent to extract light therefrom. Examples of preferred materials for the transparent support substrates include glass, quartz, and transparent resin films. Particularly preferred materials for the support substrate are resin films which impart flexibility to the organic EL element.

Examples of such resin films include polyesters, such as poly(ethylene terephthalate) (PET) and poly(ethylene naphthalate) (PEN); polyethylene; polypropylene; cellophane; cellulose esters, such as cellulose diacetate, cellulose triacetate (TAC), cellulose acetate butyrate, cellulose acetate propionate (CAP), cellulose acetate terephthalate, and cellulose nitrate or derivatives thereof; poly(vinylidene chloride); poly(vinyl alcohol); poly(ethylenevinyl alcohol); syndiotactic polystyrenes; polycarbonates; norbornene resins; polymethylpentene; polyether ketone; polyimides; poly (ether sulfone (PES); poly(phenylene sulfide); polysulfones; polyether imides; polyether ketone imide; polyamides; fluorinated resins; nylon; poly(methyl methacrylate); acrylates or polyarylates; and cycloolefin resins, such as ARTON (trade name, made by JSR Corporation) and APEL (trade name, made by Mitsui Chemicals, Inc.).

The resin film may have a coating film of an inorganic or organic material or an inorganic/organic hybrid coating film on the surface thereof. The coating film preferably barrier characteristics, that is, a moisture permeation rate of 0.01 $g/m^2 \cdot 24$ h or less determined at 25±0.5° C. and a relative humidity of 90±2% RH in accordance with JIS K 7129-1992. The coating film preferably has high barrier characteristics, that is, an oxygen permeation rate of $1 \times 10^{-3}$ $ml/m^2 \cdot 24$ h·atm or less determined in accordance with JIS K 7126-1987 or less and a moisture permeation rate of $1 \times 10^{-5}$ $g/m^2 \cdot 24$ h or less.

The barrier film can be composed of any material which can block intrusion of substances, such as moisture and oxygen, which will deteriorate organic EL elements. The barrier film can be composed of silicon oxide, silicon dioxide, or silicon nitride, for example. The barrier film more preferably has a laminate structure composed of inorganic and organic layers to improve strength. The inorganic layer and the organic layer can be laminated in any order. Preferably, inorganic layers and organic layers are alternatingly laminated.

The barrier film can be formed by any process, such as vacuum evaporation, sputtering, reactive sputtering, molecular beam epitaxy, cluster ion beaming process, ion plating, plasma polymerization, atmospheric pressure plasma polymerization, plasma chemical vapor deposition (CVD), laser CVD, thermal CVD, or coating. Particularly preferred is atmospheric pressure plasma polymerization described in Japanese Patent Application Laid-Open No. 2004-68143.

Examples of the opaque support substrate include metal plates made of aluminum and stainless steel, films, opaque resin substrates, and ceramic substrates.

The organic EL element according to the present invention extracts the emitted light at room temperature (25° C.) at an external quantum efficiency of preferably 1% or more, more preferably 5% or more.

The external quantum efficiency (%) is defined by an expression: external quantum efficiency (%)=((the number of photons emitting light from organic EL element)/(the number of electrons flowing in organic EL element)×100.

The organic EL element according to the present invention may include a hue improving filter, such as a color filter, or a color converting filter containing a fluorescent substance to convert the light emitted from the organic EL element into multi-colored light.

[Sealing]

The organic EL element according to the present invention can be sealed through bonding of a sealing member, an electrode, and a support substrate with an adhesive, for example. The sealing member can be disposed over the display region of the organic EL element. The sealing member may be a concave or flat plate. The sealing member can be accepted regardless of transparency and electric insulation.

Specific examples of the sealing member include glass plates, polymer plates and films, and metal plates and films. Examples of materials for the glass plates include soda lime glass, barium.strontium-containing glass, lead glass, aluminosilicate glass, borosilicate glass, barium borosilicate glass, and quartz. Examples of materials for the polymer plates include polycarbonate, acrylates, polyethylene terephthalate, poly(ether sulfide), and polysulfone. Examples of materials for the metal plates include one or more metals selected from the group consisting of stainless steel, iron, copper, aluminum, magnesium, nickel, zinc, chromium, titanium, molybdenum, silicon, germanium, and tantalum or alloys thereof.

Preferred in the present invention are polymer films and metal films, which can attain thin organic EL elements. The polymer films preferably have an oxygen permeation rate of $1\times10^{-3}$ ml/m$^2$·24 h·atm or less determined in accordance with JIS K 7126-1987 and a moisture permeation rate of $1\times10^{-3}$ g/m$^2$·24 h or less determined at 25±0.5° C. and a relative humidity of 90±2% in accordance with JIS K 7129-1992.

The sealing member is processed into a concave surface by sandblasting or chemical etching.

Specific examples of the adhesive include photocurable and thermosetting adhesives of acrylic and methacrylic oligomers having reactive vinyl groups, and moisture-curable adhesives of 2-cyanoacrylic acid esters. Examples of the adhesive include epoxy heatsetting and chemosetting (binary systems) adhesives. Other examples thereof include hot-melt polyamide, polyester, and polyolefin adhesives. Further examples thereof include cationic UV-curable epoxy resin adhesives.

An adhesive curable at a temperature from room temperature to 80° C. to bond the workpiece is preferred to prevent deterioration of the organic EL element during heat treatment. The adhesive may contain a desiccant dispersed therein. The adhesive may be applied to the bonding portions with a commercially available dispenser or by a printing process, such as screen printing.

Alternatively, a sealing film composed of an inorganic layer and an organic layer can be suitably disposed on the support substrate so as to cover the electrode remote from the support substrate and the organic layer underlying the electrode. In this case, the sealing film can be formed of any material which can block intrusion of substances, such as moisture and oxygen, which cause deterioration of organic EL elements. Silicon oxide, silicon dioxide, and silicon nitride can be used, for example.

The sealing film preferably has a laminate structure composed of these inorganic and organic layers to improve the strength of the film. The sealing film can be formed by any process, such as vacuum evaporation, sputtering, reactive sputtering, molecular beam epitaxy, cluster ion beaming, ion plating, plasma polymerization, atmospheric pressure plasma polymerization, plasma CVD, laser CVD, thermal CVD, or coating.

The organic EL element has a gap between the sealing member and the display region. The gap preferably contains an inert gas, such as nitrogen or argon, or an inert liquid, such as fluorohydrocarbon or silicone oil, in the form of a gaseous or liquid phase. The gap may also be in vacuum. Alternatively, the gap may contain a hygroscopic compound encapsulated therein.

Examples of the hygroscopic compound include metal oxides (such as sodium oxide, potassium oxide, calcium oxide, barium oxide, magnesium oxide, and aluminum oxide), sulfurates (such as sodium sulfate, calcium sulfate, magnesium sulfate, and cobalt sulfate), metal halides (such as calcium chloride, magnesium chloride, cesium fluoride, tantalum fluoride, cerium bromide, magnesium bromide, barium iodide, and magnesium iodide), and perchlorates (such as barium perchlorate and magnesium perchlorate). Suitably used are anhydrides of sulfurates, metal halides, and perchlorates.

[Protective Film or Plate]

A protective film or plate may be disposed on or over the sealing film remote from the support substrate to enhance the mechanical strength of the organic EL element. In particular, such a protective film or plate is preferably disposed in organic EL elements encapsulated by the sealing film because such elements do not always have sufficient mechanical strength. Examples of usable materials for the protective film or plate include glass plates, polymer plates and films, and metal plates and films that are the same as those used in sealing. Preferred are polymer films, which can achieve thin lightweight organic EL elements.

[Enhancement in Out-Coupling Efficiency]

A typical organic electroluminescent element emits light inside a layer having a refractive index (about 1.6 to 2.1) higher than that of the air, and extracts at most about 15% to 20% of the light generated in the luminous layer. This is because the light components incident on the interface (interface between the transparent substrate and the air) at an angle θ equal to or more than the critical angle are totally reflected on the interface, and cannot be extracted from the element. Moreover, light components are totally reflected between the transparent electrode or luminous layer and the transparent substrate, are transmitted through the transparent electrode or the luminous layer, and finally escape to the sides of the element.

Examples of the measures for enhancing light out-coupling efficiency include formation of irregularities on the surface of a transparent substrate to prevent total reflection of light at the interface between the transparent substrate and the air (for example, U.S. Pat. No. 4,774,435); use of a light-convergent substrate in an organic EL element to enhance the light out-coupling efficiency (for example, Japanese Patent Application Laid-Open No. 63-314795); formation of a reflecting surface on side surfaces of an organic EL element (for example, Japanese Patent Application Laid-Open No. 1-220394); disposition of a planarizing layer between a substrate and a luminous substance to form an antireflection film having a middle refractive index between the substrate and the luminous substance (for example, Japanese Patent Application Laid-Open No. 62-172691); disposition of a planarizing layer between a substrate and a luminous substance, the planarizing layer having a refractive index lower than that of the substrate (for example, Japanese Patent Application Laid-Open No. 2001-202827); and disposition of a diffraction grating between any two adjacent layers of a substrate, a transparent electrode layer, and a luminous layer (including the interface between the substrate and the outside of an organic EL element) (for example, Japanese Patent Application Laid-Open No. 11-283751).

In the present invention, a combination of these measures can be applied to the organic electroluminescent element according to the present invention. Preferred is disposition of a planarizing layer between a substrate and a luminous substance, the planarizing layer having a refractive index lower than that of the substrate or disposition of a diffraction grating between any two adjacent layers of a substrate, a transparent electrode layer, and a luminous layer (including the interface between the substrate and the outside of an organic EL element).

The present invention can employ these measures in combination to enhance the luminance or durability of the organic EL element.

If a low-refractive index medium having a thickness greater than the wavelength of light to be generated is disposed between the transparent electrode and the transparent substrate, the out-coupling efficiency to the exterior of the light from the transparent electrode increases as the refractive index of the medium decreases.

Examples of such a low-refractive index layer include aerogel, porous silica, magnesium fluoride, and fluorine polymers. The transparent substrate generally has a refractive index of about 1.5 to 1.7. The low-refractive index layer preferably has a refractive index of 1.5 or less. The refractive index is more preferably 1.35 or less.

The thickness of the low-refractive index medium is desirably at least two times the wavelength of the light in the medium. If the thickness of the low-refractive index medium is approximately equal to the wavelength of the light, such a thickness allows evanescent electromagnetic waves to intrude into the substrate to decrease the effect of the low-refractive index layer.

Disposition of a diffraction grating at the interface between any two adjacent layers or inside any medium totally reflecting light is highly effective in an enhancement in light out-coupling efficiency. The diffraction grating can orient light to a specific direction due to so-called Bragg diffraction, such as primary diffraction or secondary diffraction, rather than refraction of the light. Such features of the diffraction grating are utilized to extract the light beams from the organic EL element. Specifically, the diffraction grating is disposed between any two adjacent layers or inside the medium (transparent substrate or the transparent electrode) to diffract the light beams which are generated in the luminous layer but cannot be extracted from the organic EL element due to total reflection at the interface.

The diffraction grating desirably has a two-dimensional periodic pattern on the refractive index. The light beams emitted from the luminous layer are radiated in random directions. A typical one-dimensional diffraction grating having a periodic refractive index distribution in one specific direction diffracts only the light beams traveling in the specific direction, and does not significantly contribute to the light out-coupling efficiency of the light beams radiated in random directions.

A diffraction grating having a two-dimensional refractive index distribution, however, diffracts the light beams traveling in every direction to enhance the light out-coupling efficiency.

The diffraction grating can be disposed at the interface between any two adjacent layers or inside any medium (inside the transparent substrate or the transparent electrode). Desirably, the diffraction grating is disposed adjacent to the organic luminous layer which generates the light beams. The period of the diffraction grating at this time is preferably about half to triple the wavelength of the light in the medium. The diffraction grating is preferably composed of a two-dimensional repeating pattern consisting of, for example, squares, triangles, or honeycombs arranged into a lattice.

[Light-Condensing Sheet]

The organic electroluminescent element according to the present invention can include a microlens array structure disposed on the light-extracting surface of the support substrate (substrate) or include a light-condensing sheet to condense light in a specific direction, such as the front of the luminous surface of the element, thereby enhancing the luminance in the specific direction.

An exemplary microlens array is composed of quadrangular pyramids having a side of 30 μm and an apex angle of 90 degrees and two-dimensionally arranged on the light-extracting surface of the substrate. The side is preferably within the range of 10 to 100 μm. A side less than 10 μm causes diffraction to change the color of the light. A side more than 100 μm increases the thickness of the element.

An exemplary light-condensing sheet includes those used in backlights for liquid crystal display (LED) devices. Examples of such sheets include a brightness enhancing film (BEF) made by Sumitomo 3M Limited. An exemplary prism sheet is composed of a base substrate provided with stripes consisting of pyramidal prisms having an apex angle of 90 degrees and a pitch of 50 μm. The prisms may have round apices, or may be disposed at randomized pitches. Alternatively, the prisms may have any other shape.

A light diffusion plate or film can be used in combination with the light-condensing sheet to control the emission angle of the light from the organic EL element. A diffusion film LIGHT-UP made by Kimoto Co., Ltd. can be used, for example.

[Applications]

The organic EL element according to the present invention can be used in display devices, display panels, and a variety of light-emitting sources.

Examples of the light-emitting sources include, but should not be limited to, lighting devices (house lightings, car interior lightings), backlights for clocks, watches, and liquid crystal devices, advertising signs, traffic signals, and light sources for optical storage media, electrophotographic copiers, optical communication processors, and optical sensors. The organic EL element according to the present invention can be particularly effectively used in applications to backlights for liquid crystal display devices and light sources for lighting devices.

The organic EL element according to the present invention can include a layer patterned using a metal mask or by inkjet printing during formation of the layer. The patterning can be performed on only the electrode, both of the electrode and the luminous layer, or all of the layers in the element. The organic EL element can be prepared by any known process.

The colors of the light beams emitted from organic EL element according to the present invention and the compound according to the present invention are determined from the results measured with a spectroradiometric luminance meter CS-1000 (made by Konica Minolta, Inc.) with reference to the CIE chromaticity coordinates shown in FIG. 4. 16 in page 108 of "Shinpen Shikisai Kagaku Handobukku (New Scientific Handbook of Color)" (edited by the Color Science Association of Japan, published by University of Tokyo Press, 1985).

If the organic EL element according to the present invention emits white light, the term "white" indicates that the chromaticity at 1000 cd/m$^2$ in the CIE1931 color system is within the region defined by X=0.33±0.07 and Y=0.33±0.1 in the measurements of the front luminance at a view angle of 2 degrees by the method described above.

<Display Device>

The display device according to the present invention includes the organic EL element according to the present invention. The display device according to the present invention may be a unicolor or multi-color display device. A multi-color display device will now be described.

Layers of the multi-color display device can be formed through application of coating solutions over underlying layers by a process, such as deposition, casting, spin coating, inkjetting, or printing, whereas only the luminous layer is formed through a shadow mask.

If only the luminous layer is formed into a pattern, the luminous layer can be patterned by any process. Preferred processes are deposition, inkjetting, spin coating, and printing.

The organic EL element included in the display device has a configuration selected from the exemplary configurations of the organic EL element listed above, when necessary.

The organic EL element is prepared by the process described as an embodiment of preparation of the organic EL element according to the present invention described above.

Such a multi-color display device emits light under a DC voltage of about 2 to 40 V applied between an anode with a positive polarity and a cathode with a negative polarity. No current flows and thus no light emission occurs under a voltage having reverse polarities applied to the electrodes. Light emission occurs under AC voltage only while the anode is being positive and the cathode is being negative. The AC voltage can have any waveform.

The multi-color display device can be used as display devices, display panels, or a variety of light-emitting sources. Display devices or display panels can display full-color images with three types of organic EL elements emitting blue light, red light, and green light, respectively.

Examples of such display devices or display panels include television sets, personal computers, mobile apparatuses, audiovisual apparatuses, displays for text broadcasting receivers, and car-mount displays. In particular, the multi-color display device according to the present invention can be used for reproduction of still pictures and/or moving pictures. A display device for reproducing moving pictures can be driven in a simple matrix (passive matrix) mode or in an active matrix mode.

Examples of the light-emitting sources include, but should not be limited to, house lightings, car interior lightings, backlights for clocks, watches, and liquid crystal devices, advertising signs, traffic signals, light sources for optical storage media, electrophotographic copiers, optical communication processers, and optical sensors.

An exemplary display device including the organic EL element according to the present invention will now be described with reference to the drawings.

Figure 5:
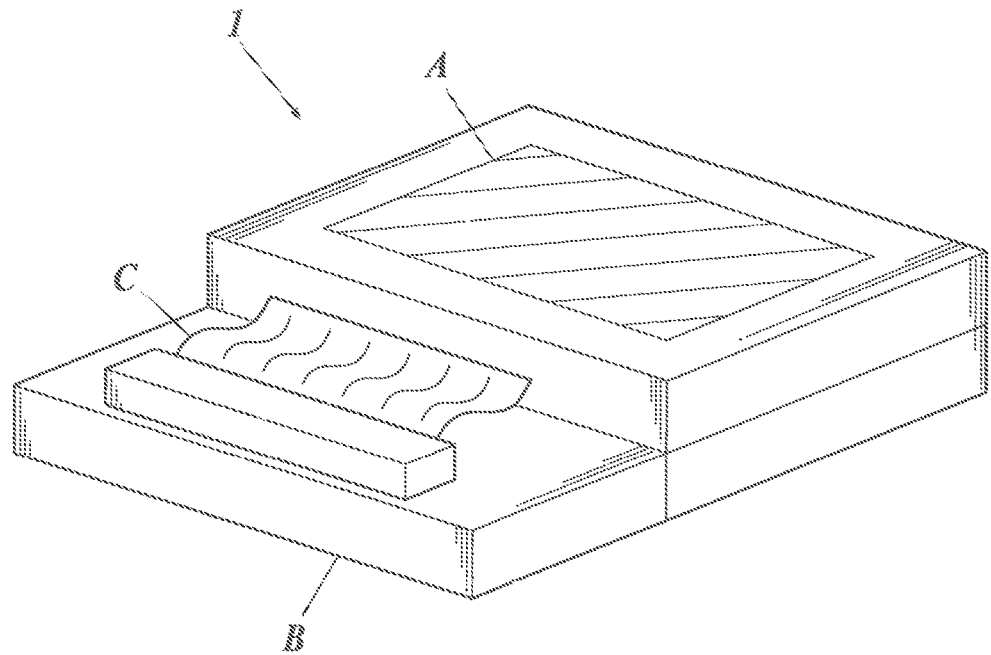
FIG. 5 is a schematic view illustrating one example of a display device including an organic EL element.

FIG. 5 is a schematic view illustrating an exemplary display device including an organic EL element. This example shows a display for a mobile phone, for example, which displays image information according to the light emission from the organic EL element.

A display 1 includes a display unit A having multiple pixels, a control unit B scanning images on the display unit A according to the image information, and a connection unit C electrically connecting the display unit A to the control unit B.

The control unit B is electrically connected to the display unit A through the connection unit C. The control unit B transmits scanning signals and image data signals to the pixels according to the image information externally input. In response to the scanning signals, the pixels on the corresponding scanning lines sequentially emit light according to the image data signals for image scanning operations, and the image information is displayed on the display unit A.

Figure 6:
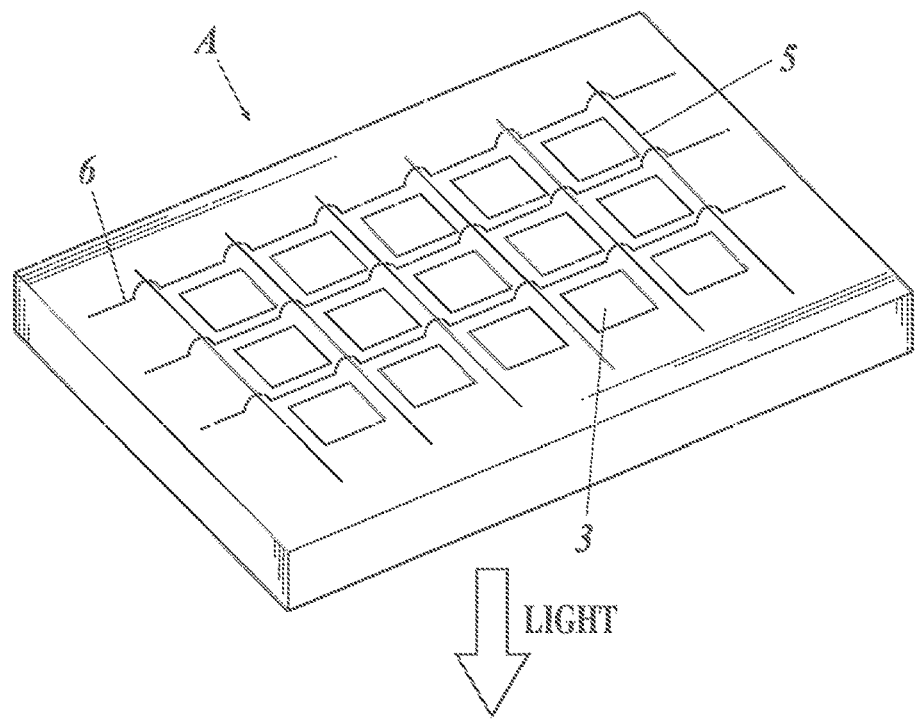
FIG. 6 is a schematic view illustrating an active matrix display device.

FIG. 6 is a schematic view illustrating an active matrix display device.

A display unit A includes a substrate, a connection unit C including multiple scanning lines 5 and data lines 6, and multiple pixels 3. The scanning lines 5, the data lines 6, and the pixels are disposed on the substrate. The main components of the display unit A will now be described.

In FIG. 6, the light emitted from the pixels 3 is extracted in the direction indicated by the white arrow (downward).

The scanning lines 5 and the data lines 6 in the connection unit are composed of conductive materials. The scanning lines 5 intersect orthogonal to the data lines 6 in a lattice pattern. The intersections are connected to the pixels 3 (details are not illustrated).

Each of the pixels 3 receives the image data signal from the data line 6 in response to the scanning signal input from the scanning line 5, and emits light according to the image data signal.

The pixels emitting red light, green light, and blue light can be appropriately disposed on the same substrate to display full-color images.

Figure 7:
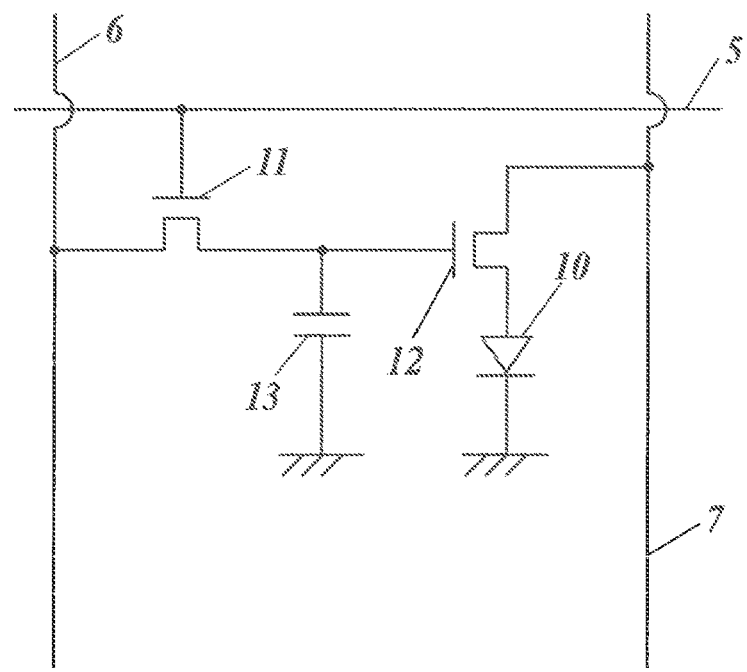
FIG. 7 is a schematic view illustrating a circuit in a pixel.

The process of emitting light from pixels will now be described. FIG. 7 is a schematic view illustrating the circuit in a pixel.

The pixel includes an organic EL element 10, a switching transistor 11, a driving transistor 12, and a capacitor 13. The pixels provided with organic EL elements 10 emitting red light, green light, and blue light can be disposed on the same substrate to display full-color images.

In FIG. 7, the control unit B inputs an image data signal from the data line 6 to the drain of the switching transistor 11. The control unit B inputs a scanning signal through the scanning line 5 to the gate of the switching transistor 11. The switching transistor 11 is then turned on, and the image data signal input to the drain is transmitted to the capacitor 13 and the gate of the driving transistor 12.

The capacitor 13 receives the image data signal, and is charged according to the potential of the image data signal. The driving transistor 12 is turned on at the same time. The driving transistor 12 has a drain connected to a power supply line 7 and a source connected to the electrode of the organic EL element 10 to feed a current from the power supply line 7 to the organic EL element 10 according to the potential of the image data signal input into the gate.

The scanning signal is transferred to the next scanning line 5 as a result of sequential scanning by the control unit B, and the switching transistor 11 is turned off. The capacitor 13 still keeps the charged potential of the image data signal in spite of the turning off of the switching transistor 11. As a result, the driving transistor 12 is kept turned on to continue the light emission of the organic EL element 10 until the next scanning signal is input. When the next scanning signal is input as a result of sequential scanning, the driving transistor 12 is turned on according to the potential of the next image data signal in synchronization with the scanning signal, and the EL element 10 emits light.

In other words, the pixels each include the organic EL element 10, and active elements, i.e., the switching transistor 11 and the driving transistor 12, which control the light emission of the organic EL element 10 in each pixel 3. Such a process of light emission is called an active matrix mode.

The organic EL element 10 may emit light having gradations derived from a multilevel image data signal having a plurality of gradation potentials or may emit a predetermined amount of light switched on/off by a binary image data signal. The capacitor 13 may keep the charged potential until the input of the next scanning signal, or may discharge the potential immediately before the input of the next scanning signal.

The display device according to the present invention may be driven not only in the active matrix mode but also in a passive matrix mode to emit light according to the data signal only while the scanning signals are being input.

Figure 8:
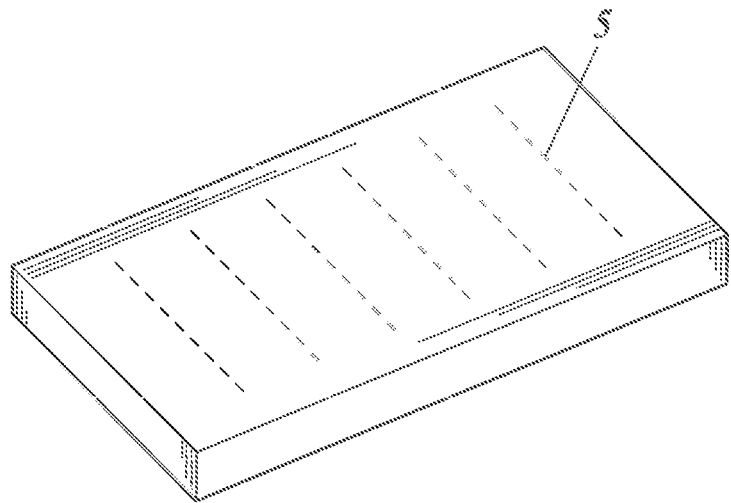
FIG. 8 is a schematic view illustrating a passive matrix display device.
Figure 8:
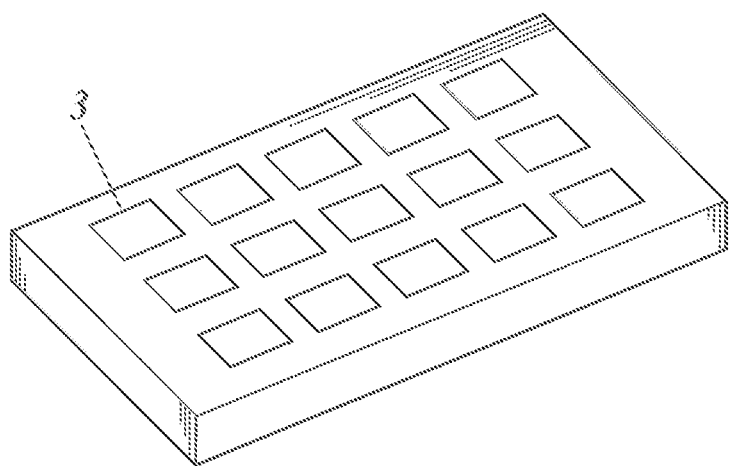
Figure 8:
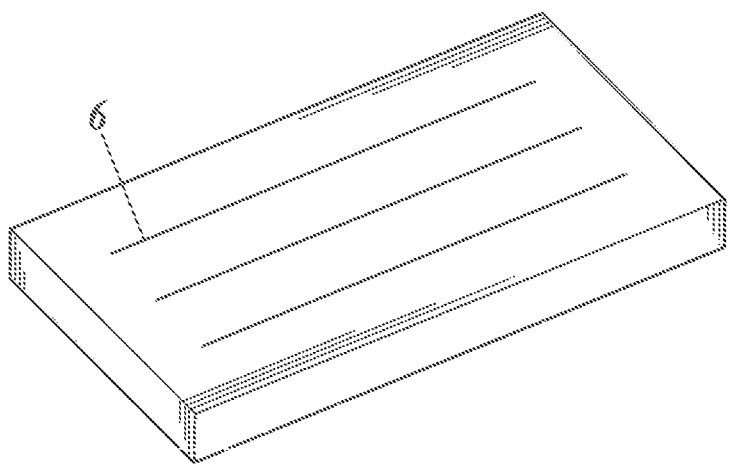

FIG. 8 is a schematic view illustrating a passive matrix display device. In FIG. 8, multiple scanning lines 5, pixels 3, and multiple image data lines 6 are disposed in sequence. The scanning lines 5 and the image data lines 6 are disposed in a lattice pattern.

Scanning signals on the scanning lines 5 are input as a result of sequential scanning, and the pixels 3 connected to the scanning lines 5 emit light according to the image data signals.

The passive matrix display device can be produced at low cost because the pixels 3 include no active element.

The organic EL element according to the present invention can achieve display devices having enhanced luminescent efficiency.

<Lighting Device>

The lighting device according to the present invention will be described. The lighting device according to the present invention includes the organic EL element.

The organic EL element according to the present invention can have a resonator structure. Examples of applications of organic EL elements having such a resonator structure include, but should not be limited to, light sources for optical storage media, electrophotographic copiers, optical communication processers, and optical sensors. The organic EL element according to the present invention causing laser oscillation can also be used in these applications.

Alternatively, the organic EL element according to the present invention can also be used as a lamp for lighting or a light source for exposure, or can also be used as image projectors or display devices (display panels) for directly displaying still pictures or moving pictures.

Display devices for reproducing moving pictures can be drive in the passive matrix mode or in the active matrix mode. Organic EL elements according to the present invention emitting light of at least two different colors can achieve a full-color display device.

The TADF compound and phosphorescent metal complex used in the present invention can be used to prepare an organic EL element emitting substantially white light. Such an organic EL element can be used in a lighting device. Alternatively, white light can be attained through mixing of different colors of light beams emitted from at least two luminous materials (TADF compound and phosphorescent metal complex) at the same time. The light beams of such a color combination may have three maximum wavelengths corresponding to three primary colors, red, green, and blue, or may have two maximum wavelengths corresponding to complementary colors, such blue and yellow, or blue green and orange.

The organic EL element according to the present invention emitting white light can be prepared by a simple process, that is, application of these luminous materials through masks. This process is used only in formation of the luminous layer, the hole transporting layer, or the electron transporting layer. Other common layers, such as electrode layers, can be formed over the entire underlying layer by a process, such as deposition, casting, spin coating, inkjetting, or printing, without patterning through the mask, at high productivity.

An organic EL element produced by this process emits white light by itself, unlike white organic EL devices including arrays of different color luminescent elements disposed in parallel.

[Embodiment of Lighting Device According to the Present Invention]

An embodiment of the lighting device including the organic EL element according to the present invention will now be described.

A glass case is disposed to cover the non-luminous surface of the organic EL element according to the present invention, a glass substrate having a thickness of 300 μm is used as a sealing substrate, an epoxy photocurable adhesive (Laxtrack LC0629B, made by TOAGOSEI CO., LTD.) is applied as a seal material around the organic EL element, and this is disposed over the cathode and is bonded to the transparent support substrate. The glass substrate is irradiated with UV light to cure the adhesive. The organic EL element is sealed to prepare a lighting device illustrated in FIGS. 9 and 10.

Figure 9:
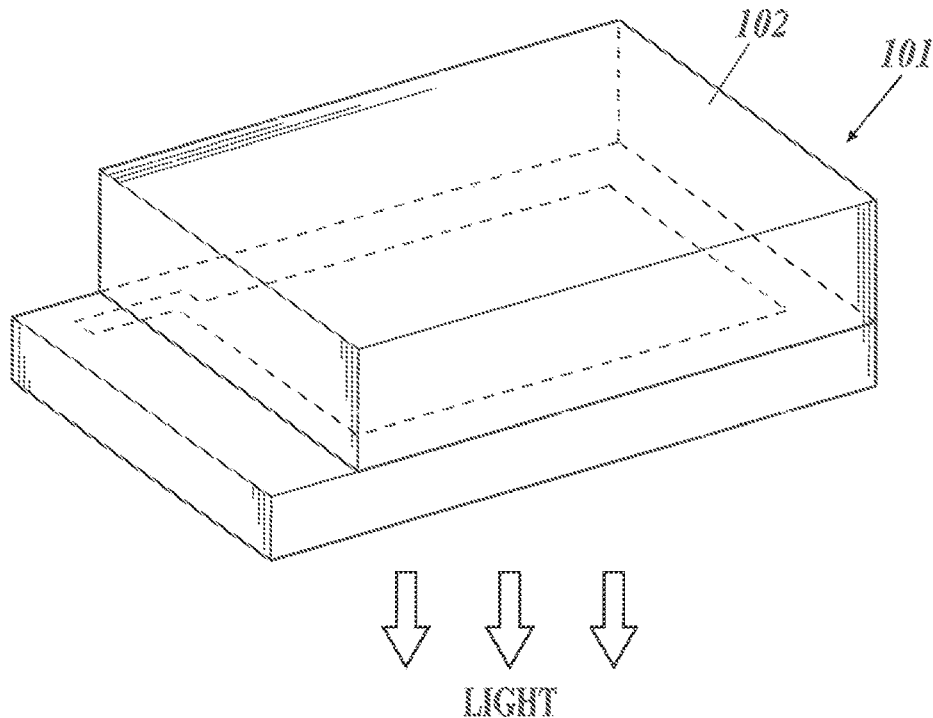
FIG. 9 is a schematic view illustrating a lighting device.

FIG. 9 is a schematic view illustrating a lighting device. An organic EL element 101 according to the present invention is covered with a glass cover 102 (sealing with the glass cover is performed under a nitrogen atmosphere (under an atmosphere of high purity nitrogen (purity: 99.999% or more) in a glovebox so as not to contact the organic EL element 101 with air).

Figure 10:
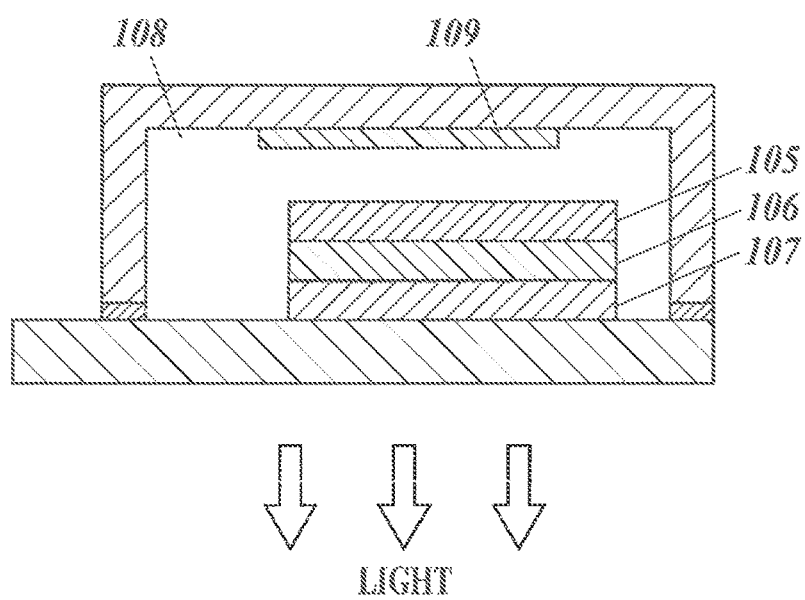
FIG. 10 is a schematic view illustrating a lighting device.

FIG. 10 is a sectional view illustrating a lighting device. FIG. 10 illustrates a cathode 105, an organic layer 106, and a glass substrate 107 with a transparent electrode. The inside of the glass cover 102 is filled with nitrogen gas 108, and contains a moisture getter 109.

The organic EL element according to the present invention can achieve lighting devices having enhanced luminescent efficiency.

EXAMPLES

The present invention will now be described in more detail by way of non-limiting Examples. In Examples, "parts" and "%" indicate "parts by mass" and "mass %", respectively, unless otherwise specified.

Example 1

Preparation of Thin Film 1-1: Coating Film

A quartz substrate with dimensions of 50 mm×50 mm and a thickness of 0.7 mm was ultrasonically cleaned with isopropyl alcohol, was dried under a dry nitrogen gas stream, and was cleaned with UV/ozone for five minutes.

A diluted solution of a TADF compound 4,5-bis(carbazol-9-yl)-1,2-dicyanobenzene (2CzPN) in toluene was applied onto the substrate by spin coating at 500 rpm for 30 seconds to form a thin film. The thin film was dried at 120° C. for 30 minutes to prepare a thin film having a thickness of 40 nm.

Preparation of Thin Film 1-1: Deposited Film

A quartz substrate with dimensions of 50 mm×50 mm and a thickness of 0.7 mm was ultrasonically cleaned with isopropyl alcohol, was dried under a dry nitrogen gas stream, and was cleaned with UV/ozone for five minutes. This transparent substrate was fixed to a substrate holder of a commercially available vacuum deposition apparatus.

A TADF compound 2CzPN in an amount optimal to formation of a thin film was placed in a deposition crucible in a vacuum deposition system. The deposition crucible used was made of molybdenum for resistive heating.

After the vacuum deposition system was evacuated to $1\times10^{-4}$ Pa, 2CzPN was deposited at a rate of 0.1 nm/sec to form a thin film having a thickness of 40 nm.

Preparation of Thin Films 1-2 to 1-7

Thin films 1-2 to 1-7 were prepared as in Thin film 1-1 by coating and deposition except that different TADF compounds were used as shown in Table 4.

Preparation of Thin Films 1-8 to 1-12

Thin films 1-8 to 1-12 were prepared as in Thin film 1-1 by coating and deposition except that a TADF compound 2,4-bis{3-(9H-carbazol-9-yl)-9H-carbazol-9-yl}-6-phenyl-1,3,5-triazine (CC2TA) was used and the proportions of Phosphorescent metal complexes 1, 2, and 3 and the host compound were varied shown in Table 4. The materials for deposited films placed in the deposition crucibles can be co-deposited at different rates to form films composed of the materials with different contents. The proportion of the deposition rates of the materials was determined based on the mass proportion of the compounds other than the solvent in the composition shown in Table 4.

Preparation of Thin Films 1-13 to 1-16

Thin films 1-13 to 1-16 were prepared as in Thin film 1-1 by coating and deposition except that no TADF compound was used and composition ratios of Phosphorescent metal complexes 1, 2, and 3 and the host compound were varied shown in Table 4. The materials for deposited films placed in the deposition crucibles can be co-deposited at different rates to form films composed of the materials with different contents. The proportion of the deposition rates of the materials was determined based on the mass proportion of the compounds other than the solvent in the composition shown in Table 4.

(Evaluation of Thin Films 1-1 to 1-16)

The samples of Thin films 1-1 to 1-16 were measured to observe their photoluminescent (PL) spectra. PL light was measured with an absolute PL quantum yields measurement system C9920-02 (made by Hamamatsu Photonics K.K.) at room temperature and an excitation wavelength of 350 nm.

(Determination of First Difference in Wavelength of Emitted Light)

The shortest peak wavelengths of the thin films appearing in the spectra were determined. In the thin film samples, the difference between the peak wavelength of the light from the deposited film and that of the light from the coating film was defined as a first difference in wavelength of the emitted light.

(Determination of Quantum Efficiency)

The relative value of quantum efficiency was determined on coating and deposition as follows: The quantum efficiency of the coating film relative to that of a TADF solution and that of the deposited film relative to the TADF solution were determined; then the quantum efficiency of the coating film relative to the quantum efficiency of the deposited film was determined as the relative quantum efficiency of the thin film.

For example, for a 4CzIPN (TADF compound) solution having an absolute quantum efficiency of 98, a deposited film containing 4CzIPN having an absolute quantum efficiency of 94, and a coating film containing 4CzIP having an absolute quantum efficiency of 96, the relative value is determined as follows:

Relative quantum efficiency of deposited film=(98−94)/98

Relative quantum efficiency of coating film=(98−96)/98

Quantum efficiency (relative value)={(98−96)/98}/{(98−94)/98}×100=50

The first difference in wavelength of the emitted light and the relative value of the quantum efficiency were determined in each of Thin films 1-1 to 1-16. The results are shown in Table 5.

TABLE 4

| THIN FILM | TADF COM-POUND | *1 | *2 | *3 | HOST COM-POUND | SOLVENT | TADF COM-POUND [MASS %] | *1 [MASS %] | *2 [MASS %] | *3 [MASS %] | HOST COM-POUND [MASS %] | SOL-VENT [MASS %] | NOTE |
|---|---|---|---|---|---|---|---|---|---|---|---|---|---|
| 1-1 | 2CzPN | — | — | — | — | TOLUENE | 0.630 | — | — | — | — | 99.370 | EXAMPLE |
| 1-2 | 4Cz IPN | — | — | — | — | TOLUENE | 0.630 | — | — | — | — | 99.370 | EXAMPLE |
| 1-3 | 4CzPN | — | — | — | — | TOLUENE | 0.630 | — | — | — | — | 99.370 | EXAMPLE |
| 1-4 | 4CzTPN | — | — | — | — | TOLUENE | 0.630 | — | — | — | — | 99.370 | EXAMPLE |
| 1-5 | 4CzTPN-Me | — | — | — | — | TOLUENE | 0.630 | — | — | — | — | 99.370 | EXAMPLE |
| 1-6 | 4CzTPN-Ph | — | — | — | — | TOLUENE | 0.630 | — | — | — | — | 99.370 | EXAMPLE |
| 1-7 | CC2TA | — | — | — | — | TOLUENE | 0.630 | — | — | — | — | 99.370 | EXAMPLE |
| 1-8 | CC2TA | P-14 | — | — | — | TOLUENE | 0.210 | 0.420 | — | — | — | 99.370 | EXAMPLE |
| 1-9 | CC2TA | P-10 | — | — | — | TOLUENE | 0.210 | 0.420 | — | — | — | 99.370 | EXAMPLE |
| 1-10 | CC2TA | P-10 | — | P-9 | — | TOLUENE | 0.200 | 0.420 | — | 0.010 | — | 99.370 | EXAMPLE |
| 1-11 | CC2TA | P-10 | P-13 | P-9 | — | TOLUENE | 0.200 | 0.400 | 0.015 | 0.015 | — | 99.370 | EXAMPLE |
| 1-12 | CC2TA | P-10 | P-13 | P-9 | S-58 | TOLUENE | 0.032 | 0.095 | 0.002 | 0.002 | 0.499 | 99.370 | EXAMPLE |
| 1-13 | — | P-14 | — | — | — | TOLUENE | — | 0.630 | — | — | — | 99.370 | *4 |
| 1-14 | — | P-10 | — | — | — | TOLUENE | — | 0.630 | — | — | — | 99.370 | *4 |
| 1-15 | — | P-14 | — | — | S-58 | TOLUENE | — | 0.095 | — | — | 0.535 | 99.370 | *4 |
| 1-16 | — | P-14 | P-13 | P-9 | S-58 | TOLUENE | — | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE

TABLE 5

| THIN FILM | S₁ (TADF)-T₁ (P1) [eV] | S₁ (TADF)-T₁ (P2) [eV] | S₁ (TADF)-T₁ (P3) [eV] | T₁ (TADF)-T₁ (P1) [eV] | T₁ (TADF)-T₁ (P2) [eV] | T₁ (TADF)-T₁ (P3) [eV] | *1 [nm] | *2 | NOTE |
|---|---|---|---|---|---|---|---|---|---|
| 1-1  | —    | —    | —    | —    | —    | —    |  3 | 92  | EXAMPLE |
| 1-2  | —    | —    | —    | —    | —    | —    |  5 | 50  | EXAMPLE |
| 1-3  | —    | —    | —    | —    | —    | —    |  3 | 88  | EXAMPLE |
| 1-4  | —    | —    | —    | —    | —    | —    |  3 | 75  | EXAMPLE |
| 1-5  | —    | —    | —    | —    | —    | —    |  4 | 92  | EXAMPLE |
| 1-6  | —    | —    | —    | —    | —    | —    |  4 | 91  | EXAMPLE |
| 1-7  | —    | —    | —    | —    | —    | —    |  3 | 90  | EXAMPLE |
| 1-8  | 0.25 | —    | —    | 0.19 | —    | —    |  2 | 91  | EXAMPLE |
| 1-9  | 0.40 | —    | —    | 0.34 | —    | —    |  2 | 89  | EXAMPLE |
| 1-10 | 0.40 | —    | 0.90 | 0.34 | —    | 0.84 |  1 | 69  | EXAMPLE |
| 1-11 | 0.40 | 0.72 | 0.90 | 0.34 | 0.66 | 0.84 |  1 | 82  | EXAMPLE |
| 1-12 | 0.40 | 0.72 | 0.90 | 0.34 | 0.66 | 0.84 |  1 | 89  | EXAMPLE |
| 1-13 | —    | —    | —    | —    | —    | —    | -2 | 103 | *3 |
| 1-14 | —    | —    | —    | —    | —    | —    | -3 | 106 | *3 |
| 1-15 | —    | —    | —    | —    | —    | —    | -1 | 106 | *3 |
| 1-16 | —    | —    | —    | —    | —    | —    |  0 | 110 | *3 |

*1: FIRST DIFFERENCE IN WAVELENGTH OF EMITTED LIGHT
*2: QUANTUM EFFICIENCY (RELATIVE VALUE)
*3: COMPARATIVE EXAMPLE

Advantageous Effects

A positive difference in wavelength of the emitted light indicates that the TADF compound is more highly dispersed in the coating film than in the deposited film. In contrast, a negative difference indicates that the TADF compound more highly agglomerates in the coating film than in the deposited film.

A relative value of the quantum efficiency of less than 100 indicates that the quantum efficiency of the coating film is close to the quantum efficiency of the TADF solution, and has high performance.

Although it should be preferred that the TADF compound and all of the phosphorescent metal complexes satisfy the conditions expressed by Expressions (1) and (3), the results show that a high performance thin film can be achieved if at least one of the phosphorescent metal complexes satisfies the conditions expressed by Expressions (1) and (3) in a system containing several phosphorescent metal complexes emitting white light having satisfactory color rendering characteristics.

Example 2

Preparation of Organic EL Element 2-1: Coating Film (1.1) Preparation of Gas Barrier Support Substrate (Flexible Film)

A support substrate or a poly(ethylene naphthalate) film (made by Teijin DuPont Films Japan Limited, hereinafter abbreviated to PEN) was prepared. An inorganic gas barrier film made of SiOx (thickness: 500 nm) was continuously formed over the entire surface of PEN, on which an anode was formed in the subsequent step, with an atmospheric pressure plasma discharging system having a configuration described in Japanese Patent Application Laid-Open No. 2004-68143. A gas barrier flexible film was thereby prepared (oxygen permeation rate: $1\times10^{-3}$ ml/m²·24 h·atm or less, moisture permeation rate: $1\times10^{-6}$ g/m²·24 h or less).

(1.2) Deposition of Anode

Indium.tin oxide (ITO) was deposited on the gas barrier flexible film by sputtering into a film having a thickness of 120 nm. The film was patterned by photolithography into an anode.

The patterned anode had a light emission area of 50 mm².

(1.3) Deposition of Hole Injecting Layer

The ITO substrate after the patterning was ultrasonically cleaned with isopropyl alcohol, was dried under a dry nitrogen gas stream, and was cleaned with UV/ozone for five minutes. A 70% diluted solution of poly(3,4-ethylenedioxythiophene)-polystyrene sulfonate (abbreviated to PEDOT/PSS, made by Bayer AG, Baytron P Al 4083) in pure water was applied onto the substrate by spin coating at 3000 rpm for 30 seconds to form a thin film. The thin film was dried at 200° C. for one hour to prepare a hole injecting layer having a thickness of 30 nm.

(1.4) Deposition of Hole Transporting Layer

This substrate was placed under a nitrogen atmosphere containing nitrogen gas (grade G1). The following hole transporting layer composition was applied onto the substrate by spin coating at 1500 rpm for 30 seconds to form a thin film. The workpiece was kept at 160° C. for 30 minutes to prepare a hole transporting layer having a thickness of 30 nm.

<Hole Transporting Layer Composition>

| Hole transporting material HT-1 (weight average molecular weight Mw: 80000) | 0.5 mass % |
|---|---|
| Chlorobenzene | 99.5 mass % |

[Chemical Formula 83]

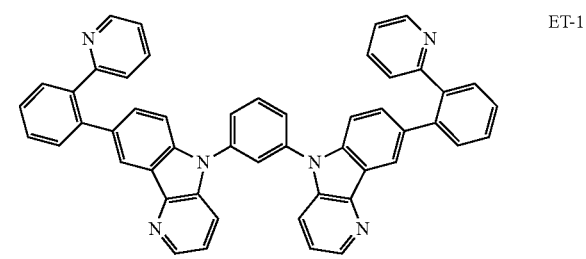

ET-1

-continued

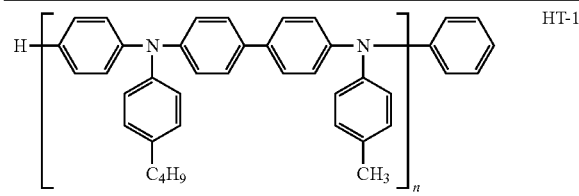

(1.5) Deposition of Luminous Layer

A composition containing TADF compound 2CzPN and Host compound S-58 shown in Table 6 was applied onto the workpiece by spin coating at 500 rpm for 30 seconds to form a thin film. The thin film was kept at 120° C. for 30 minutes to prepare a luminous layer having a thickness of 40 nm.

(1.6) Deposition of Electron Transporting Layer

A solution of 20 mg ET-1 in 4 ml tetrafluoropropanol (TFPO) was applied onto the workpiece by spin coating at 1500 rpm for 30 seconds to form a film. The film was kept at 120° C. for 30 minutes to prepare an electron transporting layer having a thickness of 30 nm.

(1.7) Deposition of Electron Injecting Layer and Cathode

The workpiece was placed in a vacuum deposition system so as not to be exposed to the air. Sodium fluoride and potassium fluoride were separately placed in molybdenum resistive heating boats, and the boats were placed in the vacuum deposition system. The vacuum deposition system was evacuated to $4\times10^{-5}$ Pa. While the boat containing sodium fluoride was being heated, sodium fluoride was deposited onto the electron transporting layer at 0.02 nm/sec to form a thin film having a thickness of 1 nm. Potassium fluoride was then deposited onto the thin film at 0.02 nm/sec as in sodium fluoride to form an electron injecting layer having a thickness of 1.5 nm.

In the subsequent step, aluminum was deposited onto the electron injecting layer to prepare a cathode having a thickness of 100 nm. Organic EL element 2-1 was thereby prepared.

Preparation of Organic EL Element 2-1: Deposited Film

A deposited film for Organic EL element 2-1 was prepared as in Organic EL element 2-1 except that a luminous layer was formed by the following deposition process.

(2.5) Deposition of Luminous Layer

A TADF compound 2CzPN and a host compound S-58 in amounts optimal to formation of thin films were separately placed in deposition crucibles of a vacuum deposition system. The deposition crucible used was made of molybdenum for resistive heating. The TADF compound, the host compound, and the solvent were used in the proportion shown in Table 6.

After the vacuum deposition system was evacuated to $1\times10^{-4}$ Pa, 2CzPN and S-58 were co-deposited at rates of 0.025 nm/sec and 0.075 nmm/sec, respectively, to prepare a luminous layer having a thickness of 40 nm.

Preparation of Organic EL Elements 2-2 to 2-22

Organic EL elements 2-2 to 2-22 were prepared as in Organic EL element 2-1 except that coating solutions containing different compounds in proportions shown in Table 6 were applied by a coating process to prepare luminous layers.

Organic EL elements 2-2 to 2-22 were prepared as in Organic EL element 2-1 except that different compounds were deposited at rates shown in Table 6 so that the deposition rates correspond to the composition ratios to prepare luminous layers. The proportion of the deposition rates of the materials was determined based on the mass proportion of the compounds other than the solvent.

TABLE 6

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 2-1 | 2CzPN | — | — | — | S-58 | TOLUENE | 0.032 | — | — | — | 0.598 | 99.370 | EXAMPLE |
| 2-2 | 4Cz IPN | — | — | — | S-58 | TOLUENE | 0.032 | — | — | — | 0.598 | 99.370 | EXAMPLE |
| 2-3 | 4CzPN | — | — | — | S-58 | TOLUENE | 0.032 | — | — | — | 0.598 | 99.370 | EXAMPLE |
| 2-4 | 4CzTPN | — | — | — | S-58 | TOLUENE | 0.032 | — | — | — | 0.598 | 99.370 | EXAMPLE |
| 2-5 | 4CzTPN-Me | — | — | — | S-58 | TOLUENE | 0.032 | — | — | — | 0.598 | 99.370 | EXAMPLE |
| 2-6 | 4CzTPN-Ph | — | — | — | S-58 | TOLUENE | 0.032 | — | — | — | 0.598 | 99.370 | EXAMPLE |
| 2-7 | CC2TA | — | — | — | S-58 | TOLUENE | 0.032 | — | — | — | 0.598 | 99.370 | EXAMPLE |
| 2-8 | CC2TA | P-14 | — | — | S-58 | TOLUENE | 0.032 | 0.095 | — | — | 0.503 | 99.370 | EXAMPLE |
| 2-9 | CC2TA | P-10 | — | — | S-58 | TOLUENE | 0.032 | 0.095 | — | — | 0.503 | 99.370 | EXAMPLE |
| 2-10 | CC2TA | P-10 | — | P-9 | S-58 | TOLUENE | 0.032 | 0.095 | — | 0.002 | 0.501 | 99.370 | EXAMPLE |
| 2-11 | CC2TA | P-10 | P-13 | P-9 | S-58 | TOLUENE | 0.032 | 0.095 | 0.002 | 0.002 | 0.499 | 99.370 | EXAMPLE |
| 2-12 | CC2TA | P-136 | — | P-9 | S-58 | TOLUENE | 0.032 | 0.095 | — | 0.002 | 0.501 | 99.370 | EXAMPLE |
| 2-13 | CC2TA | P-149 | — | P-9 | S-58 | TOLUENE | 0.032 | 0.095 | — | 0.002 | 0.501 | 99.370 | EXAMPLE |
| 2-14 | CC2TA | P-153 | — | P-9 | S-58 | TOLUENE | 0.032 | 0.095 | — | 0.002 | 0.501 | 99.370 | EXAMPLE |
| 2-15 | CC2TA | P-166 | — | P-9 | S-58 | TOLUENE | 0.032 | 0.095 | — | 0.002 | 0.501 | 99.370 | EXAMPLE |
| 2-16 | CC2TA | P-10 | — | P-9 | S-1 | TOLUENE | 0.032 | 0.095 | — | 0.002 | 0.501 | 99.370 | EXAMPLE |
| 2-17 | CC2TA | P-10 | — | P-9 | S-26 | TOLUENE | 0.032 | 0.095 | — | 0.002 | 0.501 | 99.370 | EXAMPLE |
| 2-18 | CC2TA | P-10 | — | P-9 | H-106 | TOLUENE | 0.032 | 0.095 | — | 0.002 | 0.501 | 99.370 | EXAMPLE |
| 2-19 | — | P-14 | — | — | S-58 | TOLUENE | — | 0.095 | — | — | 0.535 | 99.370 | *4 |
| 2-20 | — | P-10 | — | — | S-58 | TOLUENE | — | 0.095 | — | — | 0.535 | 99.370 | *4 |
| 2-21 | — | P-14 | P-13 | P-9 | S-58 | TOLUENE | — | 0.095 | 0.002 | 0.002 | 0.531 | 99.370 | *4 |
| 2-22 | — | P-10 | P-13 | P-9 | S-58 | TOLUENE | — | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE (Evaluation of Organic EL Elements 2-1 to 2-22)

Organic EL elements 2-1 to 2-22 were evaluated as follows: A glass case is disposed to cover the non-luminous surface of each of the prepared organic EL elements, a glass substrate having a thickness of 300 μm is used as a sealing substrate, an epoxy photocurable adhesive (Laxtrack LC0629B, made by TOAGOSEI CO., LTD.) is applied as a seal material around the organic EL element, and this is disposed over the cathode and is bonded to the transparent support substrate. The glass substrate is irradiated with UV light to cure the adhesive. The organic EL element is sealed to prepare a lighting device illustrated in FIGS. 9 and 10. The lighting device was evaluated.

(Determination of External Quantum Efficiency)

Each of the organic EL elements was driven to emit light at room temperature (about 25° C.) and a constant current of 2.5 mA/cm$^2$, and the luminance of the light immediately after the activation was measured with a spectroradiometric luminance meter CS-2000 (made by Konica Minolta, Inc.).

The relative luminance of the light emitted from the coating film to that from the deposited film was determined as external quantum efficiency. A greater relative luminance indicates higher external quantum efficiency of the coating film.

TABLE 7

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | *1 [nm] | *2 | NOTE |
|---|---|---|---|---|---|---|---|---|---|
| 2-1 | — | — | — | — | — | — | 2 | 115 | EXAMPLE |
| 2-2 | — | — | — | — | — | — | 3 | 110 | EXAMPLE |
| 2-3 | — | — | — | — | — | — | 2 | 120 | EXAMPLE |
| 2-4 | — | — | — | — | — | — | 1 | 112 | EXAMPLE |
| 2-5 | — | — | — | — | — | — | 2 | 114 | EXAMPLE |
| 2-6 | — | — | — | — | — | — | 3 | 117 | EXAMPLE |
| 2-7 | — | — | — | — | — | — | 2 | 113 | EXAMPLE |
| 2-8 | 0.25 | — | — | 0.19 | — | — | 2 | 110 | EXAMPLE |
| 2-9 | 0.40 | — | — | 0.34 | — | — | 2 | 115 | EXAMPLE |
| 2-10 | 0.40 | — | 0.90 | 0.34 | — | 0.84 | 1 | 116 | EXAMPLE |
| 2-11 | 0.40 | 0.72 | 0.90 | 0.34 | 0.66 | 0.84 | 1 | 109 | EXAMPLE |
| 2-12 | 0.25 | — | 0.90 | 0.19 | — | 0.84 | 2 | 112 | EXAMPLE |
| 2-13 | 0.26 | — | 0.90 | 0.20 | — | 0.84 | 1 | 115 | EXAMPLE |
| 2-14 | 0.25 | — | 0.90 | 0.19 | — | 0.84 | 1 | 108 | EXAMPLE |
| 2-15 | 0.25 | — | 0.90 | 0.19 | — | 0.84 | 1 | 109 | EXAMPLE |
| 2-16 | 0.40 | — | 0.90 | 0.34 | — | 0.84 | 1 | 112 | EXAMPLE |
| 2-17 | 0.40 | — | 0.90 | 0.34 | — | 0.84 | 2 | 110 | EXAMPLE |
| 2-18 | 0.40 | — | 0.90 | 0.34 | — | 0.84 | 2 | 108 | EXAMPLE |
| 2-19 | — | — | — | — | — | — | -2 | 98 | *3 |
| 2-20 | — | — | — | — | — | — | -3 | 101 | *3 |
| 2-21 | — | — | — | — | — | — | -1 | 99 | *3 |
| 2-22 | — | — | — | — | — | — | 0 | 94 | *3 |

*1: FIRST DIFFERENCE IN WAVELENGTH OF EMITTED LIGHT
*2: EXTERNAL QUANTUM EFFECIENCY (RELATIVE VALUE)
*3: COMPARATIVE EXAMPLE

Example 3

Preparation of Organic EL Elements 3-1 to 3-22

Organic EL elements 3-1 to 3-22 were prepared as in Organic EL element 2-1 except that coating solutions containing different compounds in proportions shown in Table 8 were applied by a coating process to prepare luminous layers.

Organic EL elements 3-1 to 3-22 were prepared as in Organic EL element 2-1 except that different compounds were deposited at rates shown in Table 8 so that the deposition rates correspond to the composition ratios to prepare luminous layers. The proportion of the deposition rates of the materials was determined based on the mass proportion of the compounds other than the solvent.

TABLE 8

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 3-1 | 2CzPN | — | — | — | S-57 | TOLUENE | 0.032 | — | — | — | 0.598 | 99.370 | EXAMPLE |
| 3-2 | 4Cz IPN | — | — | — | S-57 | TOLUENE | 0.032 | — | — | — | 0.598 | 99.370 | EXAMPLE |

TABLE 8-continued

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 3-3  | 4CzPN     | —    | —    | —   | S-57  | TOLUENE | 0.032 | —     | —     | —     | 0.598 | 99.370 | EXAMPLE |
| 3-4  | 4CzTPN    | —    | —    | —   | S-57  | TOLUENE | 0.032 | —     | —     | —     | 0.598 | 99.370 | EXAMPLE |
| 3-5  | 4CzTPN-Me | —    | —    | —   | S-57  | TOLUENE | 0.032 | —     | —     | —     | 0.598 | 99.370 | EXAMPLE |
| 3-6  | 4CzTPN-Ph | —    | —    | —   | S-57  | TOLUENE | 0.032 | —     | —     | —     | 0.598 | 99.370 | EXAMPLE |
| 3-7  | CC2TA     | —    | —    | —   | S-57  | TOLUENE | 0.032 | —     | —     | —     | 0.598 | 99.370 | EXAMPLE |
| 3-8  | CC2TA     | P-14 | —    | —   | S-57  | TOLUENE | 0.032 | 0.095 | —     | —     | 0.503 | 99.370 | EXAMPLE |
| 3-9  | CC2TA     | P-10 | —    | —   | S-57  | TOLUENE | 0.032 | 0.095 | —     | —     | 0.503 | 99.370 | EXAMPLE |
| 3-10 | CC2TA     | P-10 | —    | P-9 | S-57  | TOLUENE | 0.032 | 0.095 | —     | 0.002 | 0.501 | 99.370 | EXAMPLE |
| 3-11 | CC2TA     | P-10 | P-13 | P-9 | S-57  | TOLUENE | 0.032 | 0.095 | 0.002 | 0.002 | 0.499 | 99.370 | EXAMPLE |
| 3-12 | CC2TA     | P-136| —    | P-9 | S-57  | TOLUENE | 0.032 | 0.095 | —     | 0.002 | 0.501 | 99.370 | EXAMPLE |
| 3-13 | CC2TA     | P-149| —    | P-9 | S-57  | TOLUENE | 0.032 | 0.095 | —     | 0.002 | 0.501 | 99.370 | EXAMPLE |
| 3-14 | CC2TA     | P-153| —    | P-9 | S-57  | TOLUENE | 0.032 | 0.095 | —     | 0.002 | 0.501 | 99.370 | EXAMPLE |
| 3-15 | CC2TA     | P-166| —    | P-9 | S-57  | TOLUENE | 0.032 | 0.095 | —     | 0.002 | 0.501 | 99.370 | EXAMPLE |
| 3-16 | CC2TA     | P-10 | —    | P-9 | S-53  | TOLUENE | 0.032 | 0.095 | —     | 0.002 | 0.501 | 99.370 | EXAMPLE |
| 3-17 | CC2TA     | P-10 | —    | P-9 | S-10  | TOLUENE | 0.032 | 0.095 | —     | 0.002 | 0.501 | 99.370 | EXAMPLE |
| 3-18 | CC2TA     | P-10 | —    | P-9 | H-201 | TOLUENE | 0.032 | 0.095 | —     | 0.002 | 0.501 | 99.370 | EXAMPLE |
| 3-19 | —         | P-14 | —    | —   | S-57  | TOLUENE | —     | 0.095 | —     | —     | 0.535 | 99.370 | *4 |
| 3-20 | —         | P-10 | —    | —   | S-57  | TOLUENE | —     | 0.095 | —     | —     | 0.535 | 99.370 | *4 |
| 3-21 | —         | P-14 | P-13 | P-9 | S-57  | TOLUENE | —     | 0.095 | 0.002 | 0.002 | 0.531 | 99.370 | *4 |
| 3-22 | —         | P-10 | P-13 | P-9 | S-57  | TOLUENE | —     | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE (Evaluation of Organic EL Elements 3-1 to 3-22)

Organic EL elements 3-1 to 3-22 were evaluated as follows: A glass case is disposed to cover the non-luminous surface of each of the prepared organic EL elements, a glass substrate having a thickness of 300 μm is used as a sealing substrate, an epoxy photocurable adhesive (Laxtrack LC0629B, made by TOAGOSEI CO., LTD.) is applied as a seal material around the organic EL element, and this is disposed over the cathode and is bonded to the transparent support substrate. The glass substrate is irradiated with UV light to cure the adhesive. The organic EL element is sealed to prepare a lighting device illustrated in FIGS. 9 and 10. The lighting device was evaluated.

(Determination of Initial Driving Voltage)

The luminance of the light emitted from each of the organic EL elements was measured at room temperature (about 25° C.) with a spectroradiometric luminance meter CS-2000 (made by Konica Minolta, Inc.) to determine the initial driving voltage at a luminance of the light at 1000 cd/m$^2$. The results are shown in Table 9.

The initial driving voltage shown in Table 9 was determined as the relative initial driving voltage of the organic EL element including the coating film to that including the deposited film. A smaller numeric value in the table indicates a lower initial driving voltage and higher performance of the coating film.

TABLE 9

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | *1 | NOTE |
|---|---|---|---|---|---|---|---|---|
| 3-1  | —    | —    | —    | —    | —    | —    | 84 | EXAMPLE |
| 3-2  | —    | —    | —    | —    | —    | —    | 85 | EXAMPLE |
| 3-3  | —    | —    | —    | —    | —    | —    | 86 | EXAMPLE |
| 3-4  | —    | —    | —    | —    | —    | —    | 89 | EXAMPLE |
| 3-5  | —    | —    | —    | —    | —    | —    | 90 | EXAMPLE |
| 3-6  | —    | —    | —    | —    | —    | —    | 88 | EXAMPLE |
| 3-7  | —    | —    | —    | —    | —    | —    | 87 | EXAMPLE |
| 3-8  | 0.25 | —    | —    | 0.19 | —    | —    | 89 | EXAMPLE |
| 3-9  | 0.40 | —    | —    | 0.34 | —    | —    | 86 | EXAMPLE |
| 3-10 | 0.40 | —    | 0.90 | 0.34 | —    | 0.84 | 89 | EXAMPLE |
| 3-11 | 0.40 | 0.72 | 0.90 | 0.34 | 0.66 | 0.84 | 90 | EXAMPLE |
| 3-12 | 0.25 | —    | 0.90 | 0.19 | —    | 0.84 | 89 | EXAMPLE |
| 3-13 | 0.26 | —    | 0.90 | 0.20 | —    | 0.84 | 91 | EXAMPLE |
| 3-14 | 0.25 | —    | 0.90 | 0.19 | —    | 0.84 | 94 | EXAMPLE |
| 3-15 | 0.25 | —    | 0.90 | 0.19 | —    | 0.84 | 91 | EXAMPLE |
| 3-16 | 0.40 | —    | 0.90 | 0.34 | —    | 0.84 | 88 | EXAMPLE |
| 3-17 | 0.40 | —    | 0.90 | 0.34 | —    | 0.84 | 89 | EXAMPLE |
| 3-18 | 0.40 | —    | 0.90 | 0.34 | —    | 0.84 | 90 | EXAMPLE |
| 3-19 | —    | —    | —    | —    | —    | —    | 98 | *2 |
| 3-20 | —    | —    | —    | —    | —    | —    | 99 | *2 |

TABLE 9-continued

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | *1 | NOTE |
|---|---|---|---|---|---|---|---|---|
| 3-21 | — | — | — | — | — | — | 104 | *2 |
| 3-22 | — | — | — | — | — | — | 101 | *2 |

*1: DRIVING VOLTAGE (RELATIVE VALUE)
*2: COMPARATIVE EXAMPLE

Example 4

Preparation of Organic EL Elements 4-1 to 4-22

Organic EL elements 4-1 to 4-22 were prepared as in Organic EL element 2-1 except that coating solutions containing different compounds in proportions shown in Table 10 were applied by a coating process to prepare luminous layers.

Organic EL elements 4-1 to 4-22 were prepared as in Organic EL element 2-1 except that different compounds were deposited at rates shown in Table 10 so that the deposition rates correspond to the composition ratios to prepare luminous layers. The proportion of the deposition rates of the materials was determined based on the mass proportion of the compounds other than the solvent.

LC0629B, made by TOAGOSEI CO., LTD.) is applied as a seal material around the organic EL element, and this is disposed over the cathode and is bonded to the transparent support substrate. The glass substrate is irradiated with UV light to cure the adhesive. The organic EL element is sealed to prepare a lighting device illustrated in FIGS. 9 and 10. The lighting device was evaluated.

(Evaluation on Continuous Driving Stability (Half-Life))

Each of the organic EL elements was continuously driven, and the luminance was measured with a spectroradiometric luminance meter CS-2000 to determine the half-life (LT50) of the luminance.

The organic EL element was driven at a current at which the luminance was 4000 cd/m² at the start of the continuous drive of the element.

TABLE 10

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 4-1 | 2CzPN | — | — | — | H-441 | TOLUENE | 0.032 | — | — | — | 0.598 | 99.370 | EXAMPLE |
| 4-2 | 4Cz IPN | — | — | — | H-441 | TOLUENE | 0.032 | — | — | — | 0.598 | 99.370 | EXAMPLE |
| 4-3 | 4CzPN | — | — | — | H-441 | TOLUENE | 0.032 | — | — | — | 0.598 | 99.370 | EXAMPLE |
| 4-4 | 4CzTPN | — | — | — | H-441 | TOLUENE | 0.032 | — | — | — | 0.598 | 99.370 | EXAMPLE |
| 4-5 | 4CzTPN-M | — | — | — | H-441 | TOLUENE | 0.032 | — | — | — | 0.598 | 99.370 | EXAMPLE |
| 4-6 | 4CzTPN-P | — | — | — | H-441 | TOLUENE | 0.032 | — | — | — | 0.598 | 99.370 | EXAMPLE |
| 4-7 | CC2TA | — | — | — | H-441 | TOLUENE | 0.032 | — | — | — | 0.598 | 99.370 | EXAMPLE |
| 4-8 | CC2TA | P-14 | — | — | H-441 | TOLUENE | 0.032 | 0.095 | — | — | 0.503 | 99.370 | EXAMPLE |
| 4-9 | CC2TA | P-10 | — | — | H-441 | TOLUENE | 0.032 | 0.095 | — | — | 0.503 | 99.370 | EXAMPLE |
| 4-10 | CC2TA | P-10 | — | P-9 | H-441 | TOLUENE | 0.032 | 0.095 | — | 0.002 | 0.501 | 99.370 | EXAMPLE |
| 4-11 | CC2TA | P-10 | P-13 | P-9 | H-441 | TOLUENE | 0.032 | 0.095 | 0.002 | 0.002 | 0.499 | 99.370 | EXAMPLE |
| 4-12 | CC2TA | P-136 | — | P-9 | H-441 | TOLUENE | 0.032 | 0.095 | — | 0.002 | 0.501 | 99.370 | EXAMPLE |
| 4-13 | CC2TA | P-149 | — | P-9 | H-441 | TOLUENE | 0.032 | 0.095 | — | 0.002 | 0.501 | 99.370 | EXAMPLE |
| 4-14 | CC2TA | P-153 | — | P-9 | H-441 | TOLUENE | 0.032 | 0.095 | — | 0.002 | 0.501 | 99.370 | EXAMPLE |
| 4-15 | CC2TA | P-166 | — | P-9 | H-441 | TOLUENE | 0.032 | 0.095 | — | 0.002 | 0.501 | 99.370 | EXAMPLE |
| 4-16 | CC2TA | P-10 | — | P-9 | S-55 | TOLUENE | 0.032 | 0.095 | — | 0.002 | 0.501 | 99.370 | EXAMPLE |
| 4-17 | CC2TA | P-10 | — | P-9 | S-9 | TOLUENE | 0.032 | 0.095 | — | 0.002 | 0.501 | 99.370 | EXAMPLE |
| 4-18 | CC2TA | P-10 | — | P-9 | H-301 | TOLUENE | 0.032 | 0.095 | — | 0.002 | 0.501 | 99.370 | EXAMPLE |
| 4-19 | — | P-14 | — | — | H-441 | TOLUENE | — | 0.095 | — | — | 0.535 | 99.370 | *4 |
| 4-20 | — | P-10 | — | — | H-441 | TOLUENE | — | 0.095 | — | — | 0.535 | 99.370 | *4 |
| 4-21 | — | P-14 | P-13 | P-9 | H-441 | TOLUENE | — | 0.095 | 0.002 | 0.002 | 0.531 | 99.370 | *4 |
| 4-22 | — | P-10 | P-13 | P-9 | H-441 | TOLUENE | — | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE (Evaluation of Organic EL Elements 4-1 to 4-22)

Organic EL elements 4-1 to 4-22 were evaluated as follows: A glass case is disposed to cover the non-luminous surface of each of the prepared organic EL elements, a glass substrate having a thickness of 300 μm is usesd as a sealing substrate, an epoxy photocurable adhesive (Laxtrack The relative value of LT50 of the organic EL element containing the coating film to LT50 of that containing the deposited film was determined as continuous driving stability. The results are shown in Table 11. A greater numeric value in the table indicates higher continuous driving stability of the coating film (prolonged service life).

TABLE 11

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | *1 | NOTE |
|---|---|---|---|---|---|---|---|---|
| 4-1 | — | — | — | — | — | — | 132 | EXAMPLE |
| 4-2 | — | — | — | — | — | — | 124 | EXAMPLE |
| 4-3 | — | — | — | — | — | — | 128 | EXAMPLE |
| 4-4 | — | — | — | — | — | — | 133 | EXAMPLE |
| 4-5 | — | — | — | — | — | — | 140 | EXAMPLE |
| 4-6 | — | — | — | — | — | — | 127 | EXAMPLE |
| 4-7 | — | — | — | — | — | — | 135 | EXAMPLE |
| 4-8 | 0.25 | — | — | 0.19 | — | — | 122 | EXAMPLE |
| 4-9 | 0.40 | — | — | 0.34 | — | — | 134 | EXAMPLE |
| 4-10 | 0.40 | — | 0.90 | 0.34 | — | 0.84 | 129 | EXAMPLE |
| 4-11 | 0.40 | 0.72 | 0.90 | 0.34 | 0.66 | 0.84 | 129 | EXAMPLE |
| 4-12 | 0.25 | — | 0.90 | 0.19 | — | 0.84 | 125 | EXAMPLE |
| 4-13 | 0.26 | — | 0.90 | 0.20 | — | 0.84 | 128 | EXAMPLE |
| 4-14 | 0.25 | — | 0.90 | 0.19 | — | 0.84 | 120 | EXAMPLE |
| 4-15 | 0.25 | — | 0.90 | 0.19 | — | 0.84 | 119 | EXAMPLE |
| 4-16 | 0.40 | — | 0.90 | 0.34 | — | 0.84 | 127 | EXAMPLE |
| 4-17 | 0.40 | — | 0.90 | 0.34 | — | 0.84 | 125 | EXAMPLE |
| 4-18 | 0.40 | — | 0.90 | 0.34 | — | 0.84 | 122 | EXAMPLE |
| 4-19 | — | — | — | — | — | — | 84 | *2 |
| 4-20 | — | — | — | — | — | — | 81 | *2 |
| 4-21 | — | — | — | — | — | — | 79 | *2 |
| 4-22 | — | — | — | — | — | — | 82 | *2 |

*1: CONTINUOUS DRIVING STABILITY (RELATIVE VALUE)
*2: COMPARATIVE EXAMPLE

Example 5

Preparation of Organic EL Elements 5-1 to 5-22

Organic EL elements 5-1 to 5-22 were prepared as in Organic EL element 2-1 except that coating solutions containing different compounds in proportions shown in Table 12 were applied by a coating process to prepare luminous layers.

Organic EL elements 5-2 to 5-22 were prepared as in Organic EL element 2-1 except that different compounds were deposited at rates shown in Table 12 so that the deposition rates correspond to composition ratios to prepare luminous layers. The proportion of the deposition rates of the materials was determined based on the mass proportion of the compounds other than the solvent.

TABLE 12

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 5-1 | 2CzPN | — | — | — | S-52 | TOLUENE | 0.032 | — | — | — | 0.598 | 99.370 | EXAMPLE |
| 5-2 | 4Cz IPN | — | — | — | S-52 | TOLUENE | 0.032 | — | — | — | 0.598 | 99.370 | EXAMPLE |
| 5-3 | 4CzPN | — | — | — | S-52 | TOLUENE | 0.032 | — | — | — | 0.598 | 99.370 | EXAMPLE |
| 5-4 | 4CzTPN | — | — | — | S-52 | TOLUENE | 0.032 | — | — | — | 0.598 | 99.370 | EXAMPLE |
| 5-5 | 4CzTPN-Me | — | — | — | S-52 | TOLUENE | 0.032 | — | — | — | 0.598 | 99.370 | EXAMPLE |
| 5-6 | 4CzTPN-Ph | — | — | — | S-52 | TOLUENE | 0.032 | — | — | — | 0.598 | 99.370 | EXAMPLE |
| 5-7 | CC2TA | — | — | — | S-52 | TOLUENE | 0.032 | — | — | — | 0.598 | 99.370 | EXAMPLE |
| 5-8 | CC2TA | P-14 | — | — | S-52 | TOLUENE | 0.032 | 0.095 | — | — | 0.503 | 99.370 | EXAMPLE |
| 5-9 | CC2TA | P-10 | — | — | S-52 | TOLUENE | 0.032 | 0.095 | — | — | 0.503 | 99.370 | EXAMPLE |
| 5-10 | CC2TA | P-10 | — | P-9 | S-52 | TOLUENE | 0.032 | 0.095 | — | 0.002 | 0.501 | 99.370 | EXAMPLE |
| 5-11 | CC2TA | P-10 | P-13 | P-9 | S-52 | TOLUENE | 0.032 | 0.095 | 0.002 | 0.002 | 0.499 | 99.370 | EXAMPLE |
| 5-12 | CC2TA | P-136 | — | P-9 | S-52 | TOLUENE | 0.032 | 0.095 | — | 0.002 | 0.501 | 99.370 | EXAMPLE |
| 5-13 | CC2TA | P-149 | — | P-9 | S-52 | TOLUENE | 0.032 | 0.095 | — | 0.002 | 0.501 | 99.370 | EXAMPLE |
| 5-14 | CC2TA | P-153 | — | P-9 | S-52 | TOLUENE | 0.032 | 0.095 | — | 0.002 | 0.501 | 99.370 | EXAMPLE |
| 5-15 | CC2TA | P-166 | — | P-9 | S-52 | TOLUENE | 0.032 | 0.095 | — | 0.002 | 0.501 | 99.370 | EXAMPLE |
| 5-16 | CC2TA | P-10 | — | P-9 | S-54 | TOLUENE | 0.032 | 0.095 | — | 0.002 | 0.501 | 99.370 | EXAMPLE |
| 5-17 | CC2TA | P-10 | — | P-9 | S-3 | TOLUENE | 0.032 | 0.095 | — | 0.002 | 0.501 | 99.370 | EXAMPLE |
| 5-18 | CC2TA | P-10 | — | P-9 | H-307 | TOLUENE | 0.032 | 0.095 | — | 0.002 | 0.501 | 99.370 | EXAMPLE |
| 5-19 | — | P-14 | — | — | S-52 | TOLUENE | — | 0.095 | — | — | 0.535 | 99.370 | *4 |
| 5-20 | — | P-10 | — | — | S-52 | TOLUENE | — | 0.095 | — | — | 0.535 | 99.370 | *4 |
| 5-21 | — | P-14 | P-13 | P-9 | S-52 | TOLUENE | — | 0.095 | 0.002 | 0.002 | 0.531 | 99.370 | *4 |
| 5-22 | — | P-10 | P-13 | P-9 | S-52 | TOLUENE | — | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE (Evaluation of Organic EL Elements 5-1 to 5-22)

Organic EL elements 5-1 to 5-22 were evaluated as follows: Each organic EL element was disposed on a glass sealing substrate having a thickness of 300 μm. An epoxy photocurable adhesive (Laxtrack LC0629B, made by TOAGOSEI CO., LTD.) was applied around the organic EL element. A glass case was disposed over the cathode to cover the non-luminous surface of the element, and was bonded to the transparent support substrate. The glass sealing substrate was irradiated with UV light to cure the adhesive. The organic EL element was sealed to prepare a lighting device illustrated in FIGS. 9 and 10. The lighting device was evaluated.

(Evaluation on Chromatic Stability)

The chromaticity at the start of the continuous driving of the organic EL element (t=0) and the chromaticity at the half-life LT50 of the luminance were measured with a spectroradiometric luminance meter CS-2000 (made by Konica Minolta, Inc.) in the evaluation on continuous driving stability, and the relative value of the chromaticity of the element containing the coating film to that of the element containing the deposited film was determined as chromatic stability. A smaller numeric value in Table 13 indicates higher chromatic stability of the coating film.

TABLE 13

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | *1 | NOTE |
|---|---|---|---|---|---|---|---|---|
| 5-1 | — | — | — | — | — | — | 58 | EXAMPLE |
| 5-2 | — | — | — | — | — | — | 67 | EXAMPLE |
| 5-3 | — | — | — | — | — | — | 70 | EXAMPLE |
| 5-4 | — | — | — | — | — | — | 55 | EXAMPLE |
| 5-5 | — | — | — | — | — | — | 69 | EXAMPLE |
| 5-6 | — | — | — | — | — | — | 80 | EXAMPLE |
| 5-7 | — | — | — | — | — | — | 60 | EXAMPLE |
| 5-8 | 0.25 | — | — | 0.19 | — | — | 70 | EXAMPLE |
| 5-9 | 0.40 | — | — | 0.34 | — | — | 62 | EXAMPLE |
| 5-10 | 0.40 | — | 0.90 | 0.34 | — | 0.84 | 62 | EXAMPLE |
| 5-11 | 0.40 | 0.72 | 0.90 | 0.34 | 0.66 | 0.84 | 73 | EXAMPLE |
| 5-12 | 0.25 | — | 0.90 | 0.19 | — | 0.84 | 80 | EXAMPLE |
| 5-13 | 0.26 | — | 0.90 | 0.20 | — | 0.84 | 64 | EXAMPLE |
| 5-14 | 0.25 | — | 0.90 | 0.19 | — | 0.84 | 70 | EXAMPLE |
| 5-15 | 0.25 | — | 0.90 | 0.19 | — | 0.84 | 70 | EXAMPLE |
| 5-16 | 0.40 | — | 0.90 | 0.34 | — | 0.84 | 67 | EXAMPLE |
| 5-17 | 0.40 | — | 0.90 | 0.34 | — | 0.84 | 75 | EXAMPLE |
| 5-18 | 0.40 | — | 0.90 | 0.34 | — | 0.84 | 75 | EXAMPLE |
| 5-19 | — | — | — | — | — | — | 90 | *2 |
| 5-20 | — | — | — | — | — | — | 90 | *2 |
| 5-21 | — | — | — | — | — | — | 90 | *2 |
| 5-22 | — | — | — | — | — | — | 86 | *2 |

*1: CHROMATIC STABILITY (RELATIVE VALUE)
*2: COMPARATIVE EXAMPLE

Example 6

Preparation of Organic EL Elements 6-1 to 6-22

Organic EL elements 6-1 to 6-22 were prepared as in Organic EL element 2-1 except that coating solutions containing different compounds in proportions shown in Table 14 were applied by a coating process to prepare luminous layers.

Organic EL elements 6-1 to 6-22 were prepared as in Organic EL element 2-1 except that different compounds were deposited at rates shown in Table 14 so that the deposition rates correspond to the composition ratios to prepare luminous layers. The proportion of the deposition rates of the materials was determined based on the mass proportion of the compounds other than the solvent.

TABLE 14

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 6-1 | 2CzPN | — | — | — | H-447 | TOLUENE | 0.032 | — | — | — | 0.598 | 99.370 | EXAMPLE |
| 6-2 | 4Cz IPN | — | — | — | H-447 | TOLUENE | 0.032 | — | — | — | 0.598 | 99.370 | EXAMPLE |
| 6-3 | 4CzPN | — | — | — | H-447 | TOLUENE | 0.032 | — | — | — | 0.598 | 99.370 | EXAMPLE |
| 6-4 | 4CzTPN | — | — | — | H-447 | TOLUENE | 0.032 | — | — | — | 0.598 | 99.370 | EXAMPLE |

TABLE 14-continued

| ORGANIC EL ELEMENT | TADF COMPOUND | *1 | *2 | *3 | HOST COMPOUND | SOLVENT | TADF COMPOUND [MASS %] | *1 [MASS %] | *2 [MASS %] | *3 [MASS %] | HOST COMPOUND [MASS %] | SOLVENT [MASS %] | NOTE |
|---|---|---|---|---|---|---|---|---|---|---|---|---|---|
| 6-5 | 4CzTPN-Me | — | — | — | H-447 | TOLUENE | 0.032 | — | — | — | 0.598 | 99.370 | EXAMPLE |
| 6-6 | 4CzTPN-Ph | — | — | — | H-447 | TOLUENE | 0.032 | — | — | — | 0.598 | 99.370 | EXAMPLE |
| 6-7 | CC2TA | — | — | — | H-447 | TOLUENE | 0.032 | — | — | — | 0.598 | 99.370 | EXAMPLE |
| 6-8 | CC2TA | P-14 | — | — | H-447 | TOLUENE | 0.032 | 0.095 | — | — | 0.503 | 99.370 | EXAMPLE |
| 6-9 | CC2TA | P-10 | — | — | H-447 | TOLUENE | 0.032 | 0.095 | — | — | 0.503 | 99.370 | EXAMPLE |
| 6-10 | CC2TA | P-10 | — | P-9 | H-447 | TOLUENE | 0.032 | 0.095 | — | 0.002 | 0.501 | 99.370 | EXAMPLE |
| 6-11 | CC2TA | P-10 | P-13 | P-9 | H-447 | TOLUENE | 0.032 | 0.095 | 0.002 | 0.002 | 0.499 | 99.370 | EXAMPLE |
| 6-12 | CC2TA | P-136 | — | P-9 | H-447 | TOLUENE | 0.032 | 0.095 | — | 0.002 | 0.501 | 99.370 | EXAMPLE |
| 6-13 | CC2TA | P-149 | — | P-9 | H-447 | TOLUENE | 0.032 | 0.095 | — | 0.002 | 0.501 | 99.370 | EXAMPLE |
| 6-14 | CC2TA | P-153 | — | P-9 | H-447 | TOLUENE | 0.032 | 0.095 | — | 0.002 | 0.501 | 99.370 | EXAMPLE |
| 6-15 | CC2TA | P-166 | — | P-9 | H-447 | TOLUENE | 0.032 | 0.095 | — | 0.002 | 0.501 | 99.370 | EXAMPLE |
| 6-16 | CC2TA | P-10 | — | P-9 | S-56 | TOLUENE | 0.032 | 0.095 | — | 0.002 | 0.501 | 99.370 | EXAMPLE |
| 6-17 | CC2TA | P-10 | — | P-9 | S-26 | TOLUENE | 0.032 | 0.095 | — | 0.002 | 0.501 | 99.370 | EXAMPLE |
| 6-18 | CC2TA | P-10 | — | P-9 | H-106 | TOLUENE | 0.032 | 0.095 | — | 0.002 | 0.501 | 99.370 | EXAMPLE |
| 6-19 | — | P-14 | — | — | H-447 | TOLUENE | — | 0.095 | — | — | 0.535 | 99.370 | *4 |
| 6-20 | — | P-10 | — | — | H-447 | TOLUENE | — | 0.095 | — | — | 0.535 | 99.370 | *4 |
| 6-21 | — | P-14 | P-13 | P-9 | H-447 | TOLUENE | — | 0.095 | 0.002 | 0.002 | 0.531 | 99.370 | *4 |
| 6-22 | — | P-10 | P-13 | P-9 | H-447 | TOLUENE | — | 0.095 | 0.002 | 0.002 | 0.531 | 99.370 | *4 |

*1: PHOSPHORESCENT METAL COMPLEX 1
*2: PHOSPHORESCENT METAL COMPLEX 2
*3: PHOSPHORESCENT METAL COMPLEX 3
*4: COMPARATIVE EXAMPLE (Evaluation of Organic EL Elements 6-1 to 6-22)

Organic EL elements 6-1 to 6-22 were evaluated as follows: A glass case is disposed to cover the non-luminous surface of each of the prepared organic EL elements according to the present invention, a glass substrate having a thickness of 300 μm is usesd as a sealing substrate, an epoxy photocurable adhesive (Laxtrack LC0629B, made by TOAGOSEI CO., LTD.) is applied as a seal material around the organic EL element, and this is disposed over the cathode and is bonded to the transparent support substrate. The glass substrate is irradiated with UV light to cure the adhesive. The organic EL element is sealed to prepare a lighting device illustrated in FIGS. 9 and 10. The lighting device was evaluated.

(Evaluation on Reliability)

The reliability of the luminous layer was evaluated as follows: Each of the organic EL element prepared by coating was heated in an oven at 80° C. and 60% RH for 10 hours, and the temperature of the element was adjusted under an environment at 23±3° C. and 55±3% RH for one hour. The number of dark spots per $mm^2$ was counted to evaluate the reliability of the luminous layer according to the following criteria:

⊚: no dark spot

○: 1 or 2 dark spots

Δ: 3 to 5 dark spots x: 6 or more dark spots

TABLE 15

| ORGANIC EL ELEMENT | $S_1$ (TADF)-$T_1$ (P1) [eV] | $S_1$ (TADF)-$T_1$ (P2) [eV] | $S_1$ (TADF)-$T_1$ (P3) [eV] | $T_1$ (TADF)-$T_1$ (P1) [eV] | $T_1$ (TADF)-$T_1$ (P2) [eV] | $T_1$ (TADF)-$T_1$ (P3) [eV] | RELIABILITY | NOTE |
|---|---|---|---|---|---|---|---|---|
| 6-1 | — | — | — | — | — | — | ⊚ | EXAMPLE |
| 6-2 | — | — | — | — | — | — | ○ | EXAMPLE |
| 6-3 | — | — | — | — | — | — | ○ | EXAMPLE |
| 6-4 | — | — | — | — | — | — | ⊚ | EXAMPLE |
| 6-5 | — | — | — | — | — | — | ○ | EXAMPLE |
| 6-6 | — | — | — | — | — | — | ○ | EXAMPLE |
| 6-7 | — | — | — | — | — | — | ⊚ | EXAMPLE |
| 6-8 | 0.25 | — | — | 0.19 | — | — | ⊚ | EXAMPLE |
| 6-9 | 0.40 | — | — | 0.34 | — | — | ⊚ | EXAMPLE |
| 6-10 | 0.40 | — | 0.90 | 0.34 | — | 0.84 | ⊚ | EXAMPLE |
| 6-11 | 0.40 | 0.72 | 0.90 | 0.34 | 0.66 | 0.84 | ⊚ | EXAMPLE |
| 6-12 | 0.25 | — | 0.90 | 0.19 | — | 0.84 | ⊚ | EXAMPLE |
| 6-13 | 0.26 | — | 0.90 | 0.20 | — | 0.84 | ⊚ | EXAMPLE |
| 6-14 | 0.25 | — | 0.90 | 0.19 | — | 0.84 | ⊚ | EXAMPLE |
| 6-15 | 0.25 | — | 0.90 | 0.19 | — | 0.84 | ⊚ | EXAMPLE |
| 6-16 | 0.40 | — | 0.90 | 0.34 | — | 0.84 | ⊚ | EXAMPLE |
| 6-17 | 0.40 | — | 0.90 | 0.34 | — | 0.84 | ⊚ | EXAMPLE |
| 6-18 | 0.40 | — | 0.90 | 0.34 | — | 0.84 | ⊚ | EXAMPLE |
| 6-19 | — | — | — | — | — | — | X | *1 |
| 6-20 | — | — | — | — | — | — | Δ | *1 |
| 6-21 | — | — | — | — | — | — | Δ | *1 |
| 6-22 | — | — | — | — | — | — | Δ | *1 |

*1: COMPARATIVE EXAMPLE

Advantageous Effects

Tables 7, 9, 11, 13, and 15 evidently show that the organic electroluminescent elements including luminous layers composed of the coating solution for forming a luminous layer according to the present invention contained TADF compounds having improved dispersion without any complex molecular design, and had enhanced luminescent efficiency, initial driving voltage, continuous driving stability, chromatic stability, and reliability.

Although it should be preferred that the TADF compound and all of the phosphorescent metal complexes satisfy the conditions expressed by Expressions (1) and (3) as in Example 1, the results show that a high performance thin film can be achieved if at least one of the phosphorescent metal complexes satisfies the conditions expressed by Expressions (1) and (3) in a system containing several phosphorescent metal complexes emitting white light having satisfactory color rendering characteristics.

INDUSTRIAL APPLICABILITY

The coating solution for forming a luminous layer according to the present invention can enhance the quantum efficiency. The coating solution for forming a luminous layer can be used in preparation of organic EL elements. Such organic EL elements can be suitably used in applications to display devices, display panels, house lightings, car interior lightings, backlights for clocks, watches, and liquid crystal devices, advertising signs, traffic signals, light sources for optical storage media, electrophotographic copiers, optical communication processors, and optical sensors, and light-emitting sources broadly used in display devices for general household electric appliances.

EXPLANATION OF REFERENCE NUMERALS 1 display
3 pixel
5 scanning line
6 data line
7 power supply line
10 organic EL element
11 switching transistor
12 driving transistor
13 capacitor
101 organic EL element
102 glass cover
105 cathode
106 organic EL layer
107 glass substrate with transparent electrode
108 nitrogen gas
109 moisture getter
A display unit
B control unit
C connection unit

The invention claimed is:
1. A coating solution for forming a luminous layer included in one or more organic layers disposed between an anode and a cathode, the coating solution comprising:
a thermally-activated delayed fluorescent, compound, and
a heavy atom compound having an external heavy-atom effect to promote intersystem crossing of the thermally-activated delayed fluorescent compound from a triplet excited state to a singlet excited state to increase a fluorescent intensity,
wherein the heavy atom compound is a phosphorescent metal complex,
a lowest excited triplet energy level ($T_1$(TADF)) of the thermally-activated delayed fluorescent compound and a lowest excited triplet energy level ($T_1$(P)) of the phosphorescent metal complex are within ranges allowing transfer of energy electrons therebetween,
a difference in energy between a lowest excited singlet energy level ($S_1$(TADF)) of the thermally-activated delayed fluorescent compound and the lowest excited triplet energy level ($T_1$(P)) of the phosphorescent metal complex is within a range represented by Expression (1):

$$-0.2 \text{ eV} \leq [S_1(\text{TADF}) - T_1(P)] \leq 1.0 \text{ eV} \quad (1), \text{ and}$$

a difference in energy between the lowest excited triplet energy level ($T_1$(TADF)) of the thermally-activated delayed fluorescent compound and the lowest excited triplet energy level ($T_1$(P)) of the phosphorescent metal complex is within a range represented by Expression (3):

$$-0.2 \text{ eV} \leq [T_1(\text{TADF}) - T_1(P)] \leq 0.5 \text{ eV} \quad (3)$$

2. The coating solution for forming the luminous layer according to claim 1, wherein the difference in energy between the lowest excited singlet energy level ($S_1$(TADF)) of the thermally-activated delayed fluorescent compound and the lowest excited triplet energy level ($T_1$(P)) of the phosphorescent metal complex is within a range represented by Expression (2)

$$0 \text{ eV} \leq [S_1(\text{TADF}) - T_1(P)] \leq 0.2 \text{ eV} \quad (2).$$

3. The coating solution for forming the luminous layer according to claim 1, wherein the difference in energy between the lowest excited triplet energy level ($T_1$(TADF)) the thermally-activated delayed fluorescent compound and the lowest excited triplet energy level ($T_1$(P)) of the phosphorescent metal complex is within a range represented by Expression (4):

$$0 \text{ eV} \leq [T_1(\text{TADF}) - T_1(P)] \leq 0.1 \text{ eV} \quad (4).$$

4. The coating solution for forming the luminous layer according to claim 1, wherein the lowest excited triplet energy level ($T_1$(TADF)) of the thermally-activated delayed fluorescent compound is within a range of 2.4 to 3.5 eV.

5. The coating solution for forming the luminous layer according to claim 1, wherein the phosphorescent metal complex has a structure represented by Formula (I)

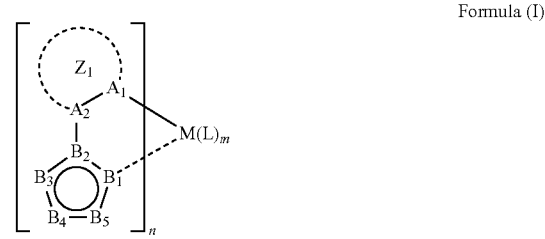

Formula (I)

where M represents Ir, Pt, Rh, Ru, Ag, $Cu_p$ or Qs, $A_1$ and $A_2$ each represent a carbon or nitrogen atom; ring $Z_1$ represents a membered aromatic aromatic hydrocarbon ring group or 5- or 6-membered aromatic aromatic heterocyclic ring group containing $A_1$ and $A_2$; $B_1$ to $B_5$ each represent a carbon or nitrogen atom so that $B_1$ to $B_5$ form a 5-membered aromatic heterocyclic ring group, and $B_1$ to $B_5$ each optionally have a substituent;

the ring $Z_1$ optionally has a substituent, or optionally has a condensed ring structure formed through bonding of substituents; substituents of ligands are optionally bonded to each other to bond the ligands to each other; L represents a monoanionic bidentate ligand coordinated with M; m represents an integer of 0 to 2; n represents an integer of 1 to 3; m+n is 2 or 3; when m is 2, two Ls are same or different, and when n is 2 or 3, two or three ligands each having the ring $Z_1$ and the aromatic heterocyclic ring group represented by $B_1$ to $B_5$ are same or different.

6. The coating solution for forming the luminous layer according to claim 1, further comprising a host compound.

7. An organic electroluminescent element comprising a luminous layer included in one or more organic layers disposed between an anode and a cathode, wherein the luminous layer is made from the coating solution for forming the luminous layer according to claim 1.

8. A lighting device comprising the organic electroluminescent element according to claim 7.

9. A display device comprising the organic electroluminescent element according to claim 7.

10. A white electroluminescent device which has a single luminous layer disposed between an anode and a cathode, the white electroluminescent device comprising:
    the organic electroluminescent element according to claim 7.

11. A method of producing an organic electroluminescent element including one or more organic layers disposed between an anode and a cathode, the method comprising:
    forming a luminous layer with the coating solution for forming the luminous layer according to claim 1, the luminous layer being one of the organic layers.

\* \* \* \* \*